United States Patent
Nguyen et al.

(10) Patent No.: US 12,498,635 B2
(45) Date of Patent: Dec. 16, 2025

(54) RESIST COMPOSITION, METHOD OF FORMING RESIST PATTERN, AND COMPOUND

(71) Applicant: TOKYO OHKA KOGYO CO., LTD., Kawasaki (JP)

(72) Inventors: KhanhTin Nguyen, Kawasaki (JP); Mari Murata, Kawasaki (JP); Masatoshi Arai, Kawasaki (JP); Nobuhiro Michibayashi, Kawasaki (JP)

(73) Assignee: TOKYO OHKA KOGYO CO., LTD., Kawasaki (JP)

( * ) Notice: Subject to any disclaimer, the term of this patent is extended or adjusted under 35 U.S.C. 154(b) by 464 days.

(21) Appl. No.: 16/686,925

(22) Filed: Nov. 18, 2019

(65) Prior Publication Data
US 2020/0183273 A1    Jun. 11, 2020

(30) Foreign Application Priority Data

Dec. 5, 2018 (JP) ................. 2018-228559

(51) Int. Cl.
| | | |
|---|---|---|
| *G03F 7/004* | (2006.01) | |
| *C07C 65/05* | (2006.01) | |
| *C07C 321/30* | (2006.01) | |
| *G03F 7/16* | (2006.01) | |
| *G03F 7/20* | (2006.01) | |
| *G03F 7/30* | (2006.01) | |

(52) U.S. Cl.
CPC ............ *G03F 7/0045* (2013.01); *C07C 65/05* (2013.01); *C07C 321/30* (2013.01); *G03F 7/162* (2013.01); *G03F 7/20* (2013.01); *G03F 7/30* (2013.01)

(58) Field of Classification Search
CPC ......... G03F 7/0045; G03F 7/162; G03F 7/20; G03F 7/30; G03F 7/0397; G03F 7/004; G03F 7/039; G03F 7/325; G03F 7/322; G03F 7/40; G03F 7/0392; G03F 7/0046; G03F 7/038; G03F 7/027; C07C 65/05; C07C 321/30; C07C 25/18; C07C 69/14; C07C 69/78; C07C 69/63; C07C 59/66; C07C 69/753; C07C 59/70; C07C 59/13; C07C 381/12; C07C 323/52; C07C 59/125; C07C 62/04; C07C 2601/08; C07C 2603/74; C08F 2/50; C08F 212/22; C08F 220/24; C08F 220/1804; C08F 212/32; C08F 212/20; C08F 220/282; C08F 212/24; C08F 220/22; C09D 125/18; C09D 183/04; C08G 77/04; C07D 333/76; C07D 335/02; C07D 307/33; C07D 493/18; C07D 335/16; C07D 313/10; C07D 307/00; C07D 333/46; C07D 327/04; C07D 333/54; C07D 493/08

See application file for complete search history.

(56) References Cited

U.S. PATENT DOCUMENTS

| | | | | |
|---|---|---|---|---|
| 2013/0157197 A1* | 6/2013 | Komuro | ................ | G03F 7/0045 430/281.1 |
| 2013/0224658 A1* | 8/2013 | Komuro | ................ | G03F 7/0045 430/281.1 |
| 2013/0260312 A1* | 10/2013 | Suzuki | .................. | G03F 7/0045 524/547 |
| 2021/0173309 A1* | 6/2021 | Sakita | .................... | G03F 7/0045 |

FOREIGN PATENT DOCUMENTS

| | | | | | |
|---|---|---|---|---|---|
| JP | 2011016970 A | * | 1/2011 | ............. | G03F 7/039 |
| JP | 2014-115386 A | | 6/2014 | | |
| JP | 2018-097125 A | | 6/2018 | | |

OTHER PUBLICATIONS

English Translation of JP 2011-016970 A; Ken Maruyama; Published: Jan. 27, 2011 (Year: 2011).*
Notice of Allowance issued in Japanese Patent Application No. 2018-228559, mailed Dec. 6, 2022.

* cited by examiner

*Primary Examiner* — Mark F. Huff
*Assistant Examiner* — Richard David Champion
(74) *Attorney, Agent, or Firm* — Knobbe, Martens, Olson & Bear, LLP

(57) ABSTRACT

A resist composition including a base material component (A) whose solubility in a developing solution is changed due to the action of an acid, and a compound (D0) formed of an anion moiety and a cation moiety which is represented by Formula (d0), in which the cation moiety of the compound (D0) has a Log P value of less than 7.7. In the formula, $M^{m+}$ represents an m-valent organic cation, $R^{d0}$ represents a substituent, p represents an integer of 0 to 3, q represents an integer of 0 to 3, n represents an integer of 2 or greater, and a relationship of "n+p≤(q×2)+5" is satisfied.

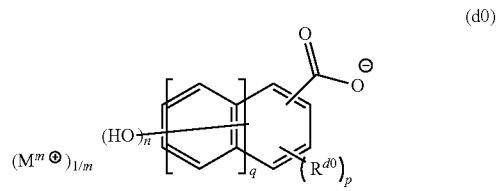

(d0)

3 Claims, No Drawings

RESIST COMPOSITION, METHOD OF FORMING RESIST PATTERN, AND COMPOUND

BACKGROUND OF THE INVENTION

Field of the Invention

The present invention relates to a resist composition, a method of forming a resist pattern, and a compound.

Priority is claimed on Japanese Patent Application No. 2018-228559, filed on Dec. 5, 2018, the content of which is incorporated herein by reference.

Description of Related Art

In lithography techniques, for example, a resist film formed of a resist material is formed on a substrate, and the resist film is subjected to selective exposure, followed by a developing treatment, thereby forming a resist pattern having a predetermined shape on the resist film. A resist material in which the exposed portions of the resist film become soluble in a developing solution is called a positive type, and a resist material in which the exposed portions of the resist film become insoluble in a developing solution is called a negative type.

In recent years, in the production of semiconductor elements and liquid crystal display elements, advances in lithography techniques have led to rapid progress in the field of pattern miniaturization. Typically, these miniaturization techniques involve shortening the wavelength (increasing the energy) of the exposure light source. Specifically, ultraviolet radiation typified by g-line and i-line radiation has been used in the related art, but nowadays KrF excimer lasers and ArF excimer lasers are used in mass production. Furthermore, research is also being conducted into lithography techniques that use an exposure light source having a wavelength shorter (energy higher) than these excimer lasers, such as electron beams (EB), extreme ultraviolet rays (EUV), and X rays.

Resist materials for use with these types of exposure light sources require lithography characteristics such as a high resolution capable of reproducing patterns of minute dimensions, and a high level of sensitivity to these types of exposure light sources.

As a resist material that satisfies these requirements, in the related art, a chemically amplified resist composition which includes a base material component whose solubility in a developing solution is changed due to an action of an acid and an acid-generator component that generates an acid upon exposure has been used.

For example, in a case where the developing solution is an alkali developing solution (alkali developing process), as a positive type chemically amplified resist composition, a composition which contains a resin component (base resin) whose solubility in an alkali developing solution is increased due to an action of an acid and an acid generator component has been typically used. In a case where a resist film formed using such a resist composition is selectively exposed at the time of forming a resist pattern, in exposed portions, an acid is generated from the acid generator component, and the polarity of the base resin increases by the action of the generated acid, thereby making the exposed portions of the resist film soluble in the alkali developing solution. Thus, by conducting alkali development, and the unexposed portions of the resist film remain to form a positive type resist pattern.

On the other hand, in a case where such a chemically amplified resist composition is applied to a solvent developing process using a developing solution containing an organic solvent (organic developing solution), since the solubility in an organic developing solution is relatively decreased at the time of an increase in polarity of the base resin, the unexposed portions of the resist film are dissolved and removed by the organic developing solution, and a negative type resist pattern in which the exposed portions of the resist film are remaining is formed. Such a solvent developing process for forming a negative type resist pattern is also referred to as a "negative type developing process".

In formation of a resist pattern, the behavior of an acid generated from an acid generator component upon exposure is regarded as a factor that greatly affects the lithography characteristics.

Meanwhile, a chemically amplified resist composition which contains an acid generator component as well as an acid diffusion control agent that controls diffusion of an acid generated from the acid generator component upon exposure has been suggested.

For example, Japanese Unexamined Patent Application, First Publication No. 2014-115386 discloses a resist composition containing a resin component whose solubility in a developing solution is changed due to an action of an acid; an acid generator component; and a photoreactive quencher which has a cation moiety having a specific structure as an acid diffusion control agent. This photoreactive quencher is considered as a component that exhibits a quenching effect by causing an ion exchange reaction with an acid generated from an acid generator component. Further, due to the blending with such a photoreactive quencher, diffusion of the acid generated from the acid generator component in unexposed portions from exposed portions of the resist film is controlled so that the lithography characteristics are improved.

SUMMARY OF THE INVENTION

Recently, with progression of advancement in lithography technology and expansion of application fields, pattern miniaturization is rapidly progressing. With this trend, a technique which enables formation of a fine pattern, in which the dimension of the pattern width is less than 100 nm, with an excellent shape is required at the time of manufacturing a semiconductor element and the like.

However, in a case where a fine pattern (for example, a fine line and space pattern) is intended to be formed on a substrate using a resist composition of the related art, it is insufficient to satisfy the requirement in terms of the uniformity (reduction in roughness) of the space width in the pattern.

The present invention has been made in consideration of the above-described circumstances, and an object thereof is to provide a new compound for a resist composition, a resist composition containing the compound, and a method of forming a resist pattern obtained by using the resist composition.

In order to achieve the above-described object, the present invention employs the following configuration.

According to a first aspect of the present invention, there is provided a resist composition which generates an acid upon exposure and whose solubility in a developing solution is changed due to an action of the acid, the resist composition including: a base material component (A) whose solubility in a developing solution is changed due to the action of an acid; and a compound (D0) formed of an anion moiety and a cation moiety which is represented by Formula (d0), in which the cation moiety of the compound (D0) has a Log P value of less than 7.7.

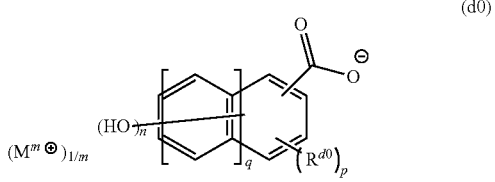

[In the formula, $M^{m+}$ represents an m-valent organic cation, $R^{d0}$ represents a substituent, p represents an integer of 0 to 3, and in a case where p represents 2 or 3, a plurality of substituents as $R^{d0}$ may be the same as or different from one another, q represents an integer of 0 to 3, n represents an integer of 2 or greater, where a relationship of "n+p≤(q×2)+5" is satisfied.]

According to a second aspect of the present invention, there is provided a method of forming a resist pattern, including: a step of forming a resist film on a support using the resist composition according to the first aspect; a step of exposing the resist film; and a step of developing the exposed resist film to form a resist pattern.

According to a third aspect of the present invention, there is provided a compound formed of an anion moiety and a cation moiety which is represented by Formula (d0), in which Log P value of the cation moiety is less than 7.7.

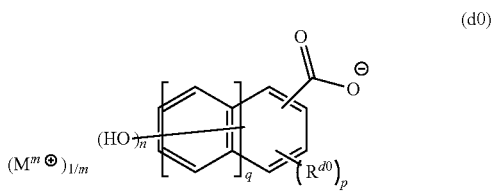

[In the formula, $M^{m+}$ represents an m-valent organic cation, $R^{d0}$ represents a substituent, p represents an integer of 0 to 3, and in a case where p represents 2 or 3, a plurality of substituents as $R^{d0}$ may be the same as or different from one another, q represents an integer of 0 to 3, n represents an integer of 2 or greater, where a relationship of "n+p≤(q×2)+5" is satisfied.]

According to the present invention, it is possible to provide a new compound for a resist composition, a resist composition containing the compound, and a method of forming a resist pattern obtained by using the resist composition.

According to the resist composition of the present invention, it is possible to form a resist pattern with improved lithography characteristics (reduction in roughness and the like) during formation of the resist pattern.

DETAILED DESCRIPTION OF THE INVENTION

In the present description and claims, the term "aliphatic" is a relative concept used in relation to the term "aromatic", and defines a group or compound that has no aromaticity.

The term "alkyl group" includes linear, branched or cyclic, monovalent saturated hydrocarbon, unless otherwise specified. The same applies for the alkyl group in an alkoxy group.

The term "alkylene group" includes linear, branched or cyclic, divalent saturated hydrocarbon, unless otherwise specified.

A "halogenated alkyl group" is a group in which some or all hydrogen atoms of an alkyl group is substituted with halogen atoms. Examples of the halogen atom include a fluorine atom, a chlorine atom, a bromine atom and an iodine atom.

A "fluorinated alkyl group" or a "fluorinated alkylene group" is a group in which some or all hydrogen atoms of an alkyl group or an alkylene group have been substituted with fluorine atoms.

The term "constitutional unit" indicates a monomer unit that contributes to the formation of a polymer compound (a resin, a polymer, or a copolymer).

The expression "may have a substituent" means that a case where a hydrogen atom (—H) is substituted with a monovalent group, or a case where a methylene (—$CH_2$—) group is substituted with a divalent group.

The term "exposure" is used as a general concept that includes irradiation with any form of radiation.

A "constitutional unit derived from acrylic acid ester" indicates a constitutional unit that is formed by the cleavage of the ethylenic double bond of acrylic acid ester.

The "acrylic acid ester" indicates a compound in which the terminal hydrogen atom of the carboxy group of acrylic acid ($CH_2$=CH—COOH) has been substituted with an organic group.

In the acrylic acid ester, the hydrogen atom bonded to the carbon atom at the α-position may be substituted with a substituent. The substituent ($R^{a0}$) that substitutes the hydrogen atom bonded to the carbon atom at the α-position is an atom other than a hydrogen atom or a group, and examples thereof include an alkyl group having 1 to 5 carbon atoms and a halogenated alkyl group having 1 to 5 carbon atoms. Further, itaconic acid diester in which the substituent ($R^{a0}$) is substituted with a substituent having an ester bond or α-hydroxyacryl ester in which the substituent ($R^{a0}$) is substituted with a hydroxyalkyl group or a group obtained by modifying a hydroxyl group thereof can be exemplified as acrylic acid ester. A carbon atom at the α-position of acrylic acid ester indicates the carbon atom bonded to the carbonyl group of acrylic acid, unless otherwise specified.

Hereinafter, acrylic acid ester in which the hydrogen atom bonded to the carbon atom at the α-position is substituted with a substituent is also referred to as α-substituted acrylic acid ester". Further, acrylic acid ester and α-substituted acrylic acid ester are also collectively referred to as "(α-substituted) acrylic acid ester".

A "constitutional unit derived from acrylamide" indicates a constitutional unit that is formed by the cleavage of the ethylenic double bond of acrylamide.

The acrylamide may have the hydrogen atom bonded to the carbon atom at the α-position substituted with a substituent, and may have either or both terminal hydrogen atoms on the amino group of acrylamide substituted with a substituent. A carbon atom at the α-position of acrylamide indicates the carbon atom bonded to the carbonyl group of acrylamide, unless otherwise specified.

As the substituent which substitutes the hydrogen atom bonded to the carbon atom at the α-position of acrylamide, the same substituents as those described above for the substituent ($R^{a0}$) at the α-position of the above-described α-position of the α-substituted acrylic acid ester can be exemplified.

A "constitutional unit derived from hydroxystyrene" indicates a constitutional unit that is formed by the cleavage of an ethylenic double bond of hydroxystyrene. A "constitutional unit derived from a hydroxystyrene derivative" indicates a constitutional unit formed by the cleavage of an ethylenic double bond of a hydroxystyrene derivative.

The term "hydroxystyrene derivative" includes compounds in which the hydrogen atom at the α-position of hydroxystyrene has been substituted with another substituent such as an alkyl group or a halogenated alkyl group; and derivatives thereof. Examples of the derivatives thereof include hydroxystyrene in which the hydrogen atom of the hydroxyl group has been substituted with an organic group and may have the hydrogen atom at the α-position substituted with a substituent; and hydroxystyrene which has a substituent other than a hydroxyl group bonded to the benzene ring and may have the hydrogen atom at the α-position substituted with a substituent. Further, the α-position (carbon atom at the α-position) indicates the carbon atom having the benzene ring bonded thereto, unless otherwise specified.

As the substituent which substitutes the hydrogen atom at the α-position of hydroxystyrene, the same substituents as those described above for the substituent at the α-position of the above-described α-substituted acrylic acid ester can be exemplified.

A "constitutional unit derived from vinylbenzoic acid or a vinylbenzoic acid derivative" indicates a constitutional unit that is formed by the cleavage of the ethylenic double bond of vinylbenzoic acid or a vinylbenzoic acid derivative.

The term "vinylbenzoic acid derivative" includes compounds in which the hydrogen atom at the α-position of vinylbenzoic acid has been substituted with another substituent such as an alkyl group or a halogenated alkyl group; and derivatives thereof. Examples of the derivatives thereof include vinylbenzoic acid in which the hydrogen atom of the carboxy group has been substituted with an organic group and may have the hydrogen atom at the α-position substituted with a substituent; and vinylbenzoic acid which has a substituent other than a hydroxyl group and a carboxy group bonded to the benzene ring and may have the hydrogen atom at the α-position substituted with a substituent. Further, the α-position (carbon atom at the α-position) indicates the carbon atom having the benzene ring bonded thereto, unless otherwise specified.

The term "styrene derivative" is a concept including those obtained by substitution of a hydrogen atom at the α-position of styrene with other substituents such as an alkyl group and a halogenated alkyl group; and these derivatives. Examples of these derivatives include those obtained by bonding a substituent to a benzene ring of hydroxystyrene in which a hydrogen atom at the α-position may be substituted with a substituent. Further, the α-position (carbon atom at the α-position) indicates the carbon atom having the benzene ring bonded thereto, unless otherwise specified.

The term "constitutional unit derived from styrene" or "constitutional unit derived from a styrene derivative" indicates a constitutional unit formed by cleavage of an ethylenic double bond of styrene or a styrene derivative.

As the alkyl group as a substituent at the α-position, a linear or branched alkyl group is preferable, and specific examples include alkyl groups of 1 to 5 carbon atoms, such as a methyl group, an ethyl group, a propyl group, an isopropyl group, an n-butyl group, an isobutyl group, a tert-butyl group, a pentyl group, an isopentyl group, and a neopentyl group.

Specific examples of the halogenated alkyl group as the substituent at the α-position include groups in which some or all hydrogen atoms of the above-described "alkyl group as the substituent at the α-position" are substituted with halogen atoms. Examples of the halogen atom include a fluorine atom, a chlorine atom, a bromine atom and an iodine atom, and a fluorine atom is particularly preferable.

Specific examples of the hydroxyalkyl group as the substituent at the α-position include groups in which some or all hydrogen atoms of the above-described "alkyl group as the substituent at the α-position" are substituted with a hydroxyl group. The number of hydroxyl groups in the hydroxyalkyl group is preferably 1 to 5, and most preferably 1.

In the present specification and the scope of the present patent claims, asymmetric carbons may be present or enantiomers or diastereomers may be present depending on the structures of the chemical formulae. In this case, these isomers are represented by one chemical formula. These isomers may be used alone or in the form of a mixture.

(Resist Composition)

The resist composition according to the first aspect of the present invention is a resist composition which generates an acid upon exposure and whose solubility in a developing solution is changed due to an action of the acid. The resist composition includes a base material component (A) (hereinafter, also referred to as a component (A)") whose solubility in a developing solution is changed due to the action of an acid, and a compound (D0) formed of an anion moiety and a cation moiety which is represented by Formula (d0), in which the cation moiety of the compound (D0) has a Log P value of less than 7.7.

As an embodiment of such a resist composition, a resist composition which contains the component (A) and the component (D0) as a base component (hereinafter, also referred to as a "component (D)") that traps an acid generated upon exposure (that is, controls diffusion of an acid) is exemplified. A resist composition which contains an acid generator component (B) (hereinafter, also referred to as a "component (B)") that generates an acid upon exposure in addition to the component (A) and the component (D0) is preferably exemplified.

In a case where a resist film is formed using the resist composition according to the present embodiment and the formed resist film is subjected to a selective exposure, an acid is generated from the component (B) at exposed portions of the resist film, and the generated acid acts on the component (A) to change the solubility of the component (A) in a developing solution, whereas the solubility of the component (A) in a developing solution is not changed at unexposed portions of the resist film, thereby generating difference in solubility in a developing solution between exposed portions and unexposed portions. Therefore, by subjecting the resist film to development, the exposed portions of the resist film are dissolved and removed to form a positive type resist pattern in a case where the resist composition is of a positive type, whereas the unexposed portions of the resist film are dissolved and removed to form a negative type resist pattern in a case where the resist composition is of a negative type.

In the present specification, a resist composition which forms a positive type resist pattern by dissolving and removing the exposed portions of the resist film is called a positive type resist composition, and a resist composition which forms a negative type resist pattern by dissolving and removing the unexposed portions of the resist film is called a negative type resist composition.

The resist composition of the present embodiment may be a positive type resist composition or a negative type resist composition. Further, in the formation of a resist pattern, the resist composition of the present embodiment can be applied to an alkali developing process using an alkali developing solution in the developing treatment, or a solvent developing process using a developing solution containing an organic solvent (organic developing solution) in the developing treatment.

The resist composition of the present embodiment has a function of generating an acid upon exposure, and the component (A) together with the component (B) may generate an acid upon exposure. In a case where the component (A) generates an acid upon exposure, the component (A) becomes a "base material component which generates an acid upon exposure and whose solubility in a developing solution is changed due to the action of the acid".

In a case where the component (A) is a base material component which generates an acid upon exposure and whose solubility in a developing solution is changed due to the action of the acid, it is preferable that a component (A1) described below is a polymer compound which generates an acid upon exposure and whose solubility in a developing solution is changed due to the action of the acid. As such a polymer compound, a resin having a constitutional unit that generates an acid upon exposure is exemplified. A known monomer can be used as the monomer that derives the constitutional unit generating an acid upon exposure.

<Component (A)>

In the resist composition according to the present embodiment, the component (A) is a base material component whose solubility in a developing solution is changed due to an action of an acid.

In the present invention, the term "base material component" indicates an organic compound capable of forming a film, and is preferably an organic compound having a molecular weight of 500 or greater. In a case where the organic compound has a molecular weight of 500 or greater, the film-forming ability is improved, and a resist pattern at a nano level can be easily formed.

The organic compound used as the base material component is broadly classified into non-polymers and polymers.

In general, as a non-polymer, any of those which have a molecular weight in the range of 500 to less than 4,000 is used. Hereinafter, a "low molecular weight compound" indicates a non-polymer having a molecular weight in the range of 500 to less than 4,000.

As a polymer, any of those which have a molecular weight of 1,000 or greater is generally used. Hereinafter, a "resin" and a "polymer compound" or a "polymer" each indicate a polymer having a molecular weight of 1,000 or greater.

As the molecular weight of the polymer, the weight-average molecular weight in terms of the polystyrene equivalent value determined by gel permeation chromatography (GPC) is used.

In a case where the resist composition of the present embodiment is a "negative type resist composition for an alkali developing process" which forms a negative type resist pattern in an alkali developing process or a case where the resist composition is a "positive type resist composition for a solvent developing process" which forms a positive type resist pattern in a solvent developing process, a base material component (A-2) (hereinafter, referred to as a component (A-2)" which is soluble in an alkali developing solution is preferably used as the component (A), and a crosslinking agent component is further blended with the component. In such a resist composition, for example, in a case where an acid is generated from the component (B) upon exposure, crosslinking occurs between the component (A-2) and the crosslinking agent component due to the action of the acid. As the result, the solubility in an alkali developing solution is decreased (the solubility in an organic developing solution is increased).

Accordingly, in the formation of a resist pattern, in a case where a resist film obtained by coating a support with the resist composition is selectively exposed, since the unexposed portions of the resist film are soluble in an alkali developing solution (sparingly soluble in an organic developing solution) and the state is not changed while the exposed portions of the resist film become sparingly soluble in an alkali developing solution (soluble in an organic developing solution), a negative type resist pattern is formed by performing development using an alkali developing solution. Further, a positive type resist pattern is formed by performing development using an organic developing solution at this time.

As the component (A-2), a resin which is soluble (hereinafter, referred to as an "alkali-soluble resin") in an alkali developing solution is preferably used.

As the alkali-soluble resin, from the viewpoint that an excellent resist pattern with less swelling can be formed, a resin having a constitutional unit derived from at least one selected from alkyl ester (preferably alkyl ester having 1 to 5 carbon atoms) of α-(hydroxyalkyl)acrylic acid and alkyl ester of α-(hydroxyalkyl)acrylic acid, disclosed in Japanese Unexamined Patent Application, First Publication No. 2000-206694; an acrylic resin or a polycycloolefin resin which contains a sulfonamide group and in which a hydrogen atom bonded to the carbon atom at the α-position may be substituted with a substituent, disclosed in U.S. Pat. No. 6,949,325; an acrylic resin which fluorinated alcohol and in which a hydrogen atom bonded to the carbon atom at the α-position may be substituted with a substituent, disclosed in U.S. Pat. No. 6,949,325, Japanese Unexamined Patent Application, First Publication No. 2005-336452, and Japanese Unexamined Patent Application, First Publication No. 2006-317803; and a polycycloolefin resin which has fluorinated alcohol, disclosed in Japanese Unexamined Patent Application, First Publication No. 2006-259582 are preferable.

Further, the α-(hydroxyalkyl)acrylic acid indicates one or both of acrylic acid formed by a hydrogen atom being bonded to the carbon atom at the α-position to which a carboxy group is bonded and α-hydroxyalkylacrylic acid formed by a hydroxyalkyl group (preferably a hydroxyalkyl group having 1 to 5 carbon atoms) being bonded to the carbon atom at the α-position, among acrylic acids in which a hydrogen atom bonded to the carbon atom at the α-position may be substituted with a substituent.

From the viewpoint that an excellent resist pattern with less swelling is easily formed, it is preferable that an amino-based crosslinking agent such as glycoluril containing a methylol group or an alkoxymethyl group or a melamine-based crosslinking agent is used as the crosslinking agent component. The amount of the crosslinking agent to be blended is preferably in a range of 1 to 50 parts by mass with respect to 100 parts by mass of the alkali-soluble resin.

In a case where the resist composition of the present embodiment is a "positive type resist composition for an alkali developing process" which forms a positive type resist pattern in an alkali developing process or a case where the resist composition is a "negative type resist composition for a solvent developing process" which forms a negative type resist pattern in a solvent developing process, a base material component (A-1) (hereinafter, referred to as a component (A-1)" whose polarity is increased due to the action of an acid is preferably used as the component (A). In the alkali developing process and the solvent developing process, since the polarity of the base material component before and after the exposure is changed by using the component (A-1), an excellent development contrast between exposed portions and unexposed portions can be obtained.

In a case of applying an alkali developing process, the component (A-1) is substantially insoluble in an alkali developing solution prior to exposure, but in a case where acid is generated from the component (B) upon exposure, the action of this acid causes an increase in the polarity of the base material component, thereby increasing the solubility of the component (A) in an alkali developing solution. Therefore, in the formation of a resist pattern, by conducting selective exposure of a resist film formed by applying the resist composition to a support, the exposed portions of the resist film change from an insoluble state to a soluble state in an alkali developing solution, whereas the unexposed portions of the resist film remain insoluble in an alkali developing solution, and hence, a positive type resist pattern is formed by alkali developing.

Meanwhile, in a case of a solvent developing process, the component (A-1) exhibits high solubility in an organic developing solution prior to exposure, and in a case where acid is generated from the component (B) upon exposure, the polarity of the component (A) is increased by the action of the generated acid, thereby decreasing the solubility of the component (A) in an organic developing solution. Therefore, in the formation of a resist pattern, by conducting selective exposure of a resist film formed by applying the resist composition to a support, the exposed portions of the resist film changes from an soluble state to an insoluble state in an organic developing solution, whereas the unexposed portions of the resist film remain soluble in an organic developing solution. As a result, by conducting development using an organic developing solution, a contrast between the exposed portions and the unexposed portions can be made, and a negative type resist pattern can be formed.

In the resist composition according to the present embodiment, the component (A) may be used alone or in combination of two or more kinds thereof.

In the resist composition of the present embodiment, it is preferable that the component (A) is the component (A-1). In other words, it is preferable that the resist composition of the present embodiment is a "positive type resist composition for an alkali developing process" which forms a positive type resist pattern in an alkali developing process or a "negative type resist composition for a solvent developing process" which forms a negative type resist pattern in a solvent developing process. At least one of a polymer compound and a low molecular weight compound can be used as the compound (A).

In a case where the component (A) is a compound (A-1), it is preferable that as the component (A-1), it is preferable that the resist composition contains a resin component (A1) (hereinafter, also referred to as a component (A1)") as the component (A-1).

In Regard to Component (A1)

The component (A1) is a resin component, and it is preferable that the component (A1) contains a polymer compound having a constitutional unit (a1) which contains an acid decomposable group whose polarity is increased due to the action of an acid.

A component which further has a constitutional unit (a10) having a hydroxystyrene skeleton in addition to the constitutional unit (a1) is preferable as the component (A1).

Further, a component which further has a constitutional unit (a2) containing a lactone-containing cyclic group, a $-SO_2$-containing cyclic group, or a carbonate-containing cyclic group in addition to the constitutional unit (a1) is also preferable as the component (A1).

Further, a component which further has a constitutional unit (a3) (here, a constitutional unit corresponding to the constitutional unit (a1) or the constitutional unit (a2) is excluded) containing a polar group-containing aliphatic hydrocarbon group in addition to the constitutional unit (a1) is also preferable as the component (A1).

In addition, the component (A1) may have a constitutional unit other than the constitutional unit (a1), the constitutional unit (a2), the constitutional unit (a3), and the constitutional unit (a10).

<<Constitutional Unit (a1)>>

The constitutional unit (a1) is a constitutional unit that contains an acid decomposable group whose polarity is increased due to the action of an acid.

The term "acid decomposable group" indicates a group in which at least a part of a bond in the structure of the acid decomposable group can be cleaved due to the action of an acid.

Examples of the acid decomposable group whose polarity is increased due to the action of an acid include groups which are decomposed due to the action of an acid to generate a polar group.

Examples of the polar group include a carboxy group, a hydroxyl group, an amino group, and a sulfo group ($-SO_3H$). Among these, a polar group containing $-OH$ in the structure thereof (hereinafter, also referred to as a "OH-containing polar group") is preferable, a carboxy group or a hydroxyl group is more preferable, and a carboxy group is particularly preferable.

More specific examples of the acid decomposable group include a group in which the above-described polar group has been protected with an acid dissociable group (such as a group in which a hydrogen atom of the OH-containing polar group has been protected with an acid dissociable group).

Here, the "acid dissociable group" indicates both (i) group in which a bond between the acid dissociable group and an atom adjacent to the acid dissociable group can be cleaved due to the action of an acid; and (ii) group in which some bonds are cleaved due to the action of an acid, and then a decarboxylation reaction occurs, thereby cleaving the bond between the acid dissociable group and the atom adjacent to the acid dissociable group.

It is necessary that the acid dissociable group that constitutes the acid decomposable group is a group which exhibits a lower polarity than the polar group generated by the dissociation of the acid dissociable group. Thus, in a case where the acid dissociable group is dissociated by the action of an acid, a polar group exhibiting a higher polarity than that of the acid dissociable group is generated, thereby increasing the polarity. As a result, the polarity of the entire component (A1) is increased. By the increase in the polarity, relatively, the solubility in a developing solution changes, and the solubility in an alkali developing solution is increased, whereas the solubility in an organic developing solution is relatively decreased.

Examples of the acid dissociable group are the same as those which have been proposed as acid dissociable groups for the base resin for a chemically amplified resist composition.

Specific examples of acid dissociable groups of the base resin for a conventional chemically amplified resist composition include an "acetal-type acid dissociable group", a "tertiary alkyl ester-type acid dissociable group", and a "tertiary alkyloxycarbonyl acid dissociable group" described below.

Acetal-Type Acid Dissociable Group:

Examples of the acid dissociable group for protecting a carboxy group or a hydroxyl group as a polar group include the acid dissociable group represented by Formula (a1-r-1) shown below (hereinafter, also referred to as an "acetal-type acid dissociable group").

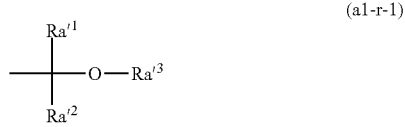

[In the formula, $Ra'^1$ and $Ra'^2$ represent a hydrogen atom or an alkyl group, $Ra'^3$ represents a hydrocarbon group, and $Ra'^3$ may be bonded to $Ra'^1$ or $Ra'^2$.]

In Formula (a1-r-1), it is preferable that at least one of $Ra'^1$ and $Ra'^2$ represents a hydrogen atom and more preferable that both of $Ra'^1$ and $Ra'^2$ represent a hydrogen atom.

In a case where $Ra'^1$ or $Ra'^2$ represents an alkyl group, examples of the alkyl group include the same alkyl groups exemplified as the substituent which may be bonded to the carbon atom at the α-position in the description on α-substituted acrylic acid ester. Among these, an alkyl group having 1 to 5 carbon atoms is preferable. Specific examples thereof include linear or branched alkyl groups. Specific examples of the alkyl group include a methyl group, an ethyl group, a propyl group, an isopropyl group, an n-butyl group, an isobutyl group, a tert-butyl group, a pentyl group, an isopentyl group, and a neopentyl group. Among these, a methyl group or an ethyl group is preferable, and a methyl group is particularly preferable.

In Formula (a1-r-1), examples of the hydrocarbon group as $Ra'^3$ include a linear or branched alkyl group and a cyclic hydrocarbon group.

The linear alkyl group has preferably 1 to 5 carbon atoms, more preferably 1 to 4 carbon atoms, and still more preferably 1 or 2 carbon atoms. Specific examples thereof include a methyl group, an ethyl group, an n-propyl group, an n-butyl group, and an n-pentyl group. Among these, a methyl group, an ethyl group, or an n-butyl group is preferable, and a methyl group or an ethyl group is more preferable.

The branched alkyl group has preferably 3 to 10 carbon atoms and more preferably 3 to 5 carbon atoms. Specific examples thereof include an isopropyl group, an isobutyl group, a tert-butyl group, an isopentyl group, a neopentyl group a 1,1-diethylpropyl group, and a 2,2-dimethylbutyl group. Among these, an isopropyl group is preferable.

In a case where $Ra'^3$ represents a cyclic hydrocarbon group, the cyclic hydrocarbon group may be an aliphatic hydrocarbon group or an aromatic hydrocarbon group, and may be a polycyclic group or a monocyclic group.

As the aliphatic hydrocarbon group which is a monocyclic group, a group in which one hydrogen atom has been removed from a monocycloalkane is preferable. The monocycloalkane has preferably 3 to 6 carbon atoms, and specific examples thereof include cyclopentane and cyclohexane.

As the aliphatic hydrocarbon group which is a polycyclic group, a group in which one hydrogen atom has been removed from a polycycloalkane is preferable. As the polycycloalkane, a group having 7 to 12 carbon atoms is preferable, and specific examples of the polycycloalkane include adamantane, norbornane, isobornane, tricyclodecane, and tetracyclododecane.

In a case where the cyclic hydrocarbon group as $Ra'^3$ becomes an aromatic hydrocarbon group, the aromatic hydrocarbon group is a hydrocarbon group having at least one aromatic ring.

The aromatic ring is not particularly limited as long as it is a cyclic conjugated system having (4n+2) π electrons, and may be monocyclic or polycyclic. The aromatic ring has preferably 5 to 30 carbon atoms, more preferably 5 to 20 carbon atoms, still more preferably 6 to 15 carbon atoms, and most preferably 6 to 12 carbon atoms.

Specific examples of the aromatic ring include aromatic hydrocarbon rings such as benzene, naphthalene, anthracene, and phenanthrene; and aromatic hetero rings in which some carbon atoms constituting the above-described aromatic hydrocarbon rings have been substituted with hetero atoms. Examples of the hetero atom in the aromatic hetero rings include an oxygen atom, a sulfur atom, and a nitrogen atom. Specific examples of the aromatic hetero ring include a pyridine ring and a thiophene ring.

Specific examples of the aromatic hydrocarbon group as $Ra'^3$ include a group in which one hydrogen atom has been removed from the above-described aromatic hydrocarbon ring or aromatic hetero ring (an aryl group or a heteroaryl group); a group in which one hydrogen atom has been removed from an aromatic compound having two or more aromatic rings (biphenyl, fluorene or the like); and a group in which one hydrogen atom of the above-described aromatic hydrocarbon ring or aromatic hetero ring has been substituted with an alkylene group (an arylalkyl group such as a benzyl group, a phenethyl group, a 1-naphthylmethyl group, a 2-naphthylmethyl group, a 1-naphthylethyl group, or a 2-naphthylethyl group). The number of carbon atoms in the alkylene group bonded to the aromatic hydrocarbon ring or aromatic hetero ring is preferably in a range of 1 to 4, more preferably 1 or 2, and particularly preferably 1.

The cyclic hydrocarbon group as $Ra'^3$ may include a substituent. Examples of the substituent include —$R^{P1}$, —$R^{P2}$—O—$R^{P1}$, —$R^{P2}$—CO—$R^{P1}$, —$R^{P2}$—CO—O$R^{P1}$, —$R^{P2}$—O—CO—$R^{P1}$, —$R^{P2}$—OH, —$R^{P2}$—CN, and —$R^{P2}$—COOH (hereinafter, these substituents will also be collectively referred to as "$Ra^{05}$").

Here, $R^{P1}$ represents a chain-like monovalent saturated hydrocarbon group having 1 to 10 carbon atoms, a monovalent aliphatic cyclic saturated hydrocarbon group having 3 to 20 carbon atoms, or a monovalent aromatic hydrocarbon group having 6 to 30 carbon atoms. Further, $R^{P2}$ represents a single bond, a chain-like divalent saturated hydrocarbon group having 1 to 10 carbon atoms, a divalent aliphatic cyclic saturated hydrocarbon group having 3 to 20 carbon atoms, or a divalent aromatic hydrocarbon group having 6 to 30 carbon atoms.

Some or all hydrogen atoms in the chain-like saturated hydrocarbon group, the aliphatic cyclic saturated hydrocarbon group, and the aromatic hydrocarbon group as $R^{P1}$ and $R^{P2}$ may be substituted with fluorine atoms. The aliphatic cyclic hydrocarbon group may have one or more of one kind of substituents or one or more of each of plural kinds of the substituents.

Examples of the chain-like monovalent saturated hydrocarbon group having 1 to 10 carbon atoms include a methyl group, an ethyl group, a propyl group, a butyl group, a pentyl group, a hexyl group, a heptyl group, an octyl group, and a decyl group.

Examples of the monovalent aliphatic cyclic saturated hydrocarbon group having 3 to 20 carbon atoms include a monocyclic aliphatic saturated hydrocarbon group such as a cyclopropyl group, a cyclobutyl group, a cyclopentyl group, a cyclohexyl group, a cycloheptyl group, a cyclooctyl group, a cyclodecyl group, or a cyclododecyl group; and a polycyclic aliphatic saturated hydrocarbon group such as a bicycle[2.2.2]octanyl group, a tricycle[5.2.1.0²,⁶]decanyl group, a tricycle[3.3.1.1³,⁷]decanyl group, a tetracyclo[6.2.1.1³,⁶.0²,⁷]dodecanyl group, or an adamantyl group.

Examples of the monovalent aromatic hydrocarbon group having 6 to 30 carbon atoms include a group formed by removing one hydrogen atom from an aromatic hydrocarbon ring, such as benzene, biphenyl, fluorene, naphthalene, anthracene, or phenanthrene.

In a case where $Ra'^3$ is bonded to $Ra'^1$ or $Ra'^2$ to form a ring, the cyclic group is preferably a 4- to 7-membered ring, and more preferably a 4- to 6-membered ring. Specific examples of the cyclic group include a tetrahydropyranyl group and a tetrahydrofuranyl group.

Tertiary Alkyl Ester-Type Acid Dissociable Group:

Examples of the acid dissociable group for protecting the carboxy group as a polar group include the acid dissociable group represented by Formula (a1-r-2) shown below.

Among the acid dissociable groups represented by Formula (a1-r-2), for convenience, a group which is constituted of alkyl groups is referred to as "tertiary ester-type acid dissociable group".

(a1-r-2)

[In the formula, $Ra'^4$ to $Ra'^6$ each independently represent a hydrocarbon group, provided that $Ra'^5$ and $Ra'^6$ may be bonded to each other to form a ring.]

Examples of the hydrocarbon group as $Ra'^4$ include a linear or branched alkyl group, a chain-like or cyclic alkenyl group, and a cyclic hydrocarbon group.

Examples of the linear or branched alkyl group and the cyclic hydrocarbon group (an aliphatic hydrocarbon group which is a monocyclic group, an aliphatic hydrocarbon group which is a polycyclic group, or an aromatic hydrocarbon group) as $Ra'^4$ are the same as those exemplified above as $Ra'^3$.

As the chain-like or cyclic alkenyl group as $Ra'^4$, an alkenyl group having 2 to 10 carbon atoms is preferable.

Examples of the hydrocarbon group as $Ra'^5$ or $Ra'^6$ are the same as those exemplified above as $Ra'^3$.

In a case where $Ra'^5$ and $Ra'^6$ are bonded to form a ring, suitable examples thereof include a group represented by Formula (a1-r2-1), a group represented by Formula (a1-r2-2), and a group represented by Formula (a1-r2-3).

Meanwhile, $Ra'^4$ to $Ra'^6$ are not bonded to one another and represent an independent hydrocarbon group, suitable examples thereof include a group represented by Formula (a1-r2-4).

(a1-r2-1)

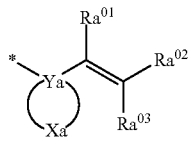

(a1-r2-2)

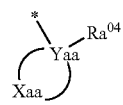

(a1-r2-3)

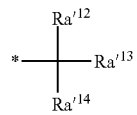

(a1-r2-4)

[In Formula (a1-r2-1), $Ra'^{10}$ represents an alkyl group having 1 to 10 carbon atoms or a group represented by Formula (a1-r2-0). $Ra'^{11}$ represents a group that forms an aliphatic cyclic group together with the carbon atom to which $Ra'^{10}$ is bonded. In Formula (a1-r2-2), Ya represents a carbon atom. Xa represents a group that forms a cyclic hydrocarbon group together with Ya. Some or all hydrogen atoms in this cyclic hydrocarbon group may be substituted. $Ra^{01}$ to $Ra^{03}$ each independently represent a hydrogen atom, a chain-like monovalent saturated hydrocarbon group having 1 to 10 carbon atoms, or a monovalent aliphatic cyclic saturated hydrocarbon group having 3 to 20 carbon atoms. Some or all hydrogen atoms in this cyclic saturated hydrocarbon group and the aliphatic cyclic saturated hydrocarbon group may be substituted. Two or more of $Ra^{01}$ to $Ra^{03}$ may be bonded to one another to form a cyclic structure. In Formula (a1-r2-3), Yaa represents a carbon atom. Xaa represents a group that forms an aliphatic cyclic group together with Yaa. Re represents an aromatic hydrocarbon group which may have a substituent. In Formula (a1-r2-4), $Ra'^{12}$ and $Ra'^{13}$ each independently represent a monovalent saturated hydrocarbon having 1 to 10 carbon atoms or a hydrogen atom. Some or all hydrogen atoms in this cyclic saturated hydrocarbon group may be substituted. $Ra'^{14}$ represents a hydrocarbon group which may have a substituent. The symbol "*" represents a bonding site (the same applies hereinafter).]

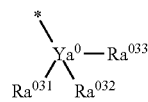

(a1-r2-r1)

[In the formula, $Ya^0$ represents a quaternary carbon atom. $Ra^{031}$, $Ra^{032}$, and $Ra^{033}$ each independently represent a hydrocarbon group which may have a substituent. Here, one or more of $Ra^{031}$, $Ra^{032}$, and $Ra^{033}$ represent a hydrocarbon group containing at least one polar group.]

In Formula (a1-r2-1), as the alkyl group having 1 to 10 carbon atoms as $Ra'^{10}$, the groups exemplified as the linear or branched alkyl group as $Ra'^3$ in Formula (a1-r-1) are preferable. It is preferable that $Ra'^{10}$ represents an alkyl group having 1 to 5 carbon atoms.

In Formula (a1-r2-0), Ya0 represents a quaternary carbon atom. That is, the number of adjacent carbon atoms bonded to $Ya^0$ (carbon atom) is 4.

In Formula (a1-r2-r1), $Ra^{031}$, $Ra^{032}$, and $Ra^{033}$ each independently represent a hydrocarbon group which may have a substituent. The hydrocarbons as $Ra^{031}$, $Ra^{032}$, and $Ra^{033}$ may each independently be a linear or branched alkyl group, a chain-like or cyclic alkenyl group, and a cyclic hydrocarbon group.

The number of carbon atoms in the linear alkyl group as $Ra^{031}$, $Ra^{032}$, and $Ra^{033}$ is preferably in a range of 1 to 5, more preferably in a range of 1 to 4, and still more preferably 1 or 2. Specific examples thereof include a methyl group, an ethyl group, an n-propyl group, an n-butyl group, and an n-pentyl group. Among these, a methyl group, an ethyl group, or an n-butyl group is preferable, and a methyl group or an ethyl group is more preferable.

The number of carbon atoms in the branched alkyl group as $Ra^{031}$, $Ra^{032}$, and $Ra^{033}$ is preferably in a range of 3 to 10 and more preferably in a range of 3 to 5. Specific examples thereof include an isopropyl group, an isobutyl group, a tert-butyl group, an isopentyl group, a neopentyl group a 1,1-diethylpropyl group, and a 2,2-dimethylbutyl group. Among these, an isopropyl group is preferable.

The number of chain-like or cyclic alkenyl group as $Ra^{031}$, $Ra^{032}$, and $Ra^{033}$ is preferably in a range of 2 to 10.

The cyclic hydrocarbon group as $Ra^{031}$, $Ra^{032}$, and $Ra^{033}$ may be an aliphatic hydrocarbon group or an aromatic hydrocarbon group and may be a polycyclic group or a monocyclic group.

As the aliphatic hydrocarbon group which is a monocyclic group, a group in which one hydrogen atom has been removed from a monocycloalkane is preferable. The monocycloalkane has preferably 3 to 6 carbon atoms, and specific examples thereof include cyclopentane and cyclohexane.

As the aliphatic hydrocarbon group which is a polycyclic group, a group in which one hydrogen atom has been removed from a polycycloalkane is preferable. As the polycycloalkane, a group having 7 to 12 carbon atoms is preferable, and specific examples of the polycycloalkane include adamantane, norbornane, isobornane, tricyclodecane, and tetracyclododecane.

The aromatic hydrocarbon group as $Ra^{031}$, $Ra^{032}$, and $Ra^{033}$ is a hydrocarbon group having at least one aromatic ring. The aromatic ring is not particularly limited as long as it is a cyclic conjugated system having (4n+2) π electrons, and may be monocyclic or polycyclic. The aromatic ring has preferably 5 to 30 carbon atoms, more preferably 5 to 20 carbon atoms, still more preferably 6 to 15 carbon atoms, and particularly preferably 6 to 12 carbon atoms. Specific examples of the aromatic ring include aromatic hydrocarbon rings such as benzene, naphthalene, anthracene, and phenanthrene; and aromatic hetero rings in which some carbon atoms constituting the above-described aromatic hydrocarbon rings have been substituted with hetero atoms. Examples of the hetero atom in the aromatic hetero rings include an oxygen atom, a sulfur atom, and a nitrogen atom. Specific examples of the aromatic hetero ring include a pyridine ring and a thiophene ring. Specific examples of the aromatic hydrocarbon group include a group in which one hydrogen atom has been removed from the above-described aromatic hydrocarbon ring or aromatic hetero ring (an aryl group or a heteroaryl group); a group in which one hydrogen atom has been removed from an aromatic compound having two or more aromatic rings (such as biphenyl or fluorene); and a group in which one hydrogen atom of the above-described aromatic hydrocarbon ring or aromatic hetero ring has been substituted with an alkylene group (for example, an arylalkyl group such as a benzyl group, a phenethyl group, a 1-naphthylmethyl group, a 2-naphthylmethyl group, a 1-naphthylethyl group, or a 2-naphthylethyl group). The number of carbon atoms in the alkylene group bonded to the aromatic hydrocarbon ring or aromatic hetero ring is preferably in a range of 1 to 4, more preferably 1 or 2, and particularly preferably 1.

In a case where the hydrocarbon group represented by $Ra^{031}$, $Ra^{032}$, and $Ra^{033}$ is substituted, examples of the substituent include a hydroxy group, a carboxy group, a halogen atom (such as a fluorine atom, a chlorine atom, or a bromine atom), an alkoxy group (such as a methoxy group, an ethoxy group, a propoxy group, or a butoxy group), and an alkyloxycarbonyl group.

Among the examples, as the hydrocarbon group which may have a substituent as $Ra^{031}$, $Ra^{032}$, and $Ra^{033}$, a linear or branched alkyl group which may have a substituent is preferable, and a linear alkyl group is more preferable.

Here, one or more of $Ra^{031}$, $Ra^{032}$, and $Ra^{033}$ represent a hydrocarbon group containing at least a polar group.

The "hydrocarbon group containing a polar group" includes both of a group in which a methylene group ($—CH_2—$) constituting a hydrocarbon group is substituted with a polar group or a group in which at least one hydrogen atom constituting a hydrocarbon group is substituted with a polar group.

As such a "hydrocarbon group containing a polar group", a functional group represented by Formula (a1-p1) is preferable.

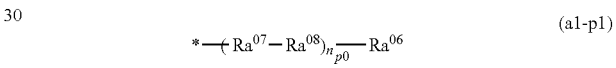

(a1-p1)

[In the formula, $Ra^{07}$ represents a divalent hydrocarbon group having 2 to 12 carbon atoms. $Ra^{08}$ represents a divalent linking group having a hetero atom. $Ra^{06}$ represents a monovalent hydrocarbon group having 1 to 12 carbon atoms. $Ra^{06}$ represents an integer of 1 to 6.]

In Formula (a1-p1), $Ra^{07}$ represents a divalent hydrocarbon group having 2 to 12 carbon atoms.

The number of carbon atoms of $Ra^{07}$ is in a range of 2 to 12, preferably in a range of 2 to 8, more preferably in a range of 2 to 6, still more preferably in a range of 2 to 4, and particularly preferably 2. As the hydrocarbon group represented by $Ra^{07}$, a chain-like or cyclic aliphatic hydrocarbon group is preferable, and a chain-like hydrocarbon group is more preferable.

Examples of $Ra^{07}$ include a linear alkanediyl group such as an ethylene group, a propane-1,3-diyl group, a butane-1,4-diyl group, a pentane-1,5-diyl group, a hexane-1,6-diyl group, a heptane-1,7-diyl group, an octane-1,8-diyl group, a nonane-1,9-diyl group, a decane-1,10-diyl group, an undecane-1,11-diyl group, or a dodecane-1,12-diyl group; a branched alkanediyl group such as a propane-1,2-diyl group, a 1-methylbutane-1,3-diyl group, a 2-methylpropane-1,3-diyl group, a pentane-1,4-diyl group, or a 2-methylbutane-1,4-diyl group; a cycloalkanediyl group such as a cyclobutane-1,3-diyl group, a cyclopentane-1,3-diyl group, a cyclohexane-1,4-diyl group, or a cyclooctane-1,5-diyl group; and a polycyclic divalent alicyclic hydrocarbon group such as a norbornane-1,4-diyl group, a norbornane-2,5-diyl group, an adamantane-1,5-diyl group, or an adamantane-2,6-diyl group.

Among these, an alkanediyl group is preferable, and a linear alkanediyl group is more preferable.

In Formula (a1-p1), $Ra^{08}$ represents a divalent linking group having a hetero atom.

Examples of Ra08 include —O—, —C(=O)—O—, —C(=O)—, —O—C(=O)—O—, —C(=O)—NH—, —NH—, —NH—C(=NH)— (H may be substituted with a substituent such as an alkyl group or an acyl group), —S—, —S(=O)$_2$—, and —S(=O)$_2$—O—.

Among these, from the viewpoint of the solubility in a developing solution, —O—, —C(=O)—O—, —C(=O)—, or —O—C(=O)—O— is preferable, and —O— or —C(=O)— is particularly preferable.

In Formula (a1-p1), Ra$^{06}$ represents a monovalent hydrocarbon group having 1 to 12 carbon atoms.

The number of carbon atoms of Ra$^{06}$ is in a range of 1 to 12. From the viewpoint of the solubility in a developing solution, the number of carbon atoms thereof is preferably in a range of 1 to 8, more preferably in a range of 1 to 5, still more preferably in a range of 1 to 3, particularly preferably 1 or 2, and most preferably 1.

Examples of the hydrocarbon group as Ra$^{06}$ include a chain-like hydrocarbon group, a cyclic hydrocarbon group, and a hydrocarbon group obtained by combining a chain-like hydrocarbon group and a cyclic hydrocarbon group.

Examples of the chain-like hydrocarbon group include a methyl group, an ethyl group, an n-propyl group, an isopropyl group, an n-butyl group, a sec-butyl group, a tert-butyl group, an n-pentyl group, an n-hexyl group, an n-heptyl group, a 2-ethylhexyl group, an n-octyl group, an n-nonyl group, an n-decyl group, an n-undecyl group, and an n-dodecyl group.

The cyclic hydrocarbon group may be an alicyclic hydrocarbon group or an aromatic hydrocarbon group.

The alicyclic hydrocarbon group may be monocyclic or polycyclic, and examples of the monocyclic alicyclic hydrocarbon group include a cycloalkyl group such as a cyclopropyl group, a cyclobutyl group, a cyclopentyl group, a cyclohexyl group, a methylcyclohexyl group, a dimethylcyclohexyl group, a cycloheptyl group, a cyclooctyl group, a cycloheptyl group, or a cyclodecyl group. Examples of the polycyclic alicyclic hydrocarbon group include a decahydronaphthyl group, an adamantyl group, a 2-alkyladamantane-2-yl group, a 1-(adamantane-1-yl)alkane-1-yl group, a norbornyl group, a methylnorbonyl group, and an isobornyl group.

Examples of the aromatic hydrocarbon group include a phenyl group, a naphthyl group, an anthryl group, a p-methylphenyl group, a p-tert-butylphenyl group, a p-adamantylphenyl group, a tolyl group, a xylyl group, a cumenyl group, a mesityl group, a biphenyl group, a phenanthryl group, a 2,6-diethylphenyl group, and a 2-methyl-6-ethylphenyl group.

From the viewpoint of the solubility in a developing solution, Ra$^{06}$ represents preferably a chain-like hydrocarbon group, more preferably an alkyl group, and still more preferably a linear alkyl group.

In Formula (a1-p1), n$_{p0}$ represents an integer of 1 to 6, preferably an integer of 1 to 3, more preferably 1 or 2, and still more preferably 1.

Hereinafter, specific examples of the hydrocarbon group containing at least a polar group will be described.

In the formula shown below, the symbol "*" represents a bonding site to be bonded to a quaternary carbon atom (Ya$^0$).

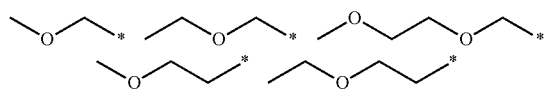

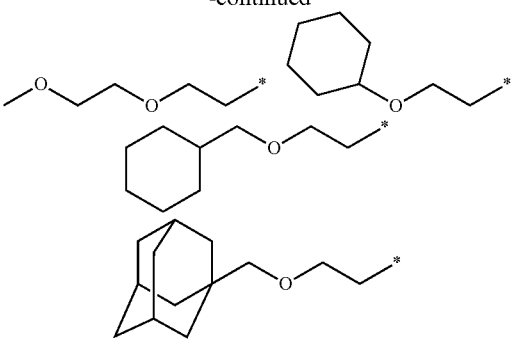

In Formula (a1-r2-r1), among Ra$^{031}$, Ra$^{032}$, and Ra$^{033}$, the number of hydrocarbon groups containing at least a polar group is 1 or more and may be appropriately determined in consideration of the solubility in a developing solution during formation of a resist pattern. For example, the number of hydrocarbon groups among Ra$^{031}$, Ra$^{032}$, and Ra$^{033}$ is preferably 1 or 2 and particularly preferably 1.

The hydrocarbon group containing at least a polar group may have a substituent other than the polar group.

Examples of the substituent include a halogen atom (such as a fluorine atom, a chlorine atom, or a bromine atom) and a halogenated alkyl group having 1 to 5 carbon atoms.

In Formula (a1-r2-1), preferred examples of Ra$^{t11}$ (an aliphatic cyclic group that is formed together with a carbon atom to which Ra$^{t10}$ is bonded) include the groups exemplified as the aliphatic hydrocarbon group which is a monocyclic group or a polycyclic group as Ra$^{t3}$ in Formula (a1-r-1).

In Formula (a1-r2-2), as the cyclic hydrocarbon group that is formed by Xa together with Ya, a group formed by further removing one or more hydrogen atoms from the cyclic monovalent hydrocarbon group (such as a monocyclic aliphatic hydrocarbon group, a polycyclic aliphatic hydrocarbon group, or an aromatic hydrocarbon group) as Ra$^{t3}$ in Formula (a1-r-1) is exemplified.

The cyclic hydrocarbon group that is formed by Xa together with Ya may have a substituent. Examples of the substituent are the same as those exemplified as the substituents which may be included in the cyclic hydrocarbon group as Ra$^{t3}$.

In Formula (a1-r2-2), examples of the cyclic monovalent hydrocarbon group having 1 to 10 carbon atoms as Ra$^{01}$ to Ra$^{03}$ include a methyl group, an ethyl group, a propyl group, a butyl group, a pentyl group, a hexyl group, a heptyl group, an octyl group, and a decyl group.

Examples of the monovalent aliphatic cyclic saturated hydrocarbon group having 3 to 20 carbon atoms as Ra$^{01}$ to Ra$^{03}$ include a monocyclic aliphatic saturated hydrocarbon group such as a cyclopropyl group, a cyclobutyl group, a cyclopentyl group, a cyclohexyl group, a cycloheptyl group, a cyclooctyl group, a cyclodecyl group, or a cyclododecyl group; and a polycyclic aliphatic saturated hydrocarbon group such as a bicycle[2.2.2]octanyl group, a tricycle[5.2.1.02,6]decanyl group, a tricycle[3.3.1.13,7]decanyl group, a tetracyclo[6.2.1.13,6.02,7]dodecanyl group, or an adamantyl group.

From the viewpoint of easily synthesizing a monomer compound from which the constitutional unit (a1) is derived, it is preferable that Ra$^{01}$ to Ra$^{03}$ represents a hydrogen atom or a chain-like monovalent saturated hydrocarbon group having 1 to 10 carbon atoms. Among these, a hydrogen atom, a methyl group, or an ethyl group is more preferable, and a hydrogen atom is particularly preferable.

Examples of the substituent included in the chain-like saturated hydrocarbon group or the aliphatic cyclic saturated hydrocarbon group represented by $Ra^{o1}$ to $Ra^{o3}$ are the same as those exemplified as $Ra^{o5}$.

Examples of the group having a carbon-carbon double bond generated by two or more of $Ra^{o1}$ to $Ra^{o3}$ being bonded to one another to form a cyclic structure include a cyclopentenyl group, a cyclohexenyl group, a methylcyclopentenyl group, a methylcyclohexenyl group, a cyclopentylidenethenyl group, and a cyclohexylidenethenyl group. Among these, from the viewpoint of easily synthesizing a monomer compound from which the constitutional unit (a1) is derived, a cyclopentenyl group, a cyclohexenyl group, or a cyclopentylidenethenyl group is preferable.

In Formula (a1-r2-3), as the aliphatic cyclic group that is formed by Xaa together with Yaa, a group exemplified as the aliphatic hydrocarbon group which is a monocyclic group or a polycyclic group as $Ra^{'3}$ in Formula (a1-r-1) is preferable.

In Formula (a1-r2-3), examples of the aromatic hydrocarbon group as $Ra^{o4}$ include a group formed by removing one or more hydrogen atoms from an aromatic hydrocarbon ring having 5 to 30 carbon atoms. Among the examples, $Ra^{o4}$ represents preferably a group formed by removing one or more hydrogen atoms from an aromatic hydrocarbon ring having 6 to 15 carbon atoms, more preferably a group formed by removing one or more hydrogen atoms from benzene, naphthalene, anthracene, or phenanthrene, still more preferably a group formed by removing one or more hydrogen atoms from benzene, naphthalene, or anthracene, particularly preferably a group formed by removing one or more hydrogen atoms from benzene or naphthalene, and most preferably a group formed by removing one or more hydrogen atoms from benzene.

Examples of the substituent which may be included in Ra04 in Formula (a1-r2-3) include a methyl group, an ethyl group, a propyl group, a hydroxyl group, a carboxyl group, a halogen atom (such as a fluorine atom, a chlorine atom, or a bromine atom), an alkoxy group (such as a methoxy group, an ethoxy group, a propoxy group, or a butoxy group), and an alkyloxycarbonyl group.

In Formula (a1-r2-4), $Ra^{'12}$ and $Ra^{'13}$ each independently represent a chain-like monovalent saturated hydrocarbon group having 1 to 10 carbon atoms or a hydrogen atom. Examples of the chain-like monovalent saturated hydrocarbon group having 1 to 10 carbon atoms as $Ra^{'12}$ and $Ra^{'13}$ are the same as those exemplified as the chain-like monovalent saturated hydrocarbon group having 1 to 10 carbon atoms as Re to Re. Some or all hydrogen atoms in the chain-like saturated hydrocarbon group may be substituted.

$Ra^{'12}$ and $Ra^{'13}$ represent preferably a hydrogen atom or an alkyl group having 1 to 5 carbon atoms, more preferably an alkyl group having 1 to 5 carbon atoms, still more preferably a methyl group or an ethyl group, and particularly preferably a methyl group.

In a case where the chain-like saturated hydrocarbon group represented by $Ra^{'12}$ and $Ra^{'13}$ is substituted, examples of the substituent are the same as those exemplified as $Ra^{o5}$.

In Formula (a1-r2-4), $Ra^{'14}$ represents a hydrocarbon group which may have a substituent. Examples of the hydrocarbon group as $Ra^{'14}$ include a linear or branched alkyl group and a cyclic hydrocarbon group.

The linear alkyl group as $Ra^{'14}$ has preferably 1 to 5 carbon atoms, more preferably 1 to 4 carbon atoms, and still more preferably 1 or 2 carbon atoms. Specific examples thereof include a methyl group, an ethyl group, an n-propyl group, an n-butyl group, and an n-pentyl group. Among these, a methyl group, an ethyl group, or an n-butyl group is preferable, and a methyl group or an ethyl group is more preferable.

The branched alkyl group as $Ra^{'14}$ has preferably 3 to 10 carbon atoms and more preferably 3 to 5 carbon atoms. Specific examples thereof include an isopropyl group, an isobutyl group, a tert-butyl group, an isopentyl group, a neopentyl group a 1,1-diethylpropyl group, and a 2,2-dimethylbutyl group. Among these, an isopropyl group is preferable.

In a case where $Ra^{'14}$ represents a cyclic hydrocarbon group, the hydrocarbon group may be an aliphatic hydrocarbon group or an aromatic hydrocarbon group, and may be a polycyclic group or a monocyclic group. As the aliphatic hydrocarbon group which is a monocyclic group, a group in which one hydrogen atom has been removed from a monocycloalkane is preferable. The monocycloalkane has preferably 3 to 6 carbon atoms, and specific examples thereof include cyclopentane and cyclohexane. As the aliphatic hydrocarbon group which is a polycyclic group, a group in which one hydrogen atom has been removed from a polycycloalkane is preferable. As the polycycloalkane, a group having 7 to 12 carbon atoms is preferable, and specific examples of the polycycloalkane include adamantane, norbornane, isobornane, tricyclodecane, and tetracyclododecane.

Examples of the aromatic hydrocarbon group as Ra'14 are the same as those exemplified as the aromatic hydrocarbon group as $Ra^{o4}$. Among these, $Ra^{'14}$ represents preferably a group formed by removing one or more hydrogen atoms from an aromatic hydrocarbon ring having 6 to 15 carbon atoms, more preferably a group formed by removing one or more hydrogen atoms from benzene, naphthalene, anthracene, or phenanthrene, still more preferably a group formed by removing one or more hydrogen atoms from benzene, naphthalene, or anthracene, particularly preferably a group formed by removing one or more hydrogen atoms from naphthalene or anthracene, and most preferably a group formed by removing one or more hydrogen atoms from naphthalene. Examples of the substituent which may be included in $Ra^{'14}$ are the same as those exemplified as the substituent which may be included in $Ra^{o4}$.

In a case where $Ra^{'14}$ in Formula (a1-r2-4) represents a naphthyl group, the position bonded to the tertiary carbon atom in Formula (a1-r2-4) may be the 1-position or the 2-position of the naphthyl group.

In a case where $Ra^{'14}$ in Formula (a1-r2-4) represents an anthryl group, the position bonded to the tertiary carbon atom in Formula (a1-r2-4) may be the 1-position, the 2-position, or the 9-position of the anthryl group.

Specific examples of the group represented by Formula (a1-r2-1) are shown below.

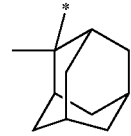

(r-pr-m1)

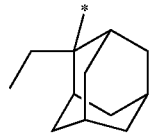

(r-pr-m2)

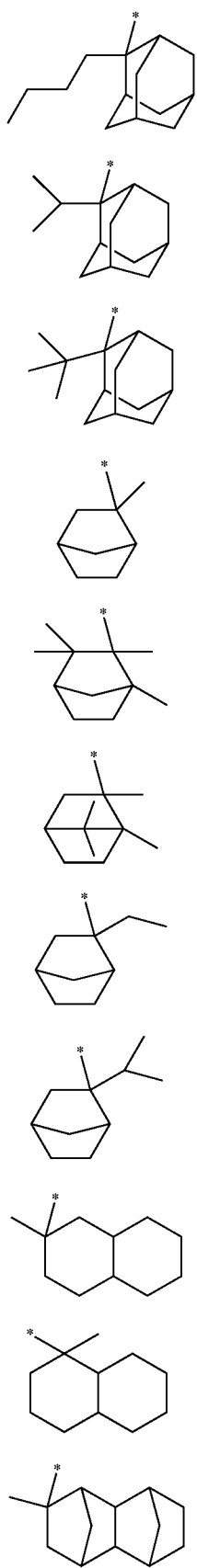
(r-pr-m3)
(r-pr-m4)
(r-pr-m5)
(r-pr-m6)
(r-pr-m7)
(r-pr-m8)
(r-pr-m9)
(r-pr-m10)
(r-pr-m11)
(r-pr-m12)
(r-pr-m13)
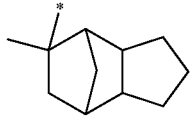
(r-pr-m14)
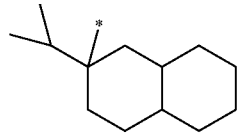
(r-pr-m15)
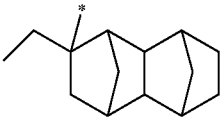
(r-pr-m16)
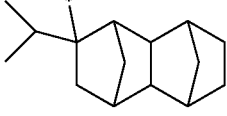
(r-pr-m17)
(r-pr-s1)
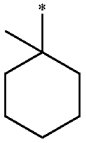
(r-pr-s2)
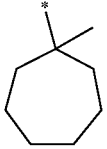
(r-pr-s3)
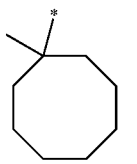
(r-pr-s4)
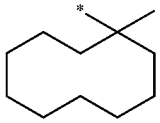
(r-pr-s5)
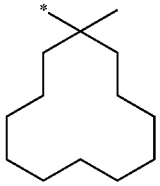
(r-pr-s6)

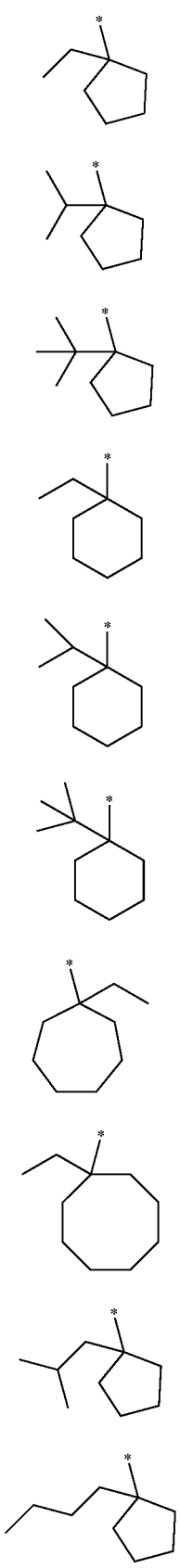
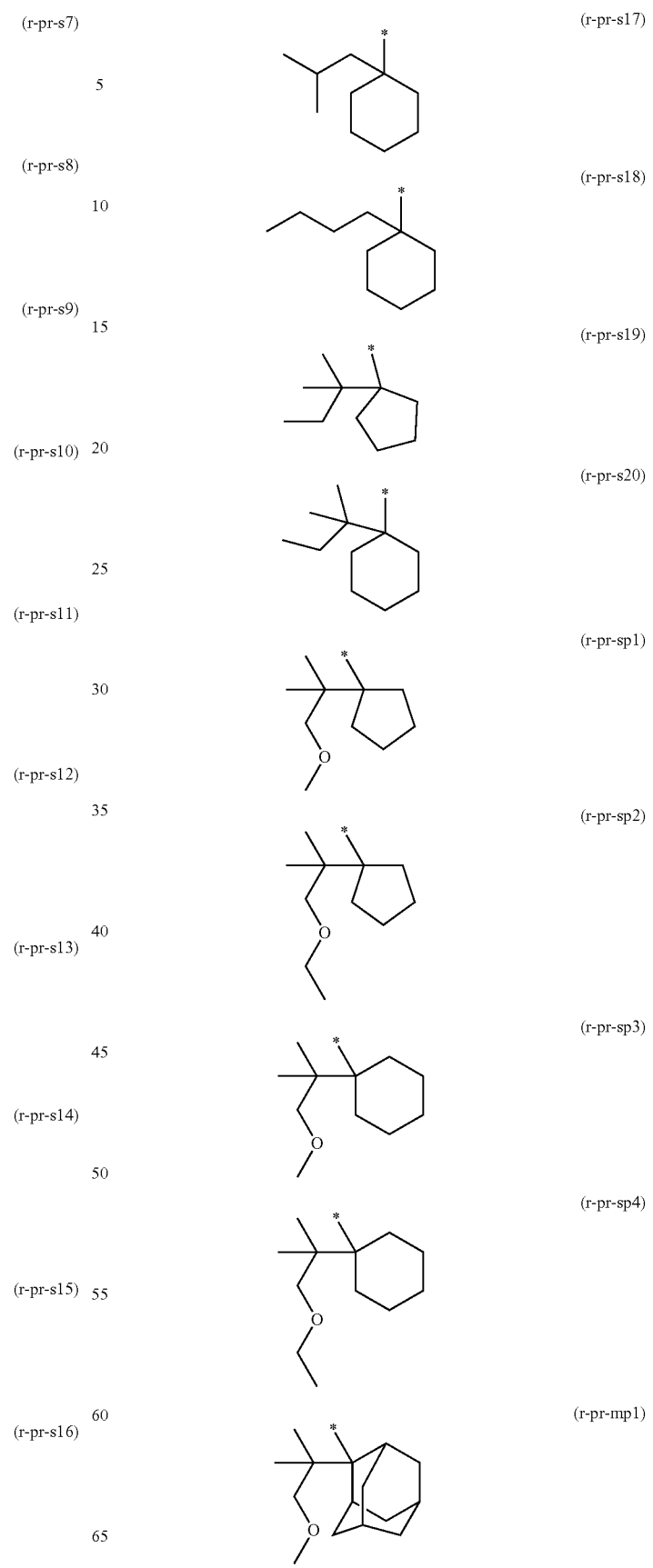

(r-pr-mp2)
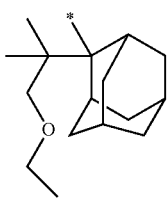
Specific examples of the group represented by Formula (a1-r2-2) are shown below.
(r-pr-sv1)
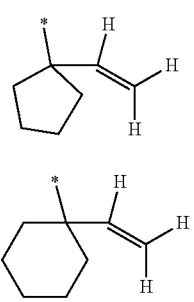
(r-pr-sv2)
(r-pr-sv3)
(r-pr-sv4)
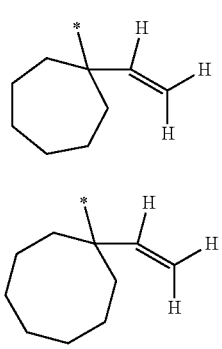
(r-pr-sv5)
(r-pr-sv6)
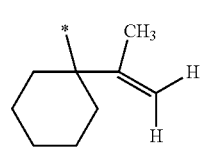
(r-pr-sv7)
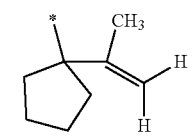
(r-pr-sv8)
(r-pr-sv9)
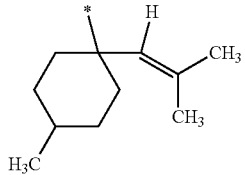
(r-pr-sv10)
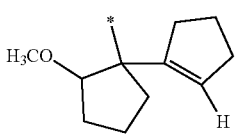
(r-pr-sv11)
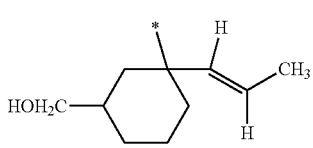
(r-pr-sv12)
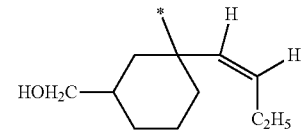
(r-pr-mv1)
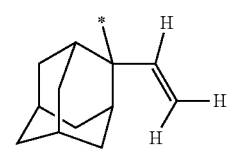
(r-pr-mv2)
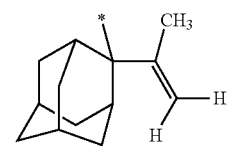
(r-pr-mv3)
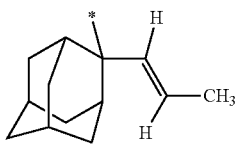
(r-pr-mv4)
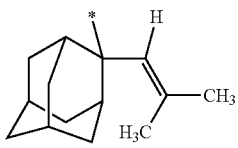
(r-pr-mv5)
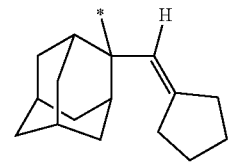
(r-pr-mv6)
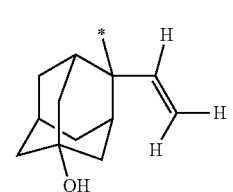

(r-pr-mv7)
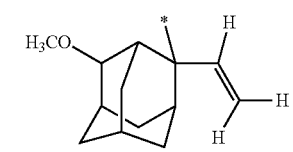
(r-pr-mv8)
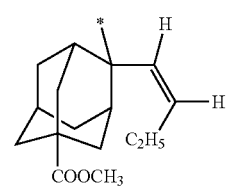
(r-pr-mv9)
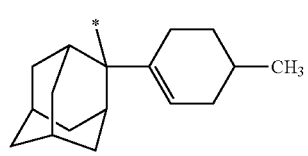
(r-pr-mv10)
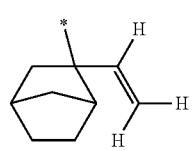
(r-pr-mv11)
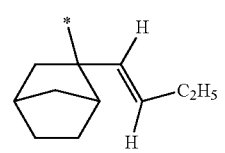
(r-pr-mv12)
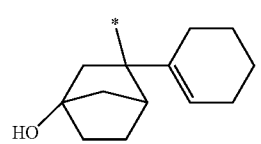
(r-pr-mv13)
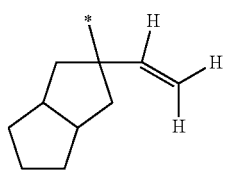
(r-pr-mv14)
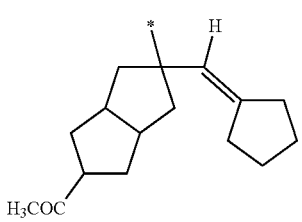
(r-pr-mv15)
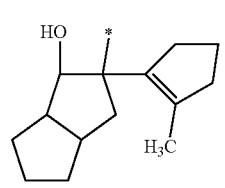
(r-pr-mv16)
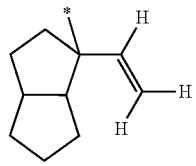
(r-pr-mv17)
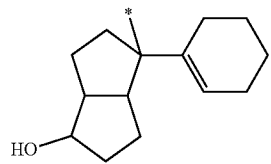
(r-pr-mv18)
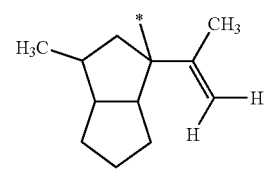
(r-pr-mv19)
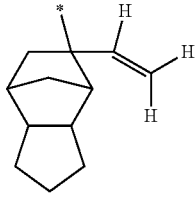
(r-pr-mv20)
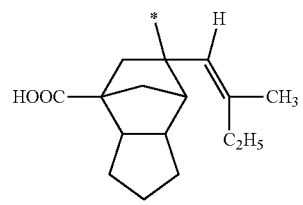
(r-pr-mv21)
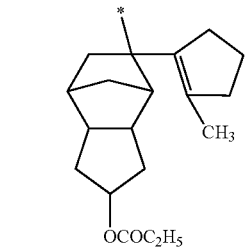
Specific examples of the group represented by Formula (a1-r2-3) are shown below.
(r-pr-sa1)
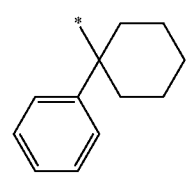

(r-pr-sa2)
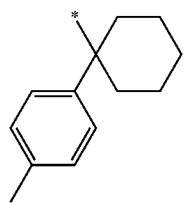
(r-pr-sa3)
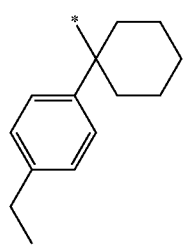
(r-pr-sa4)
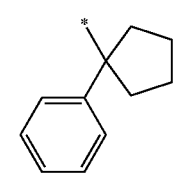
(r-pr-sa5)
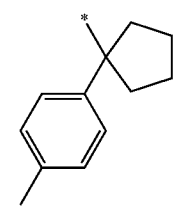
(r-pr-sa6)
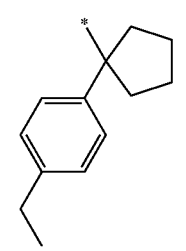
(r-pr-sa7)
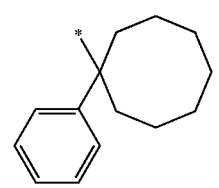
(r-pr-sa8)
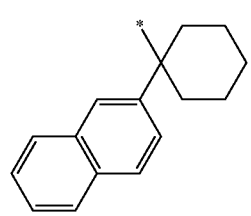
(r-pr-sa9)
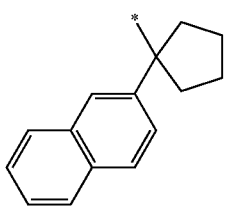
(r-pr-ma1)
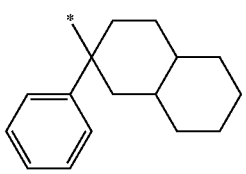
(r-pr-ma2)
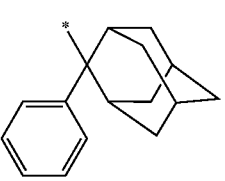
Specific examples of the group represented by Formula (a1-r2-4) are shown below.
(r-pr-cm1)
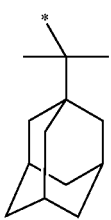
(r-pr-cm2)
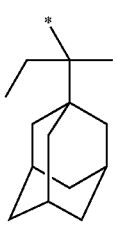
(r-pr-cm3)
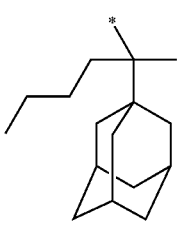
(r-pr-cm4)
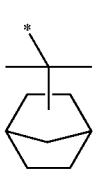

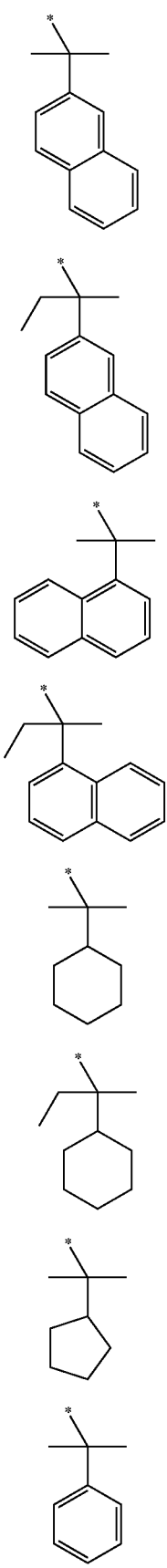
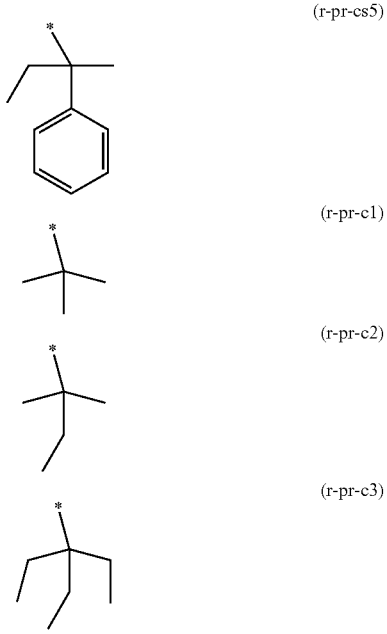

Tertiary Alkyloxycarbonyl Acid Dissociable Group:

Examples of the acid dissociable group for protecting a hydroxyl group as a polar group include an acid dissociable group (hereinafter, for convenience, also referred to as "tertiary alkyloxycarbonyl type acid dissociable group") represented by Formula (a1-r-3) shown below.

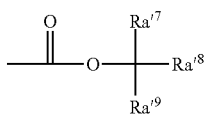

[In the formula, $Ra'^7$ to $Ra'^9$ each independently represent an alkyl group.]

In Formula (a1-r-3), $Ra'^7$ to $Ra'^9$ each independently represent preferably an alkyl group having 1 to 5 carbon atoms and more preferably an alkyl group having 1 to 3 carbon atoms.

Further, the total number of carbon atoms in each alkyl group is preferably in a range of 3 to 7, more preferably in a range of 3 to 5, and most preferably 3 or 4.

Examples of the constitutional unit (a1) include a constitutional unit derived from acrylic acid ester in which the hydrogen atom bonded to the carbon atom at the α-position may be substituted with a substituent; a constitutional unit derived from acrylamide; a constitutional unit in which at least some hydrogen atoms in a hydroxyl group of a constitutional unit derived from hydroxystyrene or a hydroxystyrene derivative are protected by a substituent containing the acid decomposable group; and a constitutional unit in which at least some hydrogen atoms in —C(=O)—OH of a constitutional unit derived from vinylbenzoic acid or a vinylbenzoic acid derivative are protected by a substituent containing the acid decomposable group.

Among the examples, as the constitutional unit (a1), a constitutional unit derived from acrylic acid ester in which the hydrogen atom bonded to the carbon atom at the α-position may be substituted with a substituent is preferable.

Specific preferred examples of such a constitutional unit (a1) include constitutional units represented by Formula (a1-1) or (a1-2) shown below.

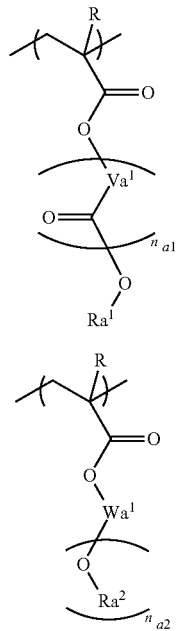

[In the formula, R represents a hydrogen atom, an alkyl group having 1 to 5 carbon atoms, or a halogenated alkyl group having 1 to 5 carbon atoms. $Va^1$ represents a divalent hydrocarbon group which may contain an ether bond. $n_{a1}$ represents an integer of 0 to 2. $Ra^1$ represents an acid dissociable group represented by Formula (a1-r-1) or (a1-r-2). $Wa^1$ represents a (na2+1)-valent hydrocarbon group, $n_{a2}$ represents an integer of 1 to 3, and $Ra^2$ represents an acid dissociable group represented by Formula (a1-r-1) or (a1-r-3)].

In Formula (a1-1), as the alkyl group having 1 to 5 carbon atoms as R, a linear or branched alkyl group having 1 to 5 carbon atoms is preferable, and specific examples thereof include a methyl group, an ethyl group, a propyl group, an isopropyl group, an n-butyl group, an isobutyl group, a tert-butyl group, a pentyl group, an isopentyl group, and a neopentyl group. The halogenated alkyl group having 1 to 5 carbon atoms is a group in which some or all hydrogen atoms of the above-described alkyl group having 1 to 5 carbon atoms have been substituted with halogen atoms. Examples of the halogen atom include a fluorine atom, a chlorine atom, a bromine atom, and an iodine atom, and a fluorine atom is particularly preferable.

As R, a hydrogen atom, an alkyl group having 1 to 5 carbon atoms, or a fluorinated alkyl group having 1 to 5 carbon atoms is preferable, and a hydrogen atom or a methyl group is most preferable in terms of industrial availability.

In Formula (a1-1), the divalent hydrocarbon group as $Va^1$ may be an aliphatic hydrocarbon group or an aromatic hydrocarbon group.

The aliphatic hydrocarbon group as the divalent hydrocarbon group represented by $Va^1$ may be saturated or unsaturated. In general, it is preferable that the aliphatic hydrocarbon group is saturated.

As specific examples of the aliphatic hydrocarbon group, a linear or branched aliphatic hydrocarbon group, and an aliphatic hydrocarbon group containing a ring in the structure thereof.

The linear aliphatic hydrocarbon group has preferably 1 to 10 carbon atoms, more preferably 1 to 6 carbon atoms, still more preferably 1 to 4 carbon atoms, and most preferably 1 to 3 carbon atoms.

As the linear aliphatic hydrocarbon group, a linear alkylene group is preferable. Specific examples thereof include a methylene group [—$CH_2$—], an ethylene group [—$(CH_2)_2$—], a trimethylene group [—$(CH_2)_3$—], a tetramethylene group [—$(CH_2)_4$—], and a pentamethylene group [—$(CH_2)_5$—].

The branched aliphatic hydrocarbon group has preferably 2 to 10 carbon atoms, more preferably 3 to 6 carbon atoms, still more preferably 3 or 4 carbon atoms, and most preferably 3 carbon atoms.

As the branched aliphatic hydrocarbon group, a branched alkylene group is preferred, and specific examples thereof include alkylalkylene groups, for example, alkylmethylene groups such as —$CH(CH_3)$—, —$CH(CH_2CH_3)$—, —$C(CH_3)_2$—, —$C(CH_3)(CH_2CH_3)$—, —$C(CH_3)(CH_2CH_2CH_3)$—, and —$C(CH_2CH_3)_2$—; alkylethylene groups such as —$CH(CH_3)CH_2$—, —$CH(CH_3)CH(CH_3)$—, —$C(CH_3)_2CH_2$—, —$CH(CH_2CH_3)CH_2$—, and —$C(CH_2CH_3)_2$—$CH_2$—; alkyltrimethylene groups such as —$CH(CH_3)CH_2CH_2$—, and —$CH_2CH(CH_3)CH_2$—; and alkyltetramethylene groups such as —$CH(CH_3)CH_2CH_2CH_2$—, and —$CH_2CH(CH_3)CH_2CH_2$—. As the alkyl group in the alkylalkylene group, a linear alkyl group having 1 to 5 carbon atoms is preferable.

Examples of the aliphatic hydrocarbon group containing a ring in the structure thereof include an alicyclic hydrocarbon group (a group in which two hydrogen atoms have been removed from an aliphatic hydrocarbon ring), a group in which the alicyclic hydrocarbon group is bonded to the terminal of the linear or branched aliphatic hydrocarbon group, and a group in which the alicyclic hydrocarbon group is interposed in the above-described linear or branched aliphatic hydrocarbon group. The linear or branched aliphatic hydrocarbon group is the same as defined for the above-described linear aliphatic hydrocarbon group or the above-described branched aliphatic hydrocarbon group.

The alicyclic hydrocarbon group has preferably 3 to 20 carbon atoms and more preferably 3 to 12 carbon atoms.

The alicyclic hydrocarbon group may be monocyclic or polycyclic. As the monocyclic alicyclic hydrocarbon group, a group in which two hydrogen atoms have been removed from a monocycloalkane is preferable. The monocycloalkane has preferably 3 to 6 carbon atoms, and specific examples thereof include cyclopentane and cyclohexane. As the polycyclic alicyclic hydrocarbon group, a group in which two hydrogen atoms have been removed from a polycycloalkane is preferable. As the polycycloalkane, a group having 7 to 12 carbon atoms is preferable. Specific examples of the polycycloalkane include adamantane, norbornane, isobornane, tricyclodecane, and tetracyclododecane.

The aromatic hydrocarbon group as the divalent hydrocarbon group represented by $Va^1$ is a hydrocarbon group having an aromatic ring.

The aromatic hydrocarbon group has preferably 3 to 30 carbon atoms, more preferably 5 to 30 carbon atoms, still more preferably 5 to 20 carbon atoms, particularly preferably 6 to 15 carbon atoms, and most preferably 6 to 12 carbon atoms. Here, the number of carbon atoms in a substituent is not included in the number of carbon atoms.

Specific examples of the aromatic ring contained in the aromatic hydrocarbon group include aromatic hydrocarbon rings such as benzene, biphenyl, fluorene, naphthalene, anthracene, and phenanthrene; and aromatic hetero rings in which some carbon atoms constituting the above-described aromatic hydrocarbon rings have been substituted with hetero atoms. Examples of the hetero atom in the aromatic hetero rings include an oxygen atom, a sulfur atom, and a nitrogen atom.

Specific examples of the aromatic hydrocarbon group include a group in which two hydrogen atoms have been removed from the above-described aromatic hydrocarbon ring (an arylene group); and a group in which one hydrogen atom of a group (an aryl group) formed by removing one hydrogen atom from the aromatic hydrocarbon ring has been substituted with an alkylene group (a group formed by removing one more hydrogen atom from an aryl group in an arylalkyl group such as a benzyl group, a phenethyl group, a 1-naphthylmethyl group, a 2-naphthylmethyl group, a 1-naphthylethyl group, or a 2-naphthylethyl group). The alkylene group (an alkyl chain in the arylalkyl group) has preferably 1 to 4 carbon atoms, more preferably 1 or 2 carbon atoms, and particularly preferably 1 carbon atom.

In Formula (a1-1), $Ra^1$ represents an acid dissociable group represented by Formula (a1-r-1) or (a1-r-2).

In Formula (a1-2), the $(n_{a2}+1)$-valent hydrocarbon group as $Wa^1$ may be an aliphatic hydrocarbon group or an aromatic hydrocarbon group. The aliphatic hydrocarbon group indicates a hydrocarbon group that has no aromaticity, and may be saturated or unsaturated. In general, it is preferable that the aliphatic hydrocarbon group is saturated. Examples of the aliphatic hydrocarbon group include a linear or branched aliphatic hydrocarbon group, an aliphatic hydrocarbon group containing a ring in the structure thereof, and a combination of the linear or branched aliphatic hydrocarbon group and the aliphatic hydrocarbon group containing a ring in the structure thereof. The valency of $n_{a2}+1$ is preferably divalent, trivalent or tetravalent, and divalent or trivalent is more preferable.

In Formula (a1-2), Rae represents an acid dissociable group represented by Formula (a1-r-1) or (a1-r-3).

Specific examples of the constitutional unit represented by Formula (a1-1) are shown below. In the formulae shown below, $R^α$ represents a hydrogen atom, a methyl group, or a trifluoromethyl group.

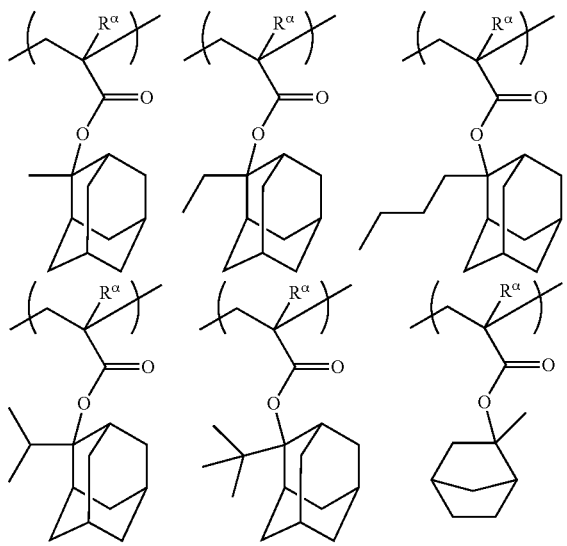

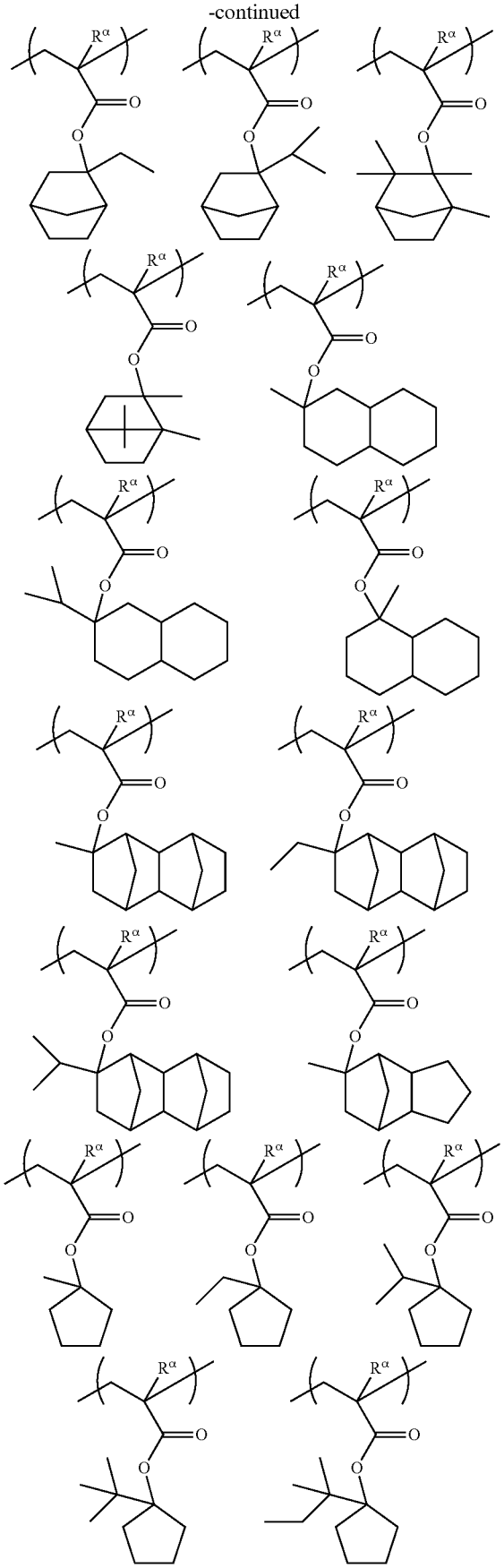

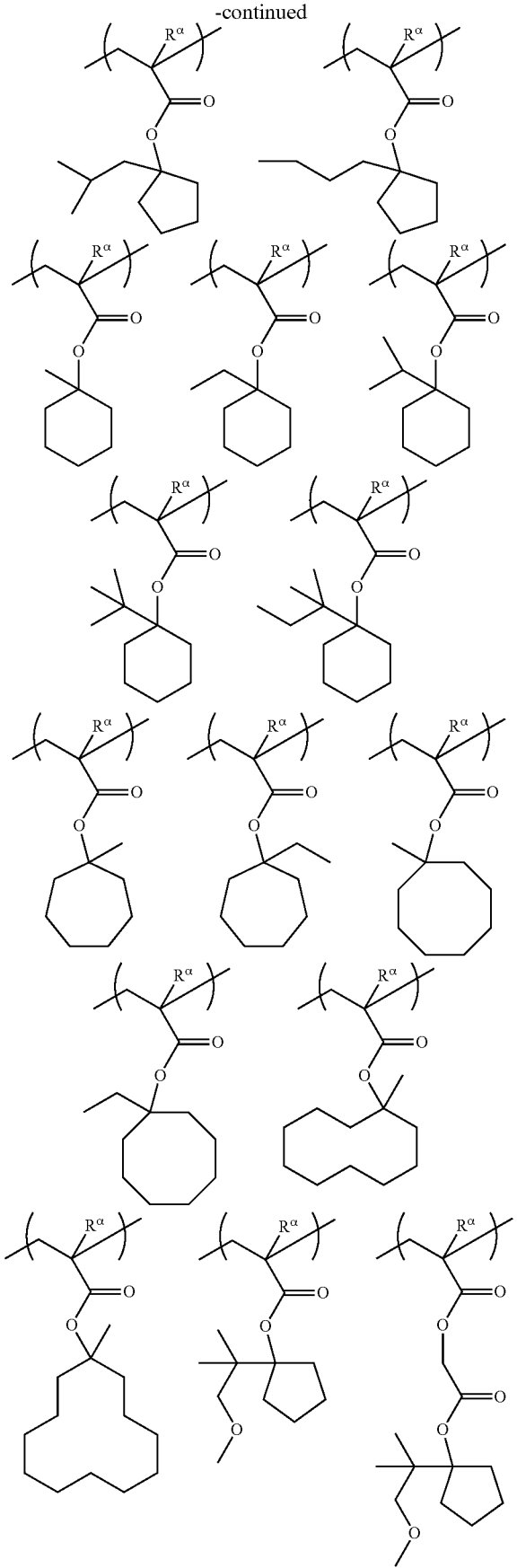
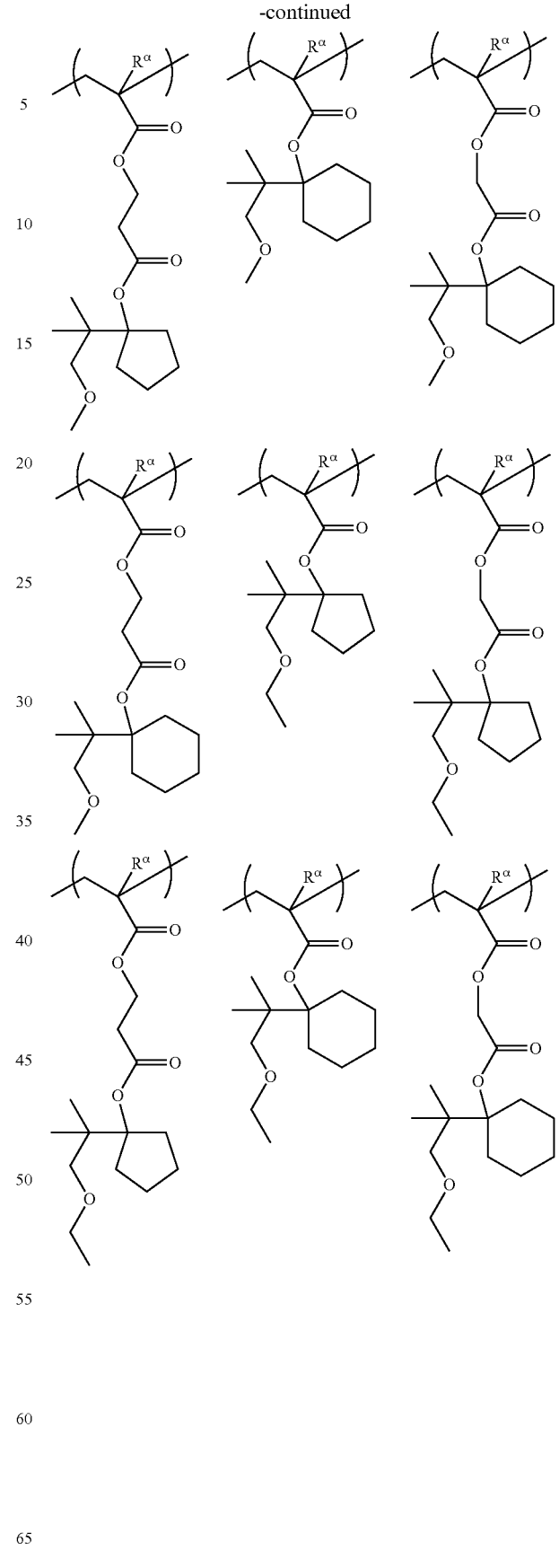

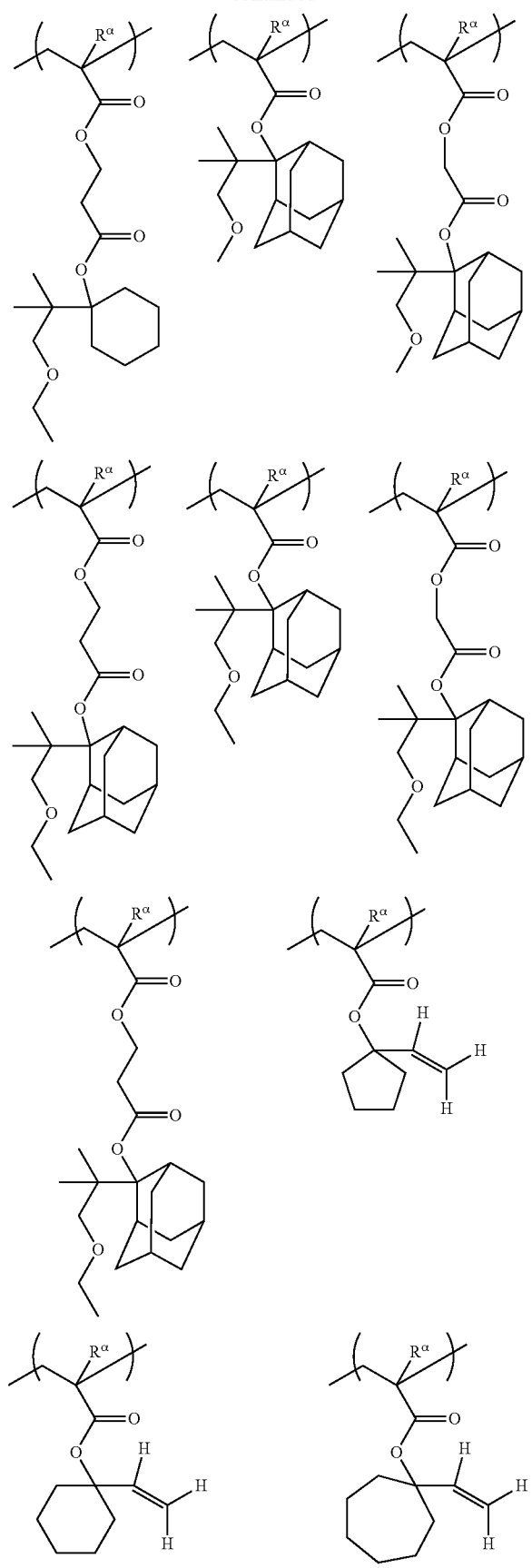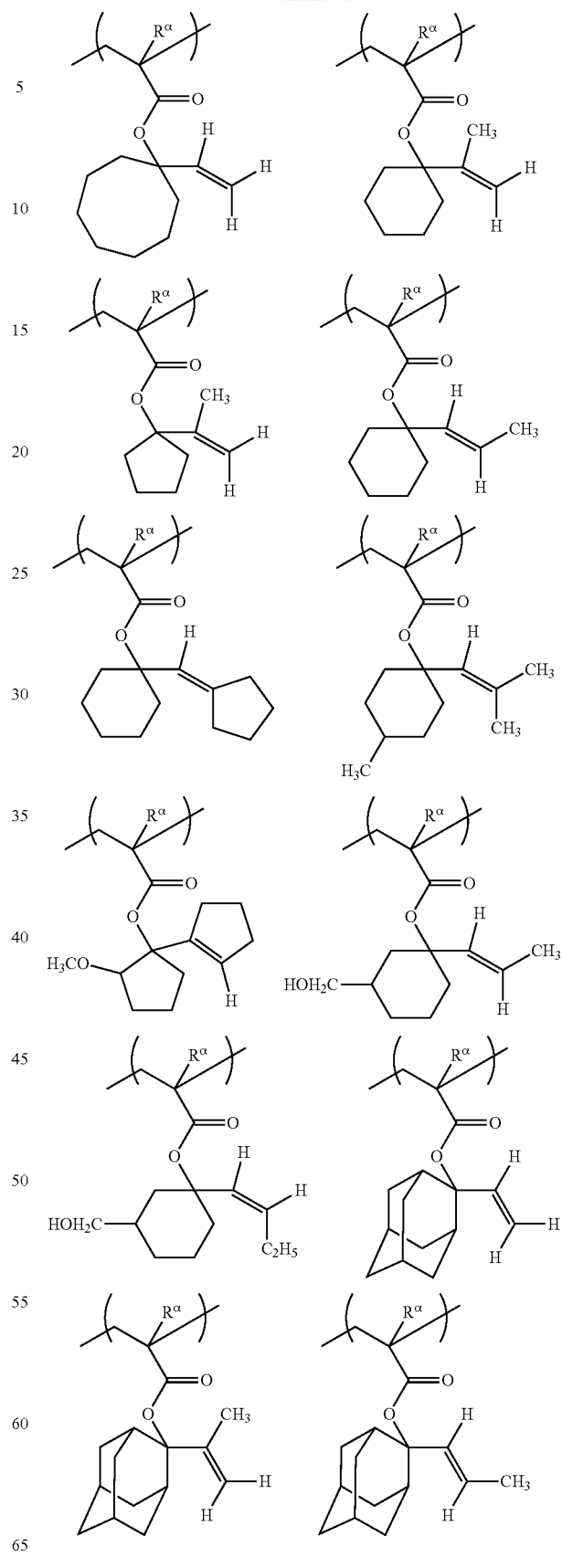

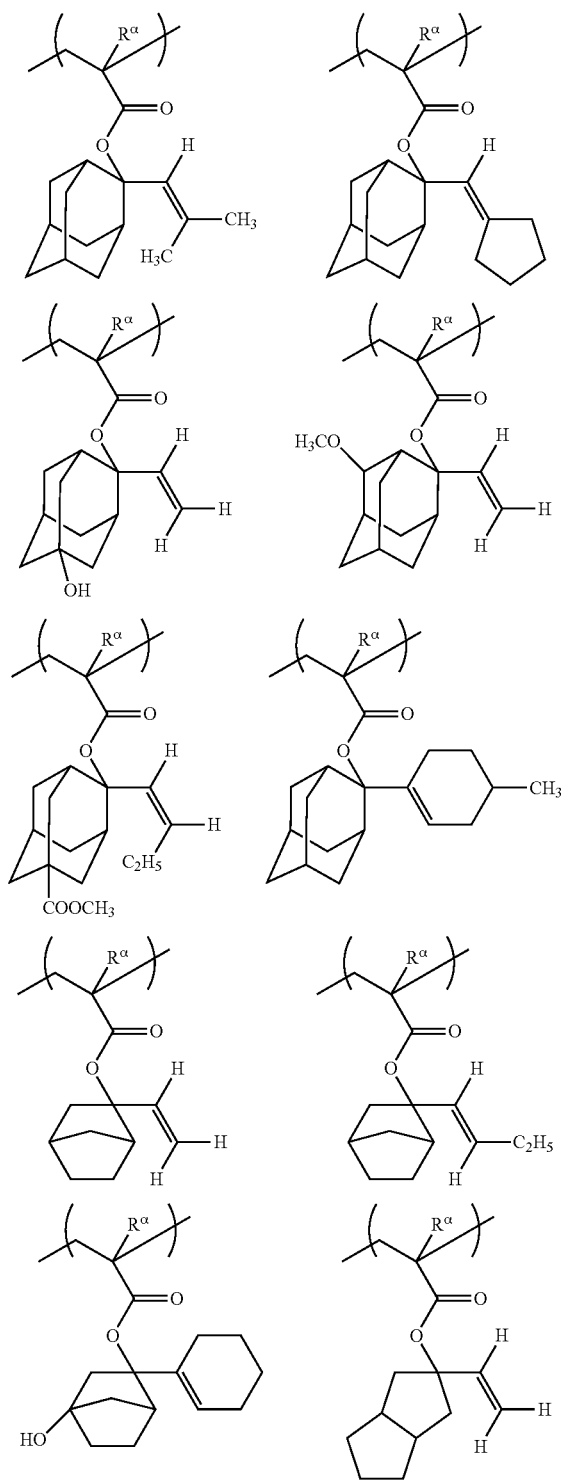
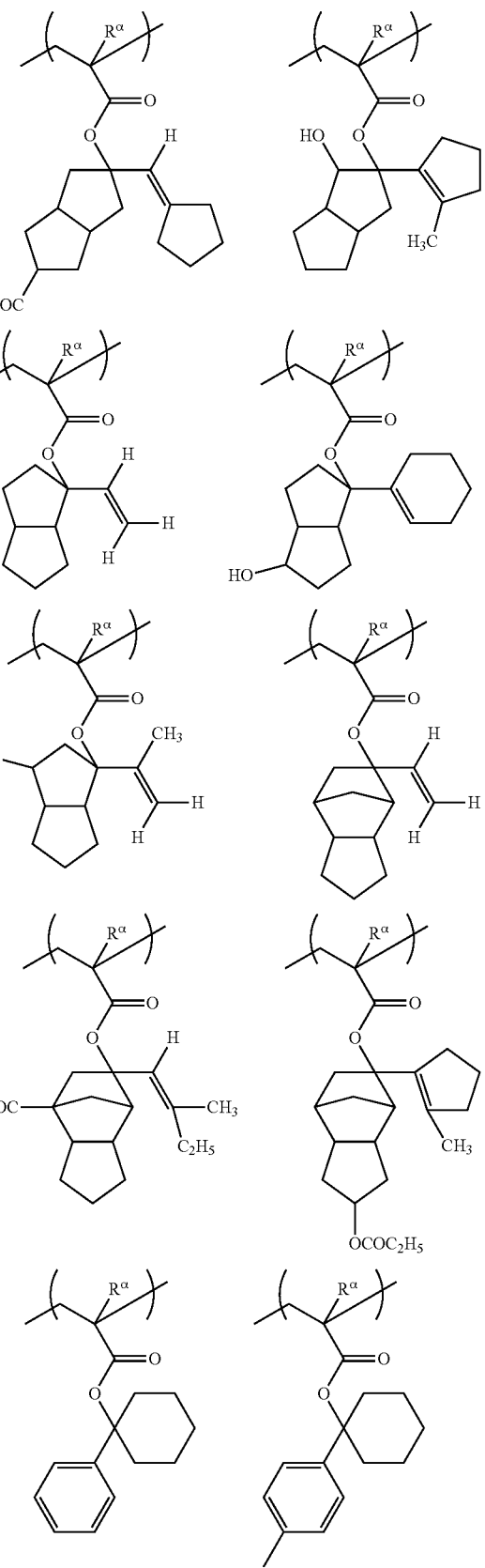

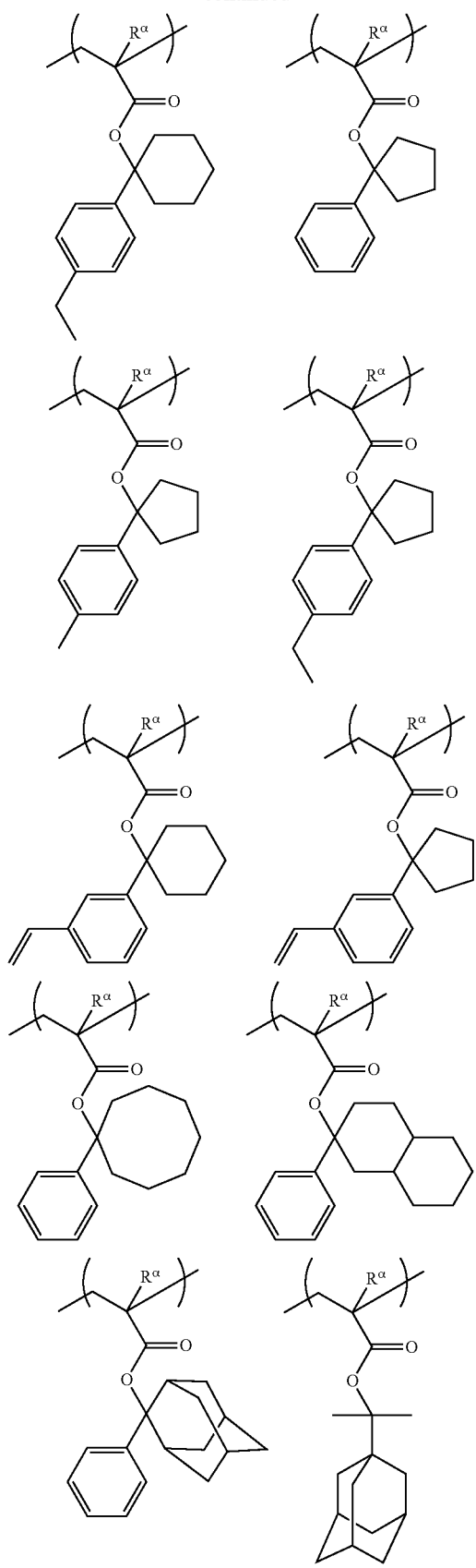
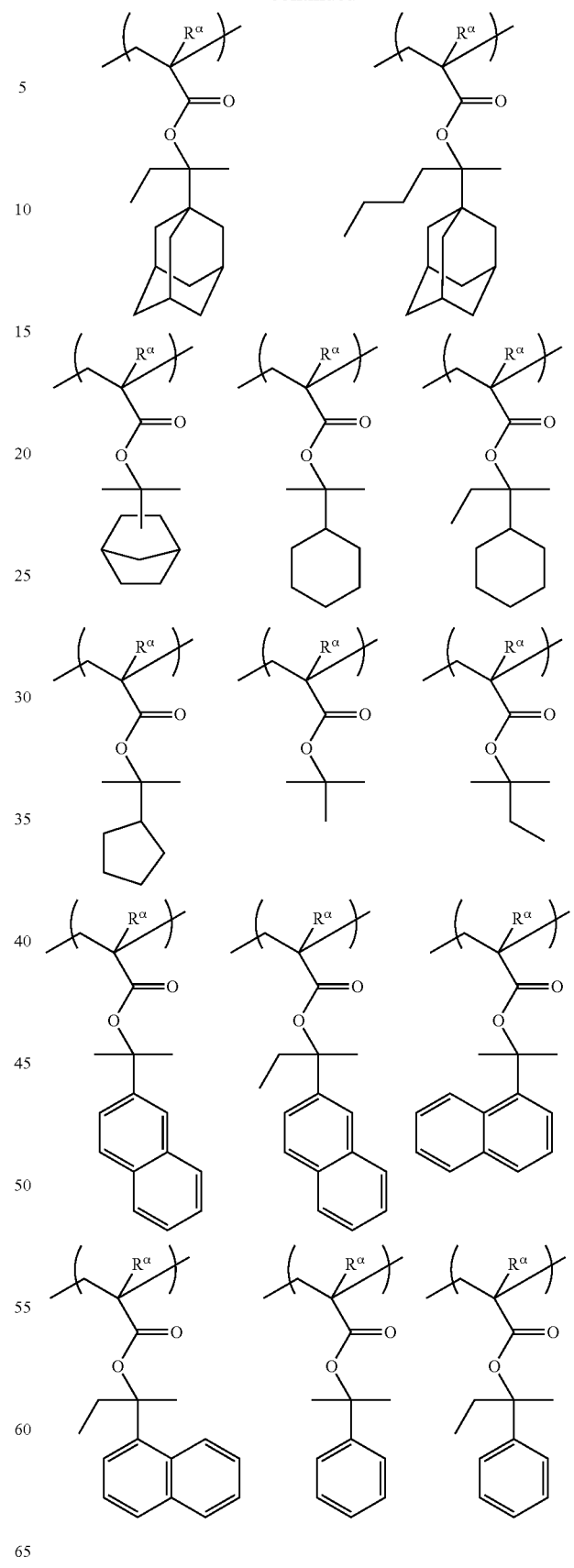

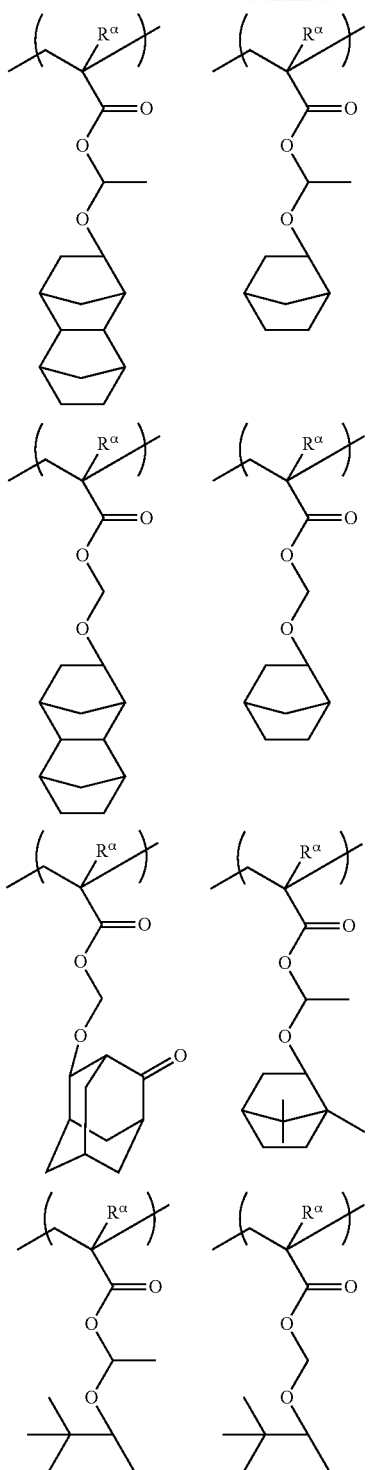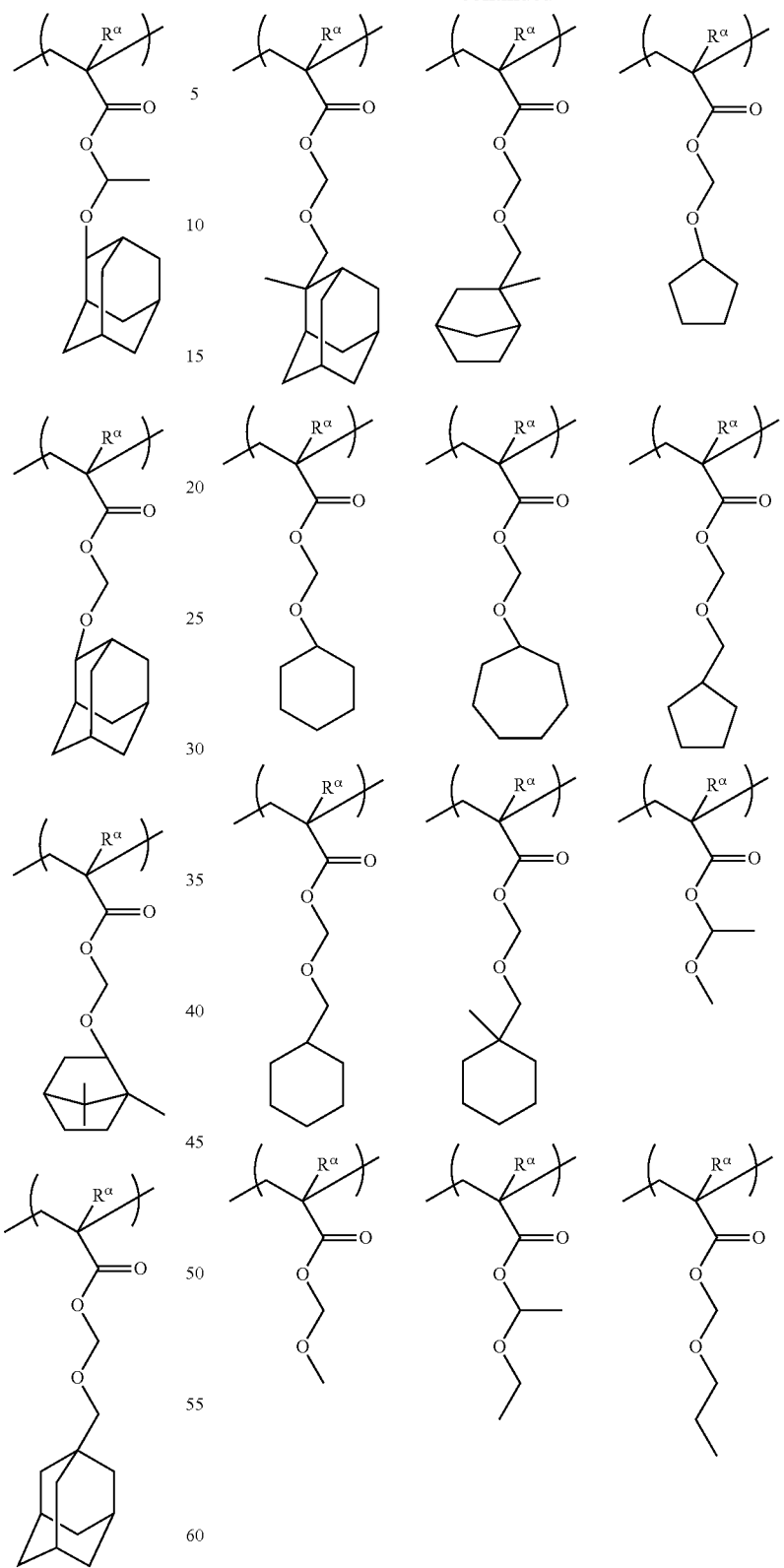

-continued
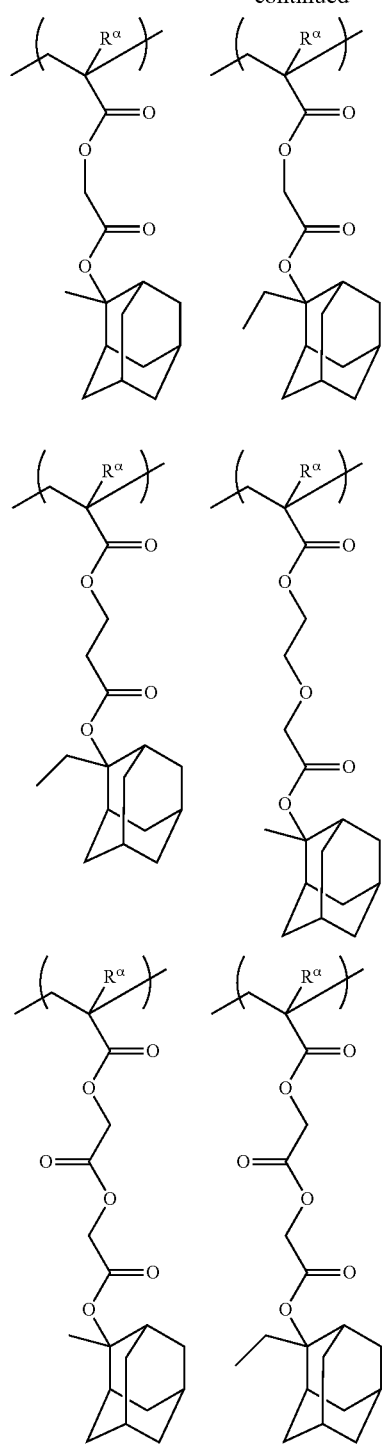
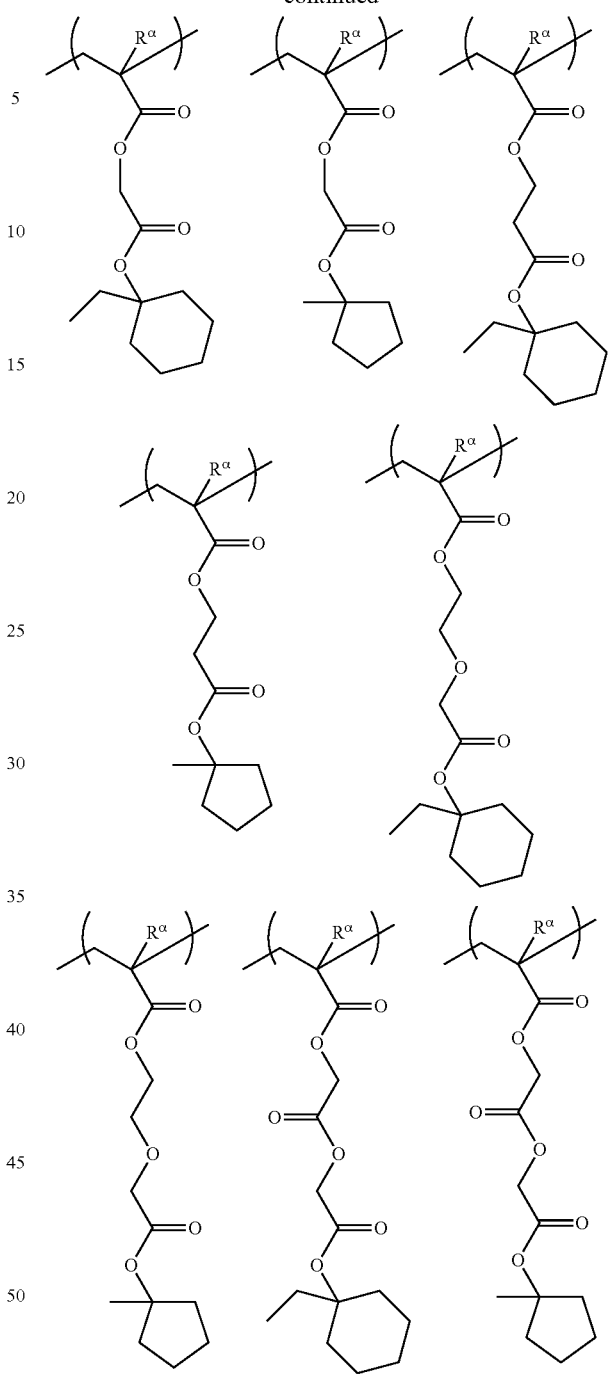
Specific examples of the constitutional unit represented by Formula (a1-2) are shown below.

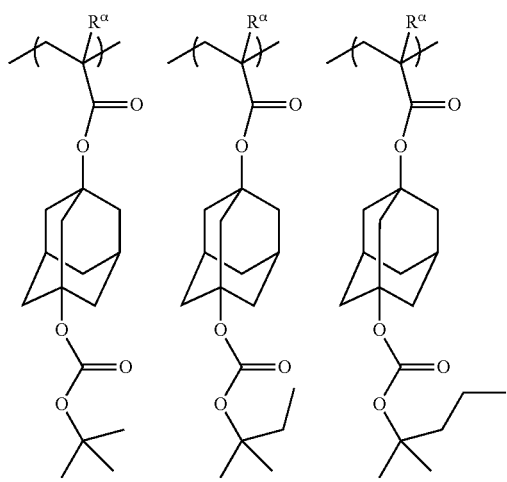

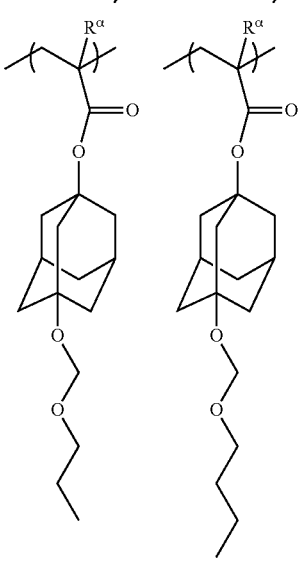

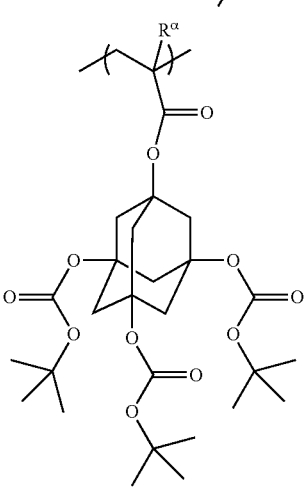

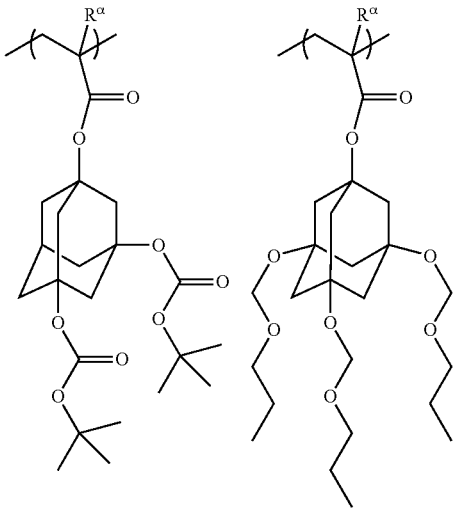

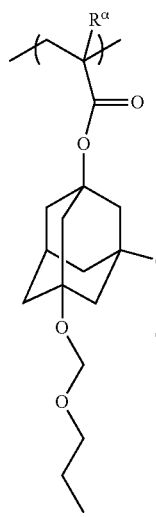

The constitutional unit (a1) included in the component (A1) may be used alone or two or more kinds thereof.

Since the lithography characteristics (the sensitivity, the shape, and the like) are easily improved using electron beams or EUV, a constitutional unit represented by Formula (a1-1) is preferable as the constitutional unit (a1).

Among the examples, as the constitutional unit (a1), those having a constitutional unit represented by Formula (a1-1-1) are particularly preferable.

(a1-1-1)

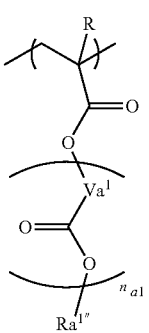

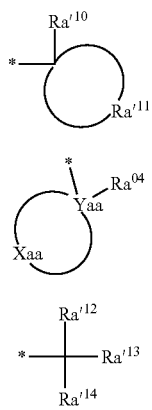

(a1-r2-1)

(a1-r2-3)

(a1-r2-4)

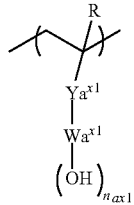

(a10-1)

[In the formulae, $Ra^{1'''}$ represents an acid dissociable group represented by Formula (a1-r2-1), (a1-r2-3), or (a1-r2-4).]

In Formula (a1-1-1), R, $Va^1$, and $n_{a1}$ each have the same definition as that for R, $Va^1$, and $n_{a1}$ in Formula (a1-1).

The description of the acid dissociable group represented by Formula (a1-r2-1), (a1-r2-3), or (a1-r2-4) is the same as the description above.

Among the examples, it is preferable that $Ra^{1'''}$ in Formula (a1-1-1) represents an acid dissociable group represented by Formula (a1-r2-1) or (a1-r2-3). Further, in Formula (a1-r2-1), it is preferable that $Ra'^{11}$ (an aliphatic cyclic group that is formed together with the carbon atom to which $Ra'^{10}$ is bonded) represents an aliphatic monocyclic group, and specific examples thereof include those exemplified as the aliphatic monocyclic group as $Ra'^{3}$ in Formula (a1-r-1). Further, in Formula (a1-r2-3), it is preferable that the aliphatic cyclic group that is formed by Xaa together with Yaa is an aliphatic monocyclic group, and specific examples thereof include those exemplified as the aliphatic monocyclic group as $Ra'^{3}$ in Formula (a1-r-1).

The proportion of the constitutional unit (a1) in the component (A1) is preferably in a range of 5% to 80% by mole, more preferably in a range of 10% to 75% by mole, and still more preferably in a range of 30% to 70% by mole with respect to the total amount (100% by mole) of all constitutional units constituting the component (A1).

By setting the proportion of the constitutional unit (a1) to be greater than or equal to the lower limit of the above-described preferable range, lithography characteristics of enhancing the sensitivity, the resolution, the roughness, and the like are improved. Further, by setting the proportion of the constitutional unit (a1) to be lower than or equal to the upper limit of the above-described preferable range, the constitutional unit (a1) and other constitutional units can be balanced, and various lithography characteristics are improved.

<<Constitutional Unit (a10) Having Hydroxystyrene Skeleton>>

The component (A1) may further have a constitutional unit (a10) having a hydroxystyrene skeleton in addition to the constitutional unit (a1).

Preferred examples of such a constitutional unit (a10) include constitutional units represented by Formula (a10-1).

[In the formula, R represents a hydrogen atom, an alkyl group having 1 to 5 carbon atoms, or a halogenated alkyl group having 1 to 5 carbon atoms. $Ya^{x1}$ represents a single bond or a divalent linking group. $Wa^{x1}$ represents an $(n_{ax1}+1)$-valent aromatic hydrocarbon group. $n_{ax1}$ represents an integer of 1 to 3.]

In Formula (a10-1), R represents a hydrogen atom, an alkyl group having 1 to 5 carbon atoms, or a halogenated alkyl group having 1 to 5 carbon atoms.

As the alkyl group having 1 to 5 carbon atoms represented by R, a linear or branched alkyl group having 1 to 5 carbon atoms is preferable, and specific examples thereof include a methyl group, an ethyl group, a propyl group, an isopropyl group, an n-butyl group, an isobutyl group, a tert-butyl group, a pentyl group, an isopentyl group, and a neopentyl group. The halogenated alkyl group having 1 to 5 carbon atoms as R is a group in which some or all hydrogen atoms of the above-described alkyl group having 1 to 5 carbon atoms have been substituted with halogen atoms. Examples of the halogen atom include a fluorine atom, a chlorine atom, a bromine atom, and an iodine atom, and a fluorine atom is particularly preferable.

As R, a hydrogen atom, an alkyl group having 1 to 5 carbon atoms, or a fluorinated alkyl group having 1 to 5 carbon atoms is preferable, and a hydrogen atom or a methyl group is most preferable in terms of industrial availability.

In Formula (a10-1), $Ya^{x1}$ represents a single bond or a divalent linking group. Suitable examples of the divalent linking group as $Ya^{x1}$ include a divalent hydrocarbon group which may have a substituent and a divalent linking group having a hetero atom.

Divalent Hydrocarbon Group which May have Substituent:

In a case where $Ya^{x1}$ represents a divalent hydrocarbon group which may have a substituent, the hydrocarbon group may be an aliphatic hydrocarbon group or an aromatic hydrocarbon group.

Aliphatic Hydrocarbon Group as $Ya^{x1}$

The aliphatic hydrocarbon group indicates a hydrocarbon group that has no aromaticity. The aliphatic hydrocarbon group may be saturated or unsaturated. In general, it is preferable that the aliphatic hydrocarbon group is saturated.

Examples of the aliphatic hydrocarbon group include a linear or branched aliphatic hydrocarbon group, and an aliphatic hydrocarbon group containing a ring in the structure thereof.

Linear or Branched Aliphatic Hydrocarbon Group

The linear or branched aliphatic hydrocarbon group has preferably 1 to 10 carbon atoms, more preferably 1 to 6 carbon atoms, still more preferably 1 to 4 carbon atoms, and most preferably 1 to 3 carbon atoms.

As the linear aliphatic hydrocarbon group, a linear alkylene group is preferable. Specific examples thereof include a methylene group [—$CH_2$—], an ethylene group [—$(CH_2)_2$—], a trimethylene group [—$(CH_2)_3$—], a tetramethylene group [—$(CH_2)_4$—], and a pentamethylene group [—$(CH_2)_5$—].

The branched aliphatic hydrocarbon group has preferably 2 to 10 carbon atoms, more preferably 3 to 6 carbon atoms, still more preferably 3 or 4 carbon atoms, and most preferably 3 carbon atoms.

As the branched aliphatic hydrocarbon group, a branched alkylene group is preferred, and specific examples thereof include alkylalkylene groups, for example, alkylmethylene groups such as —CH(CH$_3$)—, —CH(CH$_2$CH$_3$)—, —C(CH$_3$)$_2$—, —C(CH$_3$)(CH$_2$CH$_3$)—, —C(CH$_3$)(CH$_2$CH$_2$CH$_3$)—, and —C(CH$_2$CH$_3$)$_2$—; alkylethylene groups such as —CH(CH$_3$)CH$_2$—, —CH(CH$_3$)CH(CH$_3$)—, —C(CH$_3$)$_2$CH$_2$—, —CH(CH$_2$CH$_3$)CH$_2$—, and —C(CH$_2$CH$_3$)$_2$—CH$_2$—; alkyltrimethylene groups such as —CH(CH$_3$)CH$_2$CH$_2$—, and —CH$_2$CH(CH$_3$)CH$_2$—; and alkyltetramethylene groups such as —CH(CH$_3$)CH$_2$CH$_2$CH$_2$—, and —CH$_2$CH(CH$_3$)CH$_2$CH$_2$—. As the alkyl group in the alkylalkylene group, a linear alkyl group having 1 to 5 carbon atoms is preferable.

The linear or branched aliphatic hydrocarbon group may or may not have a substituent. Examples of the substituent include a fluorine atom, a fluorinated alkyl group having 1 to 5 carbon atoms which has been substituted with a fluorine atom, and a carbonyl group.

Aliphatic Hydrocarbon Group Containing Ring in Structure Thereof

Examples of the aliphatic hydrocarbon group containing a ring in the structure thereof include a cyclic aliphatic hydrocarbon group which may have a substituent containing a hetero atom in the ring structure thereof (a group in which two hydrogen atoms have been removed from an aliphatic hydrocarbon ring), a group in which the cyclic aliphatic hydrocarbon group is bonded to the terminal of a linear or branched aliphatic hydrocarbon group, and a group in which the cyclic aliphatic hydrocarbon group is interposed in a linear or branched aliphatic hydrocarbon group. As the linear or branched aliphatic hydrocarbon group, the same groups as those described above can be exemplified.

The cyclic aliphatic hydrocarbon group has preferably 3 to 20 carbon atoms and more preferably 3 to 12 carbon atoms.

The cyclic aliphatic hydrocarbon group may be a polycyclic group or a monocyclic group. As the monocyclic alicyclic hydrocarbon group, a group in which two hydrogen atoms have been removed from a monocycloalkane is preferable. The monocycloalkane has preferably 3 to 6 carbon atoms, and specific examples thereof include cyclopentane and cyclohexane. As the polycyclic alicyclic hydrocarbon group, a group in which two hydrogen atoms have been removed from a polycycloalkane is preferable. As the polycycloalkane, a group having 7 to 12 carbon atoms is preferable. Examples of the polycycloalkane include adamantane, norbornane, isobornane, tricyclodecane, and tetracyclododecane.

The cyclic aliphatic hydrocarbon group may or may not have a substituent. Examples of the substituent include an alkyl group, an alkoxy group, a halogen atom, a halogenated alkyl group, a hydroxyl group, and a carbonyl group.

The alkyl group as the substituent is preferably an alkyl group having 1 to 5 carbon atoms, and a methyl group, an ethyl group, a propyl group, an n-butyl group, or a tert-butyl group is most preferable.

The alkoxy group as the substituent is preferably an alkoxy group having 1 to 5 carbon atoms, more preferably a methoxy group, an ethoxy group, an n-propoxy group, an iso-propoxy group, an n-butoxy group, or a tert-butoxy group, and most preferably a methoxy group or an ethoxy group.

Examples of the halogen atom as the substituent include a fluorine atom, a chlorine atom, a bromine atom, and an iodine atom, and a fluorine atom is preferable.

Examples of the halogenated alkyl group as the substituent include groups in which some or all hydrogen atoms in the above-described alkyl groups have been substituted with the above-described halogen atoms.

In the cyclic aliphatic hydrocarbon group, some carbon atoms constituting the ring structure thereof may be substituted with a substituent containing a hetero atom. As the substituent containing a hetero atom, —O—, —C(=O)—O—, —S—, —S(=O)$_2$—, or —S(=O)$_2$—O— is preferable.

Aromatic Hydrocarbon Group as Ya$^{x1}$

The aromatic hydrocarbon group is a hydrocarbon group having at least one aromatic ring.

The aromatic ring is not particularly limited as long as it is a cyclic conjugated system having (4n+2) π electrons, and may be monocyclic or polycyclic. The aromatic ring has preferably 5 to 30 carbon atoms, more preferably 5 to 20 carbon atoms, still more preferably 6 to 15 carbon atoms, and particularly preferably 6 to 12 carbon atoms. Here, the number of carbon atoms in a substituent is not included in the number of carbon atoms. Specific examples of the aromatic ring include aromatic hydrocarbon rings such as benzene, naphthalene, anthracene, and phenanthrene; and aromatic hetero rings in which some carbon atoms constituting the above-described aromatic hydrocarbon rings have been substituted with hetero atoms. Examples of the hetero atom in the aromatic hetero rings include an oxygen atom, a sulfur atom, and a nitrogen atom. Specific examples of the aromatic hetero ring include a pyridine ring and a thiophene ring.

Specific examples of the aromatic hydrocarbon group include a group in which two hydrogen atoms have been removed from the above-described aromatic hydrocarbon ring or aromatic hetero ring (an arylene group or a heteroarylene group); a group in which two hydrogen atoms have been removed from an aromatic compound having two or more aromatic rings (such as biphenyl or fluorene); and a group in which one hydrogen atom of a group (an aryl group or a heteroaryl group) obtained by removing one hydrogen atom from the above-described aromatic hydrocarbon ring or aromatic hetero ring has been substituted with an alkylene group (for example, a group obtained by further removing one hydrogen atom from an aryl group in an arylalkyl group such as a benzyl group, a phenethyl group, a 1-naphthylmethyl group, a 2-naphthylmethyl group, a 1-naphthylethyl group, or a 2-naphthylethyl group). The number of carbon atoms in the alkylene group bonded to the aromatic hydrocarbon ring or aromatic hetero ring is preferably in a range of 1 to 4, more preferably 1 or 2, and particularly preferably 1.

With respect to the aromatic hydrocarbon group, the hydrogen atom in the aromatic hydrocarbon group may be substituted with a substituent. For example, the hydrogen atom bonded to the aromatic ring in the aromatic hydrocarbon group may be substituted with a substituent. Examples of substituents include an alkyl group, an alkoxy group, a halogen atom, a halogenated alkyl group, and a hydroxyl group.

The alkyl group as the substituent is preferably an alkyl group having 1 to 5 carbon atoms, and a methyl group, an ethyl group, a propyl group, an n-butyl group, or a tert-butyl group is more preferable.

As the alkoxy group, the halogen atom, and the halogenated alkyl group as the substituents, the same groups as the above-described substituent groups for substituting a hydrogen atom in the cyclic aliphatic hydrocarbon group can be exemplified.

Divalent Linking Group Containing Hetero Atom:

In a case where $Y a^{x1}$ represents a divalent linking group containing a hetero atom, preferred examples of the linking group include —O—, —C(=O)—O—, —C(=O)—, —O—C(=O)—O—, —C(=O)—NH—, —NH—, —NH—C(=NH)— (H may be substituted with a substituent such as an alkyl group, an acyl group, or the like), —S—, —S(=O)$_2$—, —S(=O)$_2$—O—, and a group represented by Formula: —$Y^{21}$—O—$Y^{22}$—, —$Y^{21}$—O—, —$Y^{21}$—C(=O)—O—, —C(=O)—O—$Y^{21}$—, —[$Y^{21}$—C(=O)—O]$_m{''}$—$Y^{22}$—, —$Y^{21}$—O—C(=O)—$Y^{22}$— or —$Y^{21}$—S(=O)$_2$—O—$Y^{22}$— [in the formulae, $Y^{21}$ and $Y^{22}$ each independently represent a divalent hydrocarbon group which may have a substituent, O represents an oxygen atom, and m'' represents an integer of 0 to 3].

In a case where the divalent linking group containing a hetero atom is —C(=O)—NH—, —C(=O)—NH—C(=O)—, —NH—, or —NH—C(=NH)—, H may be substituted with a substituent such as an alkyl group, an acyl group, or the like. The substituent (an alkyl group, an acyl group, or the like) has preferably 1 to 10 carbon atoms, more preferably 1 to 8 carbon atoms, and most preferably 1 to 5 carbon atoms.

In Formula —$Y^{21}$—O—$Y^{22}$—, —$Y^{21}$—O—, —$Y^{21}$—C(=)—O—, —C(=O)—O—$Y^{21}$—, —[$Y^{21}$—C(=O)—O]m''—$Y^{23}$—, —$Y^{21}$—O—C(=O)—$Y^{22}$—, or $Y^{21}$—S(=O)$_2$—O—$Y^{22}$—, $Y^{21}$ and $Y^{22}$ each independently represent a divalent hydrocarbon group which may have a substituent. Examples of the divalent hydrocarbon group include those (exemplified as the divalent hydrocarbon group which may have a substituent) in the description of the above-described divalent linking group.

As $Y^{21}$, a linear aliphatic hydrocarbon group is preferable, a linear alkylene group is more preferable, a linear alkylene group having 1 to 5 carbon atoms is still more preferable, and a methylene group or an ethylene group is particularly preferable.

As $Y^{22}$, a linear or branched aliphatic hydrocarbon group is preferable, and a methylene group, an ethylene group, or an alkylmethylene group is more preferable. The alkyl group in the alkylmethylene group is preferably a linear alkyl group having 1 to 5 carbon atoms, more preferably a linear alkyl group having 1 to 3 carbon atoms, and most preferably a methyl group.

In the group represented by Formula —[$Y^{21}$—C(=O)—O]m''—$Y^{22}$—, m'' represents an integer of 0 to 3, preferably an integer of 0 to 2, more preferably 0 or 1, and particularly preferably 1. In other words, it is particularly preferable that the group represented by Formula —[$Y^{21}$—C(=O)—O]m''—$Y^{22}$— represents a group represented by Formula —$Y^{21}$—C(=O)—O—$Y^{22}$—. Among these, a group represented by Formula —(CH$_2$)$_a$'C(=O)—O—(CH$_2$)$_b$'— is preferable. In the formula, a' represents an integer of 1 to 10, preferably an integer of 1 to 8, more preferably an integer of 1 to 5, still more preferably 1 or 2, and most preferably 1. b' represents an integer of 1 to 10, preferably an integer of 1 to 8, more preferably an integer of 1 to 5, still more preferably 1 or 2, and most preferably 1.

In the description above, as $Y a^{x1}$, a single bond, an ester bond [—C(=O)—O—], an ether bond (—O—), —C(=O)—NH—, a linear or branched alkylene group, or a combination of these is preferable. Among these, a single bond is more preferable.

In Formula (a10-1), $Wa^{x1}$ represents an $(n_{ax1}+1)$-valent aromatic hydrocarbon group.

Examples of the aromatic hydrocarbon group as $Wa^{x1}$ include a group formed by removing $(n_{ax1}+1)$ hydrogen atoms from an aromatic ring. The aromatic ring is not particularly limited as long as it is a cyclic conjugated system having $(4n+2)$ π electrons, and may be monocyclic or polycyclic. The aromatic ring has preferably 5 to 30 carbon atoms, more preferably 5 to 20 carbon atoms, still more preferably 6 to 15 carbon atoms, and particularly preferably 6 to 12 carbon atoms. Specific examples of the aromatic ring include aromatic hydrocarbon rings such as benzene, naphthalene, anthracene, and phenanthrene; and aromatic hetero rings in which some carbon atoms constituting the above-described aromatic hydrocarbon rings have been substituted with hetero atoms. Examples of the hetero atom in the aromatic hetero rings include an oxygen atom, a sulfur atom, and a nitrogen atom. Specific examples of the aromatic hetero ring include a pyridine ring and a thiophene ring.

In Formula (a10-1), $n_{ax1}$ represents an integer of 1 to 3, preferably 1 or 2, and more preferably 1.

Hereinafter, specific examples of the constitutional unit represented by Formula (a10-1) are described.

In each formula shown below, Ra represents a hydrogen atom, a methyl group, or a trifluoromethyl group.

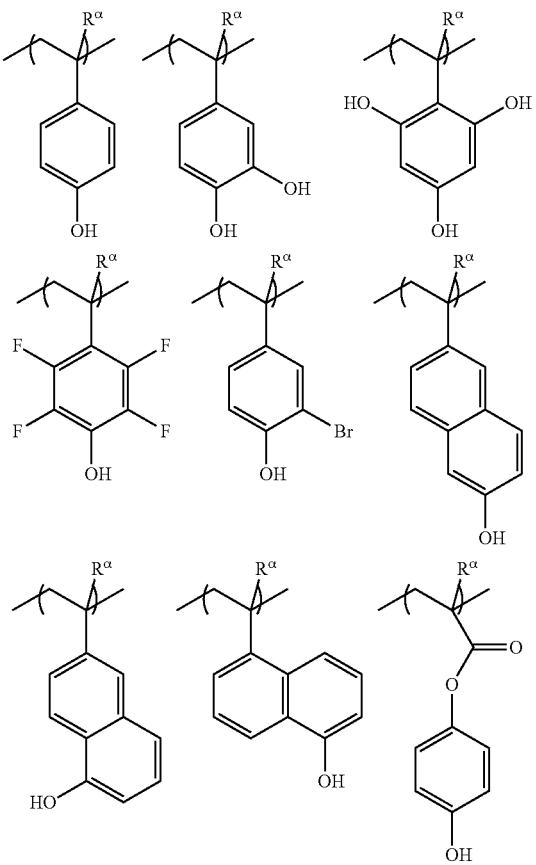

-continued

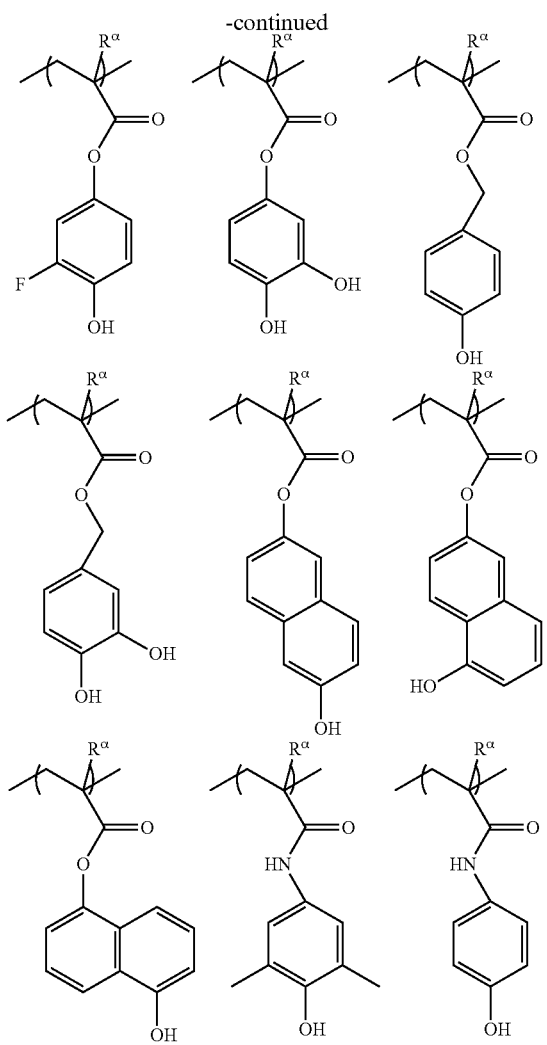

The constitutional unit (a10) in the component (A1) may be used alone or in combination of two or more kinds thereof.

The proportion of the constitutional unit (a10) in the component (A1) is preferably in a range of 0% to 80% by mole, more preferably in a range of 10% to 80% by mole, still more preferably in a range of 20% to 70% by mole, and particularly preferably in a range of 20% to 60% by mole with respect to the total amount (100% by mole) of all constitutional units constituting the component (A1).

By setting the proportion of the constitutional unit (a10) to be greater than or equal to the lower limit of the above-described preferable range, lithography characteristics of enhancing the sensitivity, the resolution, the roughness, and the like are improved. Further, by setting the proportion of the constitutional unit (a10) to be lower than or equal to the upper limit of the above-described preferable range, the constitutional unit (a10) and other constitutional units can be balanced, and various lithography characteristics are improved.

<<Constitutional Unit (a2)>>

The component (A1) may have a constitutional unit (a2) (here, a constitutional unit corresponding to the constitutional unit (a1) is excluded) containing a lactone-containing cyclic group, a —$SO_2$-containing cyclic group, or a carbonate-containing cyclic group, in addition to the constitutional unit (a1).

In a case where the component (A1) is used for forming a resist film, the lactone-containing cyclic group, the —$SO_2$-containing cyclic group, or the carbonate-containing cyclic group in the constitutional unit (a2) is effective for improving the adhesiveness of the resist film to the substrate. Further, in a case where the component (A1) contains the constitutional unit (a2), the lithography characteristics and the like are improved due to the effects of appropriately adjusting the acid diffusion length, increasing the adhesiveness of the resist film to the substrate, and appropriately adjusting the solubility during the development.

The term "lactone-containing cyclic group" indicates a cyclic group that contains a ring (lactone ring) containing a —O—C(=O)— in the ring skeleton. In a case where the lactone ring is counted as the first ring and the group contains only the lactone ring, the group is referred to as a polycyclic group. Further, in a case where the group has other ring structures, the group is referred to as a polycyclic group regardless of the structures. The lactone-containing cyclic group may be a monocyclic group or a polycyclic group.

The lactone-containing cyclic group for the constitutional unit (a2) is not particularly limited, and an optional constitutional unit may be used. Specific examples thereof include groups represented by Formulae (a2-r-1) to (a2-r-7) shown below.

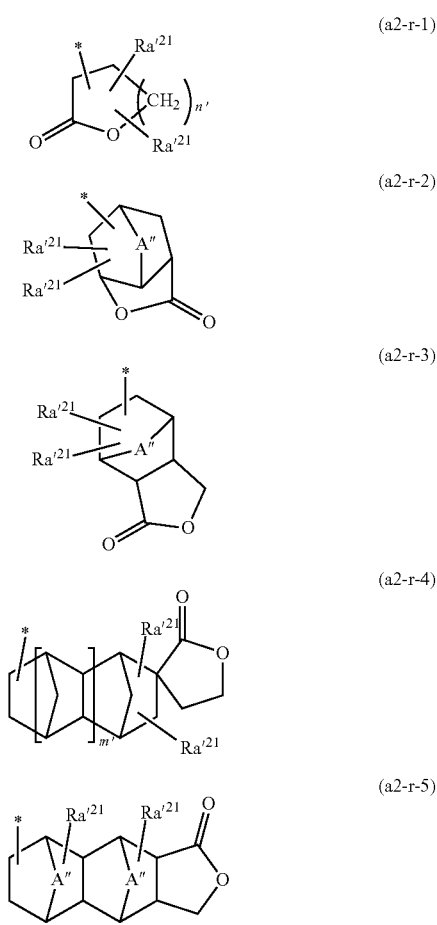

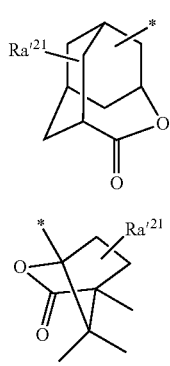

(a2-r-6)

(a2-r-7)

[In the formulae, each Ra'$^{21}$ independently represents a hydrogen atom, an alkyl group, an alkoxy group, a halogen atom, a halogenated alkyl group, a hydroxyl group, —COOR", —OC(=O)R", a hydroxyalkyl group, or a cyano group; and R" represents a hydrogen atom, an alkyl group, a lactone-containing cyclic group, a carbonate-containing cyclic group, or a —SO$_2$-containing cyclic group; A" represents an oxygen atom (—O—), a sulfur atom (—S—) or an alkylene group having 1 to 5 carbon atoms which may contain an oxygen atom or a sulfur atom; n' represents an integer of 0 to 2; and m' represents 0 or 1.]

In Formulae (a2-r-1) to (a2-r-7), the alkyl group as Ra'$^{21}$ is preferably an alkyl group having 1 to 6 carbon atom. Further, the alkyl group is preferably a linear alkyl group or a branched alkyl group. Specific examples thereof include a methyl group, an ethyl group, a propyl group, an isopropyl group, an n-butyl group, an isobutyl group, a tert-butyl group, a pentyl group, an isopentyl group, a neopentyl group and a hexyl group. Among these, a methyl group or ethyl group is preferable, and a methyl group is particularly preferable.

The alkoxy group as Ra'$^{21}$ is preferably an alkoxy group having 1 to 6 carbon atoms.

Further, the alkoxy group is preferably a linear or branched alkoxy group. Specific examples of the alkoxy groups include a group formed by linking the above-described alkyl group as Ra'$^{21}$ to an oxygen atom (—O—).

Examples of the halogen atom as Ra'$^{21}$ include a fluorine atom, a chlorine atom, a bromine atom, and an iodine atom. Among these, a fluorine atom is preferable.

Examples of the halogenated alkyl group as Ra'$^{21}$ include groups in which some or all hydrogen atoms in the above-described alkyl group as Ra'$^{21}$ have been substituted with the above-described halogen atoms. As the halogenated alkyl group, a fluorinated alkyl group is preferable, and a perfluoroalkyl group is particularly preferable.

In —COOR" and —OC(=O)R" as Ra'$^{21}$, R" represents a hydrogen atom, an alkyl group, a lactone-containing cyclic group, a carbonate-containing cyclic group, or a —SO$_2$-containing cyclic group.

The alkyl group as R" may be linear, branched, or cyclic, and preferably has 1 to 15 carbon atoms.

In a case where R" represents a linear or branched alkyl group, it is preferably an alkyl group having 1 to 10 carbon atoms, more preferably an alkyl group having 1 to 5 carbon atoms, and particularly preferably a methyl group or an ethyl group.

In a case where R" represents a cyclic alkyl group, the number of carbon atoms thereof is preferably in a range of 3 to 15, more preferably in a range of 4 to 12, and most preferably in a range of 5 to 10. Specific examples thereof include groups in which one or more hydrogen atoms have been removed from a monocycloalkane, which may or may not be substituted with a fluorine atom or a fluorinated alkyl group; and groups in which one or more hydrogen atoms have been removed from a polycycloalkane such as bicycloalkane, tricycloalkane, or tetracycloalkane. More specific examples thereof include groups in which one or more hydrogen atoms have been removed from a monocycloalkane such as cyclopentane or cyclohexane; and groups in which one or more hydrogen atoms have been removed from a polycycloalkane such as adamantane, norbornane, isobornane, tricyclodecane, or tetracyclododecane.

Examples of the lactone-containing cyclic group as R" include those exemplified as the groups represented by Formulae (a2-r-1) to (a2-r-7).

The carbonate-containing cyclic group as R" has the same definition as that for the carbonate-containing cyclic group described below. Specific examples of the carbonate-containing cyclic group include groups represented by Formulae (ax3-r-1) to (ax3-r-3).

The —SO$_2$-containing cyclic group as R" has the same definition as that for the —SO$_2$-containing cyclic group described below. Specific examples of the —SO$_2$-containing cyclic group include groups represented by Formulae (a5-r-1) to (a5-r-4).

The hydroxyalkyl group as Ra'$^{21}$ has preferably 1 to 6 carbon atoms, and specific examples thereof include a group in which at least one hydrogen atom in the alkyl group as Ra'$^{21}$ has been substituted with a hydroxyl group.

In Formulae (a2-r-2), (a2-r-3) and (a2-r-5), as the alkylene group having 1 to 5 carbon atoms as A", a linear or branched alkylene group is preferable, and examples thereof include a methylene group, an ethylene group, an n-propylene group, and an isopropylene group. Examples of alkylene groups that contain an oxygen atom or a sulfur atom include groups in which —O— or —S— is interposed in the terminal of the alkylene group or between the carbon atoms of the alkylene group, and examples thereof include —O—CH$_2$—, —CH$_2$—O—CH$_2$—, —S—CH$_2$—, and —CH$_2$—S—CH$_2$—. As A", an alkylene group having 1 to 5 carbon atoms or —O— is preferable, an alkylene group having 1 to 5 carbon atoms is more preferable, and a methylene group is most preferable.

Specific examples of the groups represented by Formulae (a2-r-1) to (a2-r-7) are shown below.

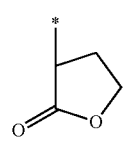

(r-Ic-1-1)

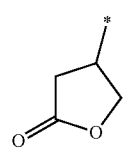

(r-Ic-1-2)

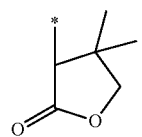

(r-Ic-1-3)

-continued
(r-Ic-1-4)
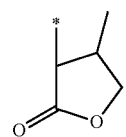
(r-Ic-1-5)
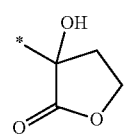
(r-Ic-1-6)
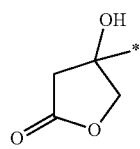
(r-Ic-1-7)
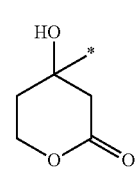
(r-Ic-2-1)
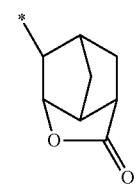
(r-Ic-2-2)
(r-Ic-2-3)
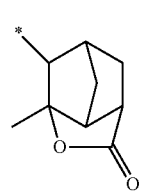
(r-Ic-2-4)
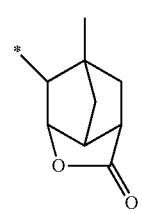
(r-Ic-2-5)
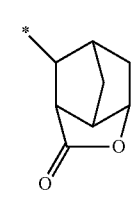
-continued
(r-Ic-2-6)
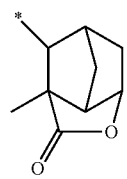
(r-Ic-2-7)
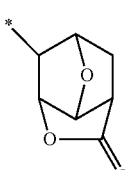
(r-Ic-2-8)
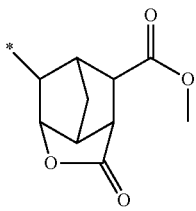
(r-Ic-2-9)
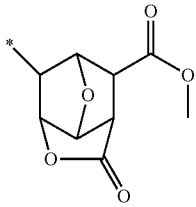
(r-Ic-2-10)
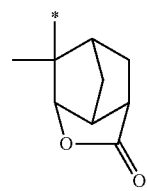
(r-Ic-2-11)
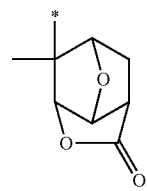
(r-Ic-2-12)
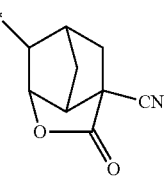
(r-Ic-2-13)
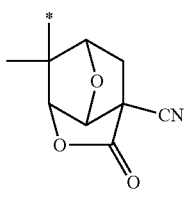

(r-Ic-2-14)
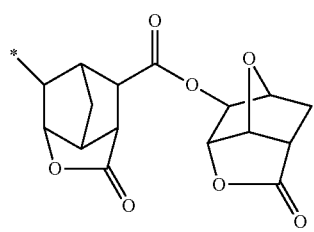
(r-Ic-2-15)
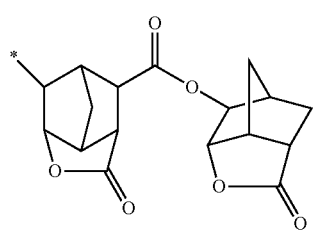
(r-Ic-2-16)
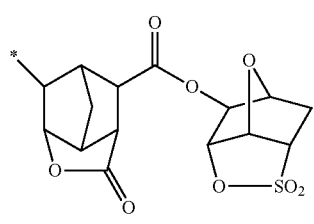
(r-Ic-2-17)
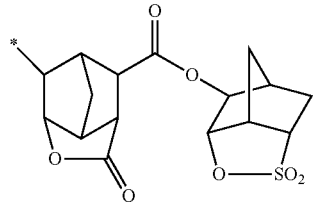
(r-Ic-2-18)
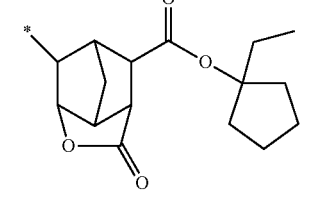
(r-Ic-3-1)
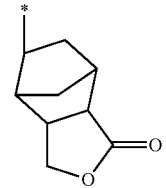
(r-Ic-3-2)
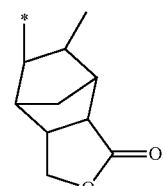
(r-Ic-3-3)
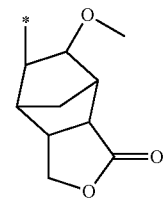
(r-Ic-3-4)
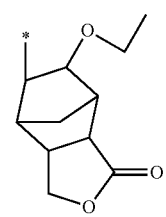
(r-Ic-3-5)
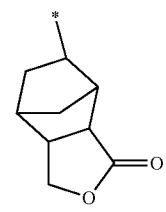
(r-Ic-4-1)
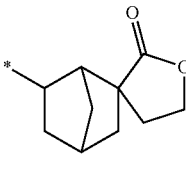
(r-Ic-4-2)
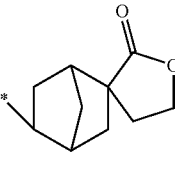
(r-Ic-4-3)
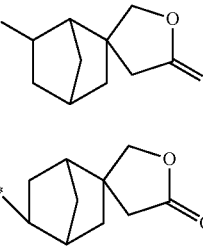
(r-Ic-4-4)
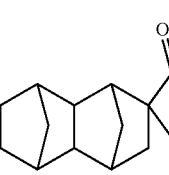
(r-Ic-4-5)
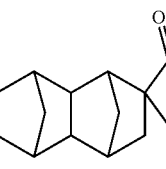
(r-Ic-4-6)

(r-Ic-4-7) 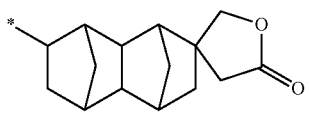

(r-Ic-4-8) 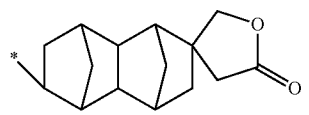

(r-Ic-4-9) 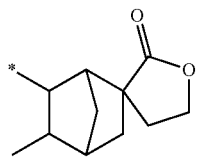

(r-Ic-5-1) 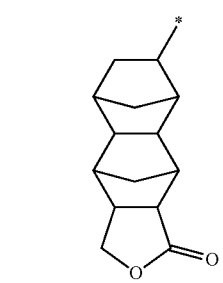

(r-Ic-5-2)

(r-Ic-5-3) 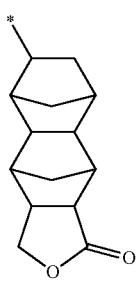

(r-Ic-5-4) 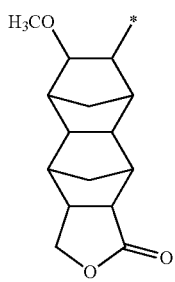

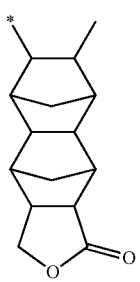

(r-Ic-6-1) 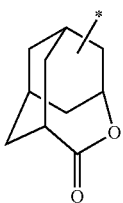

(r-Ic-7-1) 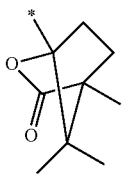

The "—SO$_2$-containing cyclic group" indicates a cyclic group having a ring containing —SO$_2$— in the ring skeleton thereof. Specifically, the —SO$_2$-containing cyclic group is a cyclic group in which the sulfur atom (S) in —SO$_2$— forms a part of the ring skeleton of the cyclic group. In a case where the ring containing —SO$_2$— in the ring skeleton thereof is counted as the first ring and the group contains only the ring, the group is referred to as a polycyclic group. Further, in a case where the group has other ring structures, the group is referred to as a polycyclic group regardless of the structures. The —SO$_2$-containing cyclic group may be a monocyclic group or a polycyclic group.

As the —SO$_2$-containing cyclic group, a cyclic group containing —O—SO$_2$— in the ring skeleton thereof, in other words, a cyclic group containing a sultone ring in which —O—S— in the —O—SO$_2$— group forms a part of the ring skeleton thereof is particularly preferable.

More specific examples of the —SO$_2$-containing cyclic group include groups represented by Formulae (a5-r-1) to (a5-r-4) shown below.

(a5-r-1) 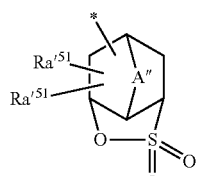

(a5-r-2) 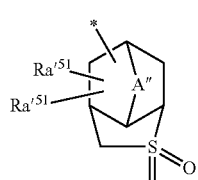

(a5-r-3) 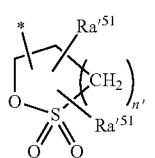

(a5-r-4)

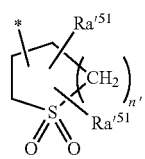

[In the formulae, each Ra'$^{51}$ independently represents a hydrogen atom, an alkyl group, an alkoxy group, a halogen atom, a halogenated alkyl group, a hydroxyl group, —COOR", —OC(=O)R", a hydroxyalkyl group, or a cyano group. R" represents a hydrogen atom, an alkyl group, a lactone-containing cyclic group, a carbonate-containing cyclic group, or a —SO$_2$-containing cyclic group. A" represents an oxygen atom, a sulfur atom or an alkylene group having 1 to 5 carbon atoms which may contain an oxygen atom or a sulfur atom. n' represents an integer of 0 to 2.]

In Formulae (a5-r-1) and (a5-r-2), A" has the same definition as that for A" in Formulae (a2-r-2), (a2-r-3) and (a2-r-5).

Examples of the alkyl group, the alkoxy group, the halogen atom, the halogenated alkyl group, —COOR", —OC(=O)R", and the hydroxyalkyl group as Ra'$^{51}$ include the same groups as those described above in the explanation of Ra'$^{21}$ in Formulae (a2-r-1) to (a2-r-7).

Specific examples of the groups represented by Formulae (a5-r-1) to (a5-r-4) are shown below. In the formulae shown below, "Ac" represents an acetyl group.

(r-sl-1-1)

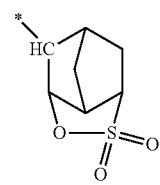

(r-sl-1-2)

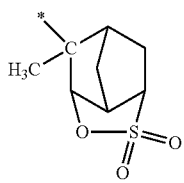

(r-sl-1-3)

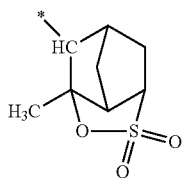

(r-sl-1-4)

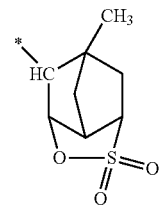

(r-sl-1-5)

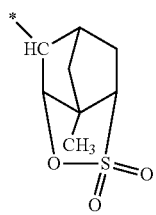

(r-sl-1-6)

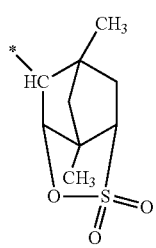

(r-sl-1-7)

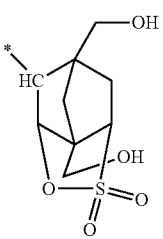

(r-sl-1-8)

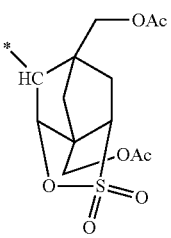

(r-sl-1-9)

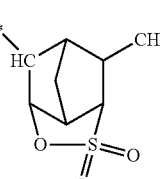

(r-sl-1-10)

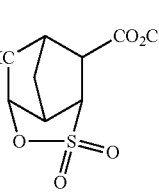

(r-sl-1-11)

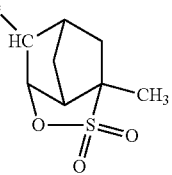

(r-sl-1-12)
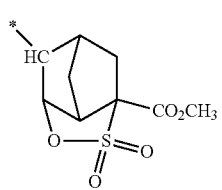
(r-sl-1-13)
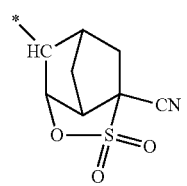
(r-sl-1-14)
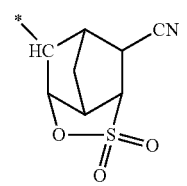
(r-sl-1-15)
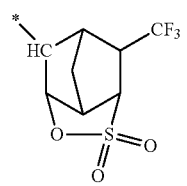
(r-sl-1-16)
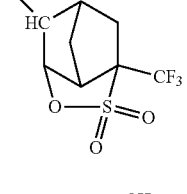
(r-sl-1-17)
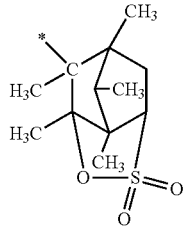
(r-sl-1-18)
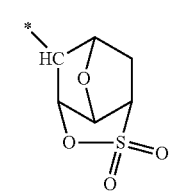
(r-sl-1-19)
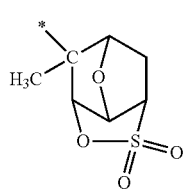
(r-sl-1-20)
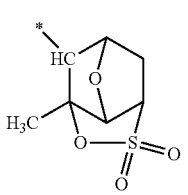
(r-sl-1-21)
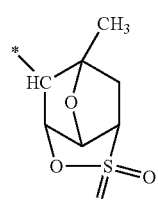
(r-sl-1-22)
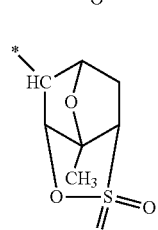
(r-sl-1-23)
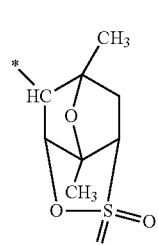
(r-sl-1-24)
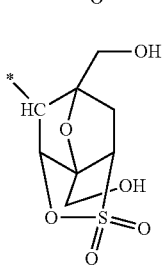
(r-sl-1-25)
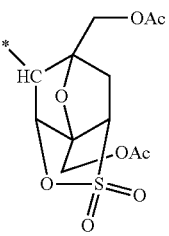
(r-sl-1-26)
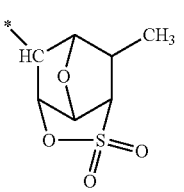

(r-sl-1-27) 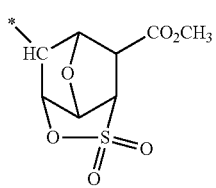

(r-sl-1-28) 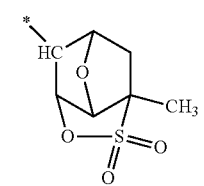

(r-sl-1-29) 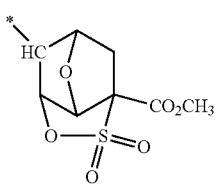

(r-sl-1-30) 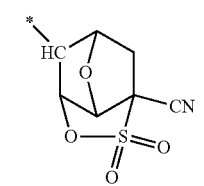

(r-sl-1-31) 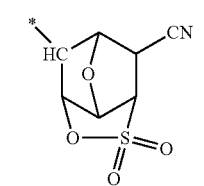

(r-sl-1-32) 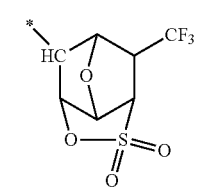

(r-sl-1-33) 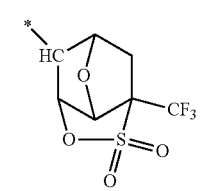

(r-sl-2-1) 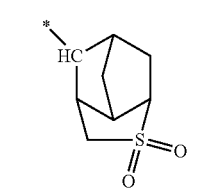

(r-sl-2-2)

(r-sl-3-1)

(r-sl-4-1)

The "carbonate-containing cyclic group" indicates a cyclic group having a ring (a carbonate ring) containing —O—C(=O)—O— in the ring skeleton thereof. In a case where the carbonate ring is counted as the first ring and the group contains only the carbonate ring, the group is referred to as a polycyclic group. Further, in a case where the group has other ring structures, the group is referred to as a polycyclic group regardless of the structures. The carbonate-containing cyclic group may be a monocyclic group or a polycyclic group.

The carbonate ring-containing cyclic group is not particularly limited, and an optional group may be used. Specific examples thereof include groups represented by Formulae (ax3-r-1) to (ax3-r-3) shown below.

(ax3-r-1) 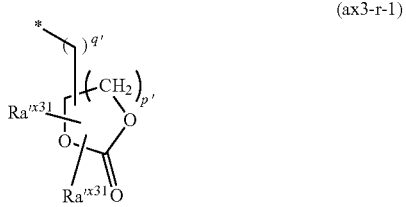

(ax3-r-2) 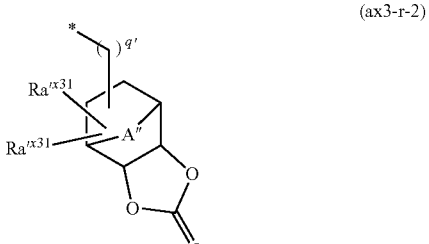

(ax3-r-3)

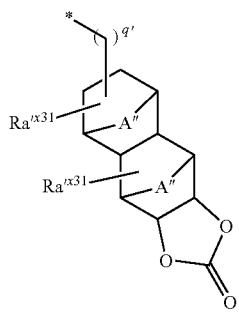

[In the formulae, each $Ra'^{x31}$ independently represents a hydrogen atom, an alkyl group, an alkoxy group, a halogen atom, a halogenated alkyl group, a hydroxyl group, —COOR″, —OC(═O)R″, a hydroxyalkyl group, or a cyano group. R″ represents a hydrogen atom, an alkyl group, a lactone-containing cyclic group, a carbonate-containing cyclic group, or a —SO$_2$-containing cyclic group. A″ represents an oxygen atom, a sulfur atom or an alkylene group having 1 to 5 carbon atoms which may contain an oxygen atom or a sulfur atom. p' represents an integer of 0 to 3, and q' represents 0 or 1]

In Formulae (ax3-r-2) and (ax3-r-3), A″ has the same definition as that for A″ in Formulae (a2-r-2), (a2-r-3) and (a2-r-5).

Examples of the alkyl group, the alkoxy group, the halogen atom, the halogenated alkyl group, —COOR″, —OC(═O)R″, and the hydroxyalkyl group as $Ra'^{31}$ include the same groups as those described above in the explanation of $Ra'^{21}$ in Formulae (a2-r-1) to (a2-r-7).

Specific examples of the groups represented by Formulae (ax3-r-1) to (ax3-r-3) are shown below.

(r-cr-1-1)

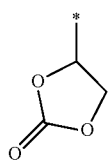

(r-cr-1-2)

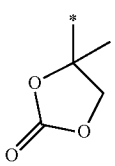

(r-cr-1-3)

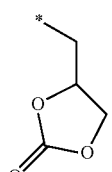

(r-cr-1-4)

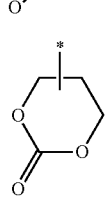

(r-cr-1-5)

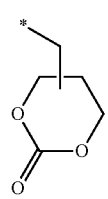

(r-cr-1-6)

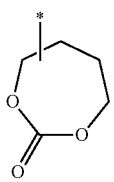

(r-cr-1-7)

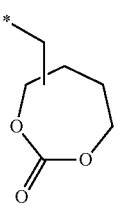

(r-cr-2-1)

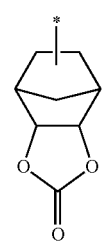

(r-cr-2-2)

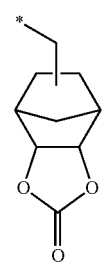

(r-cr-2-3)

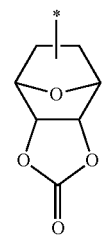

(r-cr-2-4)

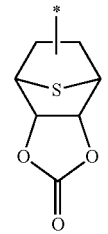

-continued (r-cr-3-1)

(r-cr-3-2)
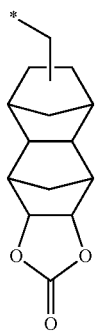

(r-cr-3-3)
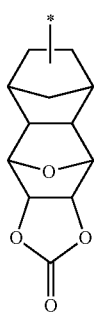

(r-cr-3-4)

(r-cr-3-5)
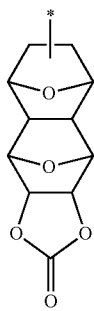

As the constitutional unit (a2), a constitutional unit derived from acrylic acid ester in which the hydrogen atom bonded to the carbon atom at the α-position may be substituted with a substituent is preferable.

It is preferable that such a constitutional unit (a2) is a constitutional unit represented by Formula (a2-1).

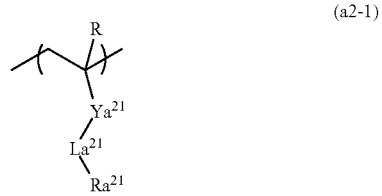

(a2-1)

[In the formula, R represents a hydrogen atom, an alkyl group having 1 to 5 carbon atoms, or a halogenated alkyl group having 1 to 5 carbon atoms. $Ya^{21}$ represents a single bond or a divalent linking group. $La^{21}$ represents —O—, —COO—, —CON(R')—, —OCO—, —CONHCO— or —CONHCS—, and R' represents a hydrogen atom or a methyl group. In a case where $La^{21}$ represents —O—, $Ya^{21}$ does not represents —CO—. $Ra^{21}$ represents a lactone-containing cyclic group, a carbonate-containing cyclic group, or a —SO$_2$-containing cyclic group.]

In Formula (a2-1), R has the same definition as described above. As R, a hydrogen atom, an alkyl group having 1 to 5 carbon atoms, or a fluorinated alkyl group having 1 to 5 carbon atoms is preferable, and a hydrogen atom or a methyl group is particularly preferable in terms of industrial availability.

In Formula (a2-1), the divalent linking group as $Ya^{21}$ is not particularly limited, and suitable examples thereof include a divalent hydrocarbon group which may have a substituent and a divalent linking group having hetero atoms. The divalent hydrocarbon group which may have a substituent and the divalent linking group having a hetero atom as $Ya^{21}$ each have the same definition as that for the divalent hydrocarbon group which may have a substituent and the divalent linking group having a hetero atom as $Ya^{x1}$ in Formula (a10-1).

As $Ya^{21}$, a single bond, an ester bond [—C(=O)—O—], an ether bond (—O—), a linear or branched alkylene group, or a combination of these is preferable.

In Formula (a2-1), $Ra^{21}$ represents a lactone-containing cyclic group, a —SO$_2$-containing cyclic group, or a carbonate-containing cyclic group.

Preferred examples of the lactone-containing cyclic group, the —SO$_2$-containing cyclic group, and the carbonate-containing cyclic group as $Ra^{21}$ include groups represented by Formulae (a2-r-1) to (a2-r-7), groups represented by Formulae (a5-r-1) to (a5-r-4), and groups represented by Formulae (ax3-r-1) to (ax3-r-3).

Among the examples, $Ra^{21}$ represents preferably a lactone-containing cyclic group or a —SO$_2$-containing cyclic group and more preferably a group represented by Formula (a2-r-1), (a2-r-2), (a2-r-6) or (a5-r-1). Specifically, a group represented by any of Chemical Formulae (r-1c-1-1) to (r-1c-1-7), (r-1c-2-1) to (r-1c-2-18), (r-1c-6-1), (r-s1-1-1), and (r-s1-1-18) is still more preferable, and a group represented by any of Formulae (r-1c-1-1) and (r-s1-1-1) is still more preferable.

The constitutional unit (a2) included in the component (A1) may be used alone or two or more kinds thereof.

In a case where the component (A1) has the constitutional unit (a2), the proportion of the constitutional unit (a2) in the component (A1) is preferably in a range of 10% to 80% by mole, more preferably in a range of 30% to 70% by mole, and still more preferably in a range of 40% to 60% by mole with respect to the total amount (100% by mole) of all constitutional units constituting the component (A1).

In a case where the proportion of the constitutional unit (a2) is greater than or equal to the lower limit of the above-described preferable range, the effect obtained by allowing the component (A1) to contain the constitutional unit (a2) can be satisfactorily achieved. On the contrary, in a case where the proportion of the constitutional unit (a2) is less than or equal to the upper limit of the above-described preferable range, the constitutional unit (a2) and other constitutional units can be balanced, and various lithography characteristics are improved.

<<Constitutional Unit (a3)>>

The component (A1) may further have a constitutional unit (a3) containing a polar group-containing aliphatic hydrocarbon group in addition to the constitutional unit (a1) (here, a constitutional unit corresponding to any of the above-described constitutional unit (a1) or (a2) is excluded). Further, in a case where the component (A1) contains the constitutional unit (a3), the lithography characteristics and the like are improved due to the effects of appropriately adjusting the acid diffusion length, increasing the adhesiveness of the resist film to the substrate, appropriately adjusting the solubility during the development, and improving the etching resistance.

Examples of the polar group include a hydroxyl group, a cyano group, a carboxy group, or a hydroxyalkyl group in which some hydrogen atoms of the alkyl group have been substituted with fluorine atoms. Among these, a hydroxyl group is particularly preferable.

Examples of the aliphatic hydrocarbon group include linear or branched hydrocarbon groups (preferably alkylene groups) having 1 to 10 carbon atoms, and cyclic aliphatic hydrocarbon groups (cyclic groups). The cyclic group may be a monocyclic group or a polycyclic group. For example, these cyclic groups can be selected appropriately from the multitude of groups that have been proposed for the resins of resist compositions for ArF excimer lasers. The cyclic group is preferably a polycyclic group and more preferably a polycyclic group having 7 to 30 carbon atoms.

Among the examples, constitutional units derived from acrylic acid ester that include an aliphatic polycyclic group containing a hydroxyl group, cyano group, carboxy group, or a hydroxyalkyl group in which some hydrogen atoms of the alkyl group have been substituted with fluorine atoms are particularly preferable. Examples of the polycyclic group include groups in which two or more hydrogen atoms have been removed from a bicycloalkane, tricycloalkane, tetracycloalkane or the like. Specific examples thereof include groups in which two or more hydrogen atoms have been removed from a polycycloalkane such as adamantane, norbornane, isobornane, tricyclodecane or tetracyclododecane. Among these polycyclic groups, groups in which two or more hydrogen atoms have been removed from adamantane, groups in which two or more hydrogen atoms have been removed from norbornane or groups in which two or more hydrogen atoms have been removed from tetracyclododecane are preferred industrially.

The constitutional unit (a3) is not particularly limited as long as the constitutional unit contains a polar group-containing aliphatic hydrocarbon group, and an optional constitutional unit may be used.

The constitutional unit (a3) is a constitutional unit derived from acrylic acid ester in which the hydrogen atom bonded to the carbon atom at the α-position may be substituted with a substituent, and a constitutional unit containing a polar group-containing aliphatic hydrocarbon group is preferable.

In a case where the hydrocarbon group in the polar group-containing aliphatic hydrocarbon group is a linear or branched hydrocarbon group having 1 to 10 carbon atoms, a constitutional unit derived from hydroxyethyl ester of acrylic acid is preferable as the constitutional unit (a3).

Further, in a case where the hydrocarbon group in the polar group-containing aliphatic hydrocarbon group is a polycyclic group, a constitutional unit represented by Formula (a3-1), a constitutional unit represented by Formula (a3-2), and a constitutional unit represented by Formula (a3-3) are preferable, and a constitutional unit represented by Formula (a3-1) is more preferable as the constitutional unit (a3).

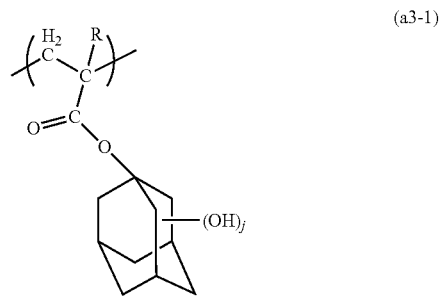

(a3-1)

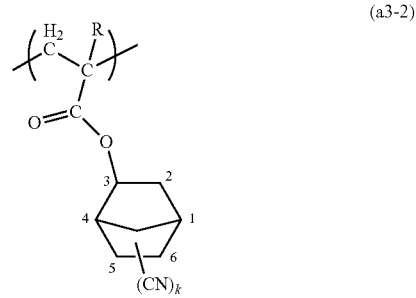

(a3-2)

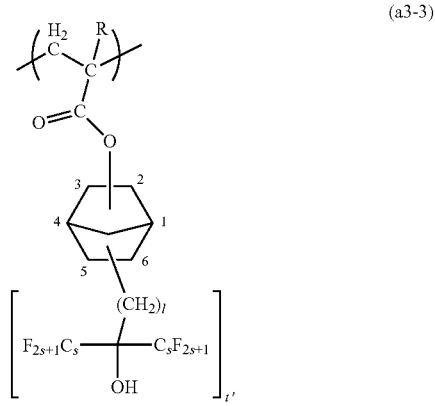

(a3-3)

[In the formulae, R has the same definition as described above, j represents an integer of 1 to 3, k represents an integer of 1 to 3, t' represents an integer of 1 to 3, l represents an integer of 1 to 5, and s represents an integer of 1 to 3.]

In Formula (a3-1), j represents preferably 1 or 2 and more preferably 1. In a case where j represents 2, it is preferable that the hydroxyl groups is bonded to the 3- and 5-positions of the adamantyl group. In a case where j represents 1, it is preferable that the hydroxyl group is bonded to the 3-position of the adamantyl group.

It is preferable that j represents 1, and it is particularly preferable that the hydroxyl group is bonded to the 3-position of the adamantyl group.

In Formula (a3-2), k represents preferably 1. The cyano group is preferably bonded to the 5- or 6-position of the norbornyl group.

In Formula (a3-3), it is preferable that t' represents 1. It is preferable that 1 represents 1. It is preferable that s represents 1. Further, it is preferable that a 2-norbornyl group or 3-norbornyl group is bonded to the terminal of the carboxy group of the acrylic acid. It is preferable that the fluorinated alkyl alcohol is bonded to the 5- or 6-position of the norbornyl group.

The constitutional unit (a3) included in the component (A1) may be used alone or two or more kinds thereof.

In a case where the component (A1) has the constitutional unit (a3), the proportion of the constitutional unit (a3) in the component (A1) is preferably in a range of 1% to 40% by mole, more preferably in a range of 2% to 30% by mole, still more preferably in a range of 5% to 25% by mole, and particularly preferably in a range of 5% to 20% by mole with respect to the total amount (100% by mole) of all constitutional units constituting the component (A1).

In a case where the proportion of the constitutional unit (a3) is greater than or equal to the lower limit of the above-described preferable range, the effect obtained by allowing the component (A1) to contain the constitutional unit (a3) can be satisfactorily achieved. On the contrary, in a case where the proportion of the constitutional unit (a3) is less than or equal to the upper limit of the above-described preferable range, the constitutional unit (a3) and other constitutional units can be balanced, and various lithography characteristics are improved.

<<Other Constitutional Units>>

The component (A1) may have constitutional units other than the constitutional unit (a1), the constitutional unit (a10), the constitutional unit (a2), and the constitutional unit (a3) described above.

Examples of other constitutional units include a constitutional unit (a9) represented by Formula (a9-1), a constitutional unit derived from styrene, a constitutional unit derived from a styrene derivative (here, a constitutional unit corresponding to the constitutional unit (a10) is excluded), and a constitutional unit containing an acid non-dissociable aliphatic cyclic group.

Constitutional Unit (a9):

The constitutional unit (a9) is a constitutional unit represented by Formula (a9-1).

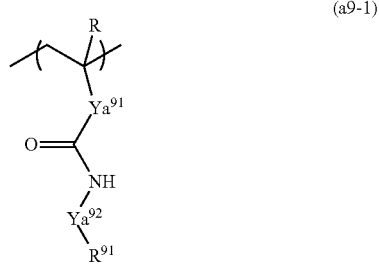

(a9-1)

[In the formula, R represents a hydrogen atom, an alkyl group having 1 to 5 carbon atoms, or a halogenated alkyl group having 1 to 5 carbon atoms. $Ya^{91}$ represents a single bond or a divalent linking group. $Ya^{92}$ represents a divalent linking group. $R^{91}$ represents a hydrocarbon group which may have a substituent.]

In Formula (a9-1), R has the same definition as described above.

As R, a hydrogen atom, an alkyl group having 1 to 5 carbon atoms, or a fluorinated alkyl group having 1 to 5 carbon atoms is preferable, and a hydrogen atom or a methyl group is particularly preferable in terms of industrial availability.

In Formula (a9-1), examples of the divalent linking group as $Ya^{91}$ include those exemplified as the divalent linking group represented by $Ya^{x1}$ in formula (a10-1). Among these, it is preferable that $Ya^{91}$ represents a single bond.

In Formula (a9-1), examples of the divalent linking group as $Ya^{92}$ include those exemplified as the divalent linking group represented by $Ya^{x1}$ in formula (a10-1).

In the divalent linking group as $Ya^{92}$, a linear or branched aliphatic hydrocarbon group is preferable as the divalent hydrocarbon group which may have a substituent.

Further, in the divalent linking group as $Ya^{92}$, examples of the divalent linking group having a hetero atom include —O—, —C(=O)—O—, —C(=O)—, —O—C(=O)—O—, —C(=O)—NH—, —NH—, —NH—C(=NH)— (H may be substituted with a substituent such as an alkyl group or an acyl group), —S—, —S(=O)$_2$—, —S(=O)$_2$—O—, and a group represented by Formula: —$Y^{21}$—O—$Y^{22}$—, —$Y^{21}$—O—, —$Y^{21}$—C(=O)—O—, —C(=O)—O—$Y^{21}$—, [$Y^{21}$—C(=O)—O]$_m$'—$Y^{22}$—, or —$Y^{21}$—O—C(=O)—$Y^{22}$— [in the formulae, $Y^{21}$ and $Y^{22}$ each independently represent a divalent hydrocarbon group which may have a substituent, 0 represents an oxygen atom, and m' represents an integer of 0 to 3]. Among these, —C(=O)— or —C(=S)— is preferable.

In Formula (a9-1), examples of the hydrocarbon group as R91 include an alkyl group, a monovalent alicyclic hydrocarbon group, an aryl group, and an aralkyl group.

The alkyl group as $R^{91}$ has preferably 1 to 8 carbon atoms, more preferably 1 to 6 carbon atoms, and still more preferably 1 to 4 carbon atoms and may be linear or branched.

Specific preferred examples thereof include a methyl group, an ethyl group, a propyl group, a butyl group, a hexyl group, and an octyl group. The monovalent alicyclic hydrocarbon group as $R^{91}$ has preferably 3 to 20 carbon atoms and more preferably 3 to 12 carbon atoms and may be polycyclic or monocyclic. As the monocyclic alicyclic hydrocarbon group, a group in which one or more hydrogen atoms have been removed from a monocycloalkane is preferable. It is preferable that the monocycloalkane has 3 to 6 carbon atoms, and specific examples thereof include cyclobutane, cyclopentane, and cyclohexane. A group in which one or more hydrogen atoms have been removed from a polycycloalkane is preferable as the polycyclic alicyclic hydrocarbon group. As the polycycloalkane, a group having 7 to 12 carbon atoms is preferable, and specific examples thereof include adamantane, norbornane, isobornane, tricyclodecane, and tetracyclododecane.

As the aryl group represented by $R^{91}$, an aryl group having 6 to 18 carbon atoms is preferable and an aryl group having 6 to 10 carbon atoms is more preferable. Specifically, a phenyl group is particularly preferable.

As the aralkyl group represented by $R^{91}$, an aralkyl group in which an alkylene group having 1 to 8 carbon atoms are bonded to the "aryl group as $R^{91}$" is preferable, an aralkyl group in which an alkylene group having 1 to 6 carbon atoms are bonded to the "aryl group as $R^{91}$" is more preferable, and an aralkyl group in which an alkylene group having 1 to 4 carbon atoms are bonded to the "aryl group as R$^{91}$" is particularly preferable.

In the hydrocarbon group as R$^{91}$, it is preferable that some or all hydrogen atoms in the hydrocarbon group are substituted with fluorine atoms and more preferable that 30% to 100% of hydrogen atoms in the hydrocarbon group are substituted with fluorine atoms. Among examples, a perfluoroalkyl group in which all hydrogen atoms in the alkyl group have been substituted with fluorine atoms is particularly preferable.

The hydrocarbon group as R$^{91}$ may have a substituent. Examples of the substituent include a halogen atom, an oxo group (=O), a hydroxyl group (—OH), an amino group (—NH$_2$), and —SO$_2$—NH$_2$. Further, some carbon atoms constituting the hydrocarbon group may be substituted with a substituent having a hetero atom. Examples of the substituent having a hetero atom include —O—, —NH—, —N=, —C(=O)—O—, —S—, —S(=O)$_2$—, and —S(=O)$_2$—O—.

Examples of the hydrocarbon group having a substituent as R$^{91}$ include lactone-containing cyclic groups respectively represented by Formulae (a2-r-1) to (a2-r-7).

Further, examples of the hydrocarbon group having a substituent as R$^{91}$ include —SO$_2$-containing cyclic groups respectively represented by Formulae (a5-r-1) to (a5-r-4), a substituted aryl group represented by the following chemical formula, and a monovalent heterocyclic group.

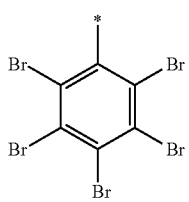

(r-ar-1)

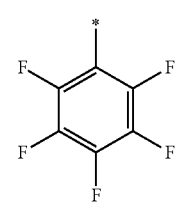

(r-ar-2)

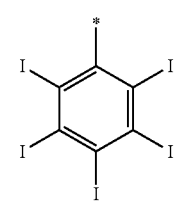

(r-ar-3)

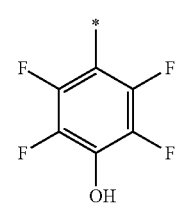

(r-ar-4)

-continued

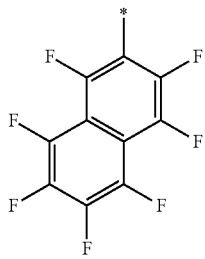

(r-ar-5)

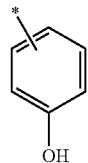

(r-ar-6)

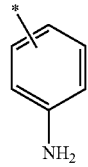

(r-ar-7)

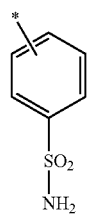

(r-ar-8)

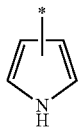

(r-hr-1)

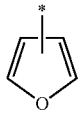

(r-hr-2)

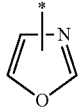

(r-hr-3)

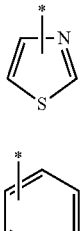

(r-hr-4)

(r-hr-5)

(r-hr-6) 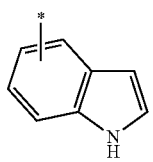

(r-hr-7) 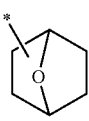

(r-hr-8) 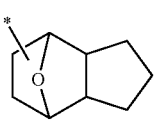

(r-hr-9) 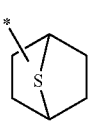

(r-hr-10) 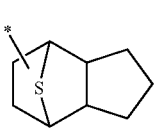

(r-hr-11) 

(r-hr-12) 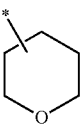

(r-hr-13) 

(r-hr-14) 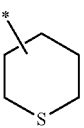

(r-hr-15) 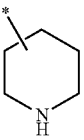

(r-hr-16) 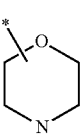

Among examples of the constitutional unit (a9), a constitutional unit represented by Formula (a9-1-1) is preferable.

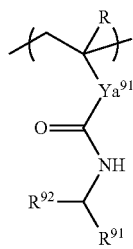

(a9-1-1)

[In the formula, R has the same definition as described above, $Ya^{91}$ represents a single bond or a divalent linking group, $R^{91}$ represents a hydrocarbon group which may have a substituent, and $R^{92}$ represents an oxygen atom or a sulfur atom.]

In Formula (a9-1-1), $Ya^{91}$, $R^{91}$, and R each have the same definition as described above. Further, $R^{92}$ represents an oxygen atom or a sulfur atom.

Hereinafter, specific examples of the constitutional unit represented by Formula (a9-1) or (a9-1-1) will be described. In the formulae, $R^{\alpha}$ represents a hydrogen atom, a methyl group, or a trifluoromethyl group.

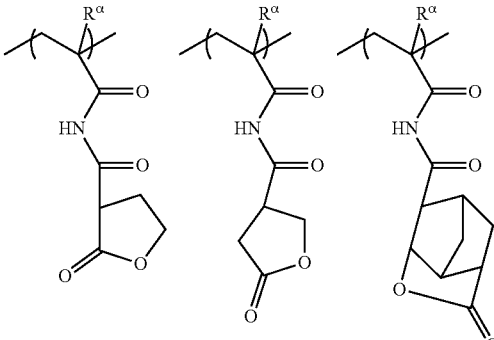

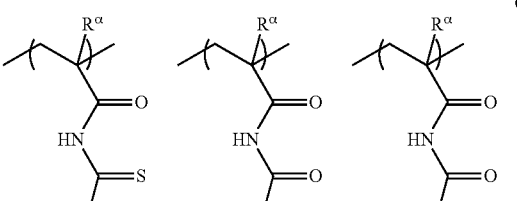

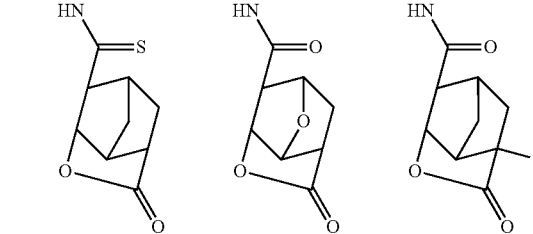

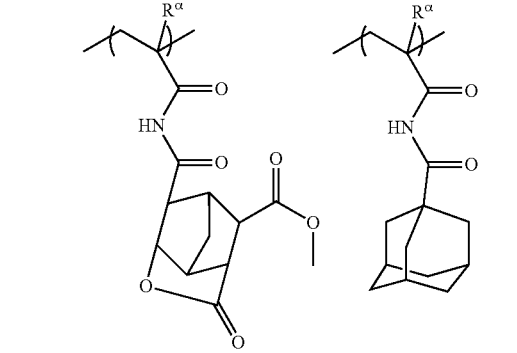

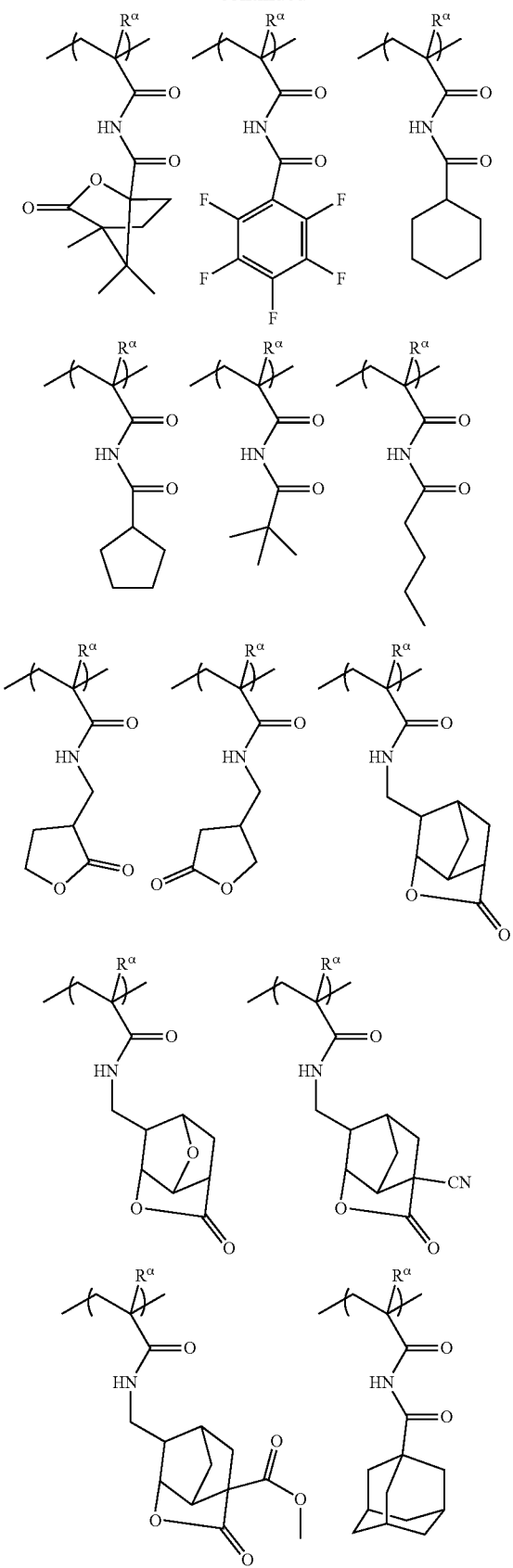

The constitutional unit (a9) in the component (A1) may be used alone or in combination of two or more kinds thereof.

In a case where the component (A1) contains the constitutional unit (a9), the proportion of the constitutional unit (a9) is preferably in a range of 1% to 40% by mole, more preferably in a range of 3% to 30% by mole, still more preferably in a range of 5% to 25% by mole, and particularly preferably in a range of 10% to 20% by mole with respect to the total amount (100% by mole) of all constitutional units constituting the component (A1).

Further, in a case where the proportion of the constitutional unit (a9) is set to be greater than or equal to the lower limit of the above-described preferable range, the effects of appropriately adjusting the acid diffusion length, increasing the adhesiveness of the resist film to the substrate, appropriately adjusting the solubility during the development, and improving the etching resistance are obtained. Further, in a case where the proportion of the constitutional unit (a9) is set to be less than or equal to the upper limit of the above-described preferable range, various lithography characteristics are improved.

The component (A1) contained in the resist composition may be used alone or in combination of two or more kinds thereof.

It is preferable that the component (A1) contains a polymer compound (A1-1) (hereinafter, also referred to as a component (A1-1)) having the constitutional unit (a1).

Preferred examples of the component (A1-1) include a polymer compound having a repeating structure of the constitutional unit (a1) and the constitutional unit (a10) and a polymer compound having a repeating structure of the constitutional unit (a1) and the constitutional unit (a2).

In addition to the combination of two constitutional units described above, any of the above-described constitutional unit may be appropriately combined according to the desired effect as the third constitutional unit or three or more constitutional units. Preferred examples of the third constitutional unit include the constitutional unit (a3).

The component (A1) can be produced by dissolving a monomer, from which each constitutional unit is derived, in a polymerization solvent and adding a radical polymerization initiator such as azobisisobutylonitrile (AIBN) or dimethyl azobisisobutyrate (for example, V-601) to the solution so that the polymerization is carried out. Alternatively, such a component (A1) can be produced by dissolving a monomer from which the constitutional unit (a1) is derived and a precursor monomer (a monomer in which the functional group is protected) from which constitutional units other than the constitutional unit (a1) are derived as necessary in a polymerization solvent, adding the above-described radical polymerization initiator to the solution, and performing a deprotection reaction. Further, a —C(CF$_3$)$_2$—OH group may be introduced into the terminal of the component (A1) during the polymerization using a chain transfer agent such as HS—CH$_2$—CH$_2$—CH$_2$—C(CF$_3$)$_2$—OH together. As described above, a copolymer into which a hydroxyalkyl group, formed by substitution of some hydrogen atoms in the alkyl group with fluorine atoms, has been introduced is effective for reducing development defects and reducing line edge roughness (LER: uneven irregularities of a line side wall).

The mass average molecular weight (Mw) (in terms of polystyrene according to gel permeation chromatography (GPC)) of the component (A1) is not particularly limited, but is preferably in a range of 1000 to 50000, more preferably in a range of 2000 to 30000, and still more preferably in a range of 3000 to 20000.

In a case where the Mw of the component (A1) is less than or equal to the upper limit of the above-described preferable range, the resist composition exhibits a satisfactory solubility in a resist solvent for a resist enough to be used as a resist. On the other hand, in a case where the Mw of the component (A1) is greater than or equal to the lower limit of the above-described preferable range, dry etching resistance and the cross-sectional shape of the resist pattern become excellent.

Further, the dispersity (Mw/Mn) of the component (A1) is not particularly limited, but is preferably in a range of 1.0 to 4.0, more preferably in a range of 1.0 to 3.0, and particularly preferably in a range of 1.0 to 2.0. Further, Mn represents the number average molecular weight.

In Regard to Component (A2)

In the resist composition of the present embodiment, a base material component (hereinafter, referred to as a "component (A2)") which does not correspond to the component (A1) and whose solubility in a developing solution is changed due to the action of an acid may be used in combination as the component (A).

The component (A2) is not particularly limited, and may be optionally selected from those known in the related art as the base material components for a chemically amplified resist composition.

In the component (A2), a polymer compound or a low molecular weight compound may be used alone or in combination of two or more kinds thereof.

The proportion of the component (A1) in the component (A) is preferably 25% by mass or greater, more preferably 50% by mass or greater, still more preferably 75% by mass or greater, and may be 100% by mass with respect to the total mass of the component (A). In a case where the proportion of the component (A1) is 25% by mass or greater, a resist pattern with improved various lithography characteristics, such as high sensitivity, the resolution, and roughness reduction, can be reliably formed. Such effects are significantly exhibited particularly in the lithography using electron beams or EUV.

In the resist composition of the present embodiment, the content of the component (A) may be appropriately adjusted according to the film thickness of a resist intended to be formed.

<Compound (D0)>

In the resist composition according to the present embodiment, a component (D0) is a compound formed of an anion moiety and a cation moiety which is represented by Formula (d0) and in which the cation moiety of the compound (D0) has a Log P value of less than 7.7.

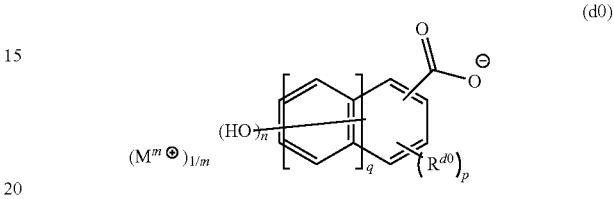

(d0)

[In the formula, M$^{m+}$ represents an m-valent organic cation. R$^{d0}$ represents a substituent. p represents an integer of 0 to 3. In a case where p represents 2 or 3, a plurality of substituents as R$^{d0}$ may be the same as or different from one another. q represents an integer of 0 to 3. n represents an integer of 2 or greater. Here, a relationship of "n+p≤(q×2)+5" is satisfied.]

In Regard to Anion Moiety

In Formula (d0), R$^{d0}$ represents a substituent. Examples of the substituent include a hydrocarbon group, an alkoxy group, an acyl group, and a hydroxyalkyl group.

Examples of the hydrocarbon group as the substituent include a linear or branched alkyl group, an aliphatic cyclic hydrocarbon group, and an aromatic hydrocarbon group.

As the linear or branched alkyl group, a linear or branched alkyl group having 1 to 5 carbon atoms is preferable, and specific examples thereof include a methyl group, an ethyl group, a propyl group, an n-butyl group, a tert-butyl group, and a pentyl group.

As the aliphatic cyclic hydrocarbon group, an aliphatic cyclic hydrocarbon group having 3 to 6 carbon atoms is preferable, and specific examples thereof include a cyclopropyl group, a cyclobutyl group, a cyclopentyl group, and a cyclohexyl group.

As the aromatic hydrocarbon group, an aromatic hydrocarbon group having 6 to 30 carbon atoms is preferable, and specific examples thereof include a group formed by removing one hydrogen atom from an aromatic hydrocarbon ring such as benzene, biphenyl, fluorene, naphthalene, anthracene, or phenanthrene. Among these, a group (phenyl group) formed by removing one hydrogen atom from benzene is more preferable.

As the alkoxy group as the substituent, an alkoxy group having 1 to 5 carbon atoms is preferable, and specific examples thereof include a methoxy group, an ethoxy group, a propoxy group, an n-butoxy group, a tert-butoxy group, and a pentyloxy group. Among these, a methoxy group is more preferable.

As the acyl group as the substituent, an acyl group having 1 to 3 carbon atoms is preferable, and specific examples thereof include a formyl group, an acetyl group, and a propionyl group.

As the hydroxyalkyl group as the substituent, a hydroxyalkyl group having 1 to 5 carbon atoms is preferable, and specific examples thereof include a hydroxymethyl group, a hydroxyethyl group, a hydroxypropyl group, a hydroxybutyl group, and a hydroxypentyl group.

In Formula (d0), p represents an integer of 0 to 3. In a case where p represents 2 or 3, a plurality of substituents as $R^{d0}$ may be the same as or different from one other. Among these, it is preferable that p represents an integer of 0 to 2.

In Formula (d0), q represents an integer of 0 to 3. That is, in the anion moiety in Formula (d0), the structure becomes a benzene structure in a case where q represents 0, a naphthalene structure in a case where q represents 1, an anthracene structure in a case where q represents 2, and a tetracene structure in a case where q represents 3.

Further, the relationship of "n+p≤(q×2)+5" is satisfied. In other words, in the benzene structure, the naphthalene structure, the anthracene structure, and the tetracene structure, all hydrogen atoms other than the hydrogen atoms substituted with the carboxylate group may be respectively substituted with the above-described substituent or a hydroxy group. Here, the anion moiety in Formula (d0) contains at least two hydroxy groups.

Hereinafter, specific preferred examples of the anion moiety in the component (D0) will be described.

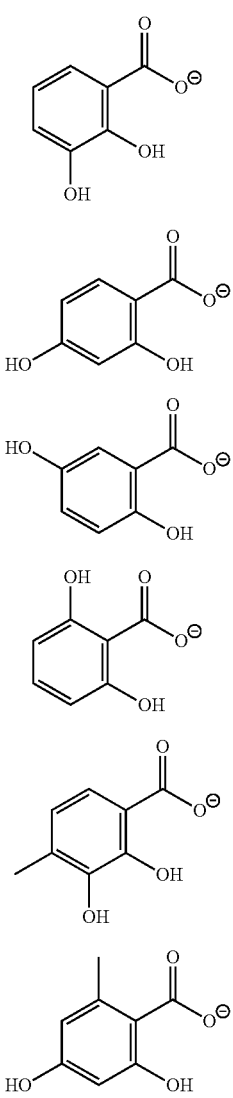

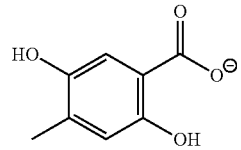
(an-d0-7)

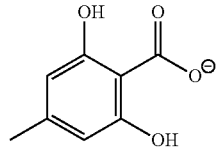
(an-d0-8)

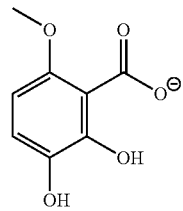
(an-d0-9)

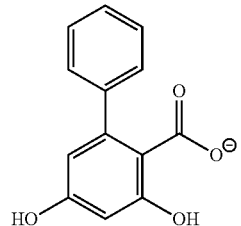
(an-d0-10)

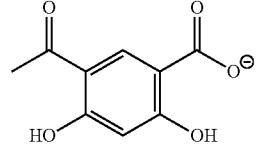
(an-d0-11)

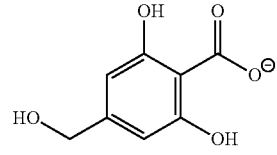
(an-d0-12)

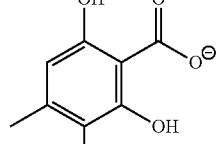
(an-d0-13)

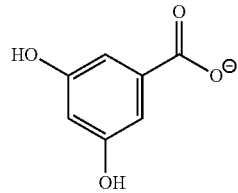
(an-d0-14)

-continued
(an-d0-15)
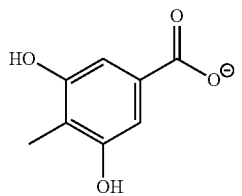
(an-d0-16)
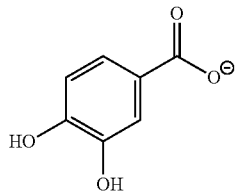
(an-d0-17)
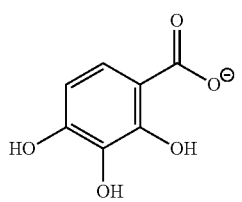
(an-d0-18)
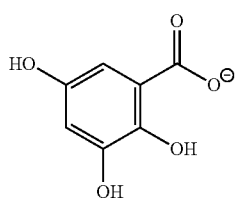
(an-d0-19)
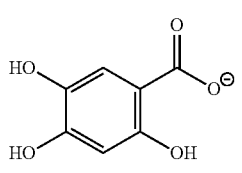
(an-d0-20)
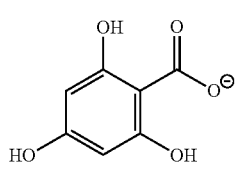
(an-d0-21)
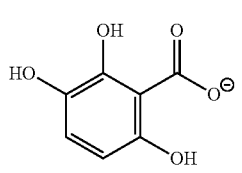
(an-d0-22)
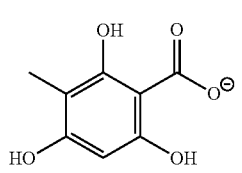
(an-d0-23)
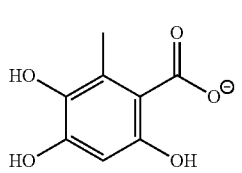
-continued
(an-d0-24)
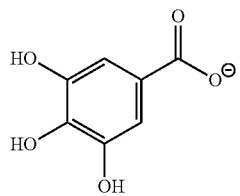
(an-d0-25)
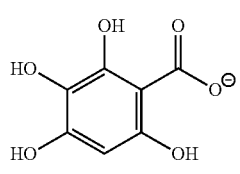
(an-d0-26)
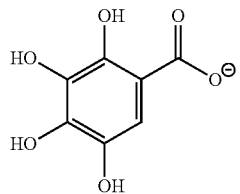
(an-d0-27)
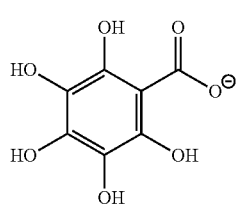
(an-d0-28)
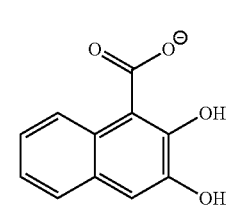
(an-d0-29)
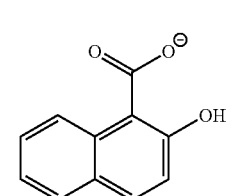
(an-d0-30)
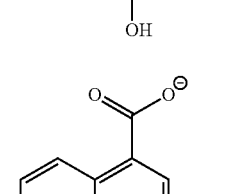

(an-d0-31)
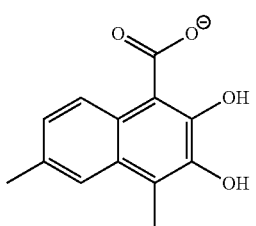
(an-d0-32)
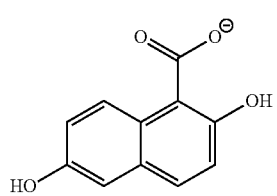
(an-d0-33)
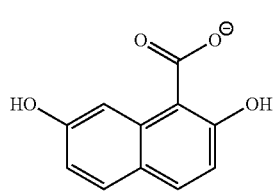
(an-d0-34)
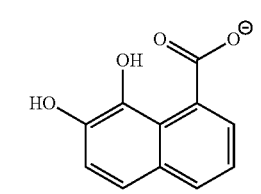
(an-d0-35)
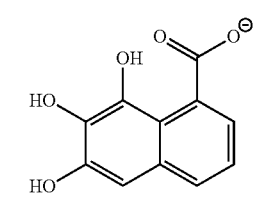
(an-d0-36)
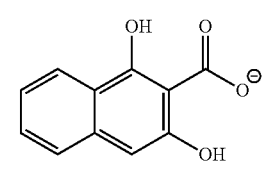
(an-d0-37)
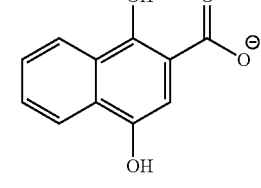
(an-d0-38)
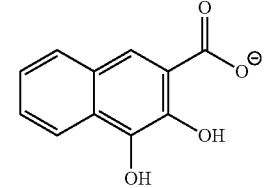
(an-d0-39)
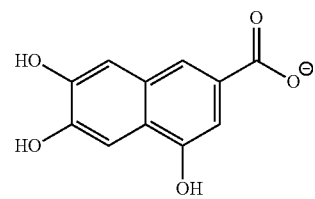
(an-d0-40)
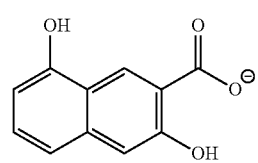
(an-d0-41)
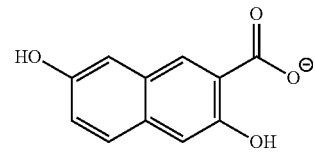
(an-d0-42)
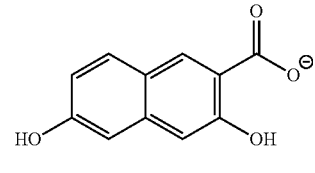
(an-d0-43)
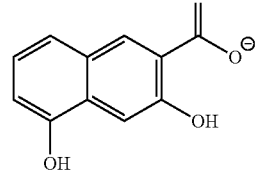
(an-d0-44)
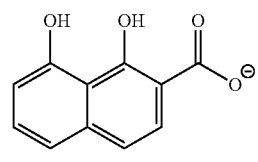
(an-d0-45)
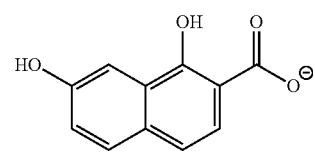
(an-d0-46)
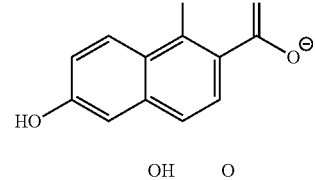
(an-d0-47)
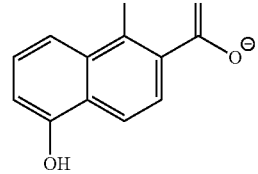

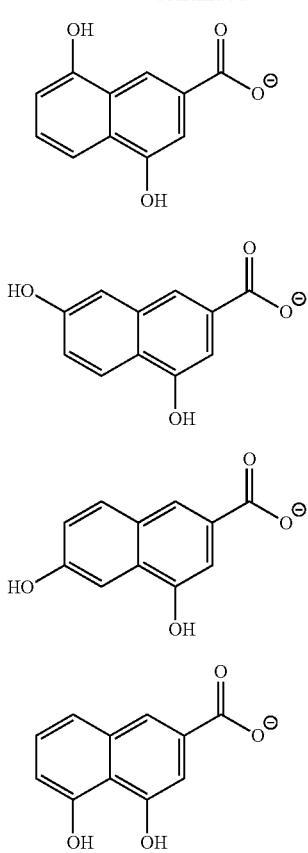

(an-d0-48)

(an-d0-49)

(an-d0-50)

(an-d0-51)

Among the examples shown above, an anion represented by any of Chemical Formulae (an-d0-2) to (an-d0-4), (an-d0-8), and (an-d0-37) is more preferable as the anion moiety in the component (D0).

In Regard to Cation Moiety $((M^{m+})_{1/m})$

In Formula (d0), $M^{m+}$ represents an m-valent organic cation. m represents an integer of 1 or greater.

The Log P value of the organic cation (the cation moiety in the component (D0)) is less than 7.7.

The "Log P value" indicates a logarithmic value of a partition coefficient ($P_{ow}$) between octanol and water. The "Log P value" is an effective parameter for characterizing the hydrophilicity and hydrophobicity of a wide range of compounds. The partition coefficient is typically acquired by calculation regardless of experiment. In the present invention, the partition coefficient indicates a value calculated based on CAChe Work System Pro Version 6. 1. 12. 33.

The hydrophilicity increases as the Log P value to a plus side across 0, and the water solubility increases (high polarity) as an absolute value increases on a minus side. The Log P value has a negative correlation with the water solubility of an organic compound and is widely used as a parameter for estimating the hydrophilicity and hydrophobicity of an organic compound.

In a case where the Log P value of the organic cation (the cation moiety of the component (D0)) is less than 7.7, the solubility during development of the resist film can be appropriately adjusted. Therefore, the lithography characteristics (reduction in roughness and the like) can be improved during formation of the resist pattern.

The Log P value of the organic cation (the cation moiety of the component (D0)) is preferably 1.0 or greater and less than 7.7, more preferably in a range of 1.7 to 7.5, and still more preferably in a range of 3.0 to 7.0.

In a case where the Log P value of the organic cation (the cation moiety of the component (D0)) is set to be in the above-described range, the lithography characteristics (reduction in roughness and the like) can be improved.

As the organic cation as $M^{m+}$, a sulfonium cation or an iodonium cation is preferable.

As the cation moiety in the component (D0), a cation represented by Formula (ca-d0) is more preferable.

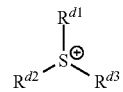

(ca-d0)

[In the formula, $R^{d1}$ represents an aryl group which may have a substituent. $R^{d2}$ and $R^{d3}$ each independently represent an aryl group which may have a substituent or may be bonded to each other to form a ring with a sulfur atom in the formula.]

In Formula (ca-d0), $R^{d1}$ represents an aryl group which may have a substituent. Specific examples of the aryl group include a group formed by removing one hydrogen atom from an aromatic hydrocarbon ring such as benzene, naphthalene, anthracene, phenanthrene, biphenyl, or fluorene. Among these, as the aryl group represented by $R^{d1}$ to $R^{d3}$, a group (a phenyl group or a naphthyl group) formed by removing one hydrogen atom from benzene or naphthalene is preferable, and a group (a phenyl group) formed by removing one hydrogen atom from benzene is more preferable.

Examples of the substituent which may be included in $R^{d1}$ include an alkyl group, a halogen atom, a halogenated alkyl group, a carbonyl group, a cyano group, an amino group, an aryl group, and groups respectively represented by Formulae (ca-r-1) to (ca-r-7).

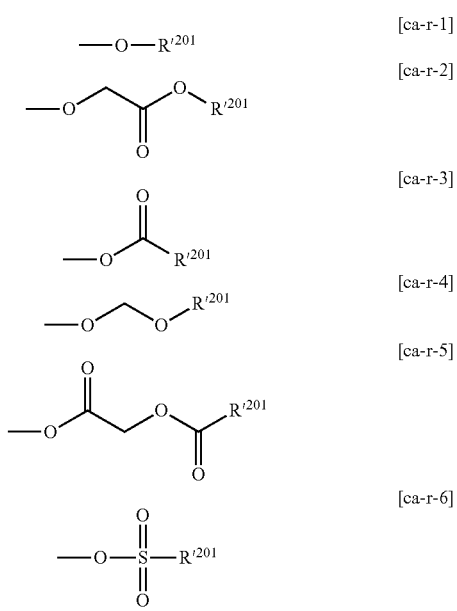

[ca-r-7]

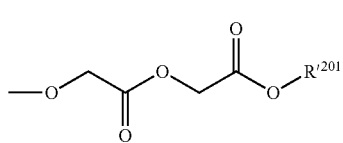

[In the formulae, $R'^{201}$'s each independently represent a hydrogen atom, a cyclic group which may have a substituent, a chain-like alkyl group which may have a substituent, or a chain-like alkenyl group which may have a substituent.]

A cyclic hydrocarbon group is preferable as the cyclic group which may have a substituent as $R'^{201}$, and the cyclic hydrocarbon group may be an aromatic hydrocarbon group or an aliphatic hydrocarbon group. The aliphatic hydrocarbon group indicates a hydrocarbon group that has no aromaticity. The aliphatic hydrocarbon group may be saturated or unsaturated. In general, it is preferable that the aliphatic hydrocarbon group is saturated. Among examples, an aliphatic hydrocarbon group is preferable, and a group formed by removing one or more hydrogen atoms from a monocycloalkane is preferable. Specific examples thereof include cyclopentane and cyclohexane.

Further, a linear or branched alkyl group may be bonded to the aliphatic hydrocarbon group. The number of carbon atoms in the linear or branched alkyl group is preferably in a range of 1 to 10, more preferably in a range of 1 to 6, still more preferably in a range of 1 to 4, and most preferably in a range of 1 to 3. As the linear or branched alkyl group, a linear or branched alkyl group having 1 to 5 carbon atoms is preferable, and specific examples thereof include a methyl group, an ethyl group, a propyl group, an n-butyl group, a tert-butyl group, and a pentyl group.

Examples of the substituent which may be included in the cyclic group as $R'^{201}$ include those exemplified as the substituent which may be included in $R^{d1}$.

The chain-like alkyl group which may have a substituent as $R'^{201}$ may be linear or branched.

The linear alkyl group has preferably 1 to 20 carbon atoms, more preferably 1 to 15 carbon atoms, and most preferably 1 to 10 carbon atoms. Specific examples thereof include a methyl group, an ethyl group, a propyl group, a butyl group, a pentyl group, a hexyl group, a heptyl group, an octyl group, a nonyl group, a decanyl group, an undecyl group, a dodecyl group, a tridecyl group, an isotridecyl group, a tetradecyl group, a pentadecyl group, a hexadecyl group, an isohexadecyl group, a heptadecyl group, an octadecyl group, a nonadecyl group, an icosyl group, a henicosyl group, and a docosyl group.

The branched alkyl group has preferably 3 to 20 carbon atoms, more preferably 3 to 15, and most preferably 3 to 10. Specific examples thereof include a 1-methylethyl group, a 1-methylpropyl group, a 2-methylpropyl group, a 1-methylbutyl group, a 2-methylbutyl group, a 3-methylbutyl group, a 1-ethylbutyl group, a 2-ethylbutyl group, a 1-methylpentyl group, a 2-methylpentyl group, a 3-methylpentyl group, a 4-methylpentyl group, and a tert-butyl group.

Among the examples, as the chain-like alkyl group which may have a substituent as $R'^{201}$, a methyl group or a tert-butyl group is preferable.

Such a chain-like alkenyl group as $R'^{201}$ may be linear or branched, and the number of carbon atoms thereof is preferably in a range of 2 to 10, more preferably in a range of 2 to 5, still more preferably in a range of 2 to 4, and particularly preferably 3.

Examples of the linear alkenyl group include a vinyl group, a propenyl group (an allyl group), and a butynyl group. Examples of the branched alkenyl group include a 1-methylvinyl group, a 2-methylvinyl group, a 1-methylpropenyl group, and a 2-methylpropenyl group.

Among these, as the substituent which may be included in $R^{d1}$, one or more substituents selected from the group consisting of an alkyl group, a group represented by Formula (ca-r-1), and a group represented by Formula (ca-r-2) are preferable.

In Formula (ca-d0), $R^{d2}$'s and Rd's each independently represent an aryl group which may have a substituent or may be bonded to each other to form a ring with a sulfur atom in the formula.

The aryl group which may have a substituent as $R^{d2}$ and $R^{d3}$ has the same definition as described in the section of $R^{d1}$.

$R^{d2}$ and $R^{d3}$ are bonded to one another to form a ring with a sulfur atom in the formula, these groups may be bonded to one another via a hetero atom such as a sulfur atom, an oxygen atom or a nitrogen atom, or a functional group such as a carbonyl group, —SO—, —SO$_2$—, —SO$_3$—, —COO—, —CONH— or —N(RN)— (here, RN represents an alkyl group having 1 to 5 carbon atoms). As a ring to be formed, a ring containing the sulfur atom in the formula in the ring skeleton thereof is preferably a 3- to 10-membered ring and most preferably a 5- to 7-membered ring including the sulfur atom. Specific examples of the ring to be formed include a thiophene ring, a thiazole ring, a thianthrene ring, a benzothiophene ring, a dibenzothiophene ring, a 9H-thioxanthene ring, a thioxanthone ring, a phenoxathiin ring, a tetrahydrothiophenium ring, and a tetrahydrothiopyranium ring.

Hereinafter, specific examples of the cation moiety in the compound (D0) will be described. The Log P values of the cation moieties are all less than 7.7.

(ca-d0-1-1)

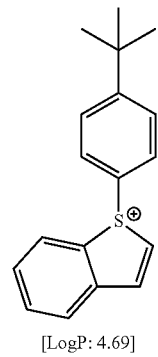

[LogP: 4.69]

(ca-d0-1-2)

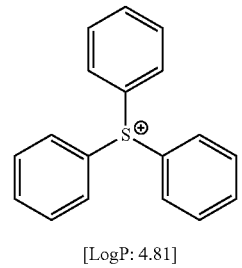

[LogP: 4.81]

-continued
(ca-d0-1-3)
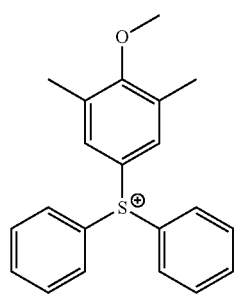
[LogP: 5.49]
(ca-d0-1-4)
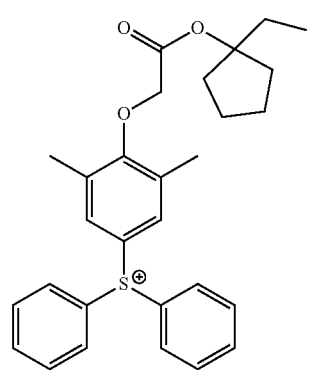
[LogP: 6.80]
(ca-d0-1-5)
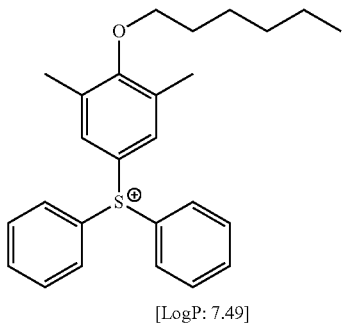
[LogP: 7.49]
(ca-d0-1-6)
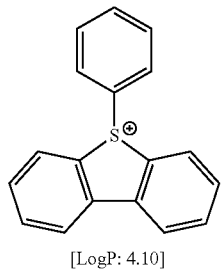
[LogP: 4.10]
(ca-d0-1-7)
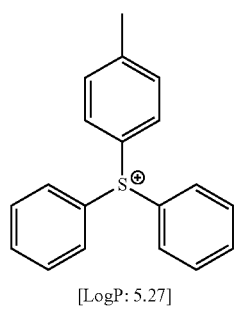
[LogP: 5.27]
-continued
(ca-d0-1-8)
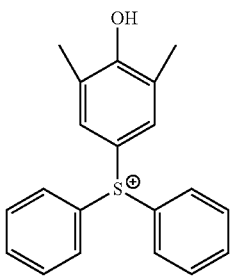
[LogP: 5.46]
(ca-d0-1-9)
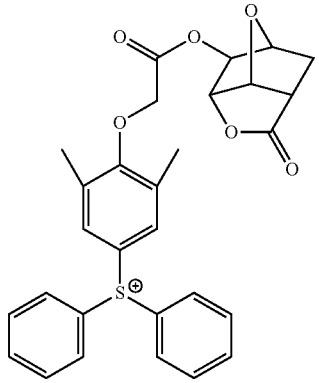
[LogP: 4.66]
(ca-d0-1-10)
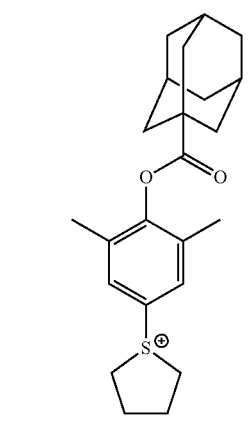
[LogP: 4.09]
(ca-d0-1-11)
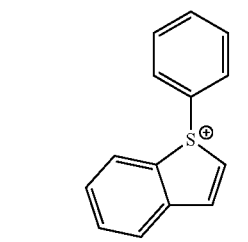
[LogP: 3.06]

-continued (ca-d0-1-12)

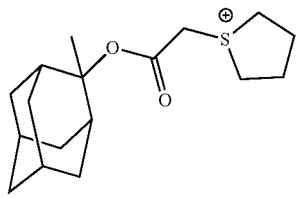

[LogP: 1.78]

In the resist composition according to the present embodiment, it is more preferable that the component (D0) is a compound represented by Formula (d0-1).

(d0-1)

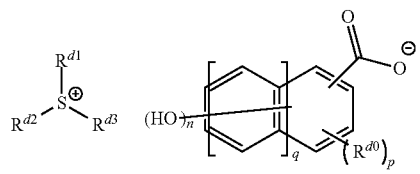

[In the formula, $R^{d1}$ represents an aryl group which may have a substituent. $R^{d2}$ and $R^{d3}$ each independently represent an aryl group which may have a substituent or may be bonded to each other to form a ring with a sulfur atom in the formula. $R^{d0}$ represents a substituent. p represents an integer of 0 to 3, and in a case where p represents 2 or 3, a plurality of substituents as $R^{d0}$ may be the same as or different from one another. q represents an integer of 0 to 3. n represents an integer of 2 or greater. Here, a relationship of "n+p≤(q×2)+5" is satisfied.]

In Formula (d0-1), the anion moiety has the same definition as described in the section of Formula (d0), and the cation moiety has the same definition as described in the section of Formula (ca-d0).

Specific examples of the component (D0) include various compounds obtained by combining cation moieties represented by any of Chemical Formulae (ca-d0-1-1) to (ca-d0-1-12) and anion moieties represented by any of Chemical Formulae (an-d0-1) to (an-d0-51).

Among these, compounds obtained by combining cation moieties represented by any of Chemical Formulae (ca-d0-1-1) to (ca-d0-1-5) and anion moieties represented by any of Chemical Formulae (an-d0-2) to (an-d0-4), (an-d0-8), and (an-d0-37) are preferable.

Hereinafter, specific examples of the component (D0) will be described, but the present invention is not limited thereto.

(D0-1)

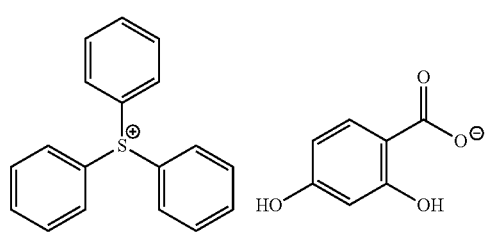

-continued (D0-2)

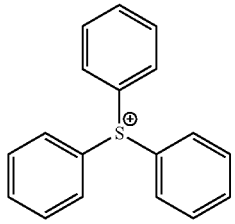 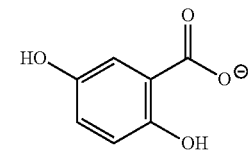

(D0-3)

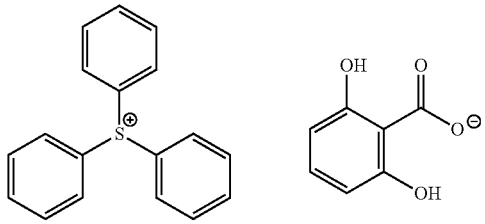

(D0-4)

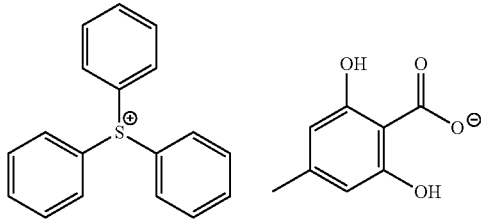

(D0-5)

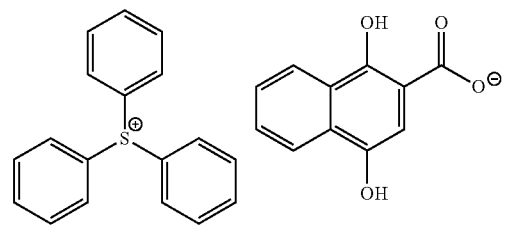

(D0-6)

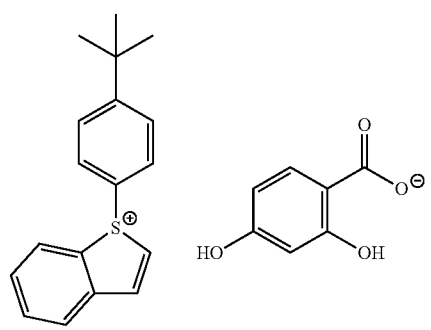

(D0-7)

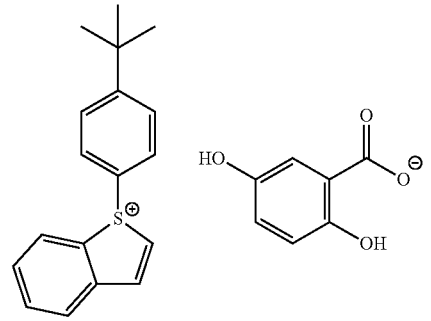

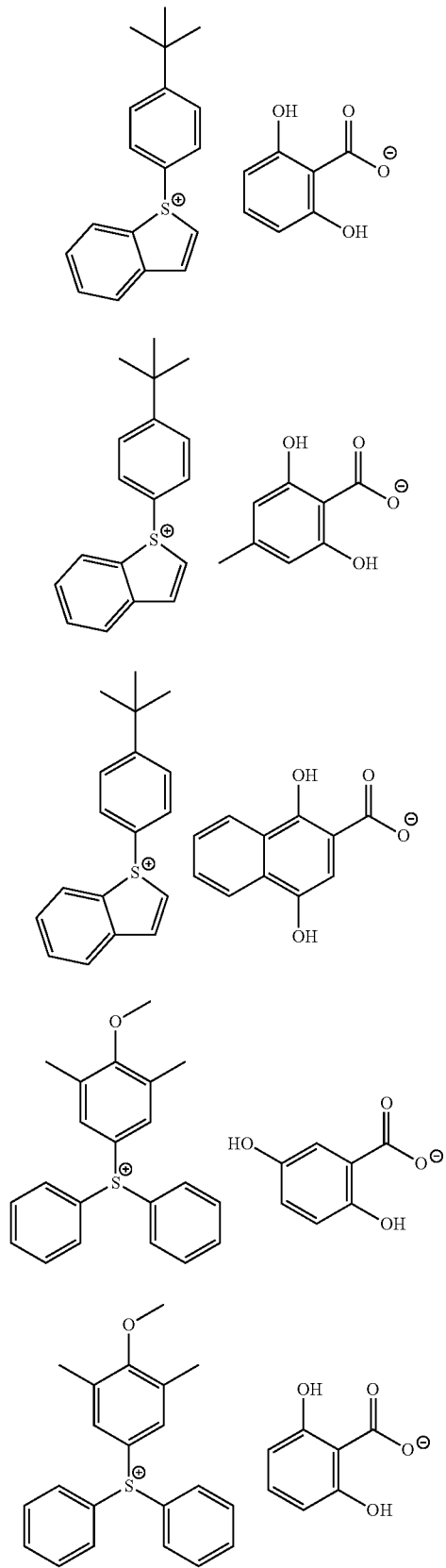
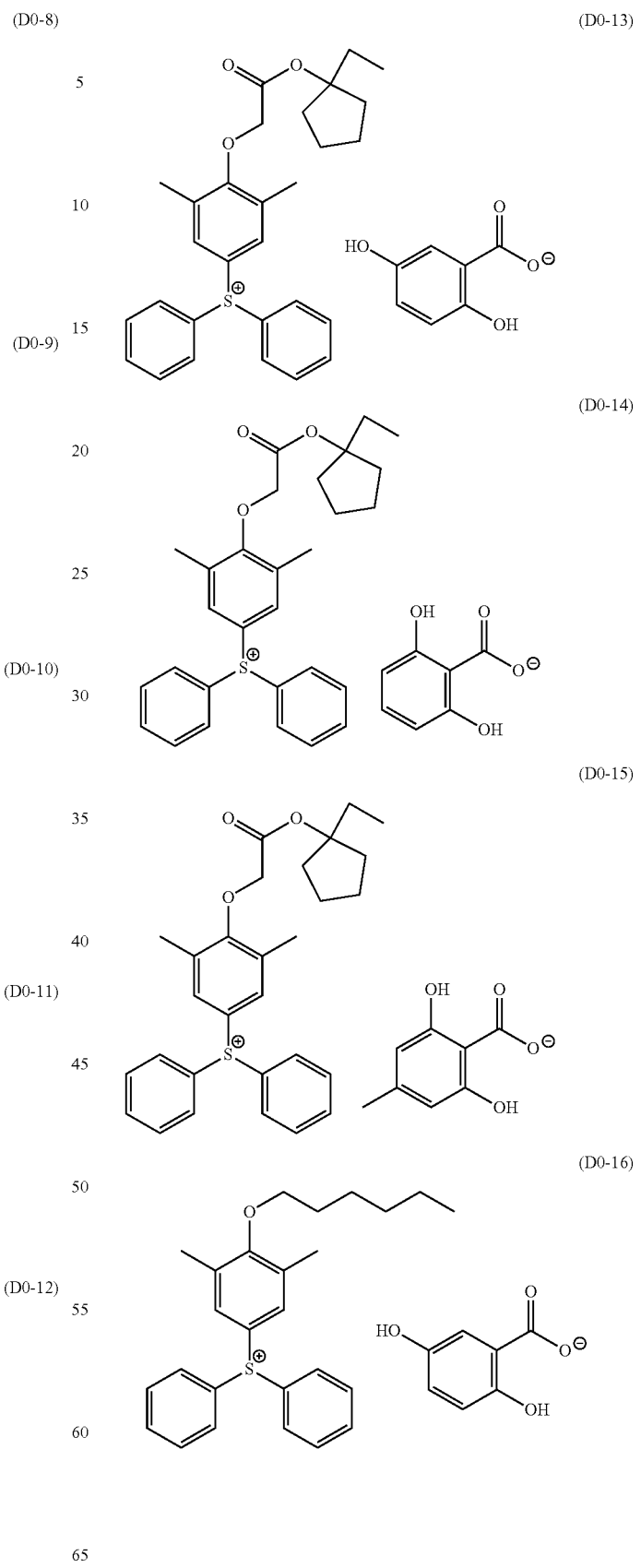

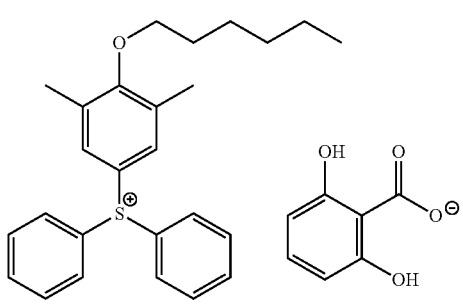

(D0-17)

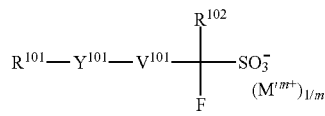

(b-1)

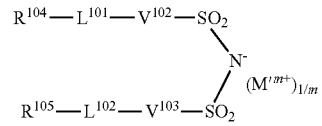

(b-2)

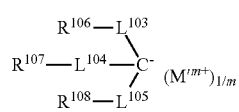

(b-3)

In the resist composition according to the present embodiment, the component (D0) may be used alone or in combination of two or more kinds thereof.

The content of the component (D0) in the resist composition according to the present embodiment is preferably in a range of 1 to 35 parts by mass, more preferably in a range of 2 to 25 parts by mass, still more preferably in a range of 3 to 20 parts by mass, and particularly preferably in a range of 3 to 15 parts by mass with respect to 100 parts by mass of the component (A).

In a case where the content of the component (D0) is greater than or equal to the lower limit of the above-described preferable range, excellent lithography characteristics and excellent resist pattern shape are easily obtained. Further, in a case where the content of the component (D0) is less than or equal to the upper limit of the above-described preferable range, the component (D0) and other components can be balanced, and various lithography characteristics are improved.

<Optional Components>

The resist composition according to the present embodiment may further contain components (optional components) other than the component (A) and the component (D0) described above.

As such optional components, a component (B), a component (D) (here, a component corresponding to the component (D0) is excluded), a component (E), a component (F), and a component (S) described below are exemplified.

<<Component (B)>>

The component (B) is an acid generator component that generates an acid upon exposure.

The component (B) is not particularly limited, and those which have been proposed as an acid generator for a chemically amplified resist composition in the related art can be used.

Examples of these acid generators are numerous and include onium salt-based acid generators such as iodonium salts and sulfonium salts; oxime sulfonate-based acid generators; diazomethane-based acid generators such as bisalkyl or bisaryl sulfonyl diazomethanes and poly(bis-sulfonyl) diazomethanes; nitrobenzylsulfonate-based acid generators; iminosulfonate-based acid generators; and disulfone-based acid generators.

Examples of the onium salt-based acid generators include a compound represented by Formula (b-1) (hereinafter, also referred to as "component (b-1)"), a compound represented by Formula (b-2) (hereinafter, also referred to as "component (b-2)"), and a compound represented by Formula (b-3) (hereinafter, also referred to as "component (b-3)").

[In the formulae, $R^{101}$ and $R^{104}$ to $R^{108}$ each independently represent a cyclic group which may have a substituent, a chain-like alkyl group which may have a substituent, or a chain-like alkenyl group which may have a substituent. $R^{104}$ and $R^{105}$ may be bonded to each other to form a ring. $R^{102}$ represents a fluorine atom or a fluorinated alkyl group having 1 to 5 carbon atoms. $Y^{101}$ represents a single bond or a divalent linking group containing an oxygen atom. $V^{101}$ to $V^{103}$ each independently represent a single bond, an alkylene group, or a fluorinated alkylene group. $L^{101}$ and $L^{102}$ each independently represent a single bond or an oxygen atom. $L^{103}$ to $L^{105}$ each independently represent a single bond, —CO— or —SO$_2$—. m represents an integer of 1 or greater, and $M^{m+}$ represents an m-valent onium cation.]

{Anion Moiety}

Anion Moiety of Component (b-1)

In Formula (b-1), $R^{101}$ represents a cyclic group which may have a substituent, a chain-like alkyl group which may have a substituent, or a chain-like alkenyl group which may have a substituent.

Cyclic Group which May have Substituent:

The cyclic group is preferably a cyclic hydrocarbon group, and the cyclic hydrocarbon group may be an aromatic hydrocarbon group or an aliphatic hydrocarbon group. The aliphatic hydrocarbon group indicates a hydrocarbon group that has no aromaticity. The aliphatic hydrocarbon group may be saturated or unsaturated. In general, it is preferable that the aliphatic hydrocarbon group is saturated.

The aromatic hydrocarbon group as $R^{101}$ is a hydrocarbon group having an aromatic ring. The aromatic hydrocarbon group has preferably 3 to 30 carbon atoms, more preferably 5 to 30, still more preferably 5 to 20, particularly preferably 6 to 15, and most preferably 6 to 10. Here, the number of carbon atoms in a substituent is not included in the number of carbon atoms.

Specific examples of the aromatic ring contained in the aromatic hydrocarbon group as $R^{101}$ include benzene, fluorene, naphthalene, anthracene, phenanthrene, biphenyl, or an aromatic hetero ring in which some carbon atoms constituting any of these aromatic rings have been substituted with hetero atoms. Examples of the hetero atom in the aromatic hetero rings include an oxygen atom, a sulfur atom, and a nitrogen atom.

Specific examples of the aromatic hydrocarbon group as $R^{101}$ include a group in which one hydrogen atom has been removed from the above-described aromatic ring (an aryl group such as a phenyl group or a naphthyl group), and a group in which one hydrogen atom in the aromatic ring has been substituted with an alkylene group (an arylalkyl group such as a benzyl group, a phenethyl group, a 1-naphthylmethyl group, a 2-naphthylmethyl group, 1-naphthylethyl group, or a 2-naphthylethyl group). The alkylene group (an alkyl chain in the arylalkyl group) has preferably 1 to 4 carbon atom, more preferably 1 or 2 carbon atoms, and particularly preferably 1 carbon atom.

Examples of the cyclic aliphatic hydrocarbon group as $R^{101}$ include aliphatic hydrocarbon groups containing a ring in the structure thereof.

Examples of the aliphatic hydrocarbon group containing a ring in the structure thereof include an alicyclic hydrocarbon group (a group in which one hydrogen atom has been removed from an aliphatic hydrocarbon ring), a group in which the alicyclic hydrocarbon group is bonded to the terminal of a linear or branched aliphatic hydrocarbon group, and a group in which the alicyclic hydrocarbon group is interposed in a linear or branched aliphatic hydrocarbon group.

The alicyclic hydrocarbon group has preferably 3 to 20 carbon atoms and more preferably 3 to 12 carbon atoms.

The alicyclic hydrocarbon group may be a polycyclic group or a monocyclic group. As the monocyclic alicyclic hydrocarbon group, a group in which one or more hydrogen atoms have been removed from a monocycloalkane is preferable. The monocycloalkane has preferably 3 to 6 carbon atoms, and specific examples thereof include cyclopentane and cyclohexane. As the polycyclic alicyclic hydrocarbon group, a group in which one or more hydrogen atoms have been removed from a polycycloalkane is preferable, and the number of carbon atoms of the polycycloalkane is preferably in a range of 7 to 30. Among polycycloalkanes, a polycycloalkane having a bridged ring polycyclic skeleton, such as adamantane, norbornane, isobornane, tricyclodecane, or tetracyclododecane, and a polycycloalkane having a fused ring polycyclic skeleton, such as a cyclic group having a steroid skeleton are preferable.

Among these examples, as the cyclic aliphatic hydrocarbon group as $R^{101}$, a group in which one or more hydrogen atoms have been removed from a monocycloalkane or a polycycloalkane is preferable, a group in which one hydrogen atom has been removed from a polycycloalkane is more preferable, an adamantyl group, or a norbornyl group is particularly preferable, and an adamantyl group is most preferable.

The linear or branched aliphatic hydrocarbon group which may be bonded to the alicyclic hydrocarbon group has preferably 1 to 10 carbon atoms, more preferably 1 to 6 carbon atoms, still more preferably 1 to 4 carbon atoms, and most preferably 1 to 3 carbon atoms.

As the linear aliphatic hydrocarbon group, a linear alkylene group is preferable. Specific examples thereof include a methylene group [—$CH_2$—], an ethylene group [—$(CH_2)_2$—], a trimethylene group [—$(CH_2)_3$—], a tetramethylene group [—$(CH_2)_4$—], and a pentamethylene group [—$(CH_2)_5$—].

As the branched aliphatic hydrocarbon group, a branched alkylene group is preferred, and specific examples thereof include alkylalkylene groups, for example, alkylmethylene groups such as —$CH(CH_3)$—, —$CH(CH_2CH_3)$—, —$C(CH_3)_2$—, —$C(CH_3)(CH_2CH_3)$—, —$C(CH_3)(CH_2CH_2CH_3)$—, and —$C(CH_2CH_3)_2$—; alkylethylene groups such as —$CH(CH_3)CH_2$—, —$CH(CH_3)CH(CH_3)$—, —$C(CH_3)_2CH_2$—, —$CH(CH_2CH_3)CH_2$—, and —$C(CH_2CH_3)_2$—$CH_2$—; alkyltrimethylene groups such as —$CH(CH_3)CH_2CH_2$—, and —$CH_2CH(CH_3)CH_2$—; and alkyltetramethylene groups such as —$CH(CH_3)CH_2CH_2CH_2$—, and —$CH_2CH(CH_3)CH_2CH_2$—. As the alkyl group in the alkylalkylene group, a linear alkyl group having 1 to 5 carbon atoms is preferable.

The cyclic hydrocarbon group as $R^{101}$ may contain a hetero atom such as a hetero ring. Specific examples thereof include lactone-containing cyclic groups represented by Formulae (a2-r-1) to (a2-r-7), the —$SO_2$-containing cyclic group represented by Formulae (a5-r-1) to (a5-r-4), and other heterocyclic groups represented by Chemical Formulae (r-hr-1) to (r-hr-16).

Examples of the substituent for the cyclic group as $R^{101}$ include an alkyl group, an alkoxy group, a halogen atom, a halogenated alkyl group, a hydroxy group, a carbonyl group, and a nitro group.

The alkyl group as the substituent is preferably an alkyl group having 1 to 12 carbon atoms, and a methyl group, an ethyl group, a propyl group, an n-butyl group, or a tert-butyl group is most preferable.

The alkoxy group as the substituent is preferably an alkoxy group having 1 to 5 carbon atoms, more preferably a methoxy group, an ethoxy group, an n-propoxy group, an iso-propoxy group, an n-butoxy group, or a tert-butoxy group, and most preferably a methoxy group or an ethoxy group.

Examples of the halogen atom for the substituent include a fluorine atom, a chlorine atom, a bromine atom, and an iodine atom, and a fluorine atom is preferable.

Example of the above-described halogenated alkyl group as the substituent includes a group in which some or all hydrogen atoms in an alkyl group having 1 to 5 carbon atoms such as a methyl group, an ethyl group, a propyl group, an n-butyl group, or a tert-butyl group have been substituted with the above-described halogen atoms.

The carbonyl group as the substituent is a group that substitutes a methylene group (—$CH_2$—) constituting the cyclic hydrocarbon group.

Chain-like alkyl group which may have substituent:

The chain-like alkyl group as $R^{101}$ may be linear or branched.

The linear alkyl group has preferably 1 to 20 carbon atoms, more preferably 1 to 15 carbon atoms, and most preferably 1 to 10 carbon atoms.

Specific examples thereof include a methyl group, an ethyl group, a propyl group, a butyl group, a pentyl group, a hexyl group, a heptyl group, an octyl group, a nonyl group, a decanyl group, an undecyl group, a dodecyl group, a tridecyl group, an isotridecyl group, a tetradecyl group, a pentadecyl group, a hexadecyl group, an isohexadecyl group, a heptadecyl group, an octadecyl group, a nonadecyl group, an icosyl group, a henicosyl group, and a docosyl group.

The branched alkyl group has preferably 3 to 20 carbon atoms, more preferably 3 to 15, and most preferably 3 to 10. Specific examples thereof include a 1-methylethyl group, a 1-methylpropyl group, a 2-methylpropyl group, a 1-methylbutyl group, a 2-methylbutyl group, a 3-methylbutyl group, a 1-ethylbutyl group, a 2-ethylbutyl group, a 1-methylpentyl group, a 2-methylpentyl group, a 3-methylpentyl group, and a 4-methylpentyl group.

Chain-like alkenyl group which may have substituent:

Such a chain-like alkenyl group as $R^{101}$ may be linear or branched, and the number of carbon atoms thereof is preferably in a range of 2 to 10, more preferably in a range of 2 to 5, still more preferably in a range of 2 to 4, and particularly preferably 3. Examples of the linear alkenyl group include a vinyl group, a propenyl group (an allyl group), and a butynyl group. Examples of the branched alkenyl group include a 1-methylvinyl group, a 2-methylvinyl group, a 1-methylpropenyl group, and a 2-methylpropenyl group.

Among the examples, as the chain-like alkenyl group, a linear alkenyl group is preferable, a vinyl group or a propenyl group is more preferable, and a vinyl group is particularly preferable.

As the substituent for the chain-like alkyl group or alkenyl group as $R^{101}$, an alkoxy group, a halogen atom, a halogenated alkyl group, a hydroxy group, a carbonyl group, a nitro group, an amino group, a cyclic group as $R^{101}$ or the like can be used.

Among the examples, as $R^{101}$, a cyclic group which may have a substituent is preferable, and a cyclic hydrocarbon group which may have a substituent is more preferable. As the substituent, a hydroxy group, a carbonyl group, a nitro group, or an amino group is preferable. Among these, from the viewpoint of being easily distributed on the substrate side in the resist film, a hydroxy group is more preferable.

More specific preferred examples of the cyclic hydrocarbon group include a phenyl group, a naphthyl group, a group in which one or more hydrogen atoms have been removed from a polycycloalkane, a lactone-containing cyclic group represented by any of Formulae (a2-r-1) to (a2-r-7), and a —SO$_2$-containing cyclic group represented by any of Formulae (a5-r-1) to (a5-r-4).

In Formula (b-1), $Y^{101}$ represents a single bond or a divalent linking group containing an oxygen atom.

In a case where $Y^{101}$ represents a divalent linking group containing an oxygen atom, $Y^{101}$ may contain an atom other than an oxygen atom. Examples of atoms other than an oxygen atom include a carbon atom, a hydrogen atom, a sulfur atom, and a nitrogen atom.

Examples of divalent linking groups containing an oxygen atom include non-hydrocarbon oxygen atom-containing linking groups such as an oxygen atom (an ether bond; —O—), an ester bond (—C(=O)—O—), an oxycarbonyl group (—O—C(=O)—), an amide bond (—C(=O)—NH—), a carbonyl group (—C(=O)—), or a carbonate bond (—O—C(=O)—O—); and combinations of the above-described non-hydrocarbon oxygen atom-containing linking groups with an alkylene group. Furthermore, a sulfonyl group (—SO$_2$—) may be linked to the combination. Examples of divalent linking groups containing an oxygen atom include linking groups represented by Formulae (y-a1-1) to (y-a1-7) shown below.

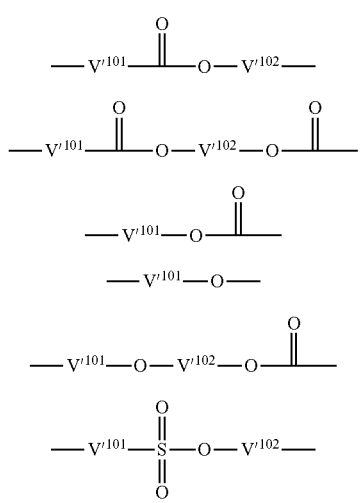

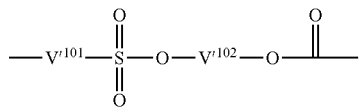

[In the formulae, $V'^{101}$ represents a single bond or an alkylene group having 1 to 5 carbon atoms, and $V'^{102}$ represents a divalent saturated hydrocarbon group having 1 to 30 carbon atoms.]

The divalent saturated hydrocarbon group as $V'^{102}$ is preferably an alkylene group having 1 to 30 carbon atoms, more preferably an alkylene group having 1 to 10 carbon atoms, and still more preferably an alkylene group having 1 to 5 carbon atoms.

The alkylene group as $V'^{101}$ and $V'^{102}$ may be a linear alkylene group or a branched alkylene group, and a linear alkylene group is preferable.

Specific examples of the alkylene group as $V'^{101}$ and $V'^{102}$ include a methylene group [—CH$_2$—]; an alkylmethylene group such as —CH(CH$_3$)—, —CH(CH$_2$CH$_3$)—, —C(CH$_3$)$_2$—, —C(CH$_3$)(CH$_2$CH$_3$)—, —C(CH$_3$)(CH$_2$CH$_3$)—, or —C(CH$_2$CH$_3$)$_2$—; an ethylene group [—CH$_2$CH$_2$—]; an alkylethylene group such as —CH(CH$_3$)CH$_2$—, —CH(CH$_3$)CH(CH$_3$)—, —C(CH$_3$)$_2$CH$_2$—, or —CH(CH$_2$CH$_3$)CH$_2$—; a trimethylene group (n-propylene group) [—CH$_2$CH$_2$CH$_2$—]; an alkyltrimethylene group such as —CH(CH$_3$)CH$_2$CH$_2$— or —CH$_2$CH(CH$_3$)CH$_2$—; a tetramethylene group [—CH$_2$CH$_2$CH$_2$CH$_2$—]; an alkyltetramethylene group such as —CH(CH$_3$)CH$_2$CH$_2$CH$_2$—, —CH$_2$CH(CH$_3$)CH$_2$CH$_2$—; and a pentamethylene group [—CH$_2$CH$_2$CH$_2$CH$_2$CH$_2$—].

Further, a part of methylene group in the alkylene group as $V'^{101}$ and $V'^{102}$ may be substituted with a divalent aliphatic cyclic group having 5 to 10 carbon atoms. The aliphatic cyclic group is preferably a divalent group in which one hydrogen atom has been removed from the cyclic aliphatic hydrocarbon group (a monocyclic aliphatic hydrocarbon group or a polycyclic aliphatic hydrocarbon group) as Ra'$^3$ in Formula (a1-r-1), and a cyclohexylene group, a 1,5-adamantylene group, or a 2,6-adamantylene group is more preferable.

$Y^{101}$ represents preferably a divalent linking group containing an ester bond or a divalent linking group containing an ether bond and more preferably linking groups represented by Formulae (y-a1-1) to (y-a1-5).

In Formula (b-1), $V^{101}$ represents a single bond, an alkylene group, or a fluorinated alkylene group. The alkylene group and the fluorinated alkylene group as $V^{101}$ preferably have 1 to 4 carbon atoms. Examples of the fluorinated alkylene group as $V^{101}$ include a group in which some or all hydrogen atoms in the alkylene group as $V^{101}$ have been substituted with fluorine atoms. Among these examples, as $V^{101}$, a single bond or a fluorinated alkylene group having 1 to 4 carbon atoms is preferable.

In Formula (b-1), $R^{102}$ represents a fluorine atom or a fluorinated alkyl group having 1 to 5 carbon atoms. $R^{102}$ represents preferably a fluorine atom or a perfluoroalkyl group having 1 to 5 carbon atoms and more preferably a fluorine atom.

As a specific example of the anion moiety for the component (b-1), in a case where $Y^{101}$ represents a single bond, a fluorinated alkylsulfonate anion such as a trifluoromethanesulfonate anion or a perfluorobutanesulfonate anion can be exemplified; and in a case where $Y^{101}$ represents a divalent linking group containing an oxygen atom, anions represented by Formulae (an-1) to (an-3) shown below can be exemplified.

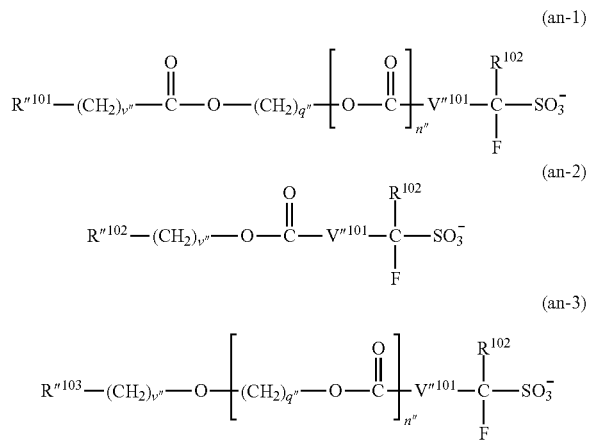

[In the formulae, $R'''^{101}$ represents an aliphatic cyclic group which may have a substituent, a group represented by any of Formulae (r-hr-1) to (r-hr-6), or a chain-like alkyl group which may have a substituent. $R'''^{102}$ represents an aliphatic cyclic group which may have a substituent, a lactone-containing cyclic group represented by any of Formulae (a2-r-1) to (a2-r-7), or a —SO$_2$-containing cyclic group represented by any of Formulae (a5-r-1) to (a5-r-4). $R'''^{103}$ represents an aromatic cyclic group which may have a substituent, an aliphatic cyclic group which may have a substituent, or a chain-like alkenyl group which may have a substituent. $V'''^{101}$ represents a single bond, an alkylene group having 1 to 4 carbon atoms, or a fluorinated alkylene group having 1 to 4 carbon atoms. $R^{102}$ represents a fluorine atom or a fluorinated alkyl group having 1 to 5 carbon atoms. Each $v''$ independently represents an integer of 0 to 3, each $q''$ independently represents an integer of 1 to 20, and $n''$ represents 0 or 11

As the aliphatic cyclic group as $R'''^{101}$, $R'''^{102}$, and $R'''^{103}$ which may have a substituent, the same groups as the cyclic aliphatic hydrocarbon group as $R^{101}$ described above are preferable.

As the substituent, the same groups as the substituents which may substitute the cyclic aliphatic hydrocarbon group as $R^{101}$ can be exemplified. Among these, a hydroxy group, a carbonyl group, a nitro group, or an amino group is preferable. Among these, from the viewpoint of being easily distributed on the substrate side in the resist film, a hydroxy group is more preferable.

As the aromatic cyclic group as $R'''^{103}$ which may have a substituent, the same groups as the aromatic hydrocarbon group for the cyclic hydrocarbon group represented by $R^{101}$ described above are preferable. As the substituent, the same groups as the substituents which may substitute the aromatic hydrocarbon group as $R^{101}$ can be exemplified.

As the chain-like alkyl group as $R'''^{101}$ which may have a substituent, the same groups exemplified as the chain-like alkyl groups represented by $R^{101}$ are preferable. As the chain-like alkenyl group as $R'''^{103}$ which may have a substituent, the same groups exemplified as the chain-like alkenyl groups represented by $R^{101}$ are preferable.

In Formulae (an-1) to (an-3), $V'''^{101}$ represents a single bond, an alkylene group having 1 to 4 carbon atoms, or a fluorinated alkylene group having 1 to 4 carbon atoms.

It is preferable that $V'''^{101}$ represents a single bond, an alkylene group having 1 carbon atom (methylene group), or a fluorinated alkylene group having 1 to 3 carbon atoms.

In Formulae (an-1) to (an-3), $R^{102}$ represents a fluorine atom or a fluorinated alkyl group having 1 to 5 carbon atoms. $R^{102}$ represents preferably a perfluoroalkyl group having 1 to 5 carbon atoms or a fluorine atom and more preferably a fluorine atom.

In Formulae (an-1) to (an-3), $v''$ represents an integer of 0 to 3 and preferably 0 or 1. $q''$ represents an integer of 1 to 20, preferably an integer of 1 to 10, more preferably an integer of 1 to 5, still more preferably 1, 2, or 3, and particularly preferably 1 or 2. $n''$ represents 0 or 1.

Anion Moiety of Component (b-2)

In Formula (b-2), $R^{104}$ and $R^{105}$ each independently represent a cyclic group which may have a substituent, a chain-like alkyl group which may have a substituent or a chain-like alkenyl group which may have a substituent, and has the same definition as that for $R^{101}$ in Formula (b-1). $R^{104}$ and $R^{105}$ may be bonded to each other to form a ring.

As $R^{104}$ and $R^{105}$, a chain-like alkyl group which may have a substituent is preferable, and a linear or branched alkyl group or a linear or branched fluorinated alkyl group is more preferable.

The chain-like alkyl group has preferably 1 to 10 carbon atoms, more preferably 1 to 7 carbon atoms, and still more preferably 1 to 3 carbon atoms. It is preferable that the number of carbon atoms in the chain-like alkyl group as $R^{104}$ and $R^{105}$ is small because the solubility in a solvent for a resist is also excellent in the range of the number of carbon atoms. Further, in the chain-like alkyl group as $R^{104}$ and $R^{105}$, it is preferable that the number of hydrogen atoms substituted with fluorine atoms is as large as possible because the acid strength increases and the transparency to high energy radiation of 200 nm or less or electron beams is improved.

The proportion of fluorine atoms in the chain-like alkyl group, that is, the fluorination ratio is preferably in a range of 70% to 100% and more preferably in a range of 90% to 100%, and it is most preferable that the chain-like alkyl group is a perfluoroalkyl group in which all hydrogen atoms are substituted with fluorine atoms. In Formula (b-2), $V^{102}$ and $V^{103}$ each independently represent a single bond, an alkylene group, or a fluorinated alkylene group, and has the same definition as that for $V^{101}$ in Formula (b-1).

In Formula (b-2), $L^{101}$ and $L^{102}$ each independently represent a single bond or an oxygen atom.

Anion Moiety of Component (b-3)

In Formula (b-3), $R^{106}$ to $R^{108}$ each independently represent a cyclic group which may have a substituent or a chain-like alkyl group which may have a substituent or a chain-like alkenyl group which may have a substituent, and has the same definition as that for $R^{101}$ in Formula (b-1).

$L^{103}$ to $L^{105}$ each independently represent a single bond, —CO—, or —SO$_2$—.

{Cation Moiety}

In Formulae (b-1), (b-2), and (b-3), m represents an integer of 1 or greater, $M'^{m+}$ represents an m-valent onium cation, and suitable examples thereof include a sulfonium cation and an iodonium cation. Further, an organic cation represented by any of Formulae (ca-1) to (ca-4) is exemplified.

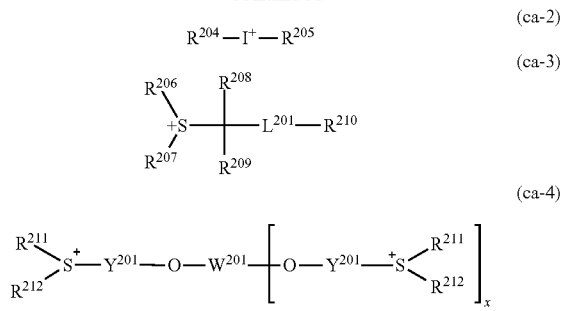

$$R^{204}-I^+-R^{205} \quad \text{(ca-2)}$$

(ca-3)

(ca-4)

[In the formulae, $R^{201}$ to $R^{207}$, $R^{211}$, and $R^{212}$ each independently represent an aryl group which may have a substituent, an alkyl group which may have a substituent, or an alkenyl group which may have a substituent. $R^{201}$ to $R^{203}$, $R^{206}$ and $R^{207}$, and $R^{211}$ and $R^{212}$ may be bonded to each other to form a ring with the sulfur atom in the formula. $R^{208}$ and $R^{209}$ each independently represent a hydrogen atom or an alkyl group having 1 to 5 carbon atoms or may be bonded to each other to form a ring with the sulfur atom in the formula. $R^{210}$ represents an aryl group which may have a substituent, an alkyl group which may have a substituent, an alkenyl group which may have a substituent, or a —$SO_2$— containing cyclic group which may have a substituent. $L^{201}$ represents —C(=O)— or —C(=O)—O—. A plurality of $Y^{201}$'s each independently represent an arylene group, an alkylene group, or an alkenylene group. x represents 1 or 2. $W^{201}$ represents a (x+1)-valent linking group.]

Examples of the aryl group as $R^{201}$ to $R^{207}$, $R^{211}$, and $R^{212}$ include an aryl group having 6 to 20 carbon atoms, and a phenyl group or a naphthyl group is preferable.

The alkyl group as $R^{201}$ to $R^{207}$, $R^{211}$, and $R^{212}$ is a chain-like or cyclic alkyl group, and the number of carbon atoms thereof is preferably in a range of 1 to 30.

The alkenyl group as $R^{201}$ to $R^{207}$, $R^{211}$, and $R^{212}$ preferably has 2 to 10 carbon atoms.

Examples of the substituent which may be included in $R^{201}$ to $R^{207}$, $R^{211}$, and $R^{212}$ include an alkyl group, a halogen atom, a halogenated alkyl group, a carbonyl group, a cyano group, an amino group, an aryl group, and groups represented by Formulae (ca-r-1) to (ca-r-7) shown above.

$R^{208}$ and $R^{209}$ each independently represent a hydrogen atom or an alkyl group having 1 to 5 carbon atoms and preferably a hydrogen atom or an alkyl group having 1 to 3 carbon atoms. In a case where $R^{208}$ and $R^{209}$ each represents an alkyl group, $R^{208}$ and $R^{209}$ may be mutually bonded to form a ring.

$R^{210}$ represents an aryl group which may have a substituent, an alkyl group which may have a substituent, an alkenyl group which may have a substituent, or a —$SO_2$— containing cyclic group which may have a substituent.

Examples of the aryl group as $R^{210}$ include an unsubstituted aryl group having 6 to 20 carbon atoms, and a phenyl group or a naphthyl group is preferable.

As the alkyl group as $R^{210}$, a chain-like or cyclic alkyl group having 1 to 30 carbon atoms is preferable.

The alkenyl group as $R^{210}$ preferably has 2 to 10 carbon atoms.

As the —$SO_2$—containing cyclic group as $R^{210}$ which may have a substituent, the "—$SO_2$-containing polycyclic group" is preferable, and a group represented by Formula (a5-r-1) is more preferable.

$Y^{201}$'s each independently represent an arylene group, an alkylene group, or an alkenylene group.

Examples of the arylene group as $Y^{201}$ include groups in which one hydrogen atom has been removed from an aryl group exemplified as the aromatic hydrocarbon group represented by $R^{101}$ in Formula (b-1).

Examples of the alkylene group and alkenylene group as $Y^{201}$ include groups in which one hydrogen atom has been removed from the chain-like alkyl group or the chain-like alkenyl group as $R^{101}$ in Formula (b-1).

In Formula (ca-4), x represents 1 or 2.

$W^{201}$ represents a (x+1)-valent linking group, that is, a divalent or trivalent linking group.

As the divalent linking group represented by $W^{201}$, a divalent hydrocarbon group which may have a substituent is preferable, and as examples thereof, the same divalent hydrocarbon groups which may have a substituent as those described above represented by $Ya^{21}$ in Formula (a2-1) can be exemplified. The divalent linking group as $W^{201}$ may be linear, branched or cyclic, and cyclic is more preferable. Among these, an arylene group having two carbonyl groups, each bonded to the terminal thereof is preferable. Examples of the arylene group include a phenylene group, and a naphthylene group, and a phenylene group is particularly preferable.

As the trivalent linking group as $W^{201}$, a group in which one hydrogen atom has been removed from the above-described divalent linking group as $W^{201}$ and a group in which the divalent linking group has been bonded to another divalent linking group can be exemplified. The trivalent linking group as $W^{201}$ is preferably a group in which two carbonyl groups are bonded to an arylene group.

Specific suitable examples of the cation represented by Formula (ca-1) include cations represented by Chemical Formulae (ca-1-1) to (ca-1-78) and (ca-1-101) to (ca-1-149) shown below.

In the following chemical formulae, g1 represents a repeating number, and g1 represents an integer of 1 to 5. g2 represents a repeating number, and g2 represents an integer of 0 to 20. g3 represents a repeating number, and g3 represents an integer of 0 to 20.

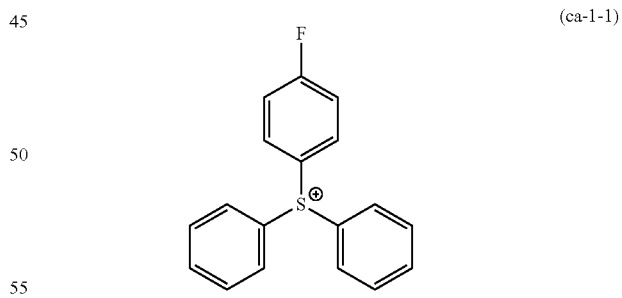

(ca-1-1)

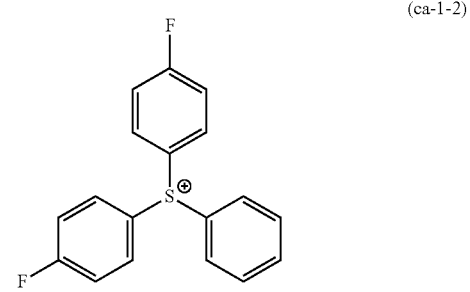

(ca-1-2)

-continued
(ca-1-3)
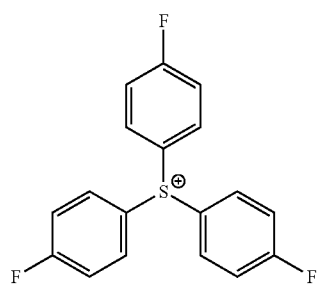
(ca-1-4)
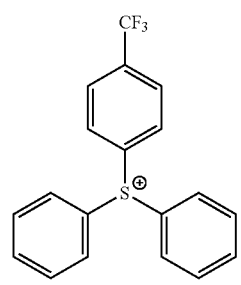
(ca-1-5)
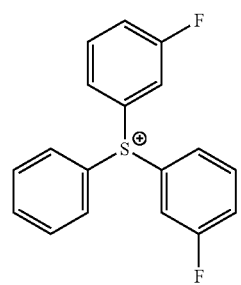
(ca-1-6)
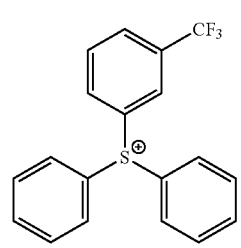
(ca-1-7)
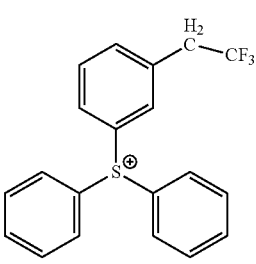
(ca-1-8)
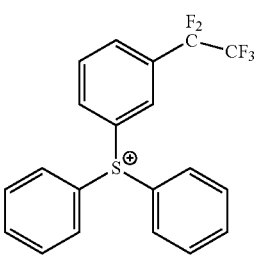
-continued
(ca-1-9)
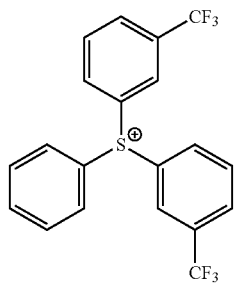
(ca-1-10)
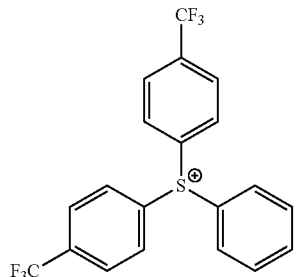
(ca-1-11)
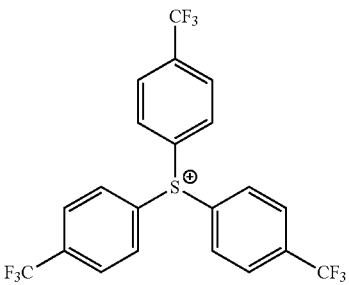
(ca-1-12)
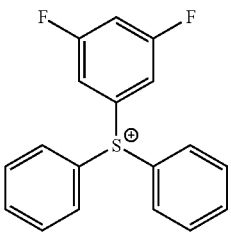
(ca-1-13)
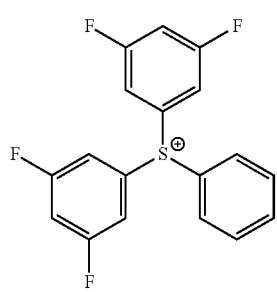

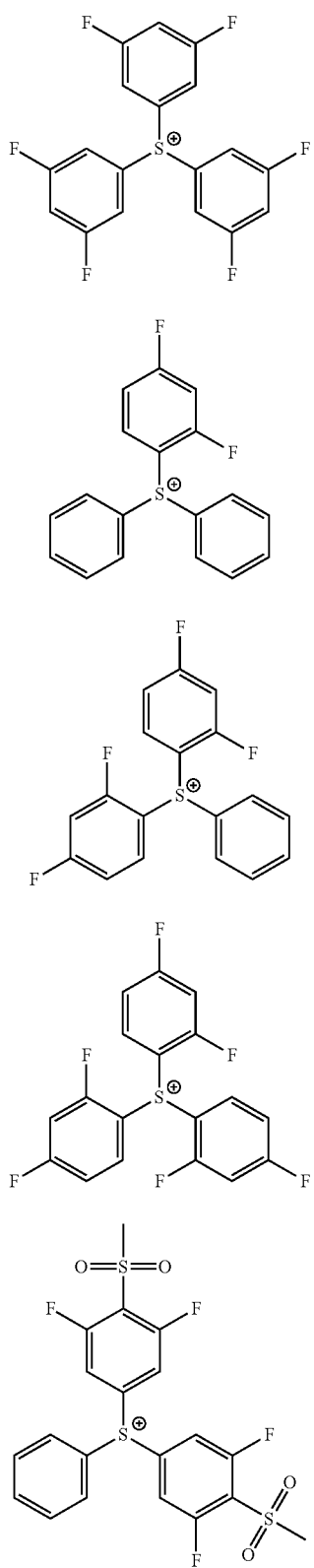
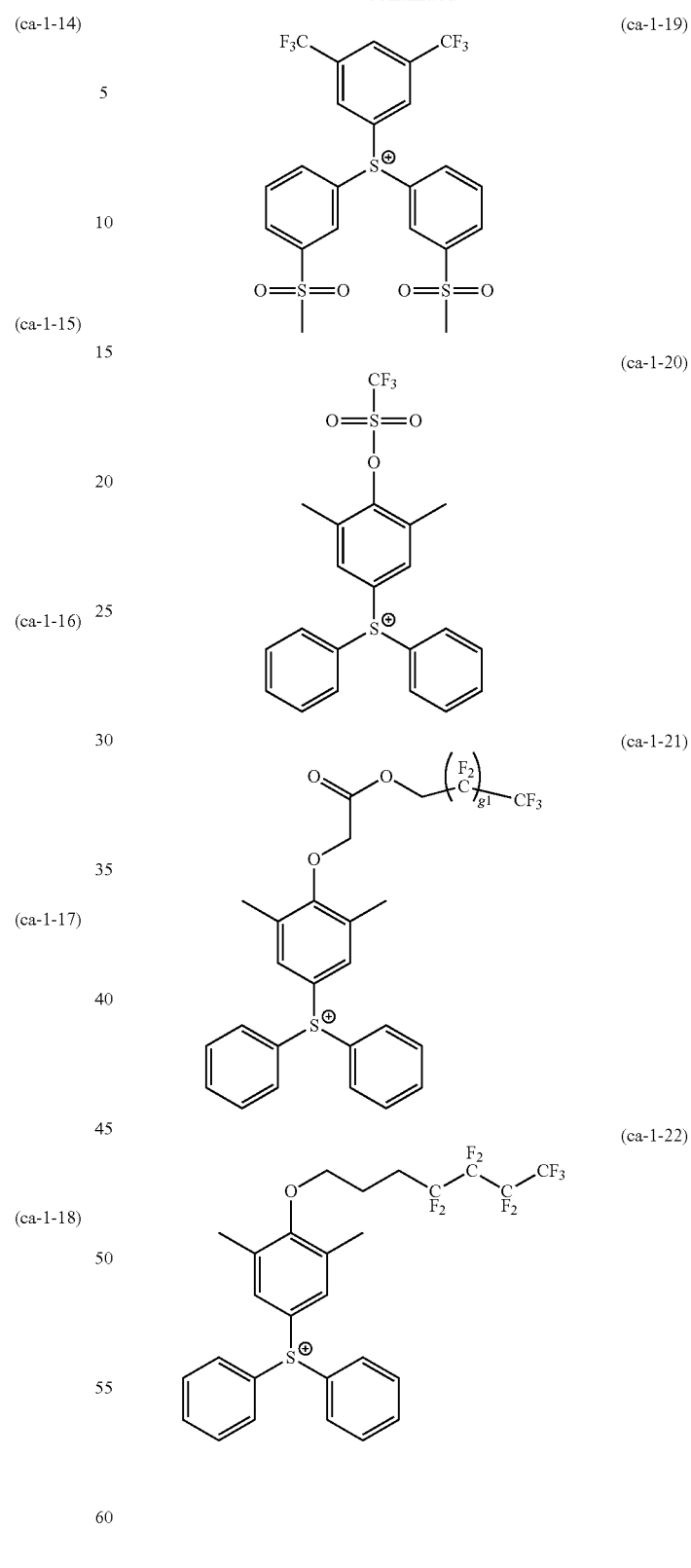

(ca-1-23)
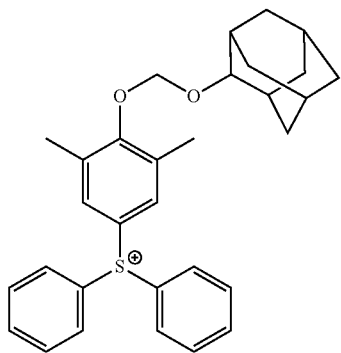
(ca-1-24)
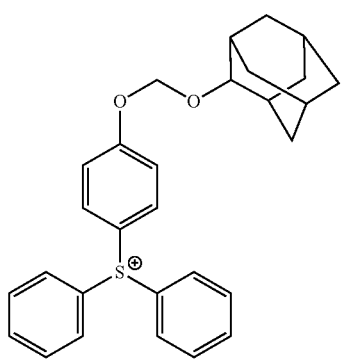
(ca-1-25)
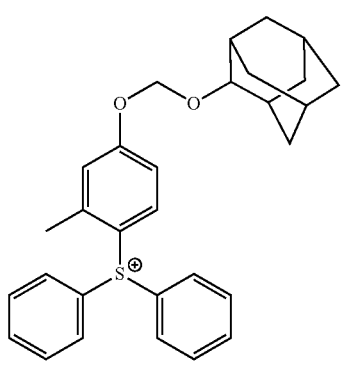
(ca-1-26)
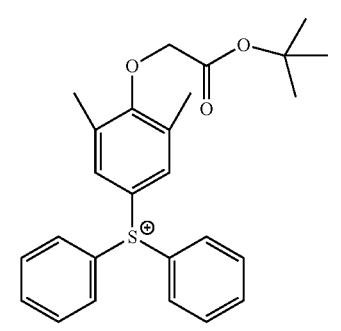
(ca-1-27)
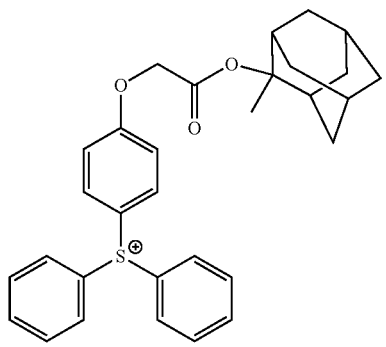
(ca-1-28)
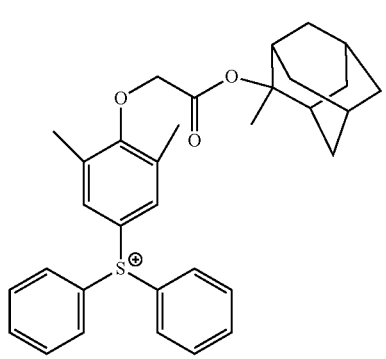
(ca-1-29)
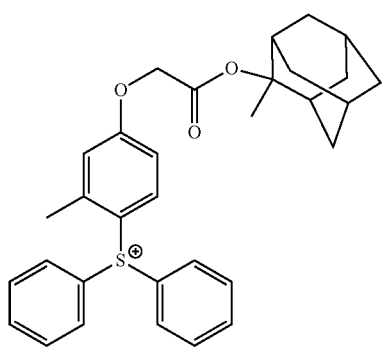
(ca-1-30)
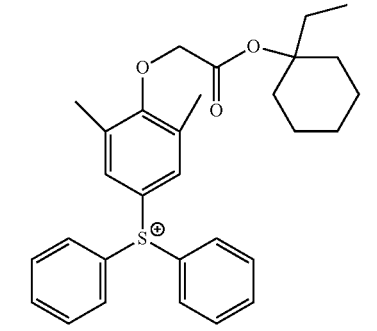

(ca-1-31)
(ca-1-32)
(ca-1-33)
(ca-1-34)
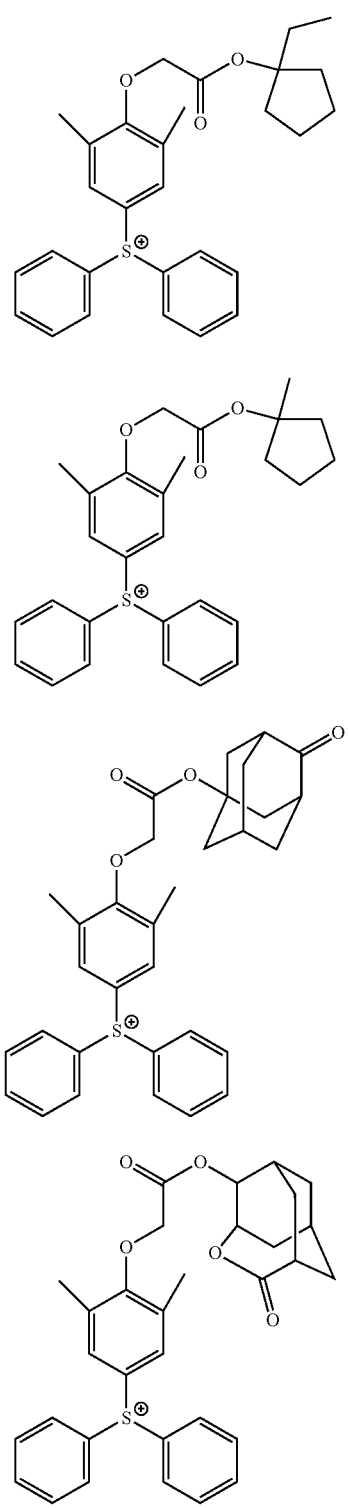
(ca-1-35)
(ca-1-36)
(ca-1-37)
(ca-1-38)
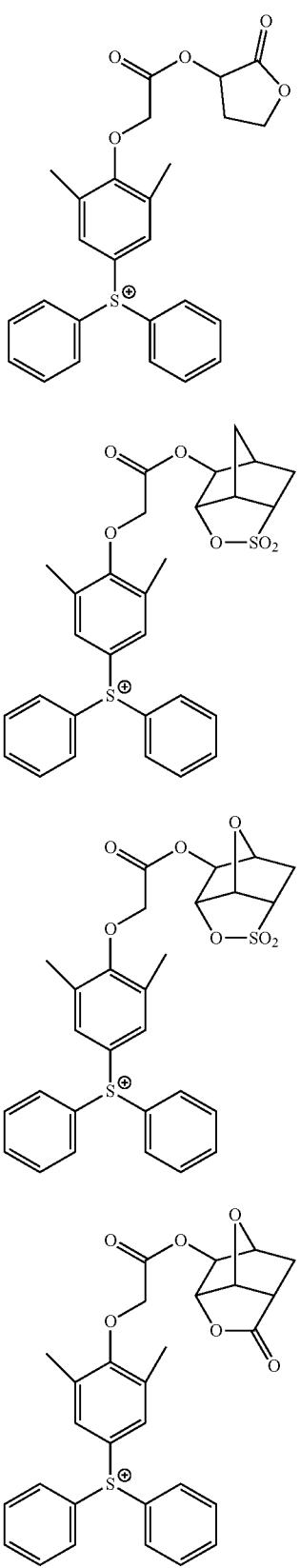

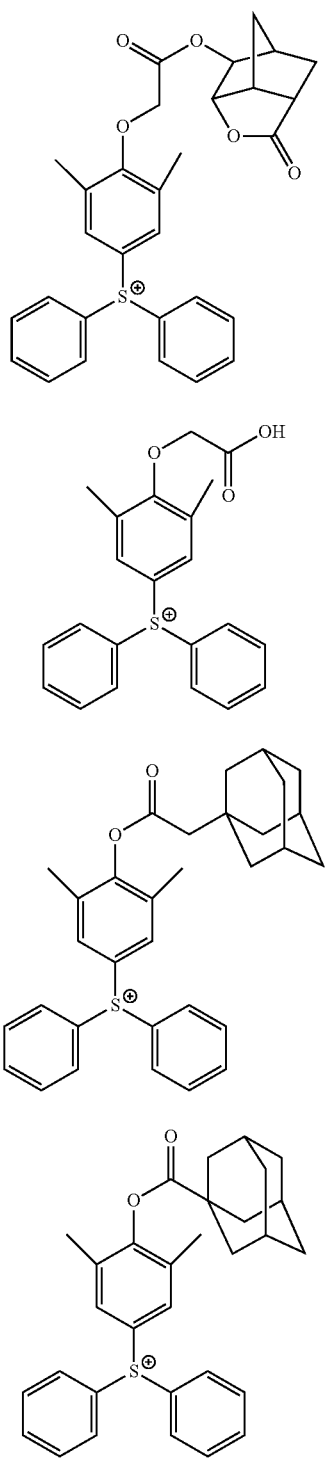
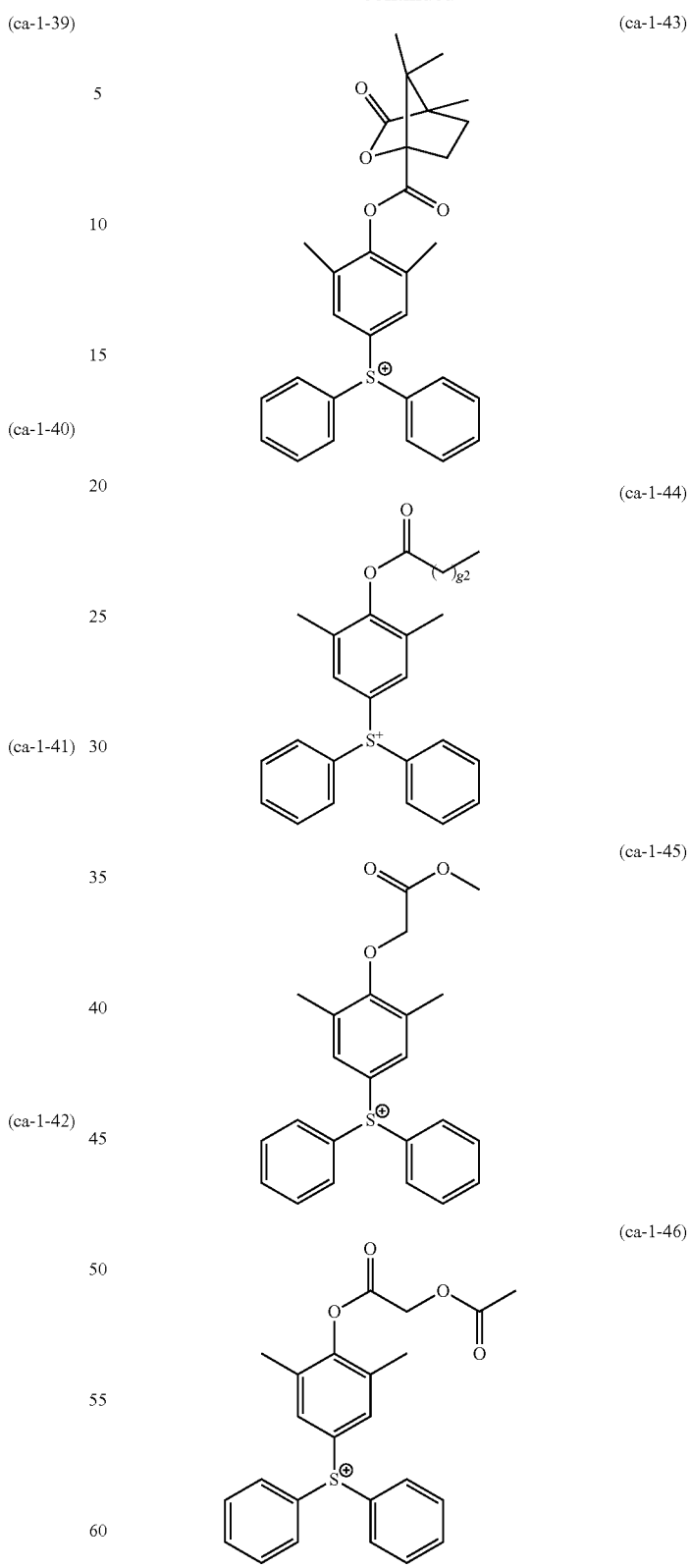

(ca-1-47)
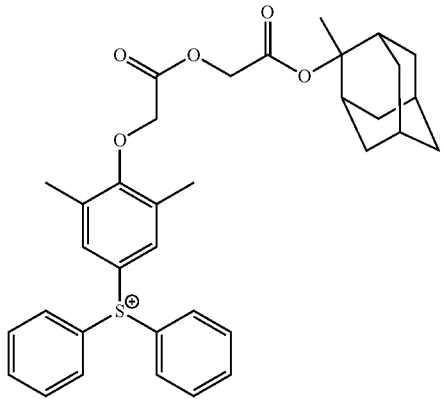
(ca-1-48)
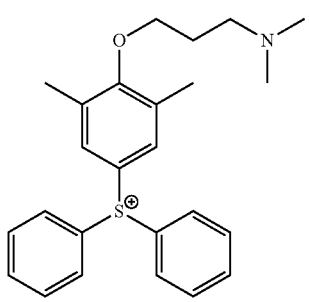
(ca-1-49)
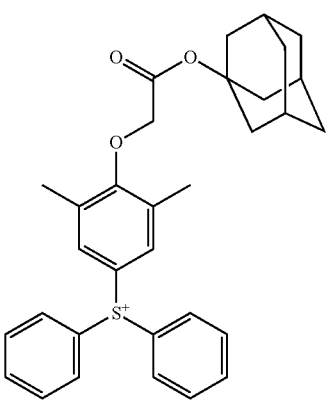
(ca-1-50)
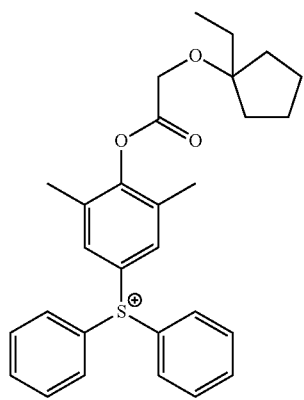
(ca-1-51)
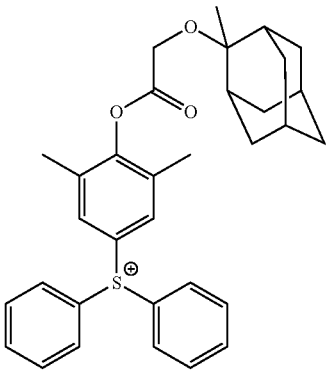
(ca-1-52)
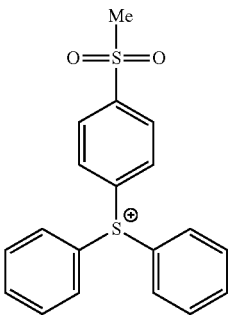
(ca-1-53)
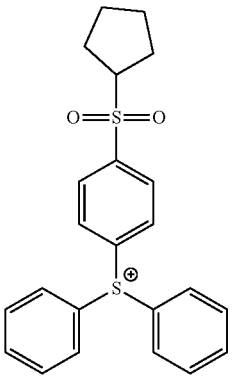
(ca-1-54)
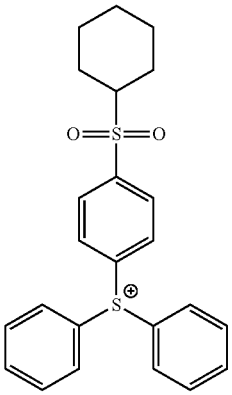

(ca-1-55)
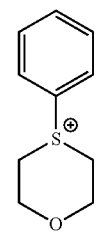
(ca-1-56)
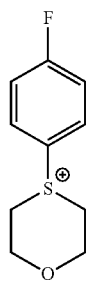
(ca-1-57)
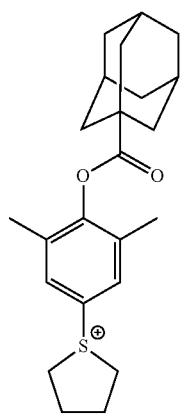
(ca-1-58)
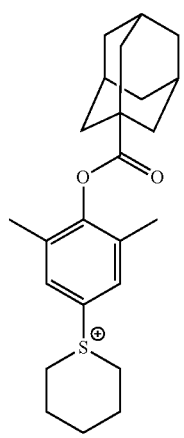
(ca-1-59)
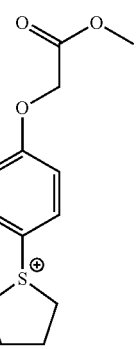
(ca-1-60)
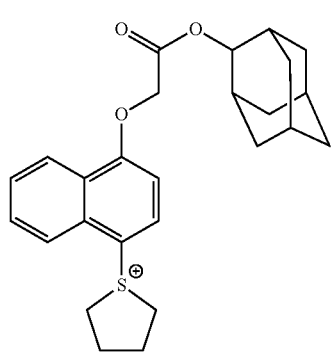
(ca-1-61)
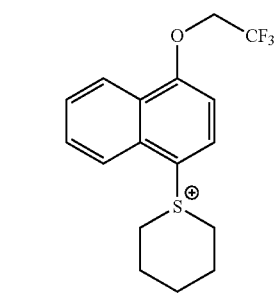
(ca-1-62)
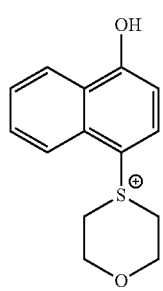
(ca-1-63)
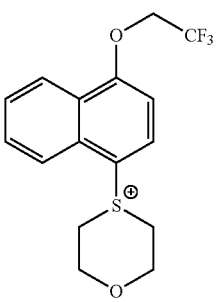

-continued
(ca-1-64)
(ca-1-65)
(ca-1-66)
(ca-1-67)
(ca-1-68)
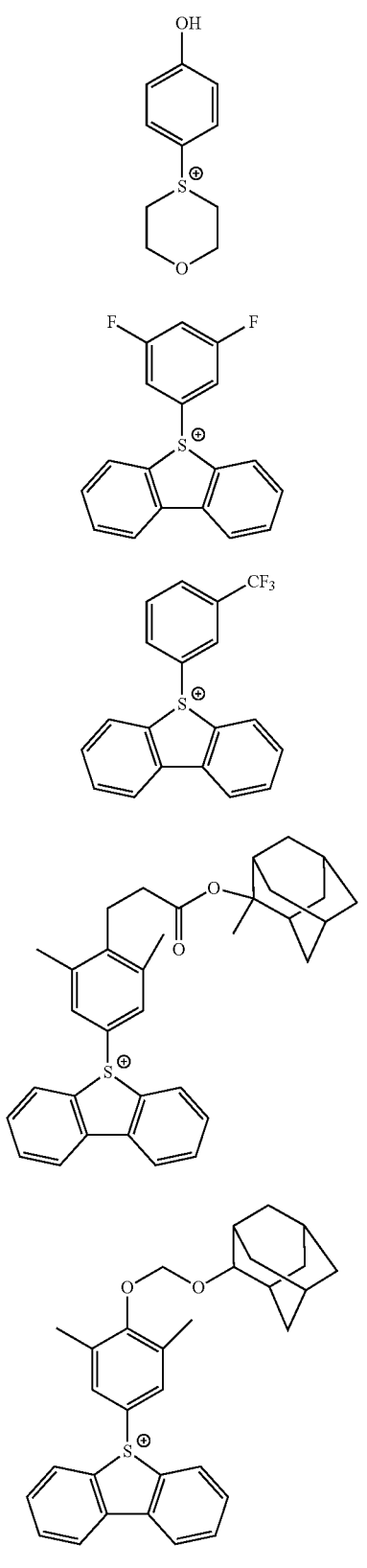
-continued
(ca-1-69)
(ca-1-70)
(ca-1-71)
(ca-1-72)
(ca-1-73)
(ca-1-74)
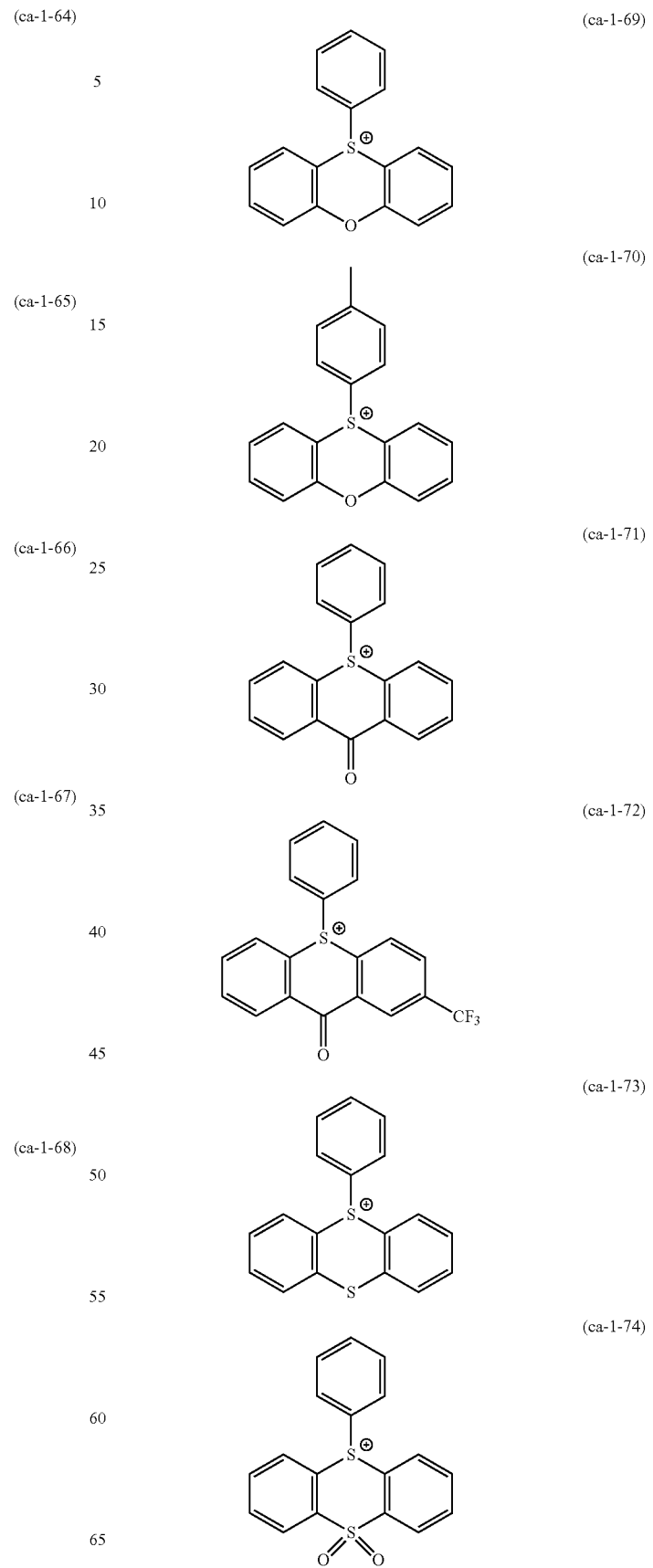

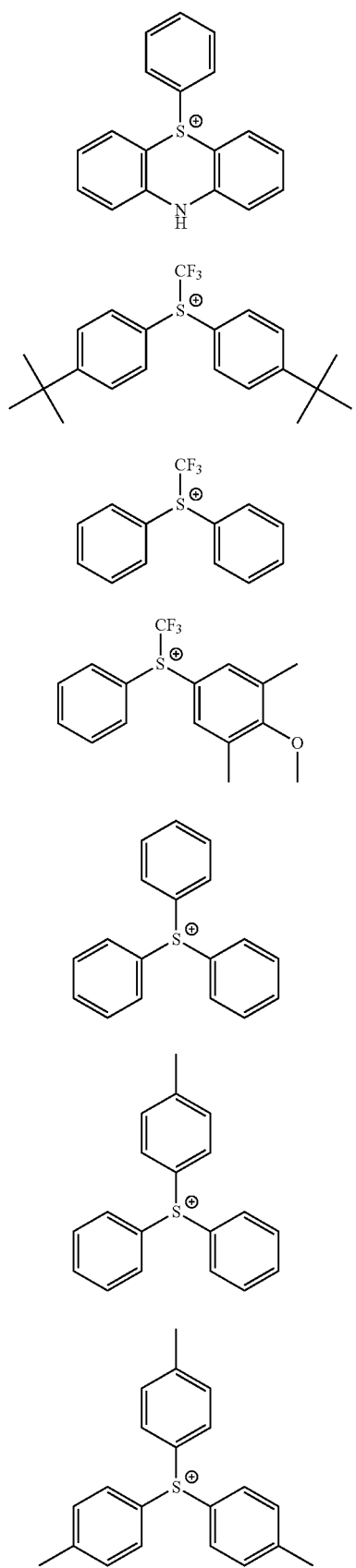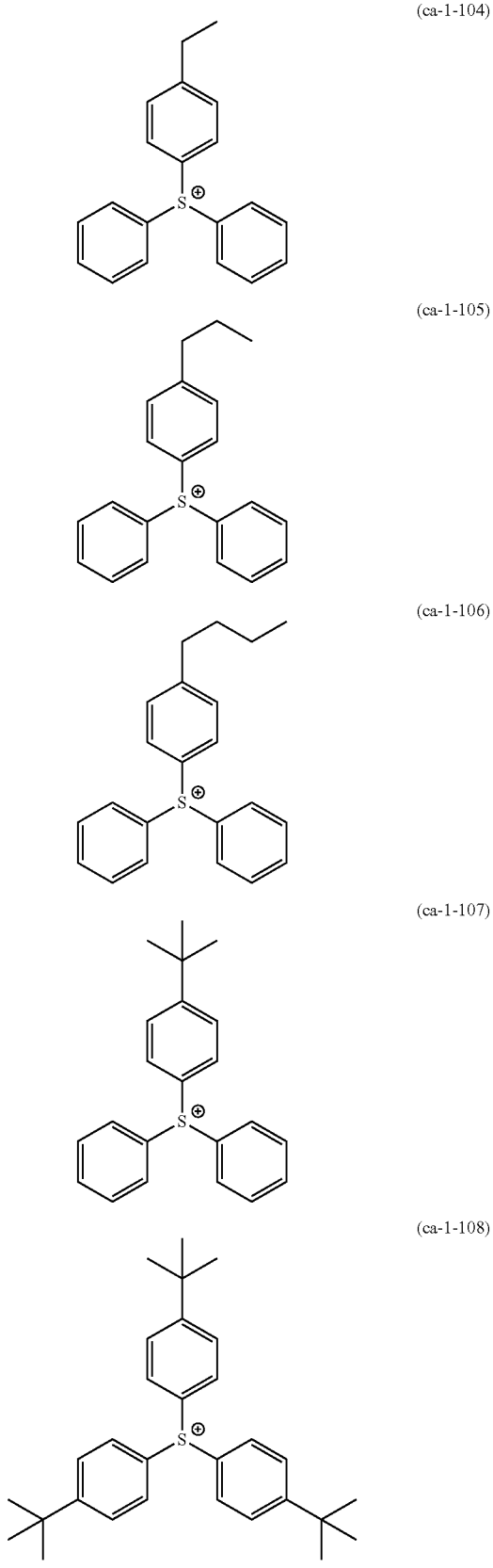

-continued
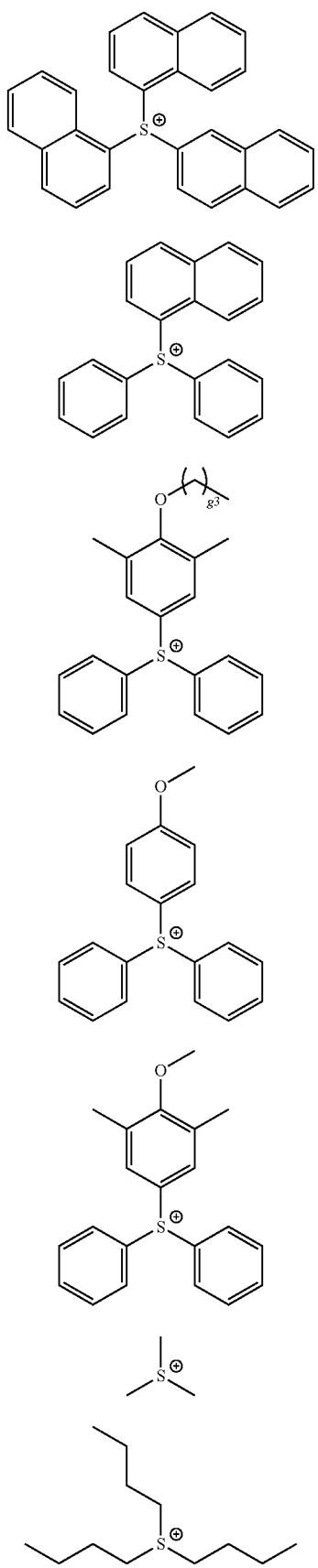
(ca-1-109)
(ca-1-110)
(ca-1-111)
(ca-1-112)
(ca-1-113)
(ca-1-114)
(ca-1-115)
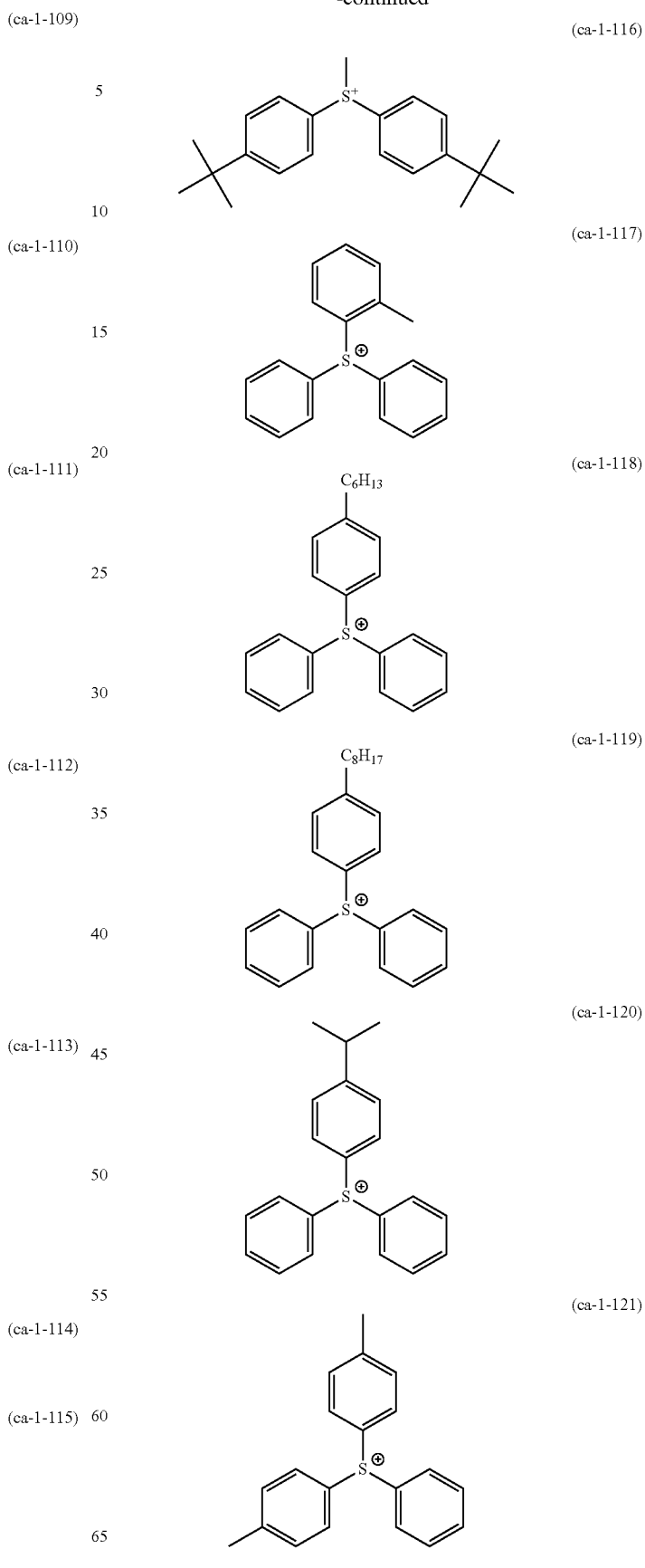
(ca-1-116)
(ca-1-117)
(ca-1-118)
(ca-1-119)
(ca-1-120)
(ca-1-121)

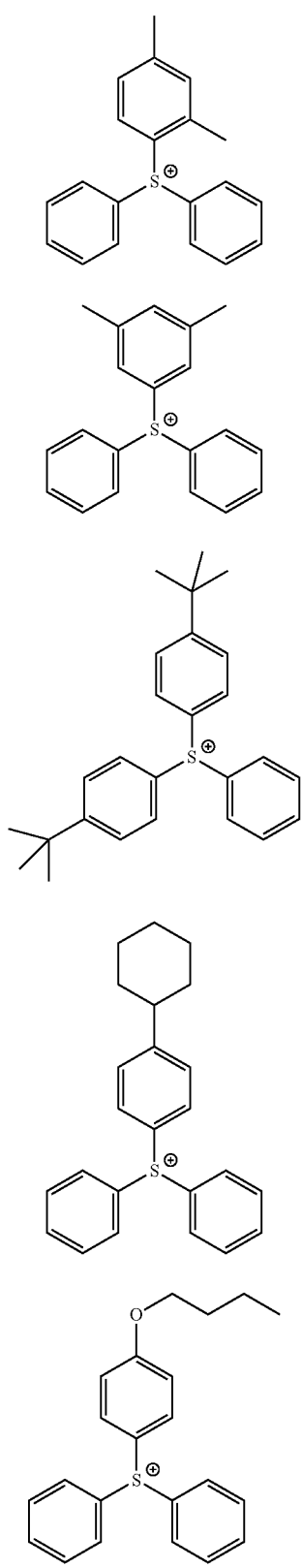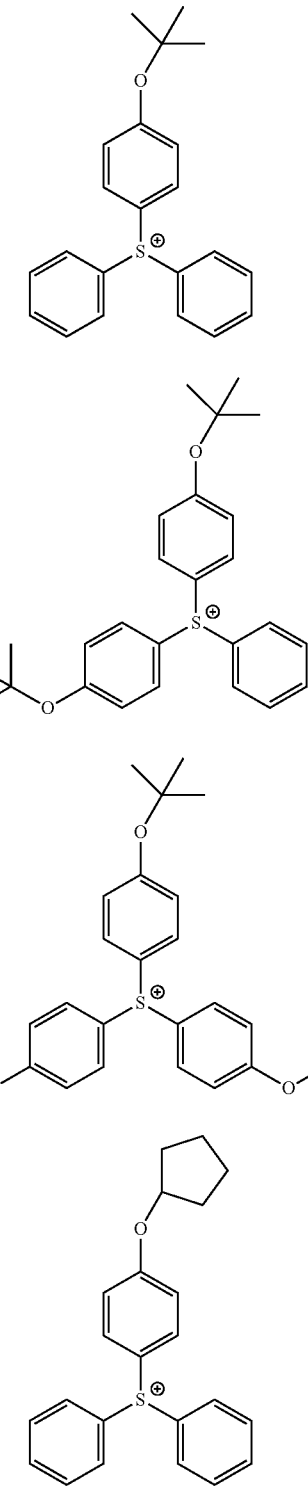

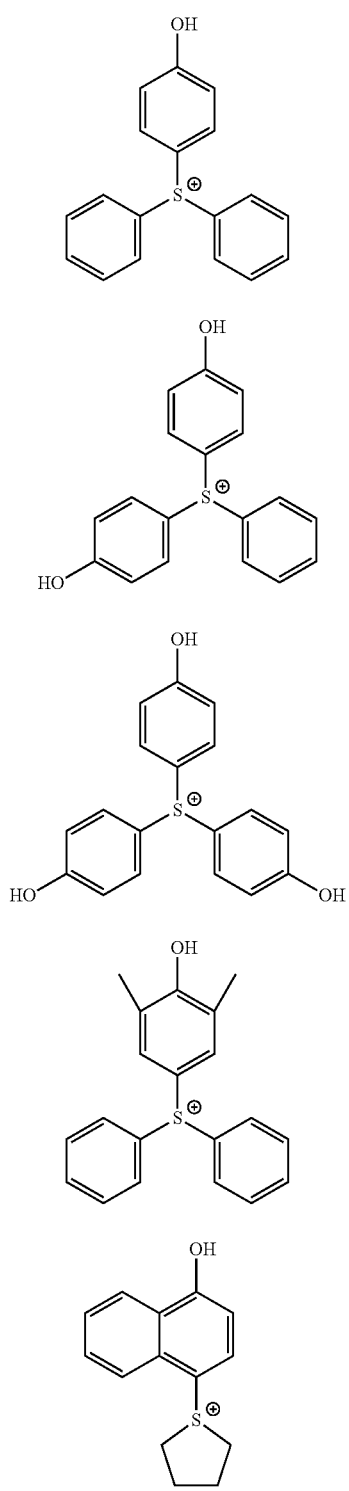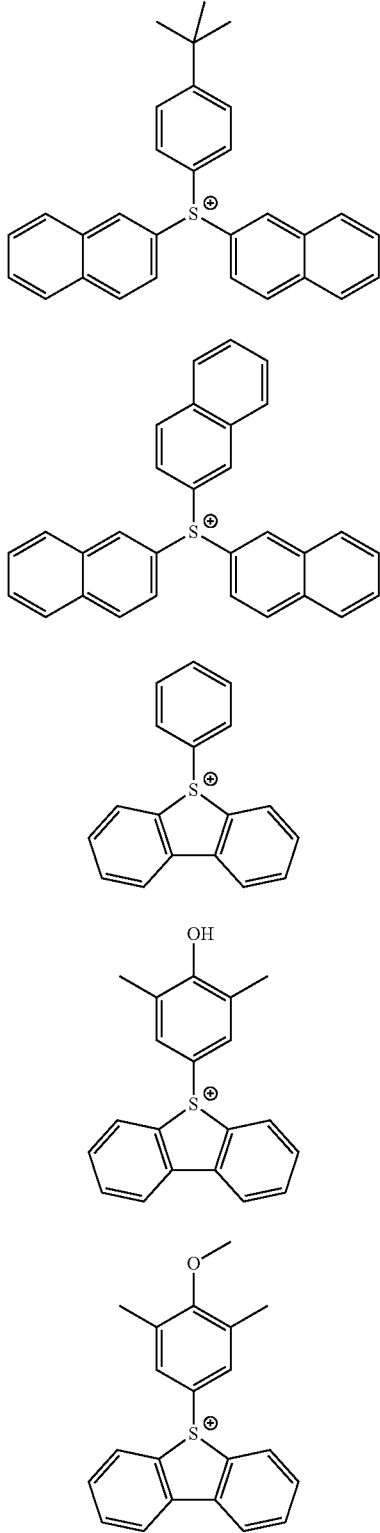

(ca-1-141) 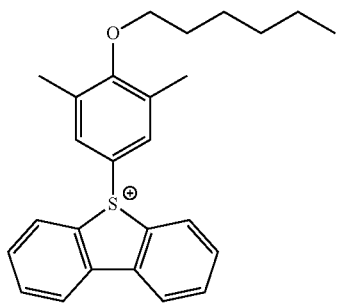

(ca-1-142) 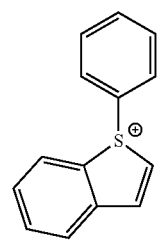

(ca-1-143) 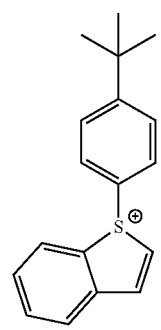

(ca-1-144) 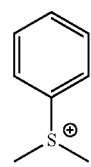

(ca-1-145) 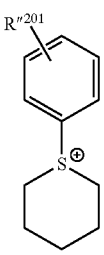

(ca-1-146) 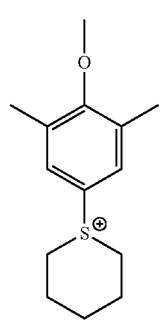

(ca-1-147) 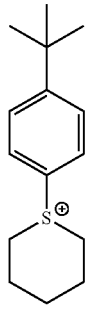

(ca-1-148) 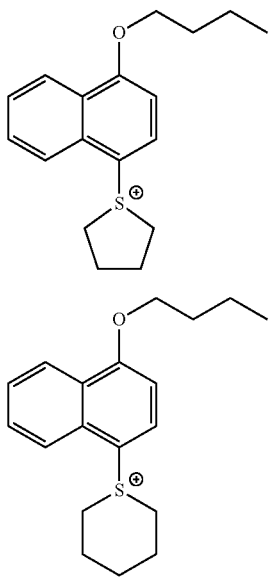

(ca-1-149) 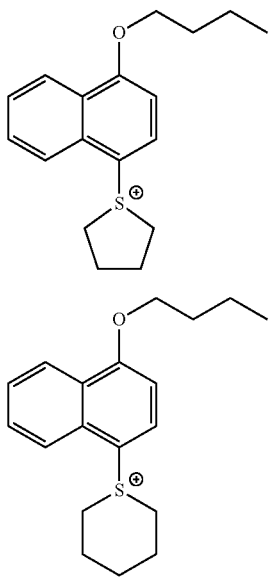

[In the formulae, $R''^{201}$ represents a hydrogen atom or a substituent. Examples of the substituent include the alkyl group, the halogen atom, the halogenated alkyl group, the carbonyl group, the cyano group, the amino group, the aryl group, and the groups represented by Formulae (ca-r-1) to (ca-r-7), which are exemplified as the substituent which may be included in $R^{201}$ to $R^{207}$, $R^{211}$, and $R^{212}$.]

Specific examples of suitable cations represented by Formula (ca-2) include a cation represented by any of Formulae (ca-2-1) and (ca-2-2), a diphenyliodonium cation, and a bis(4-tert-butylphenyl)iodonium cation.

(ca-2-1) 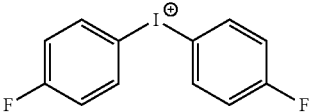

(ca-2-2) 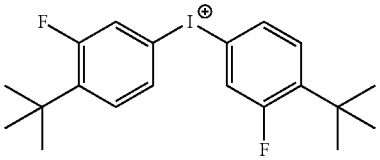

Specific examples of suitable cations represented by Formula (ca-3) include cations represented by Formulae (ca-3-1) to (ca-3-7) shown below.

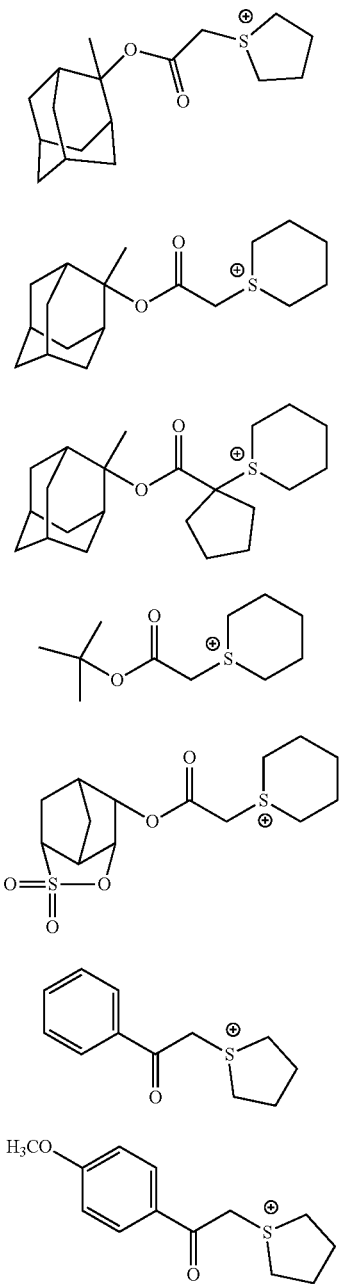

Specific examples of suitable cations represented by Formula (ca-4) include cations represented by Formulae (ca-4-1) and (ca-4-2) shown below.

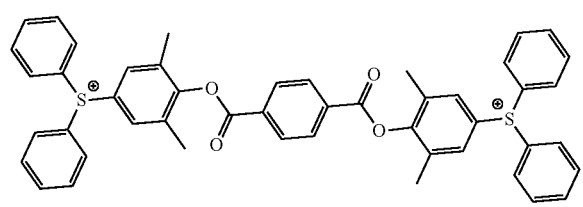

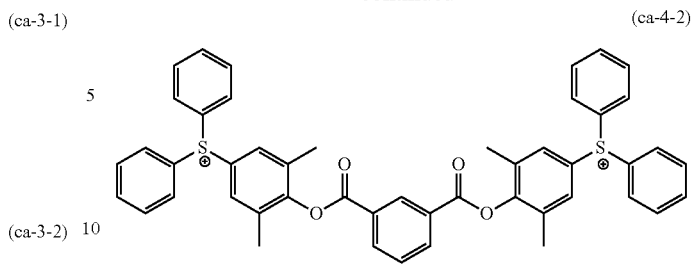

Among the examples, as the cation moiety (($M^{m+}$)$_{1/m}$), a cation represented by Formula (ca-1) is preferable, a cation represented by any of Chemical Formulae (ca-1-1) to (ca-1-78) and (ca-1-101) to (ca-1-149) is more preferable, and a cation represented by any of Formulae (ca-1-101) and (ca-1-102) is still more preferable.

Among the components (b-1), (b-2), and (b-3), as the onium salt-based acid generator in the present invention, the component (b-1) is particularly preferable.

In the resist composition according to the present embodiment, the component (B) may be used alone or in combination of two or more kinds thereof.

In a case where the resist composition contains the component (B), the content of the component (B) in the resist composition is preferably 50 parts by mass or less, more preferably in a range of 1 to 40 parts by mass, and still more preferably in a range of 5 to 30 parts by mass with respect to 100 parts by mass of the component (A).

In a case where the content of the component (B) is set to be in the above-described range, pattern formation can be satisfactorily performed.

<<Component (D)>>

The resist composition of the present embodiment may further contain a base component (a "component (D)") that does not correspond to the component (D0) in addition to the component (A) and the component (D0) or the component (A), the component (D0), and the component (B). The component (D) functions as a quencher (an acid diffusion control agent) which traps the acid generated in the resist composition upon exposure.

Examples of the component (D) include a nitrogen-containing organic compound (D1) (hereinafter, referred to as the "component (D1)") which does not correspond to the component (D0) and a photodecomposable base (D2) (hereinafter, referred to as a "component (D2)") which does not correspond to the component (D1) or the component (D0) and is decomposed upon exposure and then loses the acid diffusion controllability.

In a case where a resist composition containing the component (D1) is obtained, the contrast between exposed portions and unexposed portions of the resist film can be further improved at the time of formation of a resist pattern.

In Regard to Component (D1)

The component (D1) is a base component which is a nitrogen-containing organic compound component functioning as an acid diffusion control agent in the resist composition.

The component (D1) is not particularly limited as long as the component (D1) functions as an acid diffusion control agent, and examples thereof include an aliphatic amine and an aromatic amine.

Among examples, a secondary aliphatic amine or a tertiary aliphatic amine is preferable as the aliphatic amine.

An aliphatic amine is an amine having one or more aliphatic groups, and the aliphatic groups preferably have 1 to 12 carbon atoms.

Examples of these aliphatic amines include amines in which at least one hydrogen atom of ammonia ($NH_3$) has been substituted with an alkyl group or hydroxyalkyl group having 12 or less carbon atoms (alkylamines or alkylalcoholamines), and cyclic amines. Specific examples of alkylamines and alkylalcoholamines include monoalkylamines such as n-hexylamine, n-heptylamine, n-octylamine, n-nonylamine, and n-decylamine; dialkylamines such as diethylamine, di-n-propylamine, di-n-heptylamine, di-n-octylamine, and dicyclohexylamine; trialkylamines such as trimethylamine, triethylamine, tri-n-propylamine, tri-n-butylamine, tri-n-hexylamine, tri-n-pentylamine, tri-n-heptylamine, tri-n-octylamine, tri-n-nonylamine, tri-n-decylamine, and tri-n-dodecylamine; and alkyl alcohol amines such as diethanolamine, triethanolamine, diisopropanolamine, triisopropanolamine, di-n-octanolamine, and tri-n-octanolamine. Among these, trialkylamines of 5 to 10 carbon atoms are preferable, and tri-n-pentylamine and tri-n-octylamine are particularly preferable.

Examples of the cyclic amine include heterocyclic compounds containing a nitrogen atom as a hetero atom. The heterocyclic compound may be a monocyclic compound (aliphatic monocyclic amine), or a polycyclic compound (aliphatic polycyclic amine).

Specific examples of the aliphatic monocyclic amine include piperidine and piperazine.

The aliphatic polycyclic amine preferably has 6 to 10 carbon atoms, and specific examples thereof include 1,5-diazabicyclo[4.3.0]-5-nonene, 1,8-diazabicyclo[5.4.0]-7-undecene, hexamethylenetetramine, and 1,4-diazabicyclo[2.2.2]octane.

Examples of other aliphatic amines include tris(2-methoxymethoxyethyl)amine, tris{2-(2-methoxyethoxy)ethyl}amine, tris{2-(2-methoxyethoxymethoxy)ethyl}amine, tris{2-(1-methoxyethoxy)ethyl}amine, tris{2-(1-ethoxyethoxy)ethyl}amine, tris{2-(1-ethoxypropoxy)ethyl}amine, tris[2-{2-(2-hydroxyethoxy)ethoxy}ethyl]amine and triethanolamine triacetate, and triethanolamine triacetate is preferable.

Examples of aromatic amines include 4-dimethylaminopyridine, pyrrole, indole, pyrazole, imidazole and derivatives thereof, tribenzylamine, an aniline compound, and N-tert-butoxycarbonylpyrrolidine.

The component (D1) may be used alone or in combination of two or more kinds thereof.

Among the examples, as the component (D1), an aromatic amine is preferable, and an aniline compound is more preferable. Examples of the aniline compound include 2,6-diisopropylaniline, N,N-dimethylaniline, N,N-dibutylaniline, and N,N-dihexylaniline.

In a case where the resist composition contains the component (D1), the content of the component (D1) in the resist composition is typically in a range of 0.01 to 5 parts by mass with respect to 100 parts by mass of the component (A). In a case where the content thereof is set to be in the above-described range, the component (D1) and other components can be balanced, and various lithography characteristics are improved.

In Regard to Component (D2)

The component (D2) is not particularly limited as long as the component does not correspond to the component (D0) and is decomposed upon exposure and loses the acid diffusion controllability, and one or more compounds selected from the group consisting of a compound represented by Formula (d2-1) (hereinafter, referred to as a "component (d2-1)"), a compound represented by Formula (d2-2) (hereinafter, referred to as a "component (d2-2)"), and a compound represented by Formula (d2-3) (hereinafter, referred to as a "component (d2-3)") are preferable.

At exposed portions of the resist film, the components (d2-1) to (d2-3) are decomposed and then lose the acid diffusion controllability (basicity), and therefore the components (d2-1) to (d2-3) cannot act as a quencher, whereas at unexposed portions of the resist film, the components (d2-1) to (d2-3) act as a quencher.

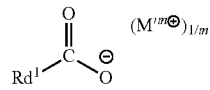

(d2-1)

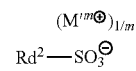

(d2-2)

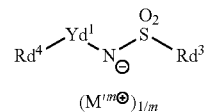

(d2-3)

[In the formulae, $Rd^1$ to $Rd^4$ represent a cyclic group which may have a substituent, a chain-like alkyl group which may have a substituent, or a chain-like alkenyl group which may have a substituent. Here, the carbon atom adjacent to the S atom as $Rd^2$ in Formula (d2-2) has no fluorine atom bonded thereto. $Yd^1$ represents a single bond or a divalent linking group. m represents an integer of 1 or greater, and each $M'^{m+}$ independently represents an m-valent onium cation.]

{Component (d2-1)}
Anion Moiety

In Formula (d2-1), Rd' represents a cyclic group which may have a substituent, a chain-like alkyl group which may have a substituent or a chain-like alkenyl group which may have a substituent, and examples thereof are the same as those described above as $R^{101}$ in Formula (b-1).

Among these, as the group as $Rd^1$, an aromatic hydrocarbon group which may have a substituent, an aliphatic cyclic group which may have a substituent and a chain-like alkyl group which may have a substituent are preferable.

Examples of the substituent for these groups include a hydroxyl group, an oxo group, an alkyl group, an aryl group, a fluorine atom, a fluorinated alkyl group, a lactone-containing cyclic group represented by any of Formulae (a2-r-1) to (a2-r-7), an ether bond, an ester bond, and a combination thereof. In a case where an ether bond or an ester bond is included as the substituent, the substituent may be bonded via an alkylene group, and a linking group represented by any of Formulae (y-a1-1) to (y-a1-5) is preferable as the substituent.

Suitable examples of the aromatic hydrocarbon group include a phenyl group, a naphthyl group, and a polycyclic structure having a bicyclooctane skeleton (for example, a polycyclic structure formed of a cyclic structure having a bicyclooctane skeleton and a cyclic structure other than the cyclic structure having a bicyclooctane skeleton).

As the aliphatic cyclic group, a group in which one or more hydrogen atoms have been removed from a polycycloalkane such as adamantane, norbornane, isobornane, tricyclodecane or tetracyclododecane is more preferable.

The chain-like alkyl group preferably has 1 to 10 carbon atoms, and specific examples thereof include a linear alkyl group such as a methyl group, an ethyl group, a propyl group, a butyl group, a pentyl group, a hexyl group, a heptyl group, an octyl group, a nonyl group, or a decyl group, and a branched alkyl group such as a 1-methylethyl group, a 1-methylpropyl group, a 2-methylpropyl group, a 1-methylbutyl group, a 2-methylbutyl group, a 3-methylbutyl group, a 1-ethylbutyl group, a 2-ethylbutyl group, a 1-methylpentyl group, a 2-methylpentyl group, a 3-methylpentyl group, or a 4-methylpentyl group.

In a case where the chain-like alkyl group is a fluorinated alkyl group having a fluorine atom or a fluorinated alkyl group as a substituent, the fluorinated alkyl group has preferably 1 to 11 carbon atoms, more preferably 1 to 8 carbon atoms, and still more preferably 1 to 4 carbon atoms. The fluorinated alkyl group may contain an atom other than a fluorine atom. Examples of the atom other than a fluorine atom include an oxygen atom, a sulfur atom, and a nitrogen atom.

As $Rd^1$, a fluorinated alkyl group in which some or all hydrogen atoms constituting a linear alkyl group have been substituted with fluorine atom(s) is preferable, and a fluorinated alkyl group in which all of the hydrogen atoms constituting a linear alkyl group have been substituted with fluorine atoms (a linear perfluoroalkyl group) is particularly preferable.

Specific examples of preferable anion moieties for the component (d2-1) are shown below.

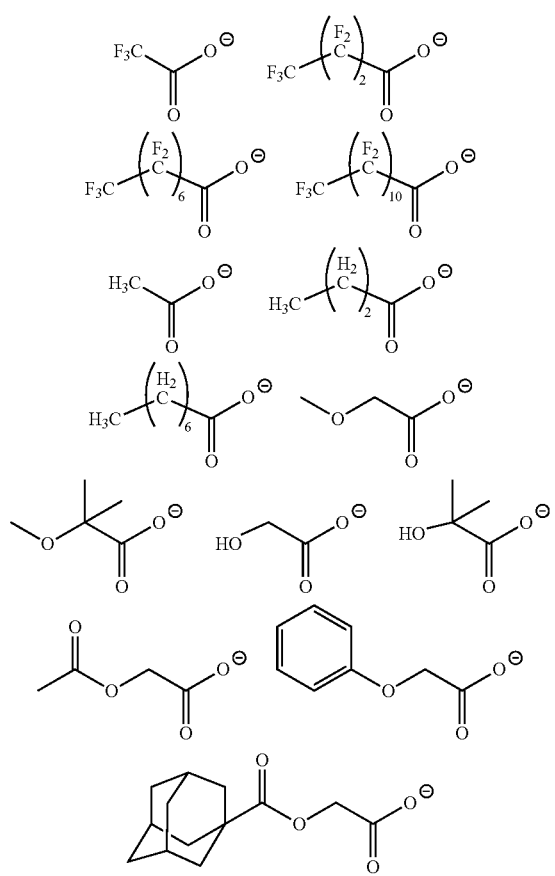

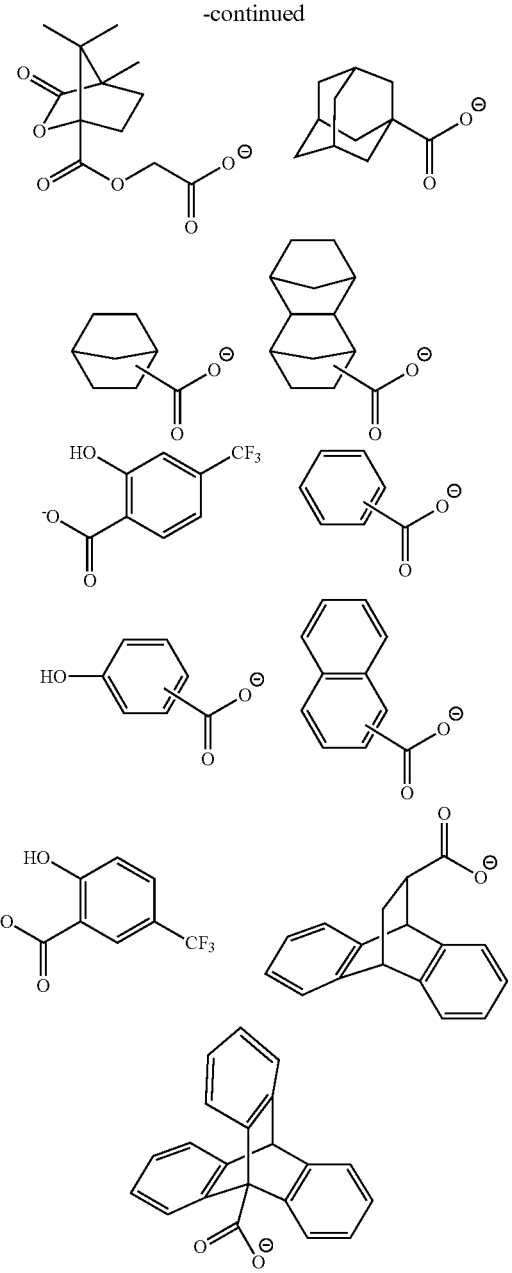

Cation Moiety

In Formula (d2-1), represents an m-valent onium cation.

Suitable examples of the onium cation as $M^{m+}$ include those exemplified as the cation represented by Formulae (ca-1) to (ca-4). Specific examples thereof include cations represented by Chemical Formulae (ca-1-1) to (ca-1-78) and (ca-1-101) to (ca-1-149).

The component (d2-1) may be used alone or in combination of two or more kinds thereof.

{Component (d2-2)}

Anion Moiety

In Formula (d2-2), $Rd^2$ represents a cyclic group which may have a substituent, a chain-like alkyl group which may have a substituent, or a chain-like alkenyl group which may have a substituent, and the same groups as those described above as $R^{101}$ in Formula (b-1) are exemplified.

Here, the carbon atom adjacent to the S atom in $Rd^2$ has no fluorine atom bonded thereto (the carbon atom adjacent to the sulfur atom in $Rd^2$ is not substituted with a fluorine atom). As a result, the anion of the component (d2-2) becomes an appropriately weak acid anion, thereby improving the quenching ability of the component (D2).

As $Rd^2$, a chain-like alkyl group which may have a substituent or an aliphatic cyclic group which may have a substituent is preferable. The chain-like alkyl group has preferably 1 to 10 carbon atoms and more preferably 3 to 10 carbon atoms. As the aliphatic cyclic group, a group in which one or more hydrogen atoms have been removed from adamantane, norbornane, isobornane, tricyclodecane, or tetracyclododecane (which may have a substituent) and a group in which one or more hydrogen atoms have been removed from camphor are more preferable.

The hydrocarbon group as $Rd^2$ may have a substituent. As the substituent, the same groups as the substituents which may be included in the hydrocarbon group (such as an aromatic hydrocarbon group, an aliphatic cyclic group, or a chain-like alkyl group) as $Rd^1$ in Formula (d2-1) can be exemplified.

Specific examples of preferable anion moieties for the component (d2-2) are shown below.

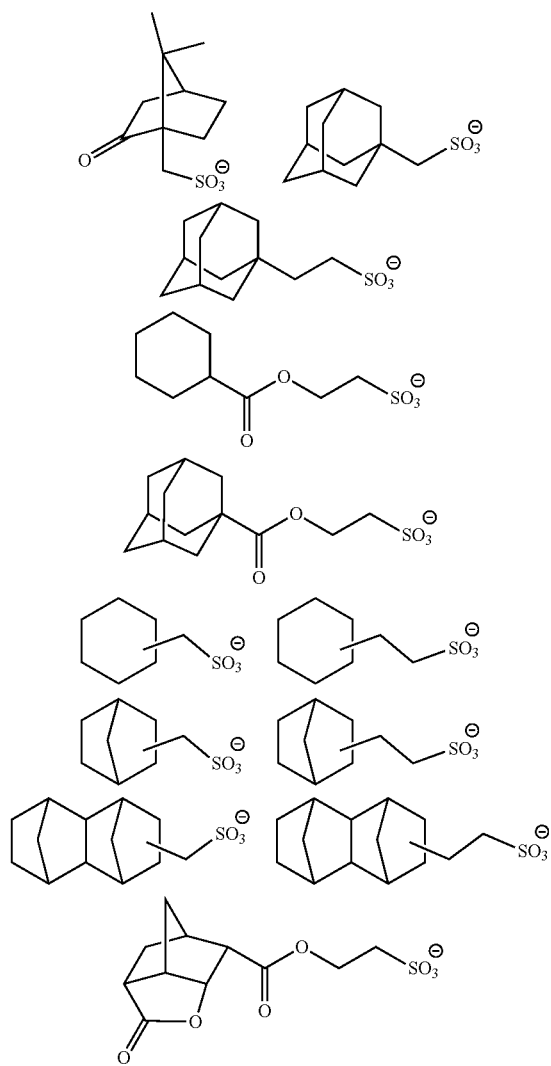

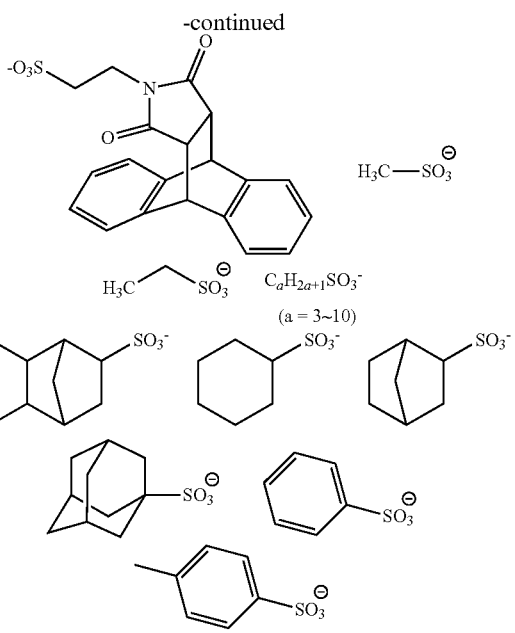

Cation Moiety

In Formula (d2-2), $M'^{m+}$ represents an m-valent onium cation and has the same definition as that for $M'^{m+}$ in Formula (d2-1).

The component (d2-2) may be used alone or in combination of two or more kinds thereof.

{Component (d2-3)}

Anion Moiety

In Formula (d2-3), $Rd^3$ represents a cyclic group which may have a substituent, a chain-like alkyl group which may have a substituent, or a chain-like alkenyl group which may have a substituent, and the same groups as those described above as $R^{101}$ in Formula (b-1) are exemplified, and a cyclic group containing a fluorine atom, a chain-like alkyl group, or a chain-like alkenyl group is preferable. Among these, a fluorinated alkyl group is preferable, and the same fluorinated alkyl groups as those described above as $Rd^1$ are more preferable.

In Formula (d2-3), $Rd^4$ represents a cyclic group which may have a substituent, a chain-like alkyl group which may have a substituent or a chain-like alkenyl group which may have a substituent, and the same groups as those described above as $R^{101}$ in Formula (b-1) are exemplified.

Among these, an alkyl group which may have substituent, an alkoxy group which may have substituent, an alkenyl group which may have substituent, or a cyclic group which may have substituent is preferable.

The alkyl group as $Rd^4$ is preferably a linear or branched alkyl group having 1 to 5 carbon atoms, and specific examples thereof include a methyl group, an ethyl group, a propyl group, an isopropyl group, an n-butyl group, an isobutyl group, a tert-butyl group, a pentyl group, an isopentyl group, and a neopentyl group. Some hydrogen atoms in the alkyl group as $Rd^4$ may be substituted with a hydroxyl group, a cyano group, or the like.

The alkoxy group as $Rd^4$ is preferably an alkoxy group having 1 to 5 carbon atoms, and specific examples thereof include a methoxy group, an ethoxy group, an n-propoxy group, an iso-propoxy group, an n-butoxy group, and a tert-butoxy group. Among these, a methoxy group and an ethoxy group are preferable.

As the alkenyl group as Rd⁴, the same groups as those described above as $R^{101}$ in Formula (b-1) can be exemplified, and a vinyl group, a propenyl group (an allyl group), a 1-methylpropenyl group, and a 2-methylpropenyl group are preferable. These groups may have an alkyl group having 1 to 5 carbon atoms or a halogenated alkyl group having 1 to 5 carbon atoms as a substituent.

As the cyclic group as Rd⁴, the same groups as those described above as $R^{101}$ in Formula (b-1) can be exemplified. Among these, as the cyclic group, an alicyclic group in which one or more hydrogen atoms have been removed from a cycloalkane such as cyclopentane, cyclohexane, adamantane, norbornane, isobornane, tricyclodecane or tetracyclododecane or an aromatic group such as a phenyl group or a naphthyl group is preferable. In a case where Rd⁴ represents an alicyclic group, the resist composition can be satisfactorily dissolved in an organic solvent, thereby improving the lithography characteristics.

In Formula (d2-3), $Yd^1$ represents a single bond or a divalent linking group.

The divalent linking group as $Yd^1$ is not particularly limited, and examples thereof include a divalent hydrocarbon group (an aliphatic hydrocarbon group or an aromatic hydrocarbon group) which may have a substituent and a divalent linking group containing a hetero atom. The divalent linking groups are the same as described above as the divalent hydrocarbon group which may have a substituent and the divalent linking group containing a hetero atom explained above as the divalent linking group as $Ya^{x1}$ in Formula (a10-1).

As $Yd^1$, a carbonyl group, an ester bond, an amide bond, an alkylene group, or a combination of these is preferable. As the alkylene group, a linear or branched alkylene group is more preferable, and a methylene group or an ethylene group is still more preferable.

Specific examples of preferable anion moieties for the component (d2-3) are shown below.

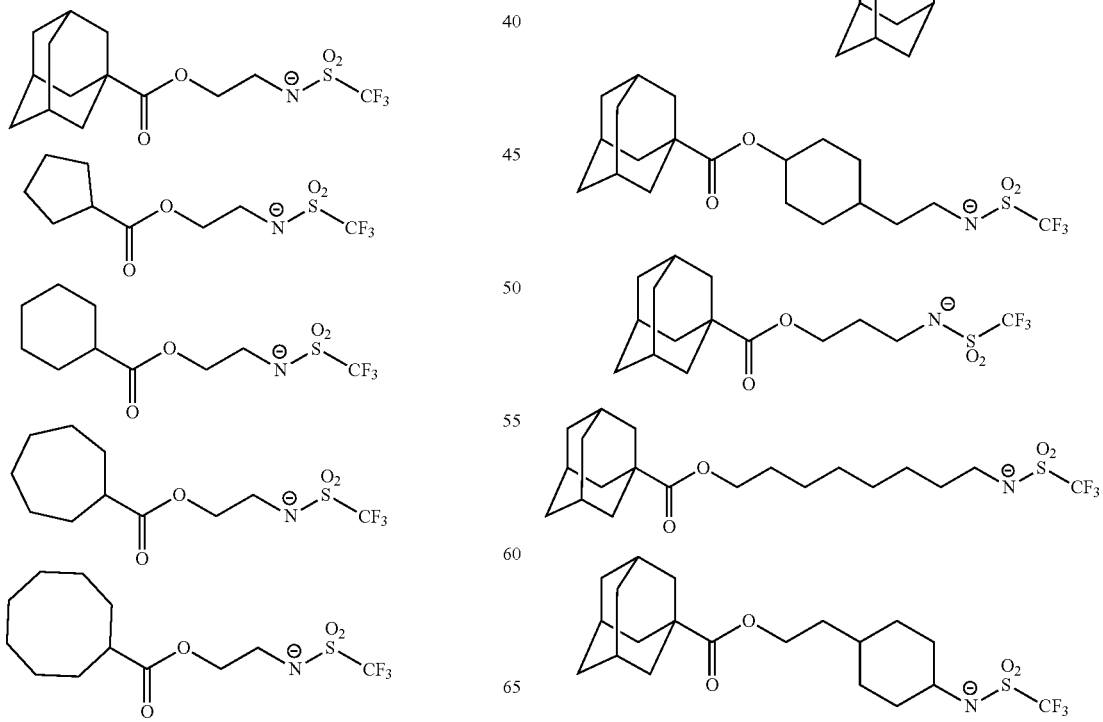

-continued

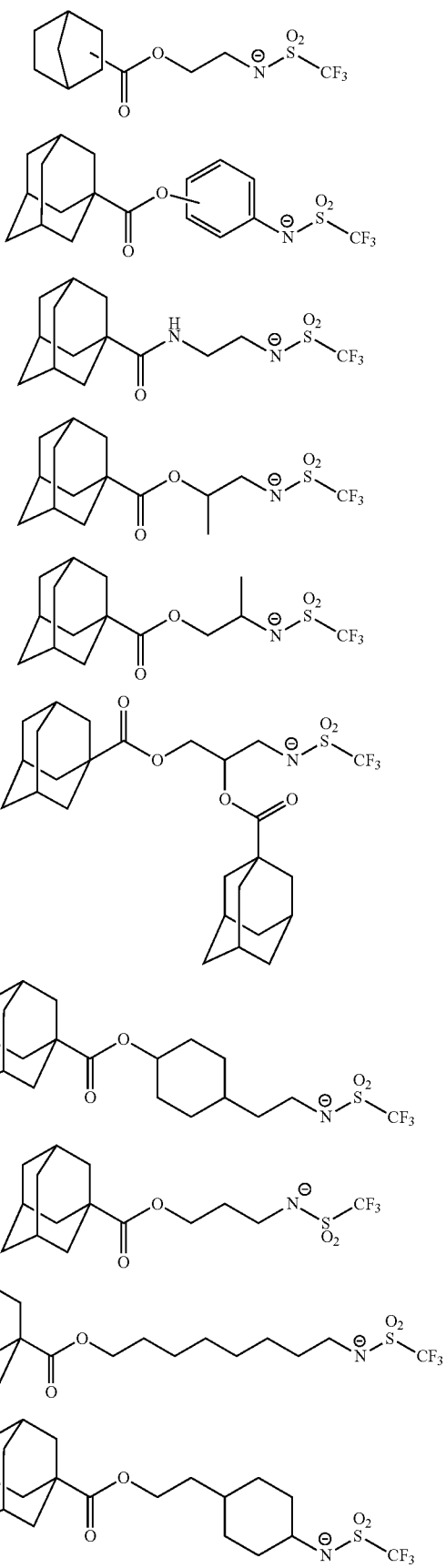

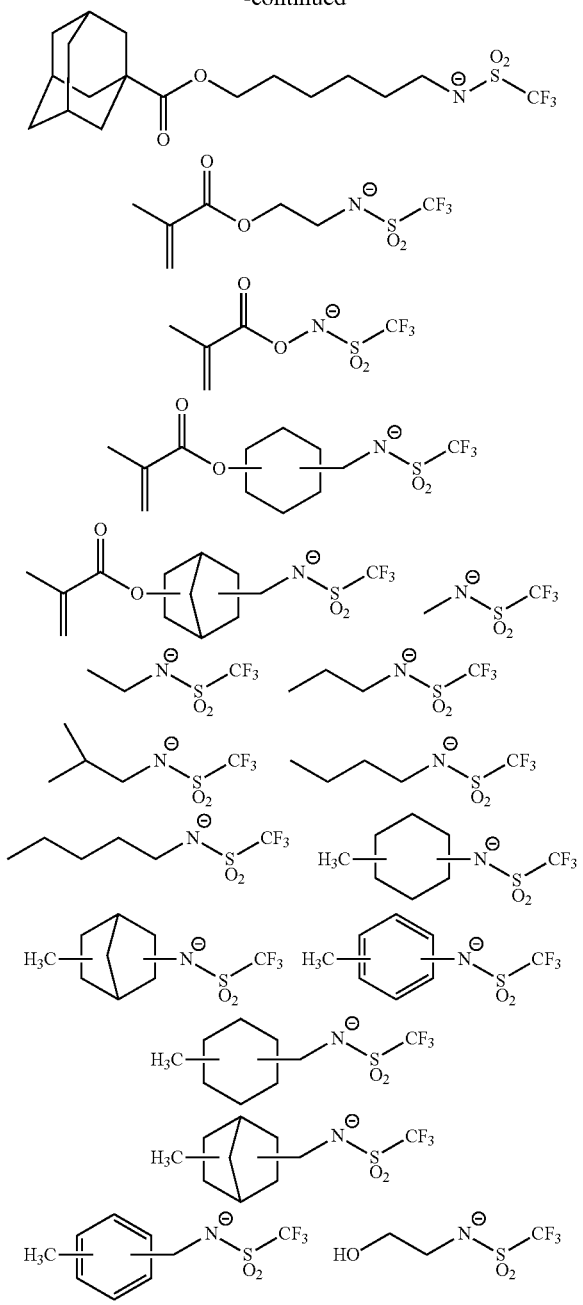

Cation Moiety

In Formula (d2-3), $M'^{m+}$ represents an m-valent onium cation and has the same definition as that for in Formula (d2-1).

The component (d2-3) may be used alone or in combination of two or more kinds thereof.

As the component (D2), only one of the above-described components (d2-1) to (d2-3) or a combination of two or more kinds thereof may be used.

In a case where the resist composition contains the component (D2), the content of the component (D2) in the resist composition is preferably in a range of 0.5 to 35 parts by mass, more preferably in a range of 1 to 25 parts by mass, still more preferably in a range of 2 to 20 parts by mass, and particularly preferably in a range of 3 to 15 parts by mass with respect to 100 parts by mass of the component (A).

In a case where the content of the component (D2) is greater than or equal to the preferable lower limit, excellent lithography characteristics and an excellent resist pattern shape are easily obtained. Further, in a case where the content thereof is less than or equal to the upper limit thereof, the component (D2) and other components can be balanced, and various lithography characteristics are improved.

Method of Producing Component (D2):

The production methods of the components (d2-1) and (d2-2) are not particularly limited, and the components (d2-1) and (d2-2) can be produced by known methods.

Further, the method of producing the component (d2-3) is not particularly limited, and the component (d2-3) can be produced in the same manner as disclosed in United States Patent Application, Publication No. 2012-0149916.

Among the examples, as the component (D) in the resist composition according to the present embodiment, the component (D2) is preferable, and the component (d2-1) is more preferable.

<<Component (E): At Least One Compound (E) Selected from Group Consisting of Organic Carboxylic Acids, Phosphorus Oxo Acids, and Derivatives Thereof>>

For the purpose of preventing any deterioration in sensitivity, and improving the resist pattern shape and the post exposure temporal stability, the resist composition of the present embodiment may contain at least one compound (E) (hereinafter referred to as the component (E)) selected from the group consisting of an organic carboxylic acid, or a phosphorus oxo acid and a derivative thereof.

Examples of suitable organic carboxylic acids include acetic acid, malonic acid, citric acid, malic acid, succinic acid, benzoic acid, and salicylic acid.

Examples of phosphorus oxo acids include phosphoric acid, phosphonic acid, and phosphinic acid. Among these, phosphonic acid is particularly preferable.

Examples of phosphorus oxo acid derivatives include esters in which a hydrogen atom in the above-described oxo acids is substituted with a hydrocarbon group. Examples of the hydrocarbon group include an alkyl group having 1 to 5 carbon atoms and an aryl group having 6 to 15 carbon atoms.

Examples of phosphoric acid derivatives include phosphoric acid esters such as di-n-butyl phosphate and diphenyl phosphate.

Examples of phosphonic acid derivatives include phosphonic acid esters such as dimethyl phosphonate, di-n-butyl phosphonate, phenylphosphonic acid, diphenyl phosphonate, and dibenzyl phosphonate.

Examples of phosphinic acid derivatives include phosphinic acid esters and phenylphosphinic acid.

In the resist composition of the present embodiment, the component (E) may be used alone or in combination of two or more kinds thereof.

In a case where the resist composition contains the component (E), the content of the component (E) is typically in a range of 0.01 to 5 parts by mass, with respect to 100 parts by mass of the component (A).

<<Component (F): Fluorine Additive Component>>

In the present embodiment, the resist composition may further include a fluorine additive (hereinafter, referred to as a "component (F)") in order to impart water repellency to the resist film or to improve the lithography characteristics.

As the component (F), a fluorine-containing polymer compound described in Japanese Unexamined Patent Application, First Publication No. 2010-002870, Japanese Unexamined Patent Application, First Publication No. 2010-032994, Japanese Unexamined Patent Application, First Publication No. 2010-277043, Japanese Unexamined Patent Application, First Publication No. 2011-13569, and Japanese Unexamined Patent Application, First Publication No. 2011-128226 can be exemplified.

Specific examples of the component (F) include polymers having a constitutional unit (f1) represented by Formula (f1-1) shown below. As the polymer, a polymer (homopolymer) consisting of a constitutional unit (f1) represented by Formula (f1-1) shown below; a copolymer of the constitutional unit (f1) and the above-described constitutional unit (a4); a copolymer of the constitutional unit (f1) and the above-described constitutional unit (a1); and a copolymer of the constitutional unit (f1), a constitutional unit derived from acrylic acid or methacrylic acid, and the above-described constitutional unit (a1) are preferable. Preferred examples of the constitutional unit (a1) to be copolymerized with the constitutional unit (f1) include a constitutional unit derived from 1-ethyl-1-cyclooctyl (meth)acrylate and a constitutional unit derived from 1-methyl-1-adamantyl (meth)acrylate.

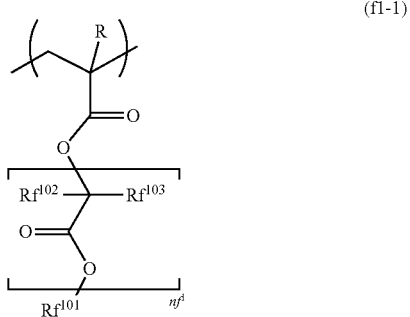

(f1-1)

[In the formula, R has the same definition as described above. $Rf^{102}$ and $Rf^{103}$ each independently represent a hydrogen atom, a halogen atom, an alkyl group having 1 to 5 carbon atoms, or a halogenated alkyl group having 1 to 5 carbon atoms, and $Rf^{102}$ and $Rf^{103}$ may be the same as or different from each other. $nf^1$ represents an integer of 0 to 5. $Rf^{101}$ represents an organic group containing a fluorine atom.]

In Formula (f1-1), R bonded to the carbon atom at the α-position has the same definition as described above. As R, a hydrogen atom or a methyl group is preferable.

In Formula (f1-1), examples of the halogen atom as $Rf^{102}$ and $Rf^{103}$ include a fluorine atom, a chlorine atom, a bromine atom, and an iodine atom, and a fluorine atom is particularly preferable. Examples of the alkyl group having 1 to 5 carbon atoms as $Rf^{102}$ and $Rf^{103}$ include those described above as the alkyl group having 1 to 5 carbon atoms as R, and a methyl group or an ethyl group is preferable. Specific examples of the halogenated alkyl group having 1 to 5 carbon atoms as $Rf^{102}$ and $Rf^{103}$ include groups in which some or all hydrogen atoms of the above-described alkyl groups of 1 to 5 carbon atoms have been substituted with halogen atoms.

Examples of the halogen atom include a fluorine atom, a chlorine atom, a bromine atom, and an iodine atom, and a fluorine atom is particularly preferable. Among these examples, as $Rf^{102}$ and $Rf^{103}$, a hydrogen atom, a fluorine atom, or an alkyl group having 1 to 5 carbon atoms is preferable, and a hydrogen atom, a fluorine atom, a methyl group, or an ethyl group is more preferable.

In Formula (f1-1), $nf^1$ represents an integer of 0 to 5, preferably an integer of 0 to 3, and more preferably an integer of 0 or 1.

In Formula (f1-1), $Rf^{101}$ represents an organic group containing a fluorine atom, and is preferably a hydrocarbon group containing a fluorine atom.

The hydrocarbon group containing a fluorine atom may be linear, branched, or cyclic, and has preferably 1 to 20 carbon atoms, more preferably 1 to 15 carbon atoms, and particularly preferably 1 to 10 carbon atoms.

It is preferable that the hydrocarbon group having a fluorine atom has 25% or more of the hydrogen atoms in the hydrocarbon group fluorinated, more preferably 50% or greater, and particularly preferably 60% or greater from the viewpoint of improving the hydrophobicity of the resist film during immersion exposure.

Among these, as $Rf^{101}$, a fluorinated hydrocarbon group having 1 to 6 carbon atoms is more preferable, and a trifluoromethyl group, $-CH_2-CF_3$, $-CH_2-CF_2-CF_3$, $-CH(CF_3)_2$, $-CH_2-CH_2-CF_3$, and $-CH_2-CH_2-CF_2-CF_2-CF_2-CF_3$ are still more preferable.

The weight-average molecular weight (Mw) (in terms of polystyrene determined by gel permeation chromatography) of the component (F) is preferably in a range of 1000 to 50000, more preferably in a range of 5000 to 40000, and most preferably in a range of 10000 to 30000. In a case where the weight-average molecular weight is less than or equal to the upper limit of the above-described range, the resist composition exhibits a satisfactory solubility in a solvent for a resist enough to be used as a resist. On the other hand, in a case where the weight-average molecular weight is greater than or equal to the lower limit of the above-described range, dry etching resistance and the cross-sectional shape of the resist pattern become excellent.

Further, the dispersity (Mw/Mn) of the component (F) is preferably in a range of 1.0 to 5.0, more preferably in a range of 1.0 to 3.0, and most preferably in a range of 1.2 to 2.5.

In the resist composition of the present embodiment, the component (F) may be used alone or in combination of two or more kinds thereof.

In a case where the resist composition contains the component (F), the content of the component (F) is typically in a range of 0.5 to 10 parts by mass, with respect to 100 parts by mass of the component (A).

<<Component (S): Organic Solvent Component>>

The resist composition of the present embodiment may be produced by dissolving the resist materials in an organic solvent (hereinafter, referred to as a "component (S)").

The component (S) may be any organic solvent which can dissolve the respective components to be used to obtain a uniform solution, and optional organic solvent can be appropriately selected from those which have been conventionally known as solvents for a chemically amplified resist composition and then used.

Examples thereof include lactones such as γ-butyrolactone; ketones such as acetone, methyl ethyl ketone, cyclohexanone, methyl-n-pentyl ketone, methyl isopentyl ketone, 2-heptanone, ethylene carbonate, and propylene carbonate; polyhydric alcohols, such as ethylene glycol, diethylene glycol, propylene glycol and dipropylene glycol; compounds having an ester bond, such as ethylene glycol monoacetate, diethylene glycol monoacetate, propylene glycol monoacetate, and dipropylene glycol monoacetate; polyhydric alcohol derivatives including compounds having an ether bond, such as a monoalkylether (such as monomethylether, monoethylether, monopropylether or monobutylether) or monophenylether of any of these polyhydric alcohols or compounds having an ester bond (among these, propylene glycol monomethyl ether acetate (PGMEA) and propylene glycol monomethyl ether (PGME) are preferable); cyclic ethers such as dioxane; esters such as methyl lactate, ethyl lactate (EL), methyl acetate, ethyl acetate, butyl acetate, methyl pyruvate, ethyl pyruvate, methyl methoxypropionate, and ethyl ethoxypropionate; aromatic organic solvents such as anisole, ethylbenzylether, cresylmethylether, diphenylether, dibenzylether, phenetole, butylphenylether, ethylbenzene, diethylbenzene, pentylbenzene, isopropylbenzene, toluene, xylene, cymene and mesitylene; and dimethylsulfoxide (DMSO).

In the resist composition of the present embodiment, the component (S) may be used alone or in the form of a mixed solvent of two or more kinds thereof.

Among these, PGMEA, PGME, γ-butyrolactone, propylene carbonate, EL, and cyclohexanone are preferable.

Further, a mixed solvent obtained by mixing PGMEA with a polar solvent is also preferable. The blending ratio (mass ratio) of the mixed solvent can be appropriately determined, taking into consideration the compatibility of the PGMEA with the polar solvent, but is preferably in the range of 1:9 to 9:1 and more preferably in a range of 2:8 to 8:2.

More specifically, in a case where EL or cyclohexanone is blended as the polar solvent, the PGMEA:EL or cyclohexanone mass ratio is preferably in a range of 1:9 to 9:1 and more preferably in a range of 2:8 to 8:2. Alternatively, in a case where PGME is blended as the polar solvent, the PGMEA:PGME mass ratio is preferably in a range of 1:9 to 9:1, more preferably in a range of 2:8 to 8:2, and still more preferably in a range of 3:7 to 7:3. Furthermore, a mixed solvent of PGMEA, PGME and cyclohexanone is also preferable.

Further, as the component (S), a mixed solvent of at least one selected from PGMEA and EL and at least one selected from γ-butyrolactone and propylene carbonate is also preferable. In this case, as the mixing ratio, the mass ratio between the former and the latter is preferably in a range of 60:40 to 99:1 and more preferably in a range of 70:30 to 95:5.

The amount of the component (S) to be used is not particularly limited and is appropriately set to have a concentration which enables coating of a coating solution to a substrate or the like depending on the thickness of the coated film. In general, the component (S) is used in an amount such that the solid content of the resist composition becomes in the range of 0.1% to 20% by mass and preferably in a range of 0.2% to 15% by mass.

Impurities or the like may be removed from the resist composition of the present embodiment using a polyimide porous film, a polyamideimide porous film, or the like after the resist material is dissolved in the component (S). For example, the resist composition may be filtered using a filter formed of a polyimide porous film, a filter formed of a polyamideimide porous film, or a filter formed of a polyimide porous film and a polyamideimide porous film. Examples of the polyimide porous film and the polyamideimide porous film include those described in Japanese Unexamined Patent Application, First Publication No. 2016-155121.

As desired, other miscible additives can also be added to the resist composition of the present embodiment. The resist composition may contain miscible additives such as additive resins, dissolution inhibitors, plasticizers, stabilizers, colorants, halation prevention agents, and dyes for improving the performance of the resist film, as appropriate.

The resist composition according to the present embodiment contains the component (A), the component (D0), and optional components as necessary.

Suitable examples thereof include a resist composition containing the component (A), the component (D0), and the component (B).

The above-described resist composition according to the present embodiment contains the component (D0) described above. Since the anion moiety of the component (D0) contains a plurality of hydroxy groups, diffusion of an acid generated from the component (A) or the component (B) can be appropriately controlled. Further, since the cation moiety of the component (D0) has a Log P value of less than 7.7, the solubility during development of the resist film can be appropriately adjusted. Therefore, according to the resist composition according to the present embodiment, it is assumed that the lithography characteristics (reduction in roughness and the like) are further improved during formation of the resist pattern.

(Method of Forming a Resist Pattern)

The method of forming a resist pattern according to the second aspect of the present invention includes a step of forming a resist film on a support using the resist composition of the embodiment; a step of exposing the resist film; and a step of developing the exposed resist film to form a resist pattern. According to the embodiment of the method of forming a resist pattern, a method of forming a resist pattern by performing processes as described below is exemplified.

First, a resist composition of the according to the embodiment is applied to a support using a spinner or the like, and a bake treatment (post applied bake (PAB)) is conducted at a temperature of 80 to 150° C. for 40 to 120 seconds and preferably 60 to 90 seconds, to form a resist film.

Following selective exposure of the thus formed resist film, by exposure through a mask having a predetermined pattern formed thereon (mask pattern) using an exposure apparatus such as an electron beam lithography apparatus or an EUV exposure apparatus, or by patterning via direct irradiation with an electron beam without using a mask pattern, baking treatment (post exposure baking (PEB)) is conducted under temperature conditions of 80 to 150° C. for 40 to 120 seconds, and preferably 60 to 90 seconds.

Next, the resist film is subjected to a developing treatment. The developing treatment is conducted using an alkali developing solution in a case of an alkali developing process, and a developing solution containing an organic solvent (organic developing solution) in a case of a solvent developing process.

After the developing treatment, it is preferable to conduct a rinse treatment. As the rinse treatment, water rinsing using pure water is preferable in a case of an alkali developing process, and rinsing using a rinse solution containing an organic solvent is preferable in a case of a solvent developing process.

In a case of a solvent developing process, after the developing treatment or the rinsing, the developing solution or the rinse liquid remaining on the pattern can be removed by a treatment using a supercritical fluid.

After the developing treatment or the rinse treatment, drying is conducted. As desired, bake treatment (post bake) can be conducted following the developing treatment.

In this manner, a resist pattern can be formed.

The support is not specifically limited and a conventionally known support can be used. For example, substrates for electronic components, and such substrates having wiring patterns formed thereon can be used. Specific examples of the material of the substrate include metals such as silicon wafer, copper, chromium, iron and aluminum; and glass. Suitable materials for the wiring pattern include copper, aluminum, nickel, and gold.

Further, as the support, any one of the above-described supports provided with an inorganic and/or organic film on the surface thereof may be used. As the inorganic film, an inorganic antireflection film (inorganic BARC) can be used. As the organic film, an organic antireflection film (organic BARC) and an organic film such as a lower-layer organic film used in a multilayer resist method can be used.

Here, a multilayer resist method is method in which at least one layer of an organic film (lower-layer organic film) and at least one layer of a resist film (upper-layer resist film) are provided on a substrate, and a resist pattern formed on the upper-layer resist film is used as a mask to conduct patterning of the lower-layer organic film. This method is considered as being capable of forming a pattern with a high aspect ratio. More specifically, in the multilayer resist method, a desired thickness can be ensured by the lower-layer organic film, and as a result, the thickness of the resist film can be reduced, and an extremely fine pattern with a high aspect ratio can be formed.

The multilayer resist method is classified into a method in which a double-layer structure consisting of an upper-layer resist film and a lower-layer organic film is formed (double-layer resist method), and a method in which a multilayer structure having at least three layers consisting of an upper-layer resist film, a lower-layer organic film and at least one intermediate layer (thin metal film or the like) provided between the upper-layer resist film and the lower-layer organic film (triple-layer resist method).

The wavelength to be used for exposure is not particularly limited and the exposure can be conducted using radiation such as an ArF excimer laser, a KrF excimer laser, an F2 excimer laser, extreme ultraviolet rays (EUV), vacuum ultraviolet rays (VUV), electron beams (EB), X-rays, and soft X-rays. The resist composition is useful for a KrF excimer laser, an ArF excimer laser, EB, and EUV, more useful for an ArF excimer laser, EB, and EUV, and particularly useful for EB and EUV. In other words, the method of forming a resist pattern according to the present embodiment is a method particularly useful in a case where the step of exposing the resist film includes a process of exposing the resist film to extreme ultraviolet rays (EUV) or electron beams (EB).

The exposure of the resist film can be a general exposure (dry exposure) conducted in air or an inert gas such as nitrogen, or liquid immersion exposure (liquid immersion lithography).

In liquid immersion lithography, the region between the resist film and the lens at the lowermost point of the immersion apparatus is pre-filled with a solvent (liquid immersion medium) that has a larger refractive index than the refractive index of air, and the exposure (immersion exposure) is conducted in this state.

The immersion medium preferably exhibits a refractive index larger than the refractive index of air but smaller than the refractive index of the resist film to be exposed. The refractive index of the immersion medium is not particularly limited as long as it satisfies the above-described requirements.

Examples of this immersion medium which exhibits a refractive index that is larger than the refractive index of air but smaller than the refractive index of the resist film include water, fluorine-based inert liquids, silicon-based solvents, and hydrocarbon-based solvents.

Specific examples of the fluorine-based inert liquids include liquids containing a fluorine-based compound such as $C_3HC_{12}F_5$, $C_4F_9OCH_3$, $C_4F_9OC_2H_5$ or $C_5H_3F_7$ as the main component, and the boiling point is preferably in a range of 70° to 180° C. and more preferably in a range of 80° to 160° C. A fluorine-based inert liquid having a boiling point in the above-described range is advantageous in that the removal of the immersion medium after the exposure can be conducted by a simple method.

As a fluorine-based inert liquid, a perfluoroalkyl compound in which all of the hydrogen atoms of the alkyl group are substituted with fluorine atoms is particularly preferable. Examples of these perfluoroalkyl compounds include perfluoroalkylether compounds and perfluoroalkylamine compounds.

Specifically, an example of a suitable perfluoroalkylether compound is perfluoro(2-butyl-tetrahydrofuran) (boiling point of 102° C.), and an example of a suitable perfluoroalkylamine compound is perfluorotributylamine (boiling point of 174° C.).

As the immersion medium, water is preferable in terms of cost, safety, environment and versatility.

As an example of the alkali developing solution used for the developing treatment in an alkali developing process, a 0.1 to 10% by mass aqueous solution of tetramethylammonium hydroxide (TMAH) can be exemplified.

As the organic solvent contained in the organic developing solution used in a solvent developing process, any of the conventional organic solvents can be used which are capable of dissolving the component (A) (prior to exposure). Specific examples of the organic solvent include polar solvents such as ketone solvents, ester solvents, alcohol solvents, nitrile solvents, amide solvents and ether solvents, and hydrocarbon solvents.

A ketone solvent is an organic solvent containing C—C(=O)—C in the structure thereof. An ester solvent is an organic solvent containing C—C(=O)—O—C in the structure thereof. An alcohol solvent is an organic solvent containing an alcoholic hydroxyl group in the structure thereof. An "alcoholic hydroxyl group" indicates a hydroxyl group bonded to a carbon atom of an aliphatic hydrocarbon group. A nitrile solvent is an organic solvent containing a nitrile group in the structure thereof. An amide solvent is an organic solvent containing an amide group in the structure thereof. An ether solvent is an organic solvent containing C—O—C in the structure thereof.

Some organic solvents containing a plurality of the functional groups which characterizes the above-described solvents in the structure thereof are also present in the organic solvent. In such a case, the organic solvent can be classified as any type of the solvent having the characteristic functional group. For example, diethylene glycol monomethylether can be classified as an alcohol solvent or an ether solvent.

A hydrocarbon solvent consists of a hydrocarbon which may be halogenated, and does not have any substituent other than a halogen atom. Examples of the halogen atom include a fluorine atom, a chlorine atom, a bromine atom and an iodine atom, and a fluorine atom is preferable.

As the organic solvent contained in the organic developing solution, among these, a polar solvent is preferable, and ketone solvents, ester solvents, and nitrile solvents are preferable.

Examples of ketone solvents include 1-octanone, 2-octanone, 1-nonanone, 2-nonanone, acetone, 4-heptanone, 1-hexanone, 2-hexanone, diisobutyl ketone, cyclohexanone, methylcyclohexanone, phenylacetone, methyl ethyl ketone, methyl isobutyl ketone, acetylacetone, acetonylacetone, ionone, diacetonylalcohol, acetylcarbinol, acetophenone, methyl naphthyl ketone, isophorone, propylenecarbonate, γ-butyrolactone and methyl amyl ketone (2-heptanone). Among these examples, as a ketone solvent, methyl amyl ketone (2-heptanone) is preferable.

Examples of ester solvents include methyl acetate, butyl acetate, ethyl acetate, isopropyl acetate, amyl acetate, isoamyl acetate, ethyl methoxyacetate, ethyl ethoxyacetate, ethylene glycol monoethyl ether acetate, ethylene glycol monopropyl ether acetate, ethylene glycol monobutyl ether acetate, ethylene glycol monophenyl ether acetate, diethylene glycol monomethyl ether acetate, diethylene glycol monopropyl ether acetate, diethylene glycol monophenyl ether acetate, diethylene glycol monobutyl ether acetate, diethylene glycol monoethyl ether acetate, 2-methoxybutyl acetate, 3-methoxybutyl acetate, 4-methoxybutyl acetate, 3-methyl-3-methoxybutyl acetate, 3-ethyl-3-methoxybutyl acetate, propylene glycol monomethyl ether acetate, propylene glycol monoethyl ether acetate, propylene glycol monopropyl ether acetate, 2-ethoxybutyl acetate, 4-ethoxybutyl acetate, 4-propoxybutyl acetate, 2-methoxypentyl acetate, 3-methoxypentyl acetate, 4-methoxypentyl acetate, 2-methyl-3-methoxypentyl acetate, 3-methyl-3-methoxypentyl acetate, 3-methyl-4-methoxypentyl acetate, 4-methyl-4-methoxypentyl acetate, propylene glycol diacetate, methyl formate, ethyl formate, butyl formate, propyl formate, ethyl lactate, butyl lactate, propyl lactate, ethyl carbonate, propyl carbonate, butyl carbonate, methyl pyruvate, ethyl pyruvate, propyl pyruvate, butyl pyruvate, methyl acetoacetate, ethyl acetoacetate, methyl propionate, ethyl propionate, propyl propionate, isopropyl propionate, methyl 2-hydroxypropionate, ethyl 2-hydroxypropionate, methyl-3-methoxypropionate, ethyl-3-methoxypropionate, ethyl-3-ethoxypropionate, and propyl-3-methoxypropionate. Among these examples, as an ester solvent, butyl acetate is preferable.

Examples of nitrile solvents include acetonitrile, propionitrile, valeronitrile, butyronitrile and the like.

A known additive can be blended with the rinse solution as necessary. Examples of the additive include surfactants. The surfactant is not particularly limited, and for example, an ionic or non-ionic fluorine and/or silicon surfactant can be used.

As the surfactant, a non-ionic surfactant is preferable, and a non-ionic fluorine surfactant or a non-ionic silicon surfactant is more preferable.

In a case where a surfactant is blended, the amount of the surfactant to be blended is typically 0.001% to 5% by mass, preferably 0.005% to 2% by mass, and more preferably 0.01% to 0.5% by mass with respect to the total amount of the organic developing solution.

The developing treatment can be performed by a conventional developing method. Examples thereof include a method in which the support is immersed in the developing solution for a predetermined time (a dip method), a method in which the developing solution is cast up on the surface of the support by surface tension and maintained for a predetermined period (a puddle method), a method in which the developing solution is sprayed onto the surface of the support (spray method), and a method in which the developing solution is continuously ejected from a developing solution ejecting nozzle while scanning at a constant rate to apply the developing solution to the support while rotating the support at a constant rate (dynamic dispense method).

As the organic solvent contained in the rinse liquid used in the rinse treatment after the developing treatment in a case of a solvent developing process, any organic solvent which is unlikely to dissolve the resist pattern is appropriately selected among organic solvents exemplified as the organic solvent used as the organic developing solution and then used. In general, at least one solvent selected from the group consisting of hydrocarbon solvents, ketone solvents, ester solvents, alcohol solvents, amide solvents and ether solvents is used. Among these, at least one solvent selected from the group consisting of hydrocarbon solvents, ketone solvents, ester solvents, alcohol solvents and amide solvents is preferable, more preferably at least one solvent selected from the group consisting of alcohol solvents and ester solvents, and an alcohol solvent is particularly preferable.

The alcohol solvent used for the rinse liquid is preferably a monohydric alcohol of 6 to 8 carbon atoms, and the monohydric alcohol may be linear, branched or cyclic. Specific examples thereof include 1-hexanol, 1-heptanol, 1-octanol, 2-hexanol, 2-heptanol, 2-octanol, 3-hexanol, 3-heptanol, 3-octanol, 4-octanol, and benzyl alcohol. Among these, 1-hexanol, 2-heptanol and 2-hexanol are preferable, and 1-hexanol and 2-hexanol are more preferable.

As the organic solvent, one kind of solvent may be used alone, or two or more kinds of solvents may be used in combination. Further, an organic solvent other than the above-described examples or water may be mixed together and used. However, in consideration of the development characteristics, the amount of water to be blended in the rinse liquid is preferably 30% by mass or less, more preferably 10% by mass or less, still more preferably 5% by mass or less, and most preferably 3% by mass or less with respect to the total amount of the rinse liquid.

As desired, the rinse solution may have a conventional additive blended. Examples of the additive include surfactants. As the surfactant, the same surfactants as those described above can be exemplified, a non-ionic surfactant is preferable, and a non-ionic fluorine surfactant or a non-ionic silicon surfactant is more preferable.

In a case where a surfactant is blended, the amount thereof to be blended is typically 0.001% to 5% by mass, preferably 0.005% to 2% by mass, and more preferably 0.01% to 0.5% by mass with respect to the total amount of the rinse liquid.

The rinse treatment using a rinse liquid (washing treatment) can be conducted by a conventional rinse method. Examples of the rinse method include a method in which the rinse liquid is continuously applied to the support while rotating it at a constant rate (rotational coating method), a method in which the support is immersed in the rinse liquid for a predetermined time (dip method), and a method in which the rinse liquid is sprayed onto the surface of the support (spray method).

In the method of forming a resist pattern according to the present embodiment, since the resist composition according to the first embodiment is used, a resist pattern with excellent lithography characteristics (reduction in roughness and the like) can be formed during formation of the resist pattern.

(Compound)

A compound according to a third embodiment of the present invention is a compound formed of an anion moiety and a cation moiety which is represented by Formula (d0) and in which the Log P value of the cation moiety is less than 7.7.

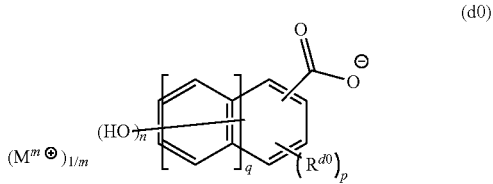

(d0)

[In the formula, $M^{m+}$ represents an m-valent organic cation. $R^{d0}$ represents a substituent, p represents an integer of 0 to 3. In a case where p represents 2 or 3, a plurality of substituents as $R^{d0}$ may be the same as or different from one another. q represents an integer of 0 to 3. n represents an integer of 2 or greater. Here, a relationship of "n+p≤(q×2)+5" is satisfied.]

As the compound, a compound formed of an anion moiety and a cation moiety which is represented by Formula (d0-1) and in which the Log P value of the cation moiety is less than 7.7 is more preferable.

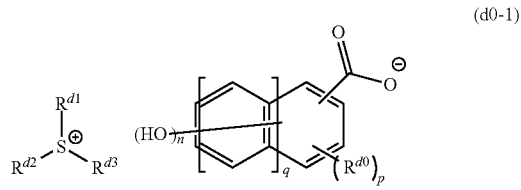

(d0-1)

[In the formula, $R^{d1}$ represents an aryl group which may have a substituent. $R^{d2}$ and $R^{d3}$ each independently represent an aryl group which may have a substituent or may be bonded to each other to form a ring with a sulfur atom in the formula. $R^{d0}$ represents a substituent. p represents an integer of 0 to 3, and in a case where p represents 2 or 3, a plurality of substituents as $R^{d0}$ may be the same as or different from one another. q represents an integer of 0 to 3. n represents an integer of 2 or greater. Here, a relationship of "n+p≤(q×2)+5" is satisfied.]

The compound represented by any of Formulae (d0) and (d0-1) is the same compound as the component (D0) described in the section of the resist composition.

[Method of Producing Compound (D0)]

The compound (D0) can be produced using a known method.

For example, the compound (D0) can be produced according to the following production method. That is, the compound (D0) represented by Formula (d0) can be produced by reacting a compound represented by Chemical Formula $((M^{m+})_{1/m}X^-)$ with an aromatic carboxylic acid containing a plurality of hydroxy groups in the presence of an appropriate base.

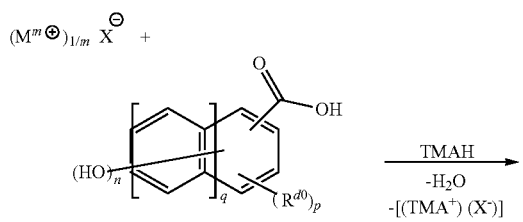

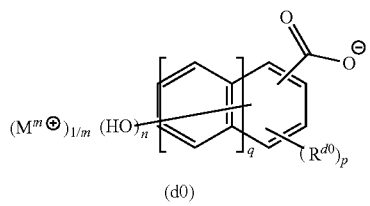

(d0)

In the reaction formula shown above, $X^-$ represents an anion of a halogen atom. Other compounds each have the same definition as that described in the section of Formula (d0).

The reaction may be carried out in the absence of a solvent or in an organic solvent (a typical solvent such as tetrahydrofuran, chloroform, or dichloromethane). The reaction temperature varies depending on the boiling point of a solvent to be used, but is approximately −20° C. to 150° C. The reaction time is approximately several minutes to several hours.

The reaction is carried out by mixing a precursor, an aromatic carboxylic acid containing a plurality of hydroxy groups, and a tetramethylammonium hydroxide (TMAH) aqueous solution and stirring the solution. In addition, the organic solvent is removed by separating the solid to be precipitated by filtration or extracting the separated oily matter using the organic solvent, thereby obtaining the compound (D0). The compound (D0) is obtained as a solid or a viscous liquid. The solid or the viscous liquid to be obtained is washed using an appropriate organic solvent as necessary or can be purified according to a recrystallization method or a column chromatography method.

The chemical structure of the compound (D0) can be identified by a typical analytical method (for example, the $^1$H-, $^{11}$B-, $^{13}$C-, $^{19}$F-, or $^{31}$P-nuclear magnetic resonance spectrum, the infrared absorption spectrum, and/or elemental analysis).

EXAMPLES

Hereinafter, the present invention will be described in more detail based on examples, but the present invention is not limited to these examples.

<Production of Compound>

Production Example of Compound (D0-1)

2,4-dihydroxybenzoic acid (compound B1) (1.3 g, 8.4 mmol) and the compound A1 (2.9 g, 8.4 mmol) were dissolved in dichloromethane (35 g), and a 5% tetramethylammonium hydroxide (TMAH) aqueous solution (15.3 g) was added thereto for the reaction at room temperature for 30 minutes. After the reaction, the water phase was removed, and the organic phase was washed with ultrapure water (10 g) 10 times. The organic phase was concentrated and dried using a rotary evaporator to obtain a compound (D0-1) (2.7 g, yield=77.1%).

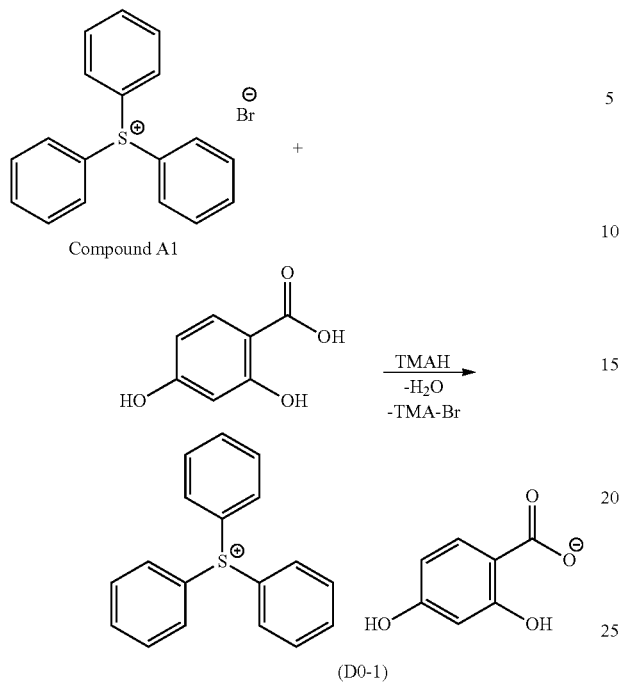

(D0-1)

Production Examples of Compounds (D0-2) to (D0-17)

Compounds (D0-2) to (D0-17) respectively represented by Chemical Formulae (D0-2) to (D0-17) were respectively obtained in the same manner as in the "production example of compound (D0-1)" described above except that the combination of the compounds A1 to A5 and the aromatic carboxylic acid (compounds B1 to B5) containing a plurality of hydroxy groups was changed.

NMR measurement was performed on each of the obtained compounds, and the structure thereof was identified based on the following analysis results.

Compound A1

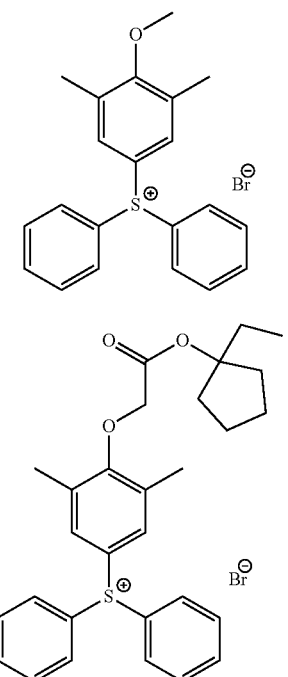

Compound A2

Compound A3

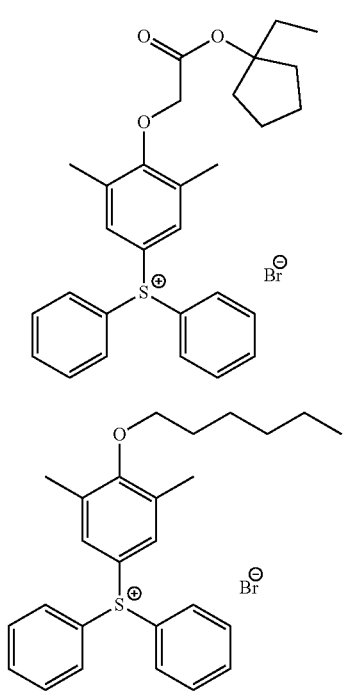

Compound A4

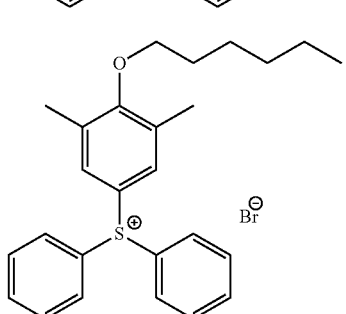

Compound A5

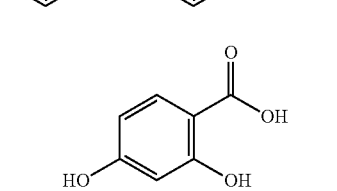

Compound B1

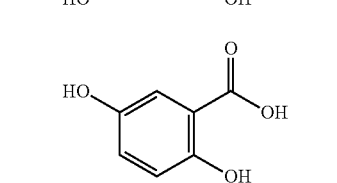

Compound B2

Compound B3

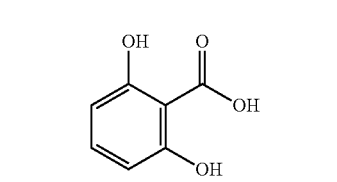

Compound B4

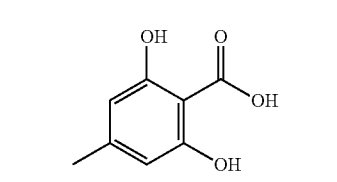

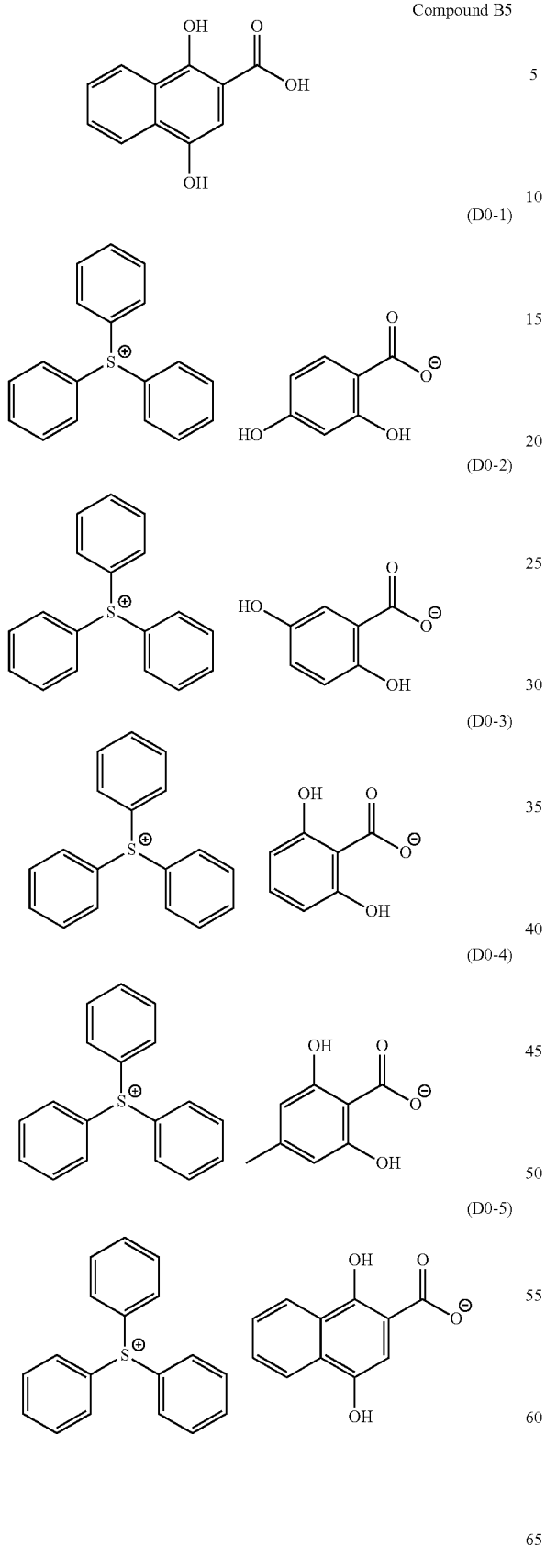
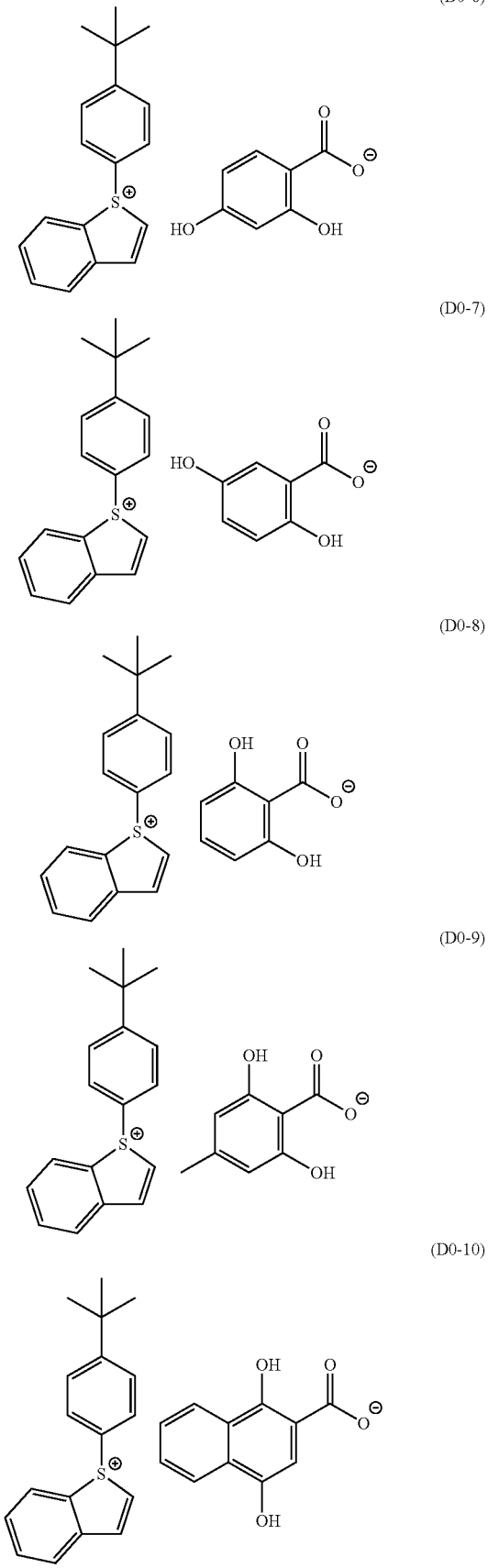

-continued

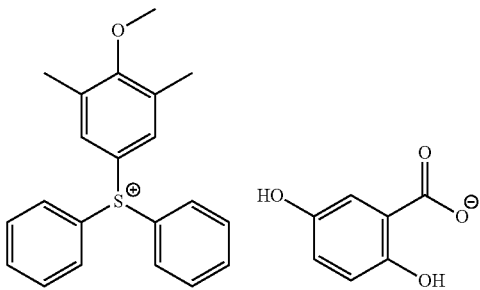
(D0-11)

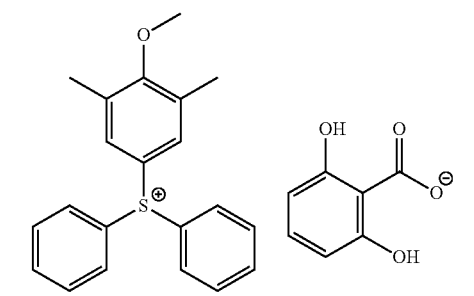
(D0-12)

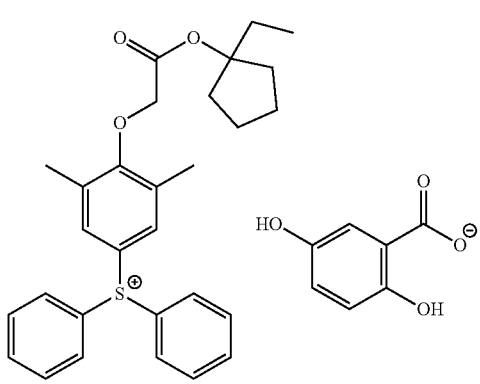
(D0-13)

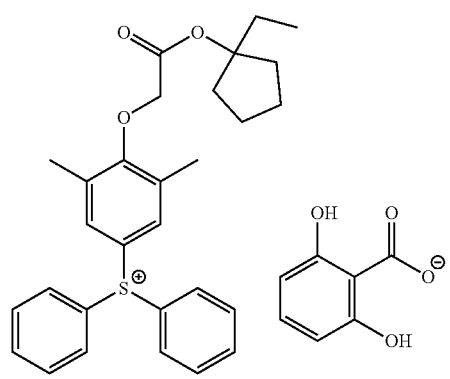
(D0-14)

-continued

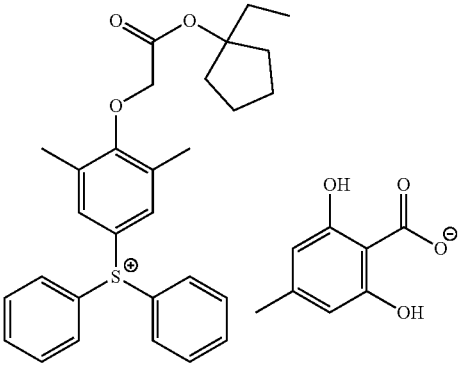
(D0-15)

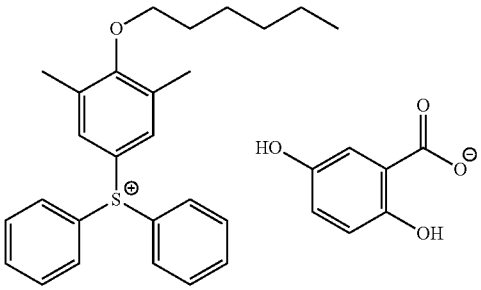
(D0-16)

(D0-17)

Compound (D0-1): Combination of Compound A1 and Compound B1
$^1$H-NMR (DMSO, 400 MHz): δ (ppm)=7.74-7.90 (m, 15H, ArH), 7.70 (d, 1H, ArH), 6.01-6.04 (m, 2H, ArH)

Compound (D0-2): Combination of Compound A1 and Compound B2
$^1$H-NMR (DMSO, 400 MHz): δ (ppm)=7.74-7.90 (m, 15H, ArH), 7.18 (s, 1H, ArH), 6.48-6.68 (m, 2H, ArH)

Compound (D0-3): Combination of Compound A1 and Compound B3
$^1$H-NMR (DMSO, 400 MHz): δ (ppm)=7.74-7.90 (m, 15H, ArH), 6.91-6.95 (t, 1H, ArH), 6.02-6.05 (d, 2H, ArH)

Compound (D0-4): Combination of Compound A1 and Compound B4
$^1$H-NMR (DMSO, 400 MHz): δ (ppm)=7.74-7.90 (m, 15H, ArH), 6.05 (s, 2H, ArH), 2.09 (s, 3H, ArCH3)

Compound (D0-5): Combination of Compound A1 and Compound B5
$^1$H-NMR (DMSO, 400 MHz): δ (ppm)=8.01-8.07 (m, 2H, ArH), 7.74-7.90 (m, 15H, ArH), 7.60-7.66 (m, 2H, ArH), 7.18 (s, 1H ArH)

Compound (D0-6): Combination of Compound A2 and Compound B1
$^1$H-NMR (DMSO, 400 MHz): δ (ppm)=8.28 (d, 2H, ArH), 8.12 (d, 1H, ArH), 7.88 (t, 1H, ArH), 7.80 (d, 1H, ArH), 7.62-7.74 (m, 6H, ArH), 6.01-6.04 (m, 2H, ArH), 1.27 (s, 9H, CH3)

Compound (D0-7): Combination of Compound A2 and Compound B2

¹H-NMR (DMSO, 400 MHz): δ (ppm)=8.28 (d, 2H, ArH), 8.12 (d, 1H, ArH), 7.88 (t, 1H, ArH), 7.80 (d, 1H, ArH), 7.62-7.74 (m, 5H, ArH), 7.18 (s, 1H, ArH), 6.48-6.68 (m, 2H, ArH), 1.27 (s, 9H, CH₃)

Compound (D0-8): Combination of Compound A2 and Compound B3

¹H-NMR (DMSO, 400 MHz): δ (ppm)=8.28 (d, 2H, ArH), 8.12 (d, 1H, ArH), 7.88 (t, 1H, ArH), 7.80 (d, 1H, ArH), 7.62-7.74 (m, 5H, ArH), 6.91-6.95 (t, 1H, ArH), 6.02-6.05 (d, 2H, ArH), 1.27 (s, 9H, CH₃)

Compound (D0-9): Combination of Compound A2 and Compound B4

¹H-NMR (DMSO, 400 MHz): δ (ppm)=8.28 (d, 2H, ArH), 8.12 (d, 1H, ArH), 7.88 (t, 1H, ArH), 7.80 (d, 1H, ArH), 7.62-7.74 (m, 5H, ArH), 6.05 (s, 2H, ArH), 2.09 (s, 3H, ArCH3), 1.27 (s, 9H, CH₃)

Compound (D0-10): Combination of Compound A2 and Compound B5

¹H-NMR (DMSO, 400 MHz): δ (ppm)=8.28 (d, 2H, ArH), 8.12 (d, 1H, ArH), 8.01-8.07 (m, 2H, ArH), 7.88 (t, 1H, ArH), 7.80 (d, 1H, ArH), 7.60-7.74 (m, 7H, ArH), 7.18 (s, 1H ArH), 1.27 (s, 9H, CH₃)

Compound (D0-11): Combination of Compound A3 and Compound B2

¹H-NMR (DMSO, 400 MHz): δ (ppm)=7.78-7.89 (m, 10H, ArH), 7.64 (s, 2H, ArH), 7.18 (s, 1H, ArH), 6.48-6.68 (m, 2H, ArH), 3.79 (s, 3H, OCH3), 2.32 (s, 6H, ArCH3)

Compound (D0-12): Combination of Compound A3 and Compound B3

¹H-NMR (DMSO, 400 MHz): δ (ppm)=7.78-7.89 (m, 10H, ArH), 7.64 (s, 2H, ArH), 6.91-6.95 (t, 1H, ArH), 6.02-6.05 (d, 2H, ArH), 3.79 (s, 3H, OCH3), 2.32 (s, 6H, ArCH3)

Compound (D0-13): Combination of Compound A4 and Compound B2

¹H-NMR (DMSO, 400 MHz): δ (ppm)=7.76-7.82 (m, 10H, ArH), 7.59 (s, 2H, ArH), 7.18 (s, 1H, ArH), 6.48-6.68 (m, 2H, ArH), 4.55 (s, 2H, CH2), 2.29 (m, 6H, CH3), 1.90-1.93 (m, 4H, CH2, cyclopentyl), 1.48-1.75 (m, 6H, cyclopentyl), 0.77-0.81 (t, 3H, CH3)

Compound (D0-14): Combination of Compound A4 and Compound B3

¹H-NMR (DMSO, 400 MHz): δ (ppm)=7.76-7.82 (m, 10H, ArH), 7.59 (s, 2H, ArH), 6.91-6.95 (t, 1H, ArH), 6.02-6.05 (d, 2H, ArH), 4.55 (s, 2H, CH2), 2.29 (m, 6H, CH3), 1.90-1.93 (m, 4H, CH2, cyclopentyl), 1.48-1.75 (m, 6H, cyclopentyl), 0.77-0.81 (t, 3H, CH3)

Compound (D0-15): Combination of Compound A4 and Compound B4

¹H-NMR (DMSO, 400 MHz): δ (ppm)=7.76-7.82 (m, 10H, ArH), 7.59 (s, 2H, ArH), 6.05 (s, 2H, ArH), 4.55 (s, 2H, CH2), 2.29 (m, 6H, CH3), 2.09 (s, 3H, ArCH3), 1.90-1.93 (m, 4H, CH2, cyclopentyl), 1.48-1.75 (m, 6H, cyclopentyl), 0.77-0.81 (t, 3H, CH3)

Compound (D0-16): Combination of Compound A5 and Compound B2

¹H-NMR (DMSO, 400 MHz): δ (ppm)=7.73-7.85 (m, 10H, ArH), 7.59 (s, 2H, ArH), 7.18 (s, 1H, ArH), 6.48-6.68 (m, 2H, ArH), 3.83 (t, 2H, OCH2), 2.33 (s, 6H, CH3), 1.45 (m, 4H, CH2), 1.29 (m, 4H, CH2), 0.87 (t, 3H, CH3)

Compound (D0-17): Combination of Compound A5 and Compound B3

¹H-NMR (DMSO, 400 MHz): δ (ppm)=7.73-7.85 (m, 10H, ArH), 7.59 (s, 2H, ArH), 6.91-6.95 (t, 1H, ArH), 6.02-6.05 (d, 2H, ArH), 3.83 (t, 2H, OCH2), 2.33 (s, 6H, CH3), 1.45 (m, 4H, CH2), 1.29 (m, 4H, CH2), 0.87 (t, 3H, CH3)

(Log P Values of Cation Moieties of Compounds (D0-1) to (D0-17))

The Log P value of the cation moiety of each of the compounds (D0-1) to (D0-17) was acquired by CAChe Work System Pro Version 6. 1. 12. 33.

As shown below, the Log P values of all cation moieties were all less than 7.7.

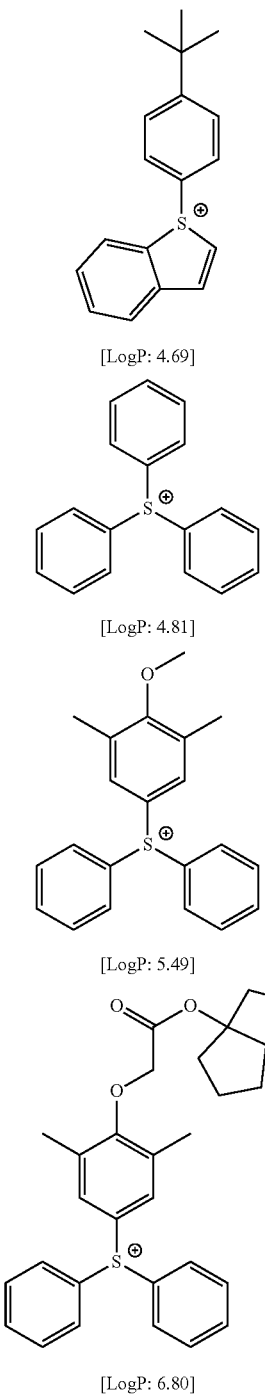

[LogP: 4.69]

[LogP: 4.81]

[LogP: 5.49]

[LogP: 6.80]

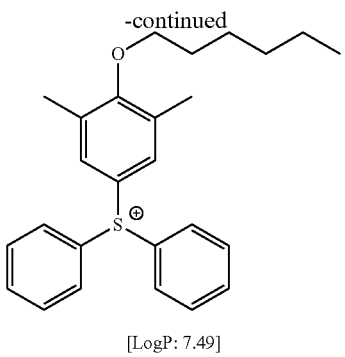

[LogP: 7.49]

<Preparation of Resist Composition>

Examples 1 to 33 and Comparative Examples 1 to 36

Respective components listed in Tables 1 to 7 were mixed and dissolved to prepare each resist composition of each example.

TABLE 1

| | Component (A) | Component (B) | Component (D) Component (D0) | Component (D) Component (D2) | Component (S) |
|---|---|---|---|---|---|
| Example 1 | (A)-1 [100] | (B1)-1 [15.0] | (D0)-1 [5.2] | — | (S)-1 [6400] |
| Example 2 | (A)-1 [100] | (B1)-1 [15.0] | (D0)-2 [5.2] | — | (S)-1 [6400] |
| Example 3 | (A)-1 [100] | (B1)-1 [15.0] | (D0)-3 [5.2] | — | (S)-1 [6400] |
| Example 4 | (A)-1 [100] | (B1)-1 [15.0] | (D0)-4 [5.4] | — | (S)-1 [6400] |
| Example 5 | (A)-1 [100] | (B1)-1 [15.0] | (D0)-5 [5.8] | — | (S)-1 [6400] |
| Example 6 | (A)-1 [100] | (B1)-1 [15.0] | (D0)-7 [5.3] | — | (S)-1 [6400] |
| Example 7 | (A)-1 [100] | (B1)-1 [15.0] | (D0)-11 [5.9] | — | (S)-1 [6400] |
| Example 8 | (A)-1 [100] | (B1)-1 [15.0] | (D0)-13 [7.7] | — | (S)-1 [6400] |
| Example 9 | (A)-1 [100] | (B1)-1 [15.0] | (D0)-16 [6.8] | — | (S)-1 [6400] |
| Example 10 | (A)-1 [100] | (B1)-1 [15.0] | (D0)-6 [5.3] | — | (S)-1 [6400] |
| Example 11 | (A)-1 [100] | (B1)-1 [15.0] | (D0)-15 [7.9] | — | (S)-1 [6400] |

TABLE 2

| | Component (A) | Component (B) | Component (D) Component (D0) | Component (D) Component (D2) | Component (S) |
|---|---|---|---|---|---|
| Comparative Example 1 | (A)-1 [100] | (B1)-1 [15.0] | — | (D2)-2 [5.0] | (S)-1 [6400] |
| Comparative Example 2 | (A)-1 [100] | (B1)-1 [15.0] | — | (D2)-6 [7.8] | (S)-1 [6400] |
| Comparative Example 3 | (A)-1 [100] | (B1)-1 [15.0] | — | (D2)-7 [7.8] | (S)-1 [6400] |
| Comparative Example 4 | (A)-1 [100] | (B1)-1 [15.0] | — | (D2)-8 [7.8] | (S)-1 [6400] |
| Comparative Example 5 | (A)-1 [100] | (B1)-1 [15.0] | — | (D2)-9 [8.0] | (S)-1 [6400] |
| Comparative Example 6 | (A)-1 [100] | (B1)-1 [15.0] | — | (D2)-10 [8.4] | (S)-1 [6400] |
| Comparative Example 7 | (A)-1 [100] | (B1)-1 [15.0] | — | (D2)-11 [7.9] | (S)-1 [6400] |
| Comparative Example 8 | (A)-1 [100] | (B1)-1 [15.0] | — | (D2)-1 [5.1] | (S)-1 [6400] |
| Comparative Example 9 | (A)-1 [100] | (B1)-1 [15.0] | — | (D2)-3 [5.7] | (S)-1 [6400] |
| Comparative Example 10 | (A)-1 [100] | (B1)-1 [15.0] | — | (D2)-4 [7.5] | (S)-1 [6400] |
| Comparative Example 11 | (A)-1 [100] | (B1)-1 [15.0] | — | (D2)-5 [6.6] | (S)-1 [6400] |

TABLE 3

| | Component (A) | Component (B) | Component (D) Component (D0) | Component (D) Component (D2) | Component (S) |
|---|---|---|---|---|---|
| Example 12 | (A)-1 [100] | (B-1)-2 [15.2] | (D0)-2 [5.2] | — | (S)-1 [6400] |
| Example 13 | (A)-1 [100] | (B-1)-2 [15.2] | (D0)-3 [5.2] | — | (S)-1 [6400] |
| Example 14 | (A)-1 [100] | (B-1)-2 [15.2] | (D0)-16 [6.8] | — | (S)-1 [6400] |
| Example 15 | (A)-1 [100] | (B-1)-2 [15.2] | (D0)-13 [7.7] | — | (S)-1 [6400] |
| Comparative Example 12 | (A)-1 [100] | (B-1)-2 [15.2] | — | (D2)-2 [5.0] | (S)-1 [6400] |
| Comparative Example 13 | (A)-1 [100] | (B-1)-2 [15.2] | — | (D2)-4 [7.5] | (S)-1 [6400] |
| Comparative Example 14 | (A)-1 [100] | (B-1)-2 [15.2] | — | (D2)-5 [6.6] | (S)-1 [6400] |
| Comparative Example 15 | (A)-1 [100] | (B-1)-2 [15.2] | — | (D2)-7 [7.8] | (S)-1 [6400] |
| Comparative Example 16 | (A)-1 [100] | (B-1)-2 [15.2] | — | (D2)-8 [7.8] | (S)-1 [6400] |

TABLE 4

| | Component (A) | Component (B) | Component (D) Component (D0) | Component (D) Component (D2) | Component (S) |
|---|---|---|---|---|---|
| Example 16 | (A)-2 [100] | (B1)-1 [8.0] | (D0)-6 [3.2] | — | (S)-2 [3600] |
| Example 17 | (A)-2 [100] | (B1)-1 [8.0] | (D0)-7 [3.2] | — | (S)-2 [3600] |
| Example 18 | (A)-2 [100] | (B1)-1 [8.0] | (D0)-8 [3.2] | — | (S)-2 [3600] |
| Example 19 | (A)-2 [100] | (B1)-1 [8.0] | (D0)-9 [3.3] | — | (S)-2 [3600] |
| Example 20 | (A)-2 [100] | (B1)-1 [8.0] | (D0)-10 [3.5] | — | (S)-2 [3600] |
| Example 21 | (A)-2 [100] | (B1)-1 [8.0] | (D0)-3 [3.1] | — | (S)-2 [3600] |
| Example 22 | (A)-2 [100] | (B1)-1 [8.0] | (D0)-12 [3.6] | — | (S)-2 [3600] |
| Example 23 | (A)-2 [100] | (B1)-1 [8.0] | (D0)-14 [4.6] | — | (S)-2 [3600] |
| Example 24 | (A)-2 [100] | (B1)-1 [8.0] | (D0)-17 [4.1] | — | (S)-2 [3600] |
| Example 25 | (A)-2 [100] | (B1)-1 [8.0] | (D0)-1 [3.1] | — | (S)-2 [3600] |
| Example 26 | (A)-2 [100] | (B1)-1 [8.0] | (D0)-15 [4.7] | — | (S)-2 [3600] |

TABLE 4-continued

| | Component (A) | Component (B) | Component (D) | | Component (S) |
|---|---|---|---|---|---|
| | | | Component (D0) | Component (D2) | |

TABLE 5

| | Component (A) | Component (B) | Component (D) | | Component (S) |
|---|---|---|---|---|---|
| | | | Component (D0) | Component (D2) | |
| Comparative Example 17 | (A)-2 [100] | (B1)-1 [8.0] | — | (D2)-1 [3.0] | (S)-2 [3600] |
| Comparative Example 18 | (A)-2 [100] | (B1)-1 [8.0] | — | (D2)-6 [4.7] | (S)-2 [3600] |
| Comparative Example 19 | (A)-2 [100] | (B1)-1 [8.0] | — | (D2)-7 [4.7] | (S)-2 [3600] |
| Comparative Example 20 | (A)-2 [100] | (B1)-1 [8.0] | — | (D2)-8 [4.7] | (S)-2 [3600] |
| Comparative Example 21 | (A)-2 [100] | (B1)-1 [8.0] | — | (D2)-9 [4.8] | (S)-2 [3600] |
| Comparative Example 22 | (A)-2 [100] | (B1)-1 [8.0] | — | (D2)-10 [5.0] | (S)-2 [3600] |
| Comparative Example 23 | (A)-2 [100] | (B1)-1 [8.0] | — | (D2)-11 [4.7] | (S)-2 [3600] |
| Comparative Example 24 | (A)-2 [100] | (B1)-1 [8.0] | — | (D2)-2 [3.0] | (S)-2 [3600] |
| Comparative Example 25 | (A)-2 [100] | (B1)-1 [8.0] | — | (D2)-3 [3.4] | (S)-2 [3600] |
| Comparative Example 26 | (A)-2 [100] | (B1)-1 [8.0] | — | (D2)-4 [4.5] | (S)-2 [3600] |
| Comparative Example 27 | (A)-2 [100] | (B1)-1 [8.0] | — | (D2)-5 [4.0] | (S)-2 [3600] |

TABLE 6

| | Component (A) | Component (B) | Component (D) | | Component (S) |
|---|---|---|---|---|---|
| | | | Component (D0) | Component (D2) | |
| Example 27 | (A)-2 [100] | (B1)-2 [8.1] | (D0)-1 [3.1] | — | (S)-2 [3600] |
| Example 28 | (A)-2 [100] | (B1)-2 [8.1] | (D0)-2 [3.1] | — | (S)-2 [3600] |
| Example 29 | (A)-2 [100] | (B1)-2 [8.1] | (D0)-12 [3.6] | — | (S)-2 [3600] |
| Example 30 | (A)-2 [100] | (B1)-2 [8.1] | (D0)-17 [4.1] | — | (S)-2 [3600] |
| Comparative Example 28 | (A)-2 [100] | (B1)-2 [8.1] | — | (D2)-2 [3.0] | (S)-2 [3600] |
| Comparative Example 29 | (A)-2 [100] | (B1)-2 [8.1] | — | (D2)-3 [3.4] | (S)-2 [3600] |
| Comparative Example 30 | (A)-2 [100] | (B1)-2 [8.1] | — | (D2)-5 [4.0] | (S)-2 [3600] |
| Comparative Example 31 | (A)-2 [100] | (B1)-2 [8.1] | — | (D2)-6 [4.7] | (S)-2 [3600] |
| Comparative Example 32 | (A)-2 [100] | (B1)-2 [8.1] | — | (D2)-7 [4.7] | (S)-2 [3600] |

TABLE 7

| | Component (A) | Component (B) | Component (D) | | Component (S) |
|---|---|---|---|---|---|
| | | | Component (D0) | Component (D2) | |
| Example 31 | (A)-3 [100] | (B1)-1 [8.0] | (D0)-2 [3.1] | — | (S)-2 [3600] |
| Example 32 | (A)-3 [100] | (B1)-1 [8.0] | (D0)-3 [3.1] | — | (S)-2 [3600] |
| Example 33 | (A)-3 [100] | (B1)-1 [8.0] | (D0)-8 [3.2] | — | (S)-2 [3600] |
| Comparative Example 33 | (A)-3 [100] | (B1)-1 [8.0] | — | (D2)-2 [3.0] | (S)-2 [3600] |
| Comparative Example 34 | (A)-3 [100] | (B1)-1 [8.0] | — | (D2)-7 [4.7] | (S)-2 [3600] |
| Comparative Example 35 | (A)-3 [100] | (B1)-1 [8.0] | — | (D2)-8 [4.7] | (S)-2 [3600] |
| Comparative Example 36 | (A)-3 [100] | (B1)-1 [8.0] | — | (D2)-1 [3.0] | (S)-2 [3600] |

In Tables 1 to 7, each abbreviation has the following meaning. The numerical values in the parentheses are blending amounts (parts by mass).

(A)-1: A polymer compound represented by Chemical Formula (A-1). The polymer compound (A-1) was obtained by radically polymerizing a monomer, from which a constitutional unit constituting the polymer compound was derived, using a predetermined molar ratio. The weight-average molecular weight (Mw) of the polymer compound (A-1) and the molecular weight dispersity (Mw/Mn) in terms of standard polystyrene acquired by GPC measurement were respectively 6900 and 1.69. The copolymer compositional ratio (the proportion (molar ratio) between constitutional units (l/m/n) in the structural formula) acquired by $^{13}$C-NMR was 30/60/10.

(A)-2: A polymer compound represented by Chemical Formula (A-2). The polymer compound (A-2) was obtained by radically polymerizing a monomer, from which a constitutional unit constituting the polymer compound was derived, using a predetermined molar ratio.

The weight-average molecular weight (Mw) of the polymer compound (A-2) and the molecular weight dispersity (Mw/Mn) in terms of standard polystyrene acquired by GPC measurement were respectively 7100 and 1.72. The copolymer compositional ratio (the proportion (molar ratio) between constitutional units (Um) in the structural formula) acquired by $^{13}$C-NMR was 50/50.

(A)-3: A polymer compound represented by Chemical Formula (A-3). The polymer compound (A-3) was obtained by radically polymerizing a monomer, from which a constitutional unit constituting the polymer compound was derived, using a predetermined molar ratio.

The weight-average molecular weight (Mw) of the polymer compound (A-3) and the molecular weight dispersity (Mw/Mn) in terms of standard polystyrene acquired by GPC measurement were respectively 10400 and 1.64. The copolymer compositional ratio (the proportion (molar ratio) between constitutional units (Um) in the structural formula) acquired by $^{13}$C-NMR was 60/40.

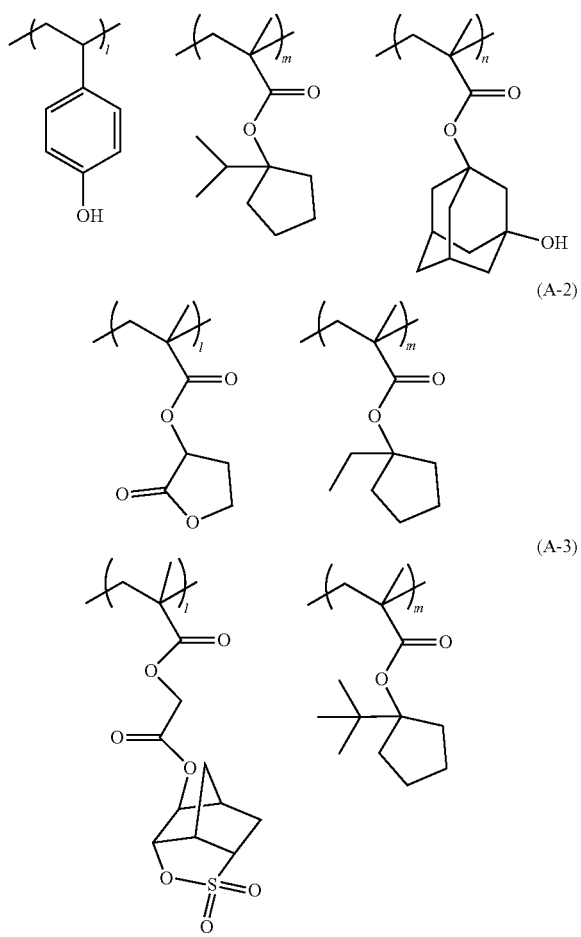

(A-1)

(A-2)

(A-3)

(B1)-1 and (B1)-2: Acid generators respectively formed of the following compound (B1-1) and compound (B1-2)

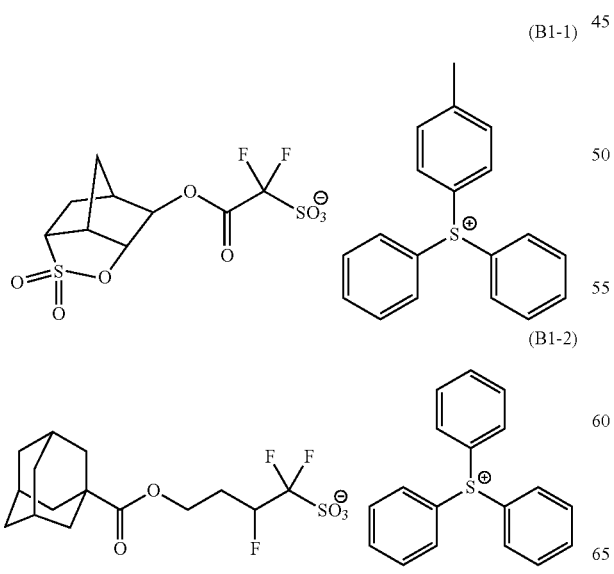

(B1-1)

(B1-2)

(D0)-1 to (D0)-17: Acid diffusion control agents formed of compounds respectively represented by Chemical Formulae (D0-1) to (D0-17)

(D2)-1 to (D2)-11: Acid diffusion control agents formed of compounds respectively represented by Chemical Formulae (D2-1) to (D2-11)

(S)-1: A mixed solvent of propylene glycol monomethyl ether acetate and propylene glycol monomethyl ether at a mass ratio of 60/40

(S)-2: A mixed solvent of propylene glycol monomethyl ether acetate and propylene glycol monomethyl ether at a mass ratio of 70/30

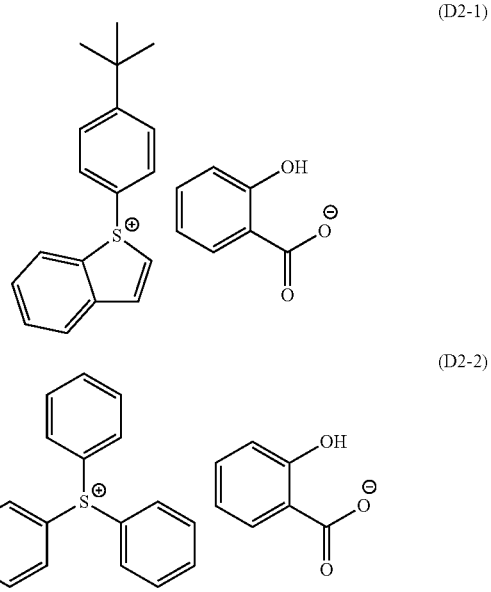

(D2-1)

(D2-2)

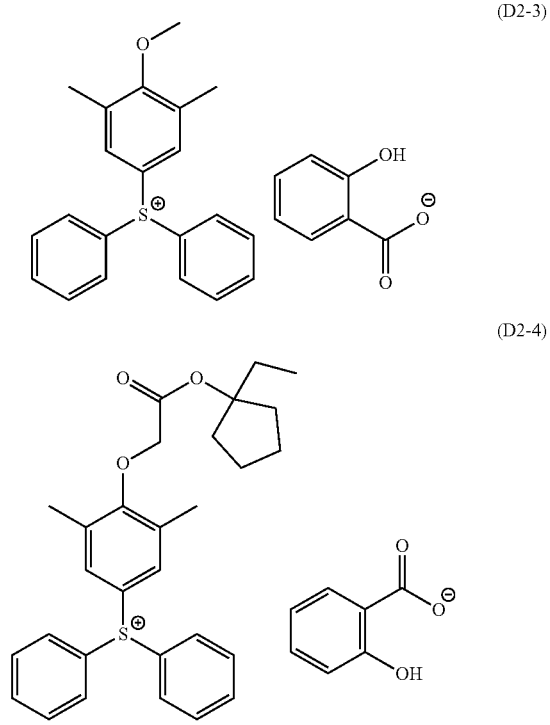

(D2-3)

(D2-4)

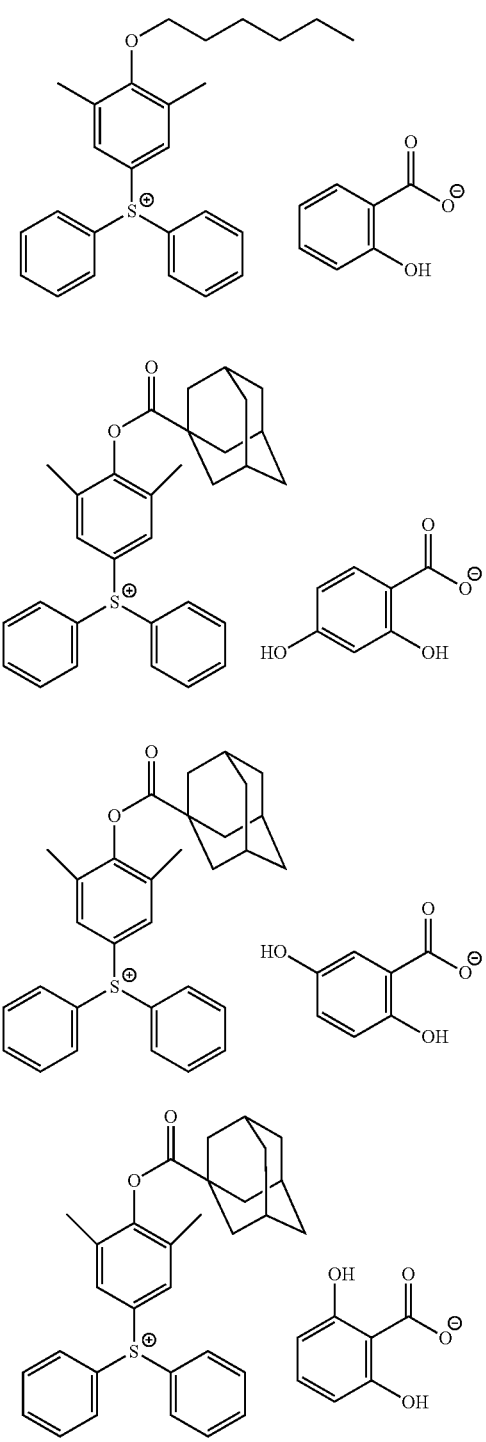
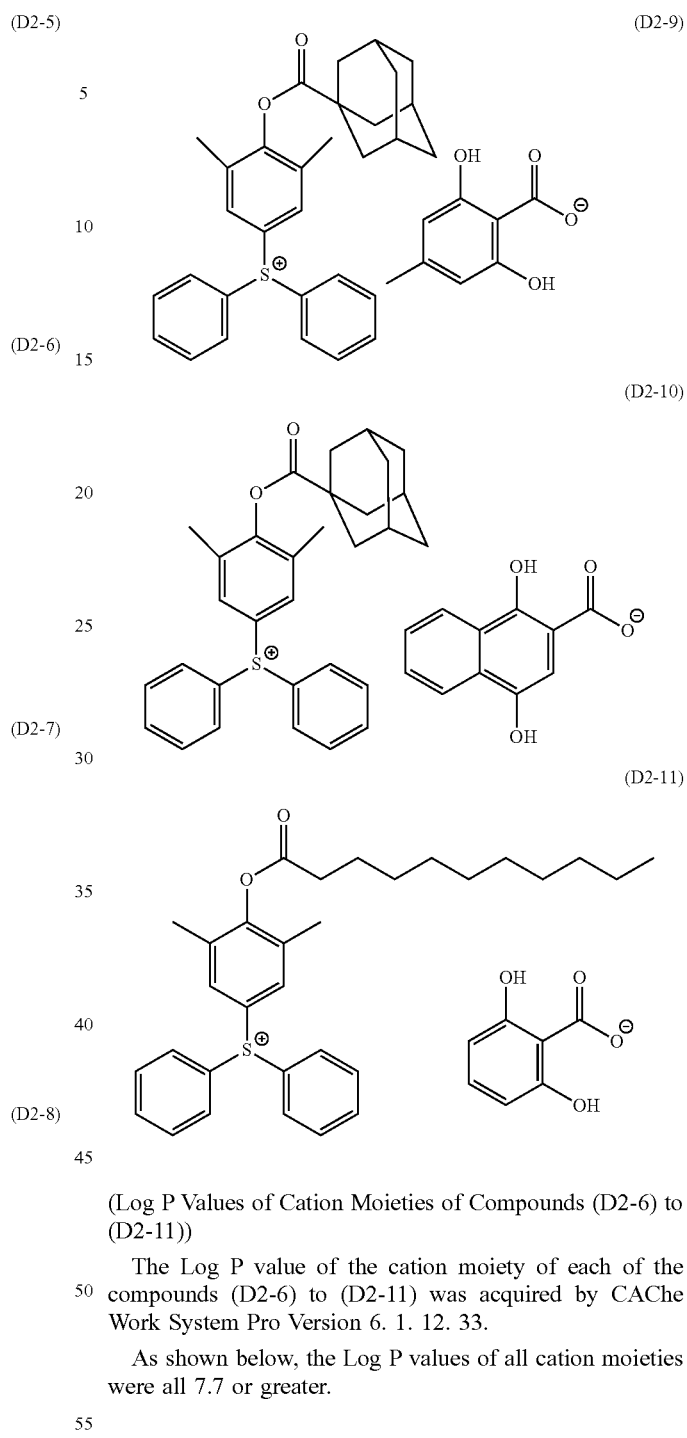
(Log P Values of Cation Moieties of Compounds (D2-6) to (D2-11))
The Log P value of the cation moiety of each of the compounds (D2-6) to (D2-11) was acquired by CAChe Work System Pro Version 6. 1. 12. 33.
As shown below, the Log P values of all cation moieties were all 7.7 or greater.

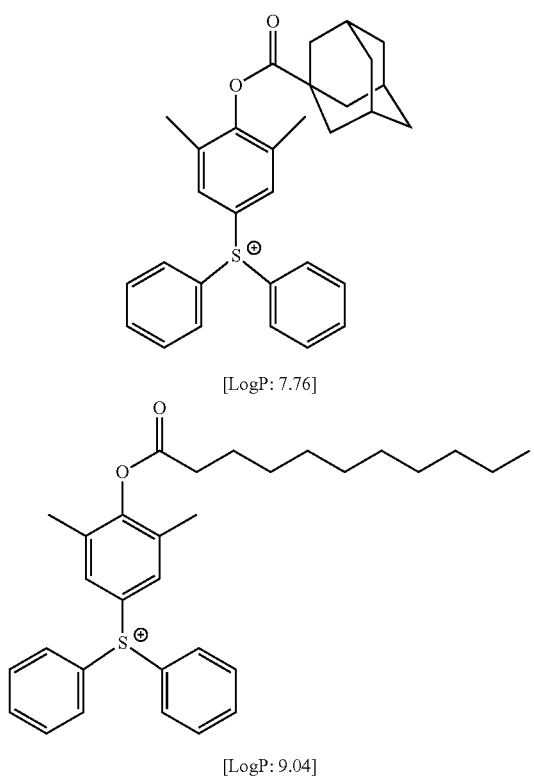

[LogP: 7.76]

[LogP: 9.04]

<Formation (1) of Resist Pattern>

An 8-inch silicon substrate to which a hexamethyldisilazane (HMDS) had been applied was coated with the resist composition of each example using a spinner, and a prebake (PAB) treatment performed thereon on a hot plate at a temperature of 110° C. for 60 seconds so that the hot plate was dried to form a resist film having a film thickness of 50 nm.

Next, drawing (exposing) was performed on the resist film at an accelerating voltage of 100 kV such that the target size was set to a line width of 50 nm to 20 nm and 1:1 line and space pattern (hereinafter, referred to as an "LS pattern") using an electron beam lithography device JEOL-JBX-9300FS (manufactured by JEOL Ltd.). Thereafter, a post exposure bake (PEB) treatment was performed thereon at 100° C. for 60 seconds.

Subsequently, alkali development was performed at 23° C. for 60 seconds using a 2.38% by mass tetramethylammonium hydroxide (TMAH) aqueous solution "NMD-3" (trade name, manufactured by TOKYO OHKA KOGYO CO., LTD.).

Thereafter, water rinsing was performed for 15 seconds using pure water.

As the result, a 1:1 LS pattern with a line width of 50 nm to 20 nm was formed.

[Evaluation of Line Width Roughness (LWR)]

Using the LS pattern formed in the section of the "formation (1) of resist pattern", the 3σ which is the scale that indicates the LWR was acquired. The results are listed in Tables 8 to 10 in the columns of "LWR (nm)".

The "3σ" indicates three times (3a) (unit: nm) the standard deviation (a) acquired based on the result of measurement performed by measuring 400 sites of line positions in the longitudinal direction of the line using a scanning electron microscope (trade name: S-9380, manufactured by Hitachi High-Technologies Corporation, accelerating voltage of 800 V).

In a case where the value of the 3σ is small, this indicates that the roughness of a line side wall is small and an LS pattern with a uniform width is obtained.

[Evaluation of Resolution]

An optimum exposure amount Eop ($\mu C/cm^2$) at which the LS pattern with a target size was formed based on the <formation (1) of resist pattern> was acquired. In addition, the minimum dimension of a pattern to be resolved without collapsing while the exposure amount from the optimum exposure amount Eop was increased to form an LS pattern was acquired using a scanning electron microscope S-9380 (manufactured by Hitachi High-Technologies Corporation). The results are listed in Tables 8 to 10 in the columns of "resolution (nm)".

TABLE 8

| | PAB (° C.) | PEB (° C.) | LWR (nm) | Resolution [nm] |
|---|---|---|---|---|
| Example 1 | 110 | 100 | 4.3 | 30 |
| Example 2 | 110 | 100 | 4.3 | 30 |
| Example 3 | 110 | 100 | 4.2 | 30 |
| Example 4 | 110 | 100 | 4.4 | 32 |
| Example 5 | 110 | 100 | 4.6 | 34 |
| Example 6 | 110 | 100 | 4.3 | 32 |
| Example 7 | 110 | 100 | 4.4 | 32 |
| Example 8 | 110 | 100 | 4.2 | 28 |
| Example 9 | 110 | 100 | 4.7 | 38 |
| Example 10 | 110 | 100 | 4.5 | 32 |
| Example 11 | 110 | 100 | 4.4 | 30 |

TABLE 9

| | PAB (° C.) | PEB (° C.) | LWR (nm) | Resolution [nm] |
|---|---|---|---|---|
| Comparative Example 1 | 110 | 100 | 5.3 | 48 |
| Comparative Example 2 | 110 | 100 | 5.3 | 46 |
| Comparative Example 3 | 110 | 100 | 5.2 | 46 |
| Comparative Example 4 | 110 | 100 | 5.2 | 46 |
| Comparative Example 5 | 110 | 100 | 5.4 | 48 |
| Comparative Example 6 | 110 | 100 | 5.6 | 48 |
| Comparative Example 7 | 110 | 100 | 5.9 | 50 |
| Comparative Example 8 | 110 | 100 | 5.5 | 48 |
| Comparative Example 9 | 110 | 100 | 5.6 | 48 |
| Comparative Example 10 | 110 | 100 | 5.3 | 46 |
| Comparative Example 11 | 110 | 100 | 5.7 | 50 |

TABLE 10

| | PAB (° C.) | PEB (° C.) | LWR (nm) | Resolution [nm] |
|---|---|---|---|---|
| Example 12 | 110 | 100 | 4.4 | 30 |
| Example 13 | 110 | 100 | 4.3 | 30 |
| Example 14 | 110 | 100 | 4.8 | 38 |
| Example 15 | 110 | 100 | 4.3 | 28 |
| Comparative | 110 | 100 | 5.4 | 48 |

TABLE 10-continued

|  | PAB (° C.) | PEB (° C.) | LWR (nm) | Resolution [nm] |
|---|---|---|---|---|
| Example 12 |  |  |  |  |
| Comparative Example 13 | 110 | 100 | 5.4 | 46 |
| Comparative Example 14 | 110 | 100 | 5.7 | 48 |
| Comparative Example 15 | 110 | 100 | 5.3 | 46 |
| Comparative Example 16 | 110 | 100 | 5.3 | 46 |

Based on the results in Tables 8 to 10, according to the resist composition of each example to which the present invention has been applied, it was confirmed that a resist pattern which has excellent resolution in the formation (1) of the resist pattern and an excellent shape with reduced roughness can be formed.

<Formation (2) of Resist Pattern>

A 12-inch silicon wafer was coated with an organic antireflection film composition "ARC95" (trade name, manufactured by Brewer Science, Inc.) using a spinner, fired on a hot plate at a temperature of 205° C. for 60 seconds, and dried to form an organic antireflection film having a film thickness of 90 nm.

The organic antireflection film was coated with the resist composition of each example using a spinner, and a prebake (PAB) treatment performed thereon on a hot plate at a temperature of 100° C. for 60 seconds so that the hot plate was dried to form a resist film having a film thickness of 90 nm.

Next, the resist film was selectively irradiated with an ArF excimer laser (193 nm) through a mask pattern using an immersion exposure apparatus 1900i (manufactured by ASML Holding N. V.; NA1. 2, Dipole X35, a 0.85/0.60, Y-pol.).

Thereafter, a post exposure bake (PEB) treatment was performed thereon at 100° C. for 60 seconds.

Subsequently, alkali development was performed at 23° C. for 10 seconds using a 2.38% by mass tetramethylammonium hydroxide (TMAH) aqueous solution "NMD-3" (trade name, manufactured by TOKYO OHKA KOGYO CO., LTD.).

As the result, a line and space resist pattern (LS pattern) with a line width of 64 nm and a pitch of 112 nm was formed.

[Evaluation of Line Width Roughness (LWR)]

Using the LS pattern formed in the section of the "formation (2) of resist pattern", the 3α which is the scale that indicates the LWR was acquired. The results are listed in Tables 11 to 14 in the columns of "LWR (nm)".

The "3σ" indicates three times (3a) (unit: nm) the standard deviation (a) acquired based on the result of measurement performed by measuring 400 sites of line positions in the longitudinal direction of the line using a scanning electron microscope (trade name: S-9380, manufactured by Hitachi High-Technologies Corporation, accelerating voltage of 800 V).

In a case where the value of the 3σ is small, this indicates that the roughness of a line side wall is small and an LS pattern with a uniform width is obtained.

TABLE 11

|  | PAB (° C.) | PEB (° C.) | LWR (nm) |
|---|---|---|---|
| Example 16 | 100 | 100 | 3.3 |
| Example 17 | 100 | 100 | 3.4 |
| Example 18 | 100 | 100 | 3.2 |
| Example 19 | 100 | 100 | 3.5 |
| Example 20 | 100 | 100 | 3.6 |
| Example 21 | 100 | 100 | 3.2 |
| Example 22 | 100 | 100 | 3.3 |
| Example 23 | 100 | 100 | 3.2 |
| Example 24 | 100 | 100 | 3.6 |
| Example 25 | 100 | 100 | 3.4 |
| Example 26 | 100 | 100 | 3.3 |

TABLE 12

|  | PAB (° C.) | PEB (° C.) | LWR (nm) |
|---|---|---|---|
| Comparative Example 17 | 100 | 100 | 4.1 |
| Comparative Example 18 | 100 | 100 | 4.0 |
| Comparative Example 19 | 100 | 100 | 3.9 |
| Comparative Example 20 | 100 | 100 | 3.9 |
| Comparative Example 21 | 100 | 100 | 4.1 |
| Comparative Example 22 | 100 | 100 | 4.2 |
| Comparative Example 23 | 100 | 100 | 4.4 |
| Comparative Example 24 | 100 | 100 | 4.0 |
| Comparative Example 25 | 100 | 100 | 4.2 |
| Comparative Example 26 | 100 | 100 | 3.9 |
| Comparative Example 27 | 100 | 100 | 4.3 |

TABLE 13

|  | PAB (° C.) | PEB (° C.) | LWR (nm) |
|---|---|---|---|
| Example 27 | 100 | 100 | 3.3 |
| Example 28 | 100 | 100 | 3.2 |
| Example 29 | 100 | 100 | 3.5 |
| Example 30 | 100 | 100 | 3.7 |
| Comparative Example 28 | 100 | 100 | 4.1 |
| Comparative Example 29 | 100 | 100 | 4.3 |
| Comparative Example 30 | 100 | 100 | 4.1 |
| Comparative Example 31 | 100 | 100 | 4.0 |
| Comparative Example 32 | 100 | 100 | 4.0 |

TABLE 14

|  | PAB (° C.) | PEB (° C.) | LWR (nm) |
|---|---|---|---|
| Example 31 | 100 | 100 | 3.3 |
| Example 32 | 100 | 100 | 3.2 |
| Example 33 | 100 | 100 | 3.4 |
| Comparative Example 33 | 100 | 100 | 4.0 |

TABLE 14-continued

| | PAB (° C.) | PEB (° C.) | LWR (nm) |
|---|---|---|---|
| Comparative Example 34 | 100 | 100 | 3.9 |
| Comparative Example 35 | 100 | 100 | 3.9 |
| Comparative Example 36 | 100 | 100 | 4.1 |

Based on the results in Tables 11 to 14, according to the resist composition of each example to which the present invention has been applied, it was confirmed that a resist pattern which has excellent resolution in the formation (2) of the resist pattern and an excellent shape with reduced roughness can be formed.

While preferred embodiments of the invention have been described and illustrated above, it should be understood that these are exemplary of the invention and are not to be considered as limiting. Additions, omissions, substitutions, and other modifications can be made without departing from the spirit or scope of the present invention. Accordingly, the invention is not to be considered as being limited by the foregoing description, and is only limited by the scope of the appended claims.

What is claimed is:

1. A resist composition which generates an acid upon exposure and whose solubility in a developing solution is changed due to an action of the acid, the resist composition comprising:
   a base material component (A) whose solubility in a developing solution is changed due to the action of an acid; and
   a compound (DO) formed of an anion moiety and a cation moiety, which is represented by Formula (d0),
   wherein the cation moiety of the compound (DO) has a Log P value of less than 7.7,

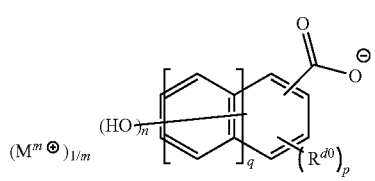

(d0)

wherein $M^{m+}$ represents an m-valent organic cation represented by Formula (ca-d0), m represents 1, $R^{d0}$ represents a substituent, p represents an integer of 0 to 3, and in a case where p represents 2 or 3, a plurality of substituents as $R^{d0}$ may be the same as or different from one another, q represents an integer of 0 to 3, n represents an integer of 2 or greater, where a relationship of "n+p≤(q×2)+5" is satisfied,

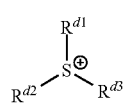

(ca-d0)

wherein $R^{d1}$ represents an aryl group which may have a substituent; and $R^{d2}$ and $R^{d3}$ each independently represent an aryl group which may have a substituent or may be bonded to each other to form a ring with a sulfur atom in Formula (ca-d0); provided that when any of $R^{d1}$, $R^{d2}$ and $R^{d3}$ has a substituent represented by any of Formula (ca-r-1) to (ca-r-7), $R'^{201}$ in Formula (ca-r-1) to (ca-r-7) is a hydrogen atom, a chain-like alkyl group which may have a substituent, or a chain-like alkenyl group which may have a substituent,

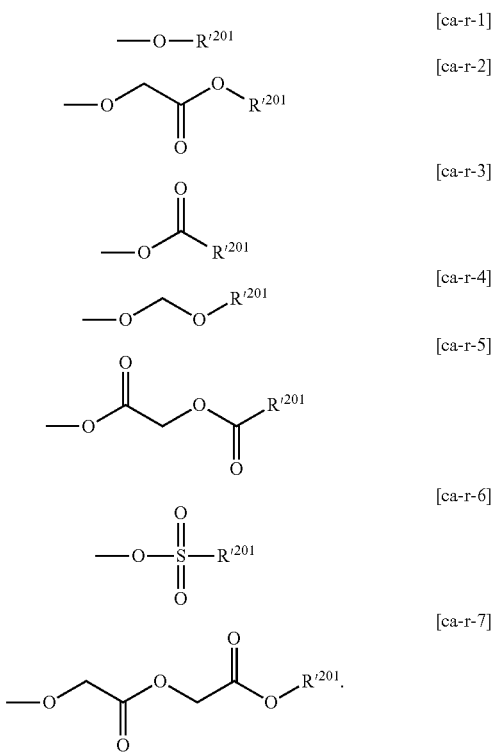

2. A method of forming a resist pattern, comprising:
   forming a resist film on a support using the resist composition according to claim 1;
   exposing the resist film; and
   developing the exposed resist film to form a resist pattern.

3. A compound formed of an anion moiety and a cation moiety, which is represented by Formula (d0),
   wherein a Log P value of the cation moiety is less than 7.7,

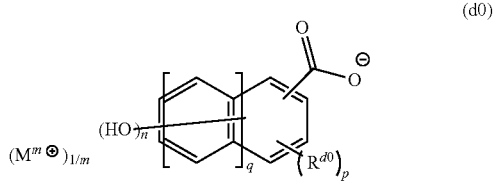

(d0)

wherein $M^{m+}$ represents an m-valent organic cation represented by Formula (ca-d0), m represents 1, $R^{d0}$ represents a substituent, p represents an integer of 0 to 3, and in a case where p represents 2 or 3, a plurality of substituents as $R^{d0}$ may be the same as or different from one another, q represents an integer of 0 to 3, n represents an integer of 2 or greater, where a relationship of "n+p≤(q×2)+5" is satisfied,

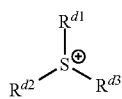 (ca-d0)

wherein $R^{d1}$ represents an aryl group which may have a substituent; and $R^{d2}$ and $R^{d3}$ each independently represent an aryl group which may have a substituent or may be bonded to each other to form a ring with a sulfur atom in Formula (ca-d0); provided that when any of $R^{d1}$, $R^{d2}$ and $R^{d3}$ has a substituent represented by any of Formula (ca-r-1) to (ca-r-7), $R'^{201}$ in Formula (ca-r-1) to (ca-r-7) is a hydrogen atom, a chain-like alkyl group which may have a substituent, or a chain-like alkenyl group which may have a substituent, —O—R'^{201}    [ca-r-1]

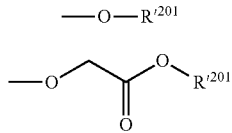 [ca-r-2]

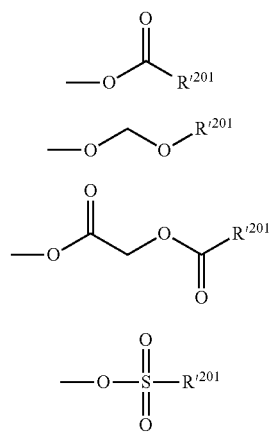

[ca-r-3]

[ca-r-4]

[ca-r-5]

[ca-r-6]

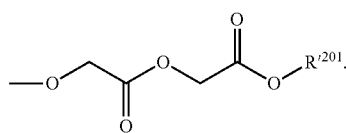 [ca-r-7]

* * * * *